(12) United States Patent
Zhang et al.

(10) Patent No.: US 11,477,885 B2
(45) Date of Patent: Oct. 18, 2022

(54) REDUNDANT TRACE FUSE FOR A CONFORMAL WEARABLE BATTERY

(71) Applicant: Inventus Power, Inc., Woodridge, IL (US)

(72) Inventors: Michael M. Zhang, Schaumburg, IL (US); Christopher Michael Reinke, Naperville, IL (US); Ilyas Ayub, Naperville, IL (US); William Mark Batts, Elburn, IL (US); Timothy James Vallaro, Batavia, IL (US); Elijah Brett Goldin, Colorado Springs, CO (US); Anvin Joe Manadan, Woodridge, IL (US)

(73) Assignee: Inventus Power, Inc., Woodridge, IL (US)

( * ) Notice: Subject to any disclaimer, the term of this patent is extended or adjusted under 35 U.S.C. 154(b) by 0 days.

(21) Appl. No.: 17/475,035

(22) Filed: Sep. 14, 2021

(65) Prior Publication Data

US 2022/0104355 A1 Mar. 31, 2022

Related U.S. Application Data

(63) Continuation-in-part of application No. 17/202,109, filed on Mar. 15, 2021, now Pat. No. 11,251,497, and
(Continued)

(51) Int. Cl.
*H05K 1/00* (2006.01)
*H05K 1/11* (2006.01)
(Continued)

(52) U.S. Cl.
CPC .......... *H05K 1/118* (2013.01); *H01M 50/209* (2021.01); *H01M 50/502* (2021.01);
(Continued)

(58) Field of Classification Search
CPC ........ H05K 1/118; H05K 1/117; H05K 1/181; H05K 3/303; H05K 2201/09072;
(Continued)

(56) References Cited

U.S. PATENT DOCUMENTS 3,993,507 A 11/1976 Hardigg
4,053,685 A 10/1977 Rowley et al.
(Continued)

FOREIGN PATENT DOCUMENTS

CN 201922162396 7/2020
KR 20080056978 A 6/2008
(Continued)

OTHER PUBLICATIONS

Rogers Corporation, "PORON® ShockSeal™ 4790-79 Foams," visited on Nov. 2, 2020 at <https://rogerscorp.com/Elastomeric%20Material%20Solutions/PORON%20Industrial%20Polyurethanes/PORON%20ShockSeal%204790%2079%20Foams>, 3 pp.
(Continued)

*Primary Examiner* — Anatoly Vortman
*Assistant Examiner* — Zhengfu J Feng
(74) *Attorney, Agent, or Firm* — Banner & Witcoff, Ltd.

(57) ABSTRACT

A housing of a conformal wearable battery (CWB) encloses a plurality of battery cells arranged in a grid-like pattern and electrically connected to a printed circuit board (PCB). The PCB includes an electrical connection pad that is electrically coupled to a positive terminal of a battery cell of the plurality of battery cells and a positive conductive region receiving electrical energy from one or more of the plurality of battery cells. A redundant trace fuse circuit is formed on the PCB to facilitate electrical connection of the electrical connection pad and the positive conductive region. The redundant trace fuse circuit includes a first fusible link for electrically connecting the first electrical connection pad to
(Continued)

the positive conductive region and a second fusible link that is selectively enabled to electrically connect the first electrical connection pad to the positive conductive region when the first fusible link is inoperative.

20 Claims, 83 Drawing Sheets

Related U.S. Application Data a continuation-in-part of application No. 17/085,928, filed on Oct. 30, 2020, now Pat. No. 11,349,174, said application No. 17/202,109 is a continuation-in-part of application No. 17/086,132, filed on Oct. 30, 2020, now Pat. No. 10,950,913, said application No. 17/085,928 is a continuation of application No. 17/085,864, filed on Oct. 30, 2020, now Pat. No. 10,980,116, said application No. 17/202,109 is a continuation-in-part of application No. 17/085,928, filed on Oct. 30, 2020, now Pat. No. 11,349,174, and a continuation-in-part of application No. 17/085,864, filed on Oct. 30, 2020, now Pat. No. 10,980,116, and a continuation-in-part of application No. 17/085,873, filed on Oct. 30, 2020, now Pat. No. 11,081,755, said application No. 17/085,928 is a continuation-in-part of application No. 17/038,287, filed on Sep. 30, 2020, now Pat. No. 11,064,604, said application No. 17/202,109 is a continuation-in-part of application No. 17/038,287, filed on Sep. 30, 2020, now Pat. No. 11,064,604, said application No. 17/085,864 is a continuation-in-part of application No. 17/038,287, filed on Sep. 30, 2020, now Pat. No. 11,064,604, said application No. 17/086,132 is a continuation-in-part of application No. 17/038,287, filed on Sep. 30, 2020, now Pat. No. 11,064,604, said application No. 17/085,873 is a continuation-in-part of application No. 17/038,287, filed on Sep. 30, 2020, now Pat. No. 11,064,604.

(51) Int. Cl.
| | | |
|---|---|---|
| *H05K 3/30* | (2006.01) | |
| *H05K 1/18* | (2006.01) | |
| *H01M 50/209* | (2021.01) | |
| *H01M 50/502* | (2021.01) | |
| *H01M 50/519* | (2021.01) | |

(52) U.S. Cl.
CPC .......... *H01M 50/519* (2021.01); *H05K 1/117* (2013.01); *H05K 1/181* (2013.01); *H05K 3/303* (2013.01); *H01M 2220/30* (2013.01); *H05K 2201/09072* (2013.01); *H05K 2201/0979* (2013.01); *H05K 2201/10037* (2013.01); *H05K 2203/107* (2013.01)

(58) Field of Classification Search
CPC . H05K 2201/0979; H05K 2201/10037; H05K 2203/107; H01M 50/209; H01M 50/502; H01M 50/519; H01M 50/24; H01M 50/26; H01M 2220/30; H01M 10/425; H01M 2200/00
USPC ........................................................ 174/254
See application file for complete search history.

(56) References Cited

U.S. PATENT DOCUMENTS

| | | |
|---|---|---|
| 4,346,151 A | 8/1982 | Uba et al. |
| 4,658,498 A | 4/1987 | Yamaura et al. |
| 6,376,126 B1 | 4/2002 | Faust et al. |
| 6,410,184 B1 | 6/2002 | Horiuchi et al. |
| 6,528,204 B1 | 3/2003 | Hikmet et al. |
| 6,773,848 B1 | 8/2004 | Nortoft et al. |
| 7,545,649 B2 | 6/2009 | Tan |
| 8,192,863 B2 | 6/2012 | Best et al. |
| 8,767,405 B2 | 7/2014 | Tokuda et al. |
| 8,795,880 B2 | 8/2014 | Matsubara |
| 8,860,372 B2 | 10/2014 | Guang et al. |
| 8,927,137 B2 | 1/2015 | Ayub et al. |
| 9,564,761 B2 | 2/2017 | Hopfer, III et al. |
| 9,640,831 B2 | 5/2017 | Tajima et al. |
| 9,660,225 B2 | 5/2017 | Miyake |
| 9,755,279 B2 | 9/2017 | Moon |
| 9,756,733 B2 | 9/2017 | Drzaic et al. |
| 9,780,421 B2 | 10/2017 | Palanchon et al. |
| 9,843,073 B2 | 12/2017 | Yoneda et al. |
| 9,923,186 B2 | 3/2018 | Tsunaki et al. |
| 9,941,506 B2 | 4/2018 | Hiroki et al. |
| 10,056,584 B2 | 8/2018 | Hwang |
| 10,134,528 B2 | 11/2018 | Stockman |
| 10,224,517 B2 | 3/2019 | Kimura |
| 10,236,492 B2 | 3/2019 | Miyake |
| 10,320,025 B2 | 6/2019 | Hiroki et al. |
| 10,388,939 B2 | 8/2019 | Urano et al. |
| 10,686,167 B2 | 6/2020 | Goto et al. |
| 10,950,913 B1 | 3/2021 | Goldin et al. |
| 11,064,604 B1 | 7/2021 | Goldin et al. |
| 11,108,105 B2 | 8/2021 | Takahashi et al. |
| 2002/0017700 A1 | 2/2002 | Mori et al. |
| 2002/0127362 A1 | 9/2002 | Jansen et al. |
| 2004/0009334 A1 | 1/2004 | Miyamoto et al. |
| 2005/0253553 A1 | 11/2005 | Phillips et al. |
| 2006/0210841 A1 | 9/2006 | Wallace et al. |
| 2008/0241677 A1 | 10/2008 | Garcia Alberola |
| 2008/0241680 A1* | 10/2008 | Lee .................. H01M 50/55 429/185 |
| 2009/0253034 A1 | 10/2009 | Nedelec |
| 2009/0291361 A1 | 11/2009 | Scorziello |
| 2013/0295434 A1 | 11/2013 | Ayub et al. |
| 2014/0212695 A1 | 7/2014 | Lane et al. |
| 2014/0216814 A1 | 8/2014 | Suzuki |
| 2015/0044511 A1* | 2/2015 | Kim ................ H01M 10/486 429/7 |
| 2015/0093982 A1 | 4/2015 | Bailey |
| 2015/0194697 A1 | 7/2015 | Hung et al. |
| 2015/0280186 A1 | 10/2015 | Fan |
| 2015/0311495 A1* | 10/2015 | Wang ................ H01M 50/505 429/121 |
| 2016/0003463 A1 | 1/2016 | Rodinger et al. |
| 2016/0156012 A1 | 6/2016 | Takahashi et al. |
| 2016/0218387 A1* | 7/2016 | Tajima ............. H01M 10/0431 |
| 2016/0233695 A1 | 8/2016 | Hopfer, III et al. |
| 2017/0018784 A1 | 1/2017 | Yun et al. |
| 2017/0025669 A1 | 1/2017 | Urano et al. |
| 2017/0079139 A1 | 3/2017 | Wu |
| 2018/0026235 A1 | 1/2018 | Akhmad |
| 2018/0062197 A1* | 3/2018 | Thiel ..................... H05K 5/06 |
| 2018/0083233 A1 | 3/2018 | Young et al. |
| 2018/0175346 A1 | 6/2018 | Schmid-Schoenbein |
| 2018/0223070 A1 | 8/2018 | O'Neil et al. |
| 2018/0261900 A1 | 9/2018 | Kim et al. |
| 2018/0301741 A1 | 10/2018 | Kumar et al. |
| 2019/0044197 A1 | 2/2019 | Ota et al. |
| 2019/0088979 A1 | 3/2019 | Grady et al. |
| 2019/0090350 A1 | 3/2019 | Kumar |
| 2019/0237832 A1 | 8/2019 | Ju et al. |
| 2019/0305303 A1 | 10/2019 | Yebka et al. |
| 2019/0326647 A1 | 10/2019 | Kawai et al. |
| 2020/0127259 A1 | 4/2020 | Yoshida et al. |
| 2020/0227693 A1 | 7/2020 | Enomoto |

(56) References Cited

U.S. PATENT DOCUMENTS

2020/0243808 A1    7/2020    Harutyunyan et al.
2020/0245495 A1    7/2020    Yi et al.
2020/0403566 A1*  12/2020   Yamaai ................... H02S 40/34

FOREIGN PATENT DOCUMENTS

WO        08023199 A1    2/2008
WO        17209052 A1   12/2017
WO    2019/025235 A1    2/2019

OTHER PUBLICATIONS

Inventus Power, "Conformal Wearable Batteries Safe, 'Flexible, Wearable Power Designed to Increase Mission Effectiveness'," visited on Nov. 4, 2020 at <https://inventuspower.com/conformal-wearable-batteries/>, pp. 3.

Rebecca Cragun, et al., "Li-Ion Conformal Wearable Battery," EaglePicher Technologies, LLC visited on Feb. 9, 2020 at <http://www.powersourcesconference.com/Power%20Sources%202018%20Digest/docs/34-2.pdf>, pp. 577-580.

Eaglepicher Technologies, "Rechargeable Conformal Battery", visited on Feb. 9, 2020 at <https://www.eaglepicher.com/sites/default/files/SLB-101%20061419.pdf>, pp. 2.

Feb. 25, 2021—U.S. Non-Final Office Action—U.S. Appl. No. 17/085,928.

Jul. 1, 2021—(WO) ISR & WO—App. No. PCT/US2021/022377.

* cited by examiner

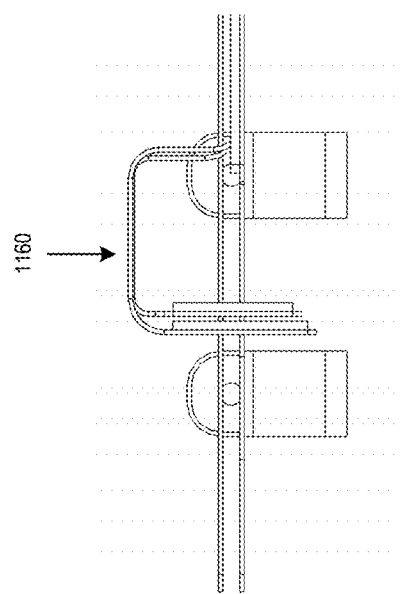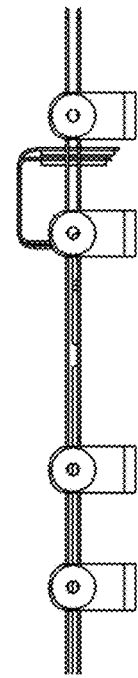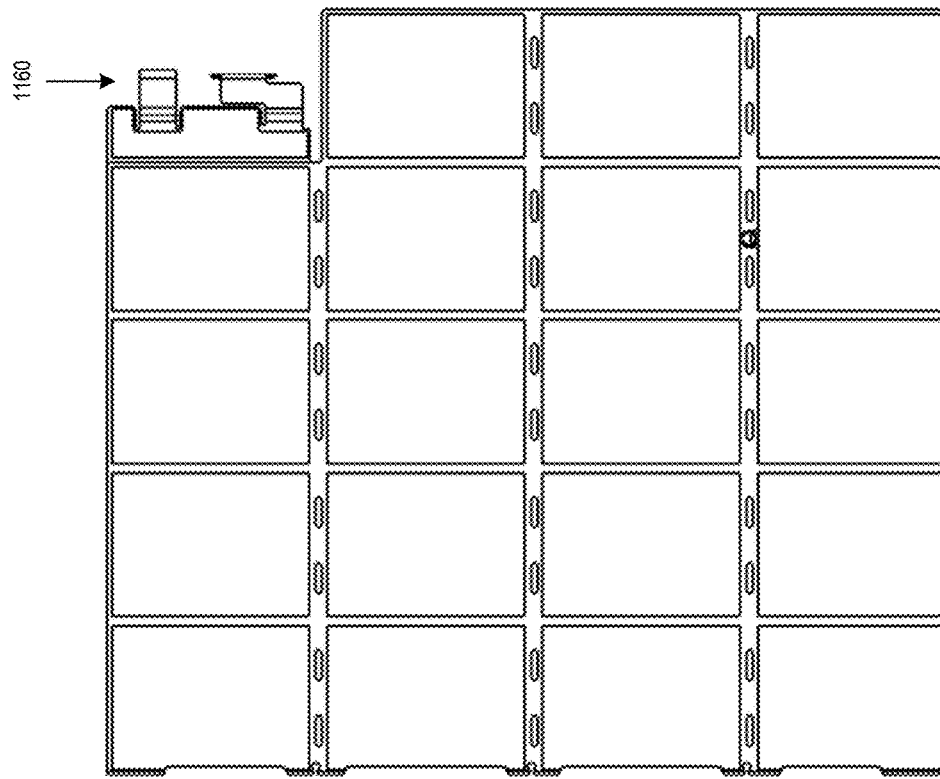
FIG. 46B
FIG. 46C
FIG. 46A

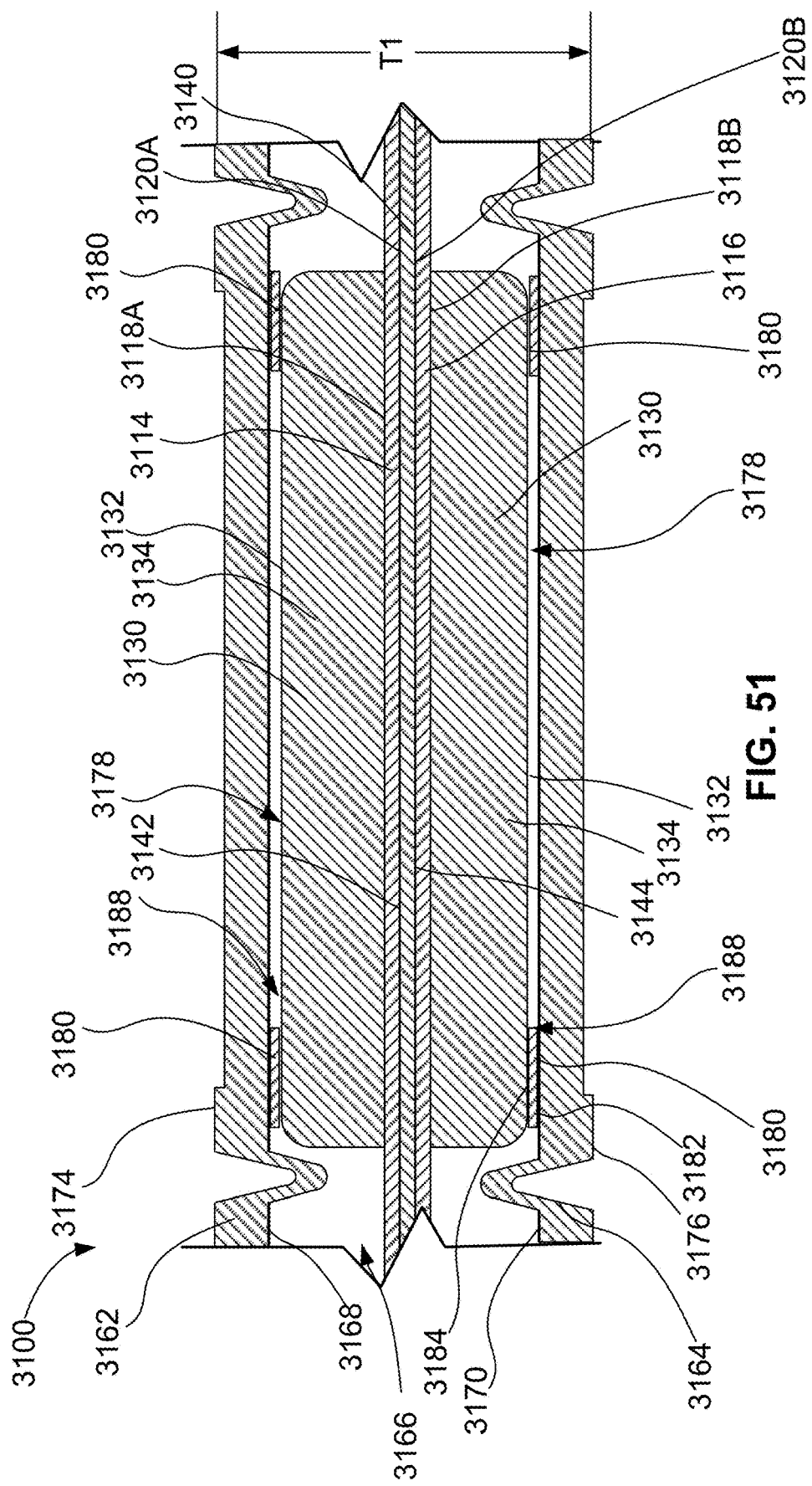

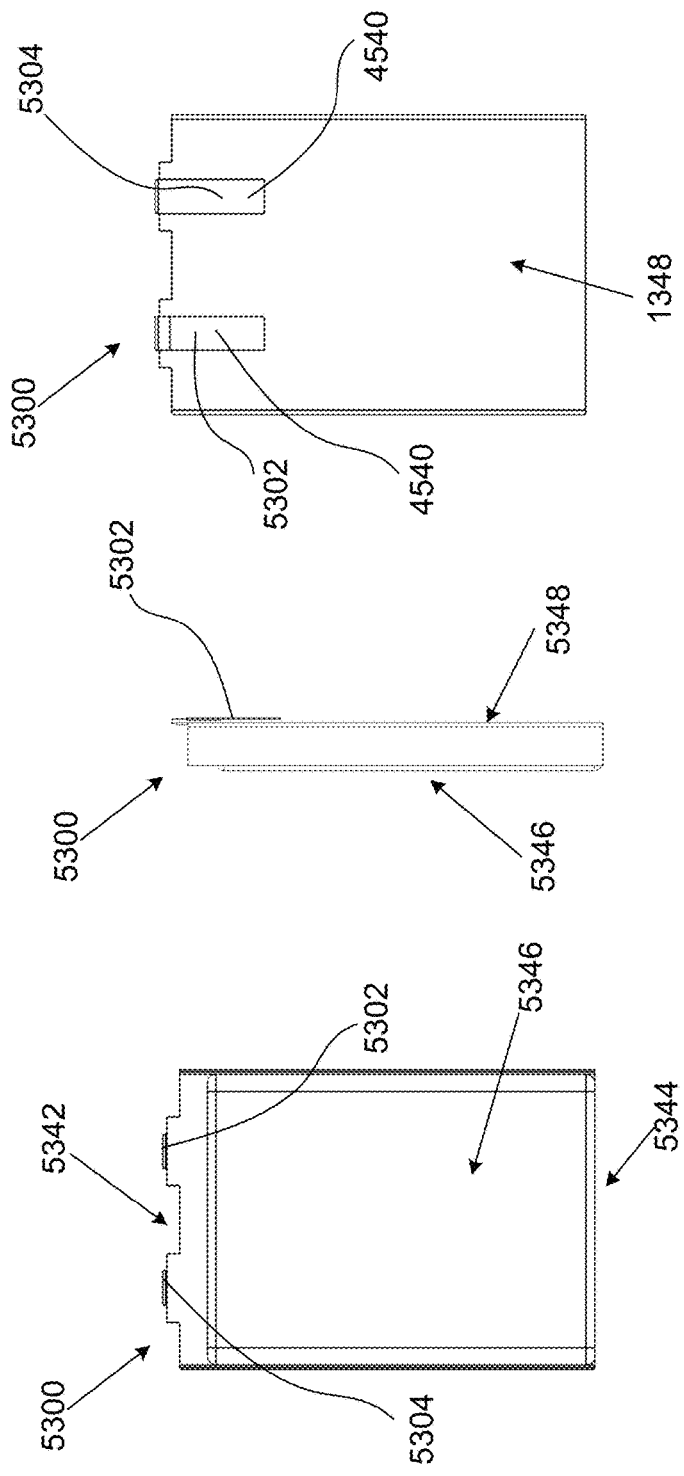
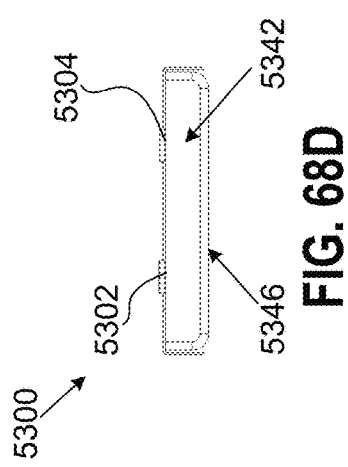

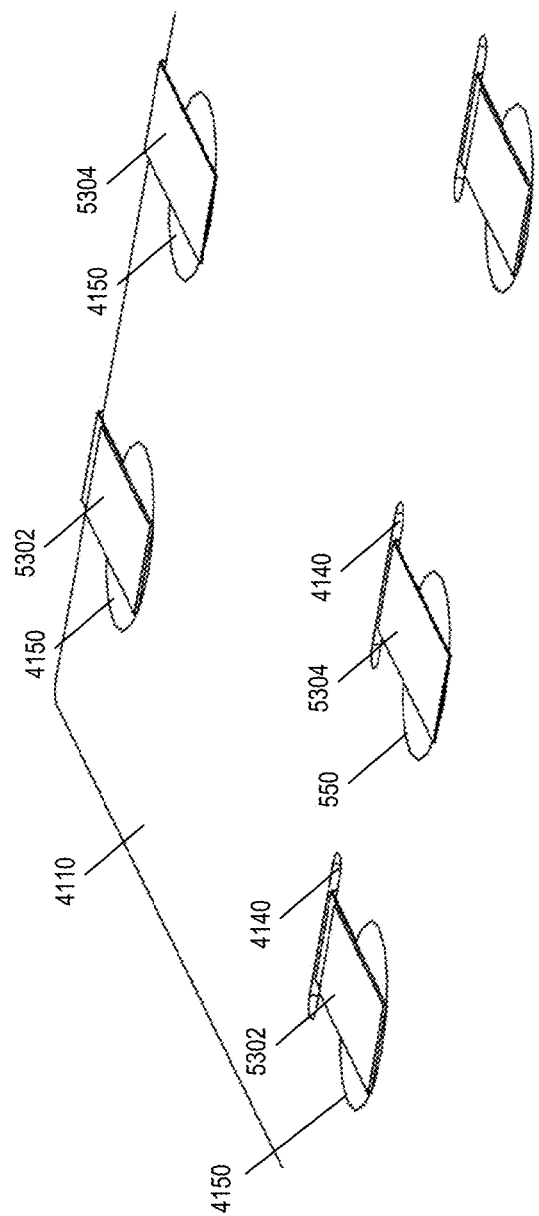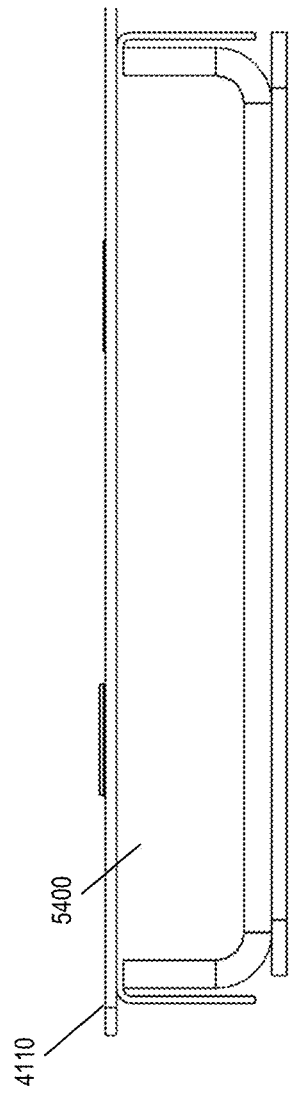
FIG. 70A
FIG. 70B

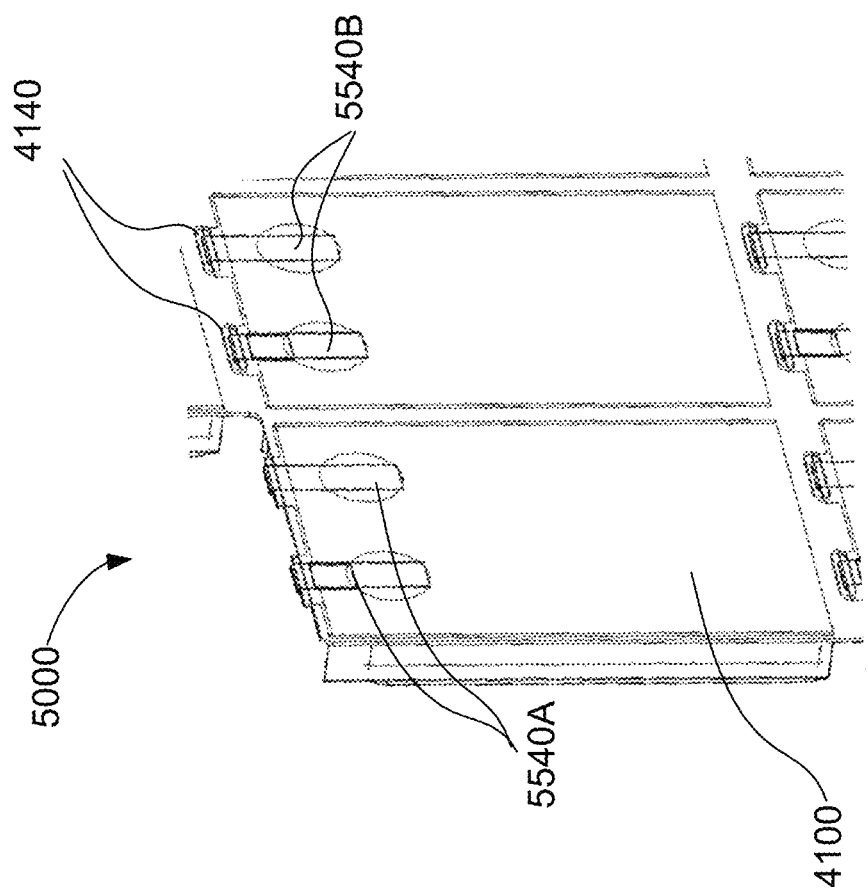
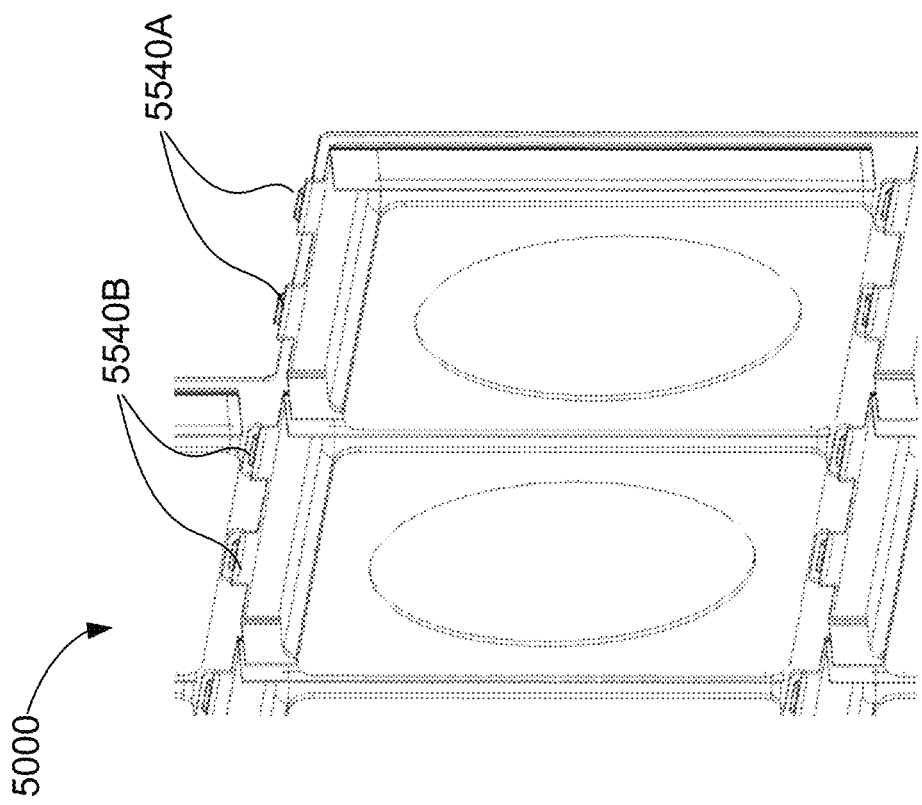

REDUNDANT TRACE FUSE FOR A CONFORMAL WEARABLE BATTERY

CROSS-REFERENCE TO RELATED APPLICATIONS

This application is a continuation-in-part of U.S. application Ser. No. 17/085,928, entitled "Flexible Battery Matrix for a Conformal Wearable Battery," which is a continuation of U.S. patent application Ser. No. 17/085,864 entitled "Flexible Battery Matrix for a Conformal Wearable Battery," filed on Oct. 30, 2020 and issued on Mar. 16, 2021 as U.S. Pat. No. 10,950,913, which is a continuation-in-part of U.S. patent application Ser. No. 17/038,287, entitled "Flexible Circuit Board for a Conformal Wearable Battery" filed on Sep. 30, 2020 and that issued on Jul. 13, 2021 as U.S. Pat. No. 11,064,604. U.S. application Ser. No. 17/085,928 is also a continuation-in-part of U.S. patent application Ser. No. 17/038,287. This application is also a continuation-in-part of U.S. patent application Ser. No. 17/202,109, entitled "Conformal Wearable Battery" filed on Mar. 15, 2021, which is a continuation-in-part of U.S. patent application Ser. No. 17/038,287, entitled "Flexible Circuit Board for a Conformal Wearable Battery" filed on Sep. 30, 2020 and that issued on Jul. 13, 2021 as U.S. Pat. No. 11,064,604. U.S. patent application Ser. No. 17/202,109 is also a continuation-in-part of U.S. application Ser. No. 17/085,873 filed on Oct. 30, 2020, entitled "Housing for a Conformal Wearable Battery," which is a continuation-in-part of U.S. patent application Ser. No. 17/038,287 filed on Sep. 30, 2020. U.S. patent application Ser. No. 17/202,109 is also a continuation-in-part of U.S. application Ser. No. 17/086,132 filed on Oct. 30, 2020 and that issued on Mar. 16, 2021 as U.S. Pat. No. 10,950,913, entitled "Impact Absorbing Member for a Conformal Wearable Battery," which is a continuation-in-part of U.S. patent application Ser. No. 17/038,287 filed on Sep. 30, 2020. U.S. patent application Ser. No. 17/202,109 is also a continuation-in-part of U.S. application Ser. No. 17/085,864 filed on Oct. 30, 2020 and that issued on Apr. 13, 2021 as U.S. Pat. No. 10,980,116, entitled "Flexible Battery Matrix for a Conformal Wearable Battery," which is a continuation-in-part of U.S. patent application Ser. No. 17/038,287 filed on Sep. 30, 2020. U.S. patent application Ser. No. 17/202,109 is also a continuation-in-part of U.S. application Ser. No. 17/085,928, entitled "Flexible Battery Matrix for a Conformal Wearable Battery," which is a continuation of U.S. patent application Ser. No. 17/085,864 filed on Oct. 30, 2020, which is a continuation-in-part of U.S. patent application Ser. No. 17/038,287 filed on Sep. 30, 2020. All of the above listed applications are herein incorporated by reference in their entirety.

FIELD

Aspects described herein generally relate to electrical power storage systems. More specifically, aspects of this disclosure relate to redundant trace fuse configurations for battery cell connections to a printed circuit board, sealed housings for a matrix of battery cells, a flexible printed circuit boards providing conductive paths for a matrix of battery cells, impact absorbing members to absorb or reduce shock and vibration forces seen by the electronic members for a portable electrical power storage system, and to flexible printed circuit boards providing conductive paths for a matrix of battery cells.

BACKGROUND

Batteries may come in different shapes and sizes depending on their intended usage. Some batteries may be arranged as packages of battery cells that are assembled together to provide a predetermined power output. These battery packages may be arranged in a durable and sealed housing to protect the batteries from damage. In some instances, the battery packages may be desired to flex or bend to accommodate their intended usage.

In addition, portable battery systems may be utilized to provide mobile and/or remote location electrical power. Integrated communications equipment and/or weapons gear utilized, for example, by law enforcement and/or military personnel requires increasingly high levels of power storage carried proximate the user's body. Methods of increasing power storage capability in a device, such as a conformal wearable battery (CWB) is to include additional battery cells and/or use larger battery cells. However, these solutions may unacceptably increase the size and/or weight of the resulting systems, reducing mobility.

As such, a need has been recognized within the mobile electrical power storage industry for increasing power capacity while improving an overall user safety of these systems, simultaneously reducing their size and weight, while improving manufacturability of individual CWB units.

SUMMARY

Aspects of the disclosure provide solutions that address and overcome technical problems associated with redundant trace fuse groups electrically connecting an electrical connection pad to a positive charge bus or negative charge bus of a printed circuit board.

Additional aspects of this disclosure may relate to redundant trace fuse configurations comprising at least two trace fuses formed into circuitry of a flexible printed circuit board (PCB). A housing of a conformal wearable battery (CWB) encloses a plurality of battery cells arranged in a grid-like pattern and electrically connected to a flexible printed circuit board (PCB). The flexible PCB includes an electrical connection pad that is electrically coupled to a positive terminal of a battery cell of the plurality of battery cells and a positive conductive region receiving electrical energy from one or more of the plurality of battery cells. A redundant trace fuse circuit is formed on the flexible PCB to facilitate electrical connection of the electrical connection pad and the positive conductive region. The redundant trace fuse circuit includes a first fusible link for electrically connecting the first electrical connection pad to the positive conductive region and a second fusible link that is selectively enabled to electrically connect the first electrical connection pad to the positive conductive region when the first fusible link is inoperative.

Additional aspects of this disclosure may relate to a conformal wearable battery with a redundant trace fuse circuit including a plurality of battery cells arranged in a grid-like pattern, a housing with an interior cavity that receives the plurality of battery cells, and a printed circuit board. In some cases, each battery cell of the plurality of battery cells comprises a positive terminal and a negative terminal to provide electricity through a transfer of electrons between the positive terminal and negative terminal. The printed circuit board may include a first electrical connection pad coupled to a positive terminal of a battery cell of the plurality of battery cells, a positive conductive region receiving electrical energy via positive terminals of one or more of the plurality of battery cells, and a first redundant trace fuse circuit. The redundant trance fuse circuit may include a first fusible link electrically connecting the first electrical connection pad to the positive conductive region and a second fusible link that is selectively enabled to electrically connect the first electrical connection pad to the positive conductive region.

Additional aspects of this disclosure may relate to a conformal wearable battery with a printed circuit board including a second electrical connection pad coupled to a negative terminal of the battery cell of the plurality of battery cells, a negative conductive region receiving electrical energy via negative terminals of one or more of the plurality of battery cells, and a second redundant trace fuse circuit including a third fusible link electrically connecting the second electrical connection pad to the negative conductive region and a fourth fusible link to selectively electrically connect the second electrical connection pad to the negative conductive region. In some cases, the first redundant trace fuse circuit includes a plurality of conductive paths to connect the first electrical connection pad to the positive conductive region, where each of the plurality of conductive paths may be connected independently from the other. In some cases, a first conductive path of the plurality of conductive paths may be a fuse element and a first pair of electrically separated conductive pads, wherein the fuse element is enabled via connection of a jumper between the first pair of electrically separated conductive pads. In some cases, a first conductive path of the plurality of conductive paths may be a pair of electrically separated conductive pads, where the first conductive path is enabled via connection of an external fuse component.

Additional aspects of this disclosure may relate to a printed circuit board, including a pair of electrical connection pads including a first electrical connection pad that may be coupled to a positive terminal of a battery cell of a plurality of battery cells, and a second electrical connection pad that may be coupled to a negative terminal of the battery cell of the plurality of battery cells. The printed circuit board may include a positive conductive region receiving electrical energy via positive terminals of one or more of the plurality of battery cells and a negative conductive region receiving electrical energy via negative terminals of one or more of the plurality of battery cells. The printed circuit board may include a plurality of first redundant trace fuse circuits, where each trace fuse circuit may include a first fusible link that electrically connects the first electrical connection pad to the positive conductive region and a second fusible link that is selectively enabled to electrically connect the first electrical connection pad to the positive conductive region.

Additional aspects of this disclosure may relate to a printed circuit board the may include a second redundant trace fuse circuit including a third fusible link electrically connecting the second electrical connection pad to the negative conductive region and a fourth fusible link to selectively electrically connect the second electrical connection pad to the negative conductive region. In some cases, the second fusible link comprises a plurality of conductive paths to connect the first electrical connection pad to the positive conductive region, wherein each of the plurality of conductive paths are connected independently from the other. In some cases, a first conductive path of the plurality of conductive paths may include a fuse element and a first pair of electrically separated conductive pads, where the fuse element may be enabled via connection of a jumper between the first pair of electrically separated conductive pads. In some cases, a first conductive path of the plurality of conductive paths may include a pair of electrically separated conductive pads, where the first conductive path may be enabled via connection of an external fuse component.

Additional aspects of this disclosure may relate to method including forming a first electrical connection between a first electrical connection pad and a first battery terminal, measuring, after forming (e.g., creating) the first electrical connection, continuity of a first electrical path between the first electrical connection pad and a first conductive region of a printed circuit board, wherein the first electrical path comprises a first trace fuse component formed on the printed circuit board, and selectively enabling, based on a measured discontinuity in the first electrical path, a second electrical connection between the first electrical connection pad and the first conductive region, wherein the second electrical connection comprises a second fuse component. In some cases, forming the second electrical connection path may include electrically connecting a second fuse component using a conductive shunt component. In some cases, the second fuse component may include a second trace fuse component formed on the printed circuit board. In some cases, the method may include measuring, after forming the second electrical connection, continuity of a second electrical path between the first electrical connection pad and the first conductive region of the printed circuit board, where the second electrical path may include a second trace fuse component formed on the printed circuit board, selectively enabling, based on a measured discontinuity in the second electrical path, a third electrical path between the first electrical connection pad and the first conductive region, where the third electrical path comprises a third fuse component. In some cases, the third fuse component may include one of a third trace fuse component or a pair of secondary electrical connection pads formed on the printed circuit board to receive an external fuse component. In some cases, the method may include electrically connecting a fuse component to a pair of secondary electrical connection pads formed on the printed circuit board. In some cases, forming the first electrical connection between the first electrical connection pad and the first battery terminal may include heating one or both of the first electrical connection pad and the first battery terminal and where the heating one or both of the first electrical connection pad and the first battery terminal causes the discontinuity in the first electrical path. In some cases, the method may include inserting through a pair of cutouts in the printed circuit board, the first battery terminal and a second battery terminal of a first battery cell, where the first battery cell may be positioned adjacent a first side of the printed circuit board and the first electrical connection pad and a second electrical connection pad are on a second side of the printed circuit board opposite the first side.

In some cases, the method may further include forming a second electrical connection between a second electrical connection pad and the second battery terminal measuring, after forming the second electrical connection, continuity of a fourth electrical path between the second electrical connection pad and a second conductive region of a printed circuit board, where the second electrical path comprises a fourth trace fuse component formed on the printed circuit board, and selectively enabling, based on a measured discontinuity in the fourth electrical path, a fifth electrical connection between the second electrical connection pad and the second conductive region, where the fifth electrical connection comprises a fifth fuse component. In some cases, the method may further include connecting, based on a successful connection of the first battery cell to the printed circuit board, a second battery cell to the printed circuit board by forming a sixth electrical connection between a third electrical connection pad and a third battery terminal comprising an anode of the second battery cell measuring, after forming the sixth electrical connection, continuity of a sixth electrical path between the third electrical connection pad and a first conductive region of a printed circuit board, where the sixth electrical path comprises a sixth trace fuse component formed on the printed circuit board, and selectively enabling, based on a measured discontinuity in the third electrical path, a seventh electrical connection between the third electrical connection pad and the first conductive region, were the seventh electrical connection comprises a seventh fuse component.

Additional aspects of this disclosure may relate to a method of assembling a printed circuit board assembly that may include (a) electrically connecting, via an application of heat energy, an anode tab of a battery cell to a first electrical connection pad formed in a printed circuit board and a cathode tab of the battery cell to a second electrical connection pad formed in the printed circuit board, wherein the first electrical connection pad is electrically connected to a first charge bus of the printed circuit board via a first trace fuse of a first redundant trace fuse assembly and the second electrical connection pad is electrically connected to a second charge bus of the printed circuit board via a second trace fuse of a second redundant trace fuse assembly and wherein the first trace fuse assembly and the second trace fuse assembly are formed in the printed circuit board, (b) determining whether one of the first trace fuse or the second trace fuse is in open circuit condition, (c) selectively enabling, based on an indication that the first trace fuse is an open circuit condition, a third trace fuse of the first trace fuse assembly (d) selectively enabling, based on an indication that the second trace fuse is an open circuit condition, a fourth trace fuse of the second trace fuse assembly (e) determining whether one of the third trace fuse or the fourth trace fuse is in open circuit condition, (f) repeating steps (a)-(e), based on an indication that the anode tab is electrically connected to the first charge bus via the first redundant trace fuse assembly and the cathode tab is electrically connected to the second charge bus via the second redundant trace fuse assembly, to electrically connect a second battery cell to the printed circuit board; and (g) discontinuing, based on an indication that at least one of the third trace fuse or the fourth trace fuse is in an open circuit condition, assembly of the printed circuit board assembly.

Additional aspects of this disclosure may relate to a conformal wearable battery that includes a plurality of battery cells arranged in a grid-like pattern, where the plurality of battery cells have a positive terminal and a negative terminal to provide electricity through a transfer of electrons between the positive terminal and negative terminal, a housing with an interior cavity that receives the plurality of battery cells, a conductive region coupled to one or more of the positive terminal and the negative terminal, where the electricity is provided from one or more of the plurality of battery cells to the conductive region, and a contact component having a front portion and a rear portion, where the contact component comprises an electrically conductive material. The front portion of the contact component may include an outward facing surface and a perimeter region surrounding the outward facing surface, where the outward facing surface may be accessible from outside of the interior cavity of the housing and the rear portion may have an inward facing surface. The contact component may be connected to the conductive region. The perimeter region of the outward facing surface of the contact component may be secured to the housing forming a sealed edge to prevent ingress of liquid into the interior cavity. The conformal wearable battery may also include a contact carrier that encases the rear portion of the contact component, where the contact carrier is also secured to the housing. The contact carrier may be secured to the housing between a rear surface of a sidewall of the housing and a rear flange that is spaced rearward of the rear surface. The housing may include a first plug that extends from the rear surface of the sidewall through an opening in the contact carrier to the rear flange of the housing. The electrically conductive material of the contact component may be formed from at least one material selected from brass, gold, copper, silver, aluminum, steel, or a combination thereof. The perimeter region may include a groove, and the rear portion may include a textured region and a threaded female element. The textured region may include a plurality of angled gear teeth. The contact component may also include an opening that receives a conductive element to create a connection between the conductive region and the contact component.

Still other aspects of this disclosure may relate to a conformal wearable battery that includes: (a) a plurality of battery cells comprising a positive terminal and a negative terminal to provide electricity through a transfer of electrons between the positive terminal and negative terminal; (b) a housing that includes a first shell and a second shell, where the first shell may connect to the second shell to form an interior cavity that receives the plurality of battery cells; (c) a conductive region coupled to one or more of the positive terminal and the negative terminal, where the electricity is provided from one or more of the plurality of battery cells to the conductive region; (d) a first contact carrier that secures a first electrically conductive contact component, where the first contact carrier is secured to the first shell; and (f) the first contact component having a front portion and a rear portion. The front portion of the first contact component may include an outward facing surface and a perimeter region surrounding the outward facing surface, where the outward facing surface is accessible from outside of the interior cavity of the housing. The first contact component is connected to the conductive region. The first contact carrier may be secured to the housing between a first rear surface of a first sidewall of the first shell and a first rear flange that is spaced rearward of the first rear surface. A first plug may extend from the first rear surface of the first sidewall through an opening in the first contact carrier to the first rear flange of the first shell, where the first plug, the first rear flange, and the first sidewall may be a single unitary member. A sidewall of the first shell may surround the perimeter region of the first contact component, and the first contact carrier may surround a textured region of the first contact component. The first rear flange may include an opening to allow access to an inward facing surface of the first contact component. A connector plate configured to receive a connector may be secured between a second rear surface of a second sidewall of the first shell and a second rear flange. In addition, a second plug may extend from the second rear surface through an opening in the connector plate to the second rear flange. The CWB may also include a second contact carrier, where the first contact carrier secures the first contact component and a second electrically conductive contact component. The second contact carrier may secure a third electrically conductive contact component and a fourth electrically conductive contact component.

Other aspects of this disclosure may relate to a system that includes: (a) an electronic component to provide an electrical signal, wherein the electronic component comprises a plurality of battery cells; (b) a housing that includes an interior cavity that receives the electronic component; (c) a conductive region coupled to the electronic component, where the electrical signal is provided from the electronic component to the conductive region; and (d) an electrically conductive contact component having a front portion and a rear portion. The front portion of the contact component may include an outward facing surface and a perimeter region surrounding the outward facing surface. The outward facing surface may be accessible from outside of the interior cavity of the housing, and the rear portion may have an inward facing surface. The contact component may be connected with the conductive region. The front portion may be partially encased by a first material that forms a sidewall of the housing, and the rear portion may be partially encased by a second material, where the first material may have a lower durometer than the second material. The electronic component may comprise a battery-charging controller and a computing processor. The perimeter region of the contact component may include a groove, and the rear portion of the contact component may include a textured region and a threaded female element. The contact component may include a threaded opening that receives a conductive element to create a direct connection between the conductive region and the contact component. The rear portion of the contact component may be secured to a contact carrier that is formed from the second material.

Yet still other aspects of this disclosure may relate to a conformal wearable battery that includes: (a) a plurality of battery cells arranged in a grid-like pattern, where the plurality of battery cells includes a positive terminal and a negative terminal to provide electricity through a transfer of electrons between the positive terminal and negative terminal; and (b) a housing that includes: (1) a first shell formed from a first member having a first plurality of rigid regions and a second member that has a first flexible region located between a first rigid region and a second rigid region of the first plurality of rigid regions, where the first shell includes a front wall with an outward facing surface formed from outward facing surfaces of the first plurality of rigid regions and an outward facing surface of the second member, and (2) a second shell attached to the first shell, wherein the second shell includes a third member having a second plurality of rigid regions and a fourth member that has a second flexible region located between a first rigid region and a second rigid region of the second plurality of rigid regions. The second shell may have an outward facing surface formed from outward facing surfaces of the second plurality of rigid regions and an outward facing surface of the second member, where the first shell may connect to the second shell to form an interior cavity that receives the plurality of battery cells. The first member may be formed from a first material, and the second member may be formed from a second material, where the first material has a hardness that is greater than a hardness of the second material. The third member may be formed from the first material, and the fourth member may be formed from the second material. The first material may be formed from a polycarbonate, and the second material may be formed from a thermoplastic elastomer. The second member may be molded onto the first member to form the first shell. Additionally, the first rigid region of the first plurality of rigid regions may include a first outward facing surface, a first inward facing surface, and a first edge region along a majority of a perimeter of the first rigid region extending between the first outward facing surface and the first inward facing surface. The first edge region may include a first edge surface and a second edge surface, where the first edge surface and the second edge surface extend in different directions. The second member may have a second edge region that has a complementary structure to the first edge region such that the first member and the second member are substantially coplanar on adjacent surfaces of the first edge region.

Still additional aspects of this disclosure may relate to a housing for a plurality of battery cells arranged in a grid-like pattern, where the housing includes: (a) a first shell having a first member having a plurality of rigid regions and a second member that has a flexible region located between a first rigid region and a second rigid region of the plurality of rigid regions, where a first wall of the first shell has an outward facing surface formed from outward facing surfaces of the plurality of rigid regions and an outward facing surface of the second member and (b) a second shell attached to the first shell forming an interior cavity between the first shell and the second shell. The first member may be formed as a unitary member, and the second member may be molded onto the first member. In addition, the first member may be formed from a first material, and the second member may be formed from a second material. The first material may have a first hardness, and the second material may have a second hardness, where the first hardness may be greater than the second hardness. The plurality of rigid regions may be arranged in an array with the plurality of rigid regions in both a horizontal direction and a vertical direction that correspond to the grid-like pattern of the plurality of battery cells. Each rigid region of the plurality of rigid regions may be spaced apart from an adjacent rigid region and is connected to the adjacent rigid region by a channel. The channel may act as a living hinge, and the channel may have a thickness that is less than a thickness of the first rigid region. The first rigid region of the plurality of rigid regions may include a first outward facing surface, a first inward facing surface, and a first edge region along a majority of a perimeter of the first rigid region extending between the first outward facing surface and the first inward facing surface. The first edge region may include a first edge surface that extends substantially perpendicular to the first outward facing surface and a second edge surface has a portion that extends substantially perpendicular to the first edge surface. The second edge surface may include a curved portion. A thickness of the first rigid region may be substantially the same as a thickness of the flexible region, where the thickness of the first rigid region may be measured at a center of the first rigid region and the thickness of the flexible region may be measured at a location adjacent a first edge region of the first rigid region. The second shell may include a third member having a second plurality of rigid regions and a fourth member that has a second flexible region located between a first rigid region and a second rigid region of the second plurality of rigid regions. A first wall of the second shell may have an outward facing surface formed from outward facing surfaces of the plurality of rigid regions and an outward facing surface of the second member. The second member may include a plurality of horizontal grooves and a plurality of vertical grooves.

Additional aspects of this disclosure may relate to a housing for a plurality of battery cells arranged in a grid-like pattern, where the housing includes a first shell having a first member having a plurality of rigid regions and a second member that has a flexible region located between a first rigid region and a second rigid region of the plurality of rigid regions, and wherein a first wall of the first shell has an outward facing surface formed from outward facing surfaces of the plurality of rigid regions and an outward facing surface of the second member, where the plurality of rigid regions are arranged in an array with the plurality of rigid regions in both a horizontal direction and a vertical direction that correspond to the grid-like pattern of the plurality of battery cells and each rigid region of the plurality of rigid regions are spaced apart from an adjacent rigid region and is connected to the adjacent rigid region by a channel. The first member may be formed as a unitary member, and the second member may be molded onto the first member. The first member may be formed from a first material, and the second member may be formed from a second material. The first material may have a first hardness, and the second material may have a second hardness, where the first hardness is greater than the second hardness.

Aspects of the disclosure provide solutions that address and overcome technical problems associated with minimizing size of a portable battery system (e.g. a conformal wearable battery system).

A flexible printed circuit board assembly (PCBA) for a conformal wearable battery (CBB) includes attachment sections for a plurality of battery cells that are arranged in a grid-like pattern on a same side of the flexible PCBA. The flexible PCBA is configured to fold along a bend axis so that the flexible PCBA is folded approximately in half. To reduce mechanical stresses placed on the flexible PCBA when folding the flexible PCBA along the bend axis, the flexible PCBA includes a plurality of cut-outs dispersed along the bend axis and parallel to adjacent battery cells. The CWB is configured to flex during use. The flexible PCBA includes a plurality of cut-outs disposed perpendicular to the bend axis, between adjacent rows of battery cells, and on the bend axis to relieve mechanical stresses applied to a bent portion of the flexible PCBA when the CWB is flexed during use.

Aspects of the disclosure may relate to a conformal wearable battery that may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

Aspects of the disclosure may relate to a conformal wearable battery that may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

Aspects of the disclosure may relate to a conformal wearable battery that may include a bend axis where the bend axis comprises a center portion of the grid like pattern of the physical connection sections.

Aspects of the disclosure may relate to a conformal wearable battery that may include the plurality of cut-outs where each first cut-out of the plurality of first cut-outs is rectangular-shaped, and where a longer edge of each first cut-out is disposed parallel to the bend axis. The conformal wearable battery may include a first cut-out where each corner of each first cut-out of the plurality of first cut-outs is rounded and/or where each second cut-out of the plurality of second cut-outs comprises a first semi-circular section, a second semi-circular section and a rectangular section. The flexible PCBA may include a first cut-out where the rectangular section is disposed between the first semi-circular section and the second semi-circular section and/or where the rectangular section is disposed laterally across the bend axis, wherein a mid-point of the rectangular section is located near the bend axis.

Aspects of the disclosure may relate to a conformal wearable battery that may have each of the plurality of battery cells physically attached to a first side of the flexible PCBA and/or where the plurality of battery cells is disposed on an outside surface of the flexible PCBA when the flexible PCBA is in a folded configuration.

Aspects of the disclosure may relate to a conformal wearable battery that may further include a sealed flexible housing wherein the flexible PCBA is disposed within an interior cavity of the sealed flexible housing and wherein the flexible PCBA is in a folded configuration.

Aspects of the disclosure may relate to a system that may include a plurality of battery cell modules and a flexible printed circuit board assembly (PCBA). The flexible PCBA includes a plurality of battery cell connection sections disposed in a grid-like pattern along a first surface of the flexible PCBA, a bend axis configured to divide the flexible PCBA in half when the flexible PCBA is in a folded configuration, and a plurality of cut-outs disposed along the bend axis, wherein each of the plurality of cut-outs reduce a bending force placed on the flexible PCBA when a flexing force is applied to the flexible PCBA. The system may include the plurality of cut-outs comprises a plurality of first cut-outs having a first shape, and a second plurality of cut-outs having a second shape. In some cases, the first shape comprises a substantially rectangular shape having rounded corners and/or the second shape comprises at least one semi-circular section and a rectangular section. In some cases, the second shape comprises a rectangular section disposed across the bend axis and a first semi-circular section disposed at an end of the rectangular section on a first side of the bend axis and a second semi-circular section disposed at an opposite end of the rectangular section and on an opposite side of the bend axis. In some cases, a first plurality of cut-outs of the plurality of cut-outs are located near an approximate mid-point of a battery cell module and/or where a portion of the plurality of cut-outs is disposed on a bend line that is perpendicular to the bend axis and between two adjacent battery cell modules Aspects of the disclosure may relate to a flexible printed circuit board assembly (PCBA) that may include a plurality of battery modules physically affixed to the flexible PCBA, wherein the plurality of battery modules are arranged in a grid-like pattern, a bend axis near an approximate mid-point of the flexible PCBA, wherein bending the flexible PCBA along the bend axis folds the flexible PCBA in half, and a plurality of cut-outs disposed along the bend axis, wherein the cutouts reduce a force exerted on the flexible PCBA along the bend axis when the flexible circuit board is flexed. In some cases, the plurality of cut-outs disposed along the bend axis comprise a plurality of first cut-outs having a first shape and a plurality of second cut-outs having a second shape and wherein the plurality of first cut-outs are disposed along a flexible portion of the flexible PCBA between adjacent rows of the grid-like pattern that are perpendicular to the bend axis and the plurality of second cut-outs are disposed between adjacent battery modules in columns of the grid-like pattern, wherein the columns are on opposite sides of the bend axis.

Some aspects of this disclosure may relate to a conformal wearable battery (CWB) that includes: (a) a plurality of non-cylindrical shaped battery polymer cells; (b) a flexible printed circuit board (PCB) with a plurality of physical connection sections disposed in a grid like pattern, where each of the plurality of battery cells is physically affixed to the flexible PCB at a corresponding physical connection section of the plurality of physical connection sections and a bend axis that facilitates folding of the flexible PCB to form an upper portion of the flexible PCB and a lower portion of the flexible PCB; (c) a visco-elastic central shock-absorbing member positioned between the upper portion and the lower portion of the flexible PCB preventing the upper portion from contacting the lower portion, where the central shock-absorbing member electrically insulates the upper portion from the lower portion; and (d) a flexible housing that includes an internal cavity that receives the plurality of battery cells, the flexible PCB, and the central shock-absorbing member. The CWB may also include a plurality of visco-elastic battery cell shock-absorbing members, where each battery cell shock-absorbing member of the plurality of battery cell shock-absorbing members being individually attached to an outward facing surface of each battery cell. Each battery cell shock-absorbing member may have an opening that is substantially aligned with a center of a pouch cell portion of each battery cell. The opening may have an area that is within a range of 30 percent and 70 percent of an area of a front surface of the battery cell shock-absorbing member, where the area of the front surface is defined as the area of the front surface that is free of the opening. At least one battery cell shock-absorbing member of the plurality of shock-absorbing members may contact an interior surface of the housing. A thickness of the central shock-absorbing member may be substantially the same as a thickness of one of the plurality of battery cell shock-absorbing members. In some examples, a thickness of the central shock-absorbing member may be within a range of 1.2 and 1.4 times a thickness of one of the plurality of battery cell shock-absorbing members. The central shock-absorbing member may be continuous and extend at least 90 percent of a width of the upper portion of the flexible PCB. A thickness of the central shock-absorbing member may be within a range of 2 percent and 5 percent of a thickness of the conformal wearable battery, where the thickness of the conformal wearable battery is defined as a distance from an outermost outward facing surface of an upper housing member to an outermost outward facing surface of a lower housing member. The central shock-absorbing member may be the same material as a battery cell shock-absorbing member of the plurality of battery cell shock-absorbing members, and where the central shock-absorbing member comprises polyurethane.

Other aspects of this disclosure may relate to a conformal wearable battery that includes (a) a plurality of battery cells; (b) a flexible printed circuit board (PCB) that includes a plurality of physical connection sections, where each of the plurality of battery cells is physically affixed to the flexible PCB at a corresponding physical connection section of the plurality of physical connection sections and a bend axis that facilitates folding of the flexible PCB to form an upper portion of the flexible PCB and a lower portion of the flexible PCB; (c) a plurality of battery cell shock-attenuating members, each battery cell shock-attenuating member of the plurality of battery cell shock-attenuating members being individually attached to an outward facing surface of each battery cell, where each battery cell shock-attenuating member is a foam member and has an opening that extends through the battery cell shock-attenuating member; and (d) a housing that includes an upper housing member, a lower housing member, and an internal cavity, wherein the internal cavity that receives the plurality of battery cells, the flexible PCB, and the plurality of battery cell shock-attenuating members. A first battery cell shock-attenuating member of the plurality of battery cell shock-attenuating members contacts an interior surface of the lower housing member and a second battery cell shock-attenuating member of the plurality of battery cell shock-attenuating members contacts an interior surface of the upper housing member. When a battery cell of the plurality of battery cells increases in volume, one of a battery cell shock-attenuating member of the plurality of shock-attenuating members is compressed. A thickness of a battery cell shock-attenuating member of the plurality of battery cell shock-attenuating members may be within a range of 4 percent and 12 percent of a thickness of a battery cell of the plurality of battery cells. The opening of the plurality of battery cell shock-attenuating members may have an oval shape. The CWB may also include a central shock-attenuating member, where the central shock-attenuating member may be positioned between the upper portion and the lower portion of the flexible PCB to prevent the upper portion from contacting the lower portion. The central shock-attenuating member may electrically insulate the upper portion from the lower portion. In addition, a thickness of the central shock-attenuating member may be substantially the same as a thickness of a battery cell shock-attenuating member of the plurality of battery cell shock-attenuating members.

Still additional aspects of this disclosure may relate to a system that includes: (a) a plurality of battery cells; (b) a flexible printed circuit board (PCB) that has a plurality of physical connection sections, where each of the plurality of battery cells may be physically affixed to the flexible PCB at a corresponding physical connection section of the plurality of physical connection sections and a bend axis that may facilitate folding of the flexible PCB to form an upper portion of the flexible PCB and a lower portion of the flexible PCB; (c) a central shock-attenuating member formed from a polymeric foam material, where the central shock-attenuating member may be positioned between the upper portion and the lower portion that prevents the upper portion of the flexible PCB from contacting the lower portion of the flexible PCB; (d) a plurality of battery cell shock-attenuating members formed from a polymeric foam material, where each battery cell shock-attenuating member of the plurality of battery cell shock-attenuating members may be individually attached to an outward facing surface of each battery cell of the plurality of battery cells; and (e) a housing that includes an internal cavity, where the internal cavity receives the plurality of battery cells, the flexible PCB, the central shock-attenuating member, and the plurality of battery cell shock-attenuating members. A battery cell shock-attenuating member of the plurality of battery cell shock-attenuating members may contact an interior surface of the housing. When a battery cell of the plurality of battery cells increases in volume, one of a battery cell shock-attenuating member of the plurality of shock-attenuating members or the central shock-attenuating member may be compressed. In addition, when a battery cell of the plurality of battery cells increases in volume, the battery cell that increases in volume may expand into a cavity formed by an opening in each battery cell shock-attenuating member of the plurality of battery cell. A thickness of a battery cell shock-attenuating member of the plurality of battery cell shock-attenuating members may be within a range of 4 percent and 12 percent of a thickness of a battery cell of the plurality of battery cells. The central shock-attenuating member may contact both inward facing surfaces of the upper portion and the lower portion of the flexible PCB.

Aspects of the disclosure provide solutions that address and overcome technical problems associated with minimizing size of a portable battery system (e.g. a conformal wearable battery system).

A need has been recognized within the mobile electrical power storage industry for increasing power capacity while improving an overall user safety of these systems while simultaneously reducing their size and weight.

A matrix of battery cell modules includes a flexible printed circuit board assembly (PCBA) for a conformal wearable battery (CWB) with a plurality of attachment sections for each of a plurality of battery cells that are arranged in a grid-like pattern on a same side of the flexible PCBA. Control and/or monitoring circuitry for the CWB may be provided in a circuitry module. The flexible PCBA is configured to fold along a bend axis so that the flexible PCBA is folded approximately in half. When affixed to the flexible PCBA, the plurality of battery cell modules and the circuitry module form a grid of physical components. When folded, the flexible PCBA forms a three-dimensional grid of physical components comprising at least the battery cell modules.

Aspects of this disclosure may relate to a conformal wearable battery that may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

In some cases, the conformal wearable battery may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly. Further, the conformal wearable battery may include a plurality of battery cells, at least one circuitry module configured to control and monitor charging and discharging of the plurality of battery cells, and a flexible printed circuit board assembly (PCBA). The flexible PCBA may include a plurality of physical connection sections disposed in a grid like pattern, wherein each of the plurality of battery cells and the at least one circuitry module is physically affixed to the flexible PCBA at a corresponding physical connection section of the plurality of physical connection sections.

Aspects of this disclosure may relate to a conformal wearable battery that may include a flexible PCBA that includes a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly. The conformal wearable battery may include a plurality of battery cells and at least one circuitry module that, when affixed to the flexible PCBA, forms a matrix of physical components. The matrix of physical components may be a matrix of at least two rows and at least two columns. The conformal wearable battery may further include at least one connector configured to provide an electrical power connection from internal circuitry of the conformal wearable battery to an external device to be powered. Aspects of this disclosure may relate to a conformal wearable that may include the plurality of battery cells, where the at least one connector, and the at least one circuitry module, when affixed to the flexible PCBA, comprises a matrix of physical components.

Aspects of this disclosure may relate to a conformal wearable battery that may comprise a bend axis that is a center of the grid like pattern of the physical connection sections when the flexible PCBA is unfolded. The conformal wearable battery of the illustrative example may include a flexible PCBA having each of the plurality of battery cells physically attached to a first side of the flexible PCBA. The conformal wearable battery may include the flexible PCBA having each of the plurality of battery cells physically attached to a first side of the flexible PCBA and each of the plurality of battery cells electrically connected to the flexible PCBA on a second side of the flexible PCBA that is opposite the first side. The conformal wearable battery of the illustrative example may include the flexible PCBA having the plurality of battery cells disposed on an outside surface of the flexible PCBA, when the flexible PCBA is in a folded configuration.

Aspects of this disclosure may relate to a plurality of battery cells that are arranged in a three-dimensional grid pattern. The conformal wearable battery of the illustrative example may include a sealed flexible housing wherein the flexible PCBA is disposed within an interior cavity of the sealed flexible housing and wherein the flexible PCBA is in a folded configuration.

Aspects of this disclosure may relate to a system that may include a plurality of battery cell modules and a flexible printed circuit board assembly (PCBA). The flexible PCBA may further include a plurality of battery cell connection sections disposed in a grid-like pattern along a first surface of the flexible PCBA where each of the plurality of battery cell modules is electrically attached to the flexible PCBA on a second surface of the flexible PCBA in a grid-like pattern, wherein the second surface is opposite the first surface. Aspects of this disclosure may relate to the system that may further include a housing, wherein the flexible PCBA, when in a folded configuration, is located within the housing. Aspects of this disclosure may relate to the illustrative system that may include a plurality of battery cell modules, where each of the plurality of battery cell modules includes a battery cell and an attenuating member made of a resilient material. Each battery cell may be a lithium-ion battery cell. The illustrative system may include a plurality of battery cells arranged in a three-dimensional grid pattern when the flexible PCBA is in a folded configuration.

Aspects of this disclosure may relate to an illustrative flexible printed circuit board assembly (PCBA) may include a plurality of battery modules physically affixed to the flexible PCBA, where the plurality of battery modules is arranged in a grid-like pattern and a bend axis near an approximate mid-point of the flexible PCBA. When the flexible PCBA is bent along the bend axis, the flexible PCBA is in a folded configuration and, when the flexible PCBA is in a folded configuration, the plurality of battery modules is disposed in a three-dimensional grid-like pattern.

Aspects of this disclosure may relate to a plurality of flexible sections of the flexible PCBA, were the flexible sections may allow for the flexible PCBA to flex between adjacent rows and adjacent columns of battery modules. The illustrative flexible PCBA may include at least one circuitry module that comprises a portion of the grid-like pattern.

Additional aspects of this disclosure may relate to a conformal wearable battery (CWB) including a plurality of battery cells, where each battery cell includes a pair of electrically conductive elements that correspond to either a cathode or an anode of each battery cell. The CWB may also include a flexible printed circuit board (PCB) that includes a plurality of physical connection sections disposed in a grid like pattern on a first side of the flexible PCB, where each of the plurality of battery cells is disposed at a corresponding physical connection section of the plurality of physical connection sections. The flexible PCB may further include a plurality of electrical connection pads linearly disposed on a second side opposite the first side of the flexible PCB, the plurality of electrical connection pads comprising an electrically conductive surface coating. The pair of electrically conductive elements may extend substantially parallel to and along the second side of the flexible PCB, and each electrically conductive elements may be connected to a corresponding electrical connection pad of the plurality of electrical connection pads on the second side of the flexible PCB forming an electrical connection.

Aspects of the disclosure may relate to the plurality of battery cells comprising pouch cell packaged polymer lithium-ion battery cells where each battery cell of the plurality of battery cells is physically attached to the first side of the flexible PCB.

Aspects of the disclosure may relate to a conformal wearable battery where the flexible PCB includes a plurality of cutouts extending through the flexible PCB, where at least one cutout of the plurality of cutouts is located adjacent to an electrical connection pad of the plurality of electrical connection pads. In some cases, each conductive element of the pair of electrically conductive elements may extend through a corresponding cutout of the plurality of cutouts.

Aspects of the disclosure may relate to a conformal wearable battery where the electrically conductive surface coating comprises an electroless nickel immersion gold (ENIG) surface coating and/or a lead-free immersion silver surface coating.

Aspects of the disclosure may relate to forming an electrical connection between each electrically conductive element of the pair of electrically conductive elements and the corresponding electrical connection pad of the plurality of electrical connection pads with a weld. In some cases, the weld is formed using a laser welding process. In some cases, the weld is formed using an ultrasonic welding process.

Aspects of the disclosure may relate to a conformal wearable battery where a connection pad of the plurality of electrical connection pads has a width that is within a range of 1.8 times and 3 times a width of an electrically conductive element of the pair of electrically conductive elements and/or where a height of an electrical connection is within a range of 1.2 to 3 times a thickness of an electrically conductive element of the pair of electrically conductive elements. In some cases, a connection pad of the plurality of electrical connection pads may have a circular shape with a diameter that is within a range of 1.8 times and 3 times a width of an electrically conductive element of the pair of electrically conductive elements.

Aspects of the disclosure may relate to a system including a first plurality of battery cells and a second plurality of battery cells and a flexible printed circuit board (PCB). In some cases, the first battery cell of the first plurality of battery cell includes a first pair of electrically conductive elements and the second battery cell of the second plurality of battery cell includes a second pair of electrically conductive elements. The flexible PCB may include a plurality of battery cell connection sections disposed in a grid-like pattern along a first surface of the flexible PCB, a plurality of cutouts disposed adjacent and parallel to an edge of the plurality of battery cell connection sections, and a plurality of electrical connection pads disposed on a second surface of the flexible PCB opposite the first surface. In some cases, the plurality of cutouts may be arranged as multiple pairs of cutouts arranged adjacent a majority of the plurality of battery cell connection sections and/or a majority of the plurality of electrical connection pads may be arranged adjacent the plurality of cutouts, and where the plurality of electrical connection pads may include an electrically conductive surface coating. In some cases, an electrically conductive element of the first pair of electrically conductive elements may wrap around an edge of the flexible PCB and may extend along the second surface of the flexible PCB such that the electrically conductive element of the first pair of electrically conductive elements may be connected to a corresponding electrical connection pad of the plurality of electrical connection pads forming a first electrical connection. In some cases, an electrically conductive element of the second pair of electrically conductive elements may extend through a cutout of the plurality of cutouts such that each electrically conductive element of the second pair of electrically conductive elements may be connected to a corresponding electrical connection pad of the plurality electrical connection pads forming a second electrical connection.

Aspects of this disclosure may relate to a flexible printed circuit board assembly (PCBA) that may include a flexible printed circuit board (PCB) and a plurality of battery cell modules physically affixed to the first side of the flexible PCB. The flexible PCBA may have a first side and a second side opposite the first side, where a plurality of electrical connection pads may be disposed on the second side of the flexible PCB. The plurality of electrical connection pads may be arranged in multiple pairs of electrical connection pads. In some cases, the plurality of electrical connection pads may include an electrically conductive surface coating. The flexible PCBA may include a plurality of cutouts linearly disposed in the flexible PCB and adjacent to corresponding electrical connection pads. In some cases, the plurality of battery cell modules may be arranged in a grid-like pattern and comprise pouch cell packaged polymer lithium-ion and each battery cell module of the plurality of battery cell modules may include a pair of electrically conductive elements that extend substantially parallel to the second side of the flexible PCB and may be configured to connect to corresponding electrical connection pads of the plurality of electrical connection pads to form an electrical connection for each battery cell module.

BRIEF DESCRIPTION OF THE DRAWINGS

The present disclosure is illustrated by way of example and not limited in the accompanying figures in which like reference numerals indicate similar elements and in which:

FIG. 46A shows a folded configuration of the flexible printed circuit board of FIG. 45 according to aspects of the disclosure;

FIGS. 46B and 46C show a view of illustrative flexible connector portions of the flexible printed circuit board of FIG. 45 according to aspects of the disclosure;

FIG. 51 illustrates a cross-sectional side view of the CWB of FIG. 50B according to aspects described herein;

FIGS. 68A-68D show different views of an illustrative battery cell 1300 according to aspects of the disclosure;

FIGS. 70A-70E show partial illustrative views of at least one battery cell module being attached to the flexible PCBA according to aspects of the disclosure;

DETAILED DESCRIPTION

Figure 1:
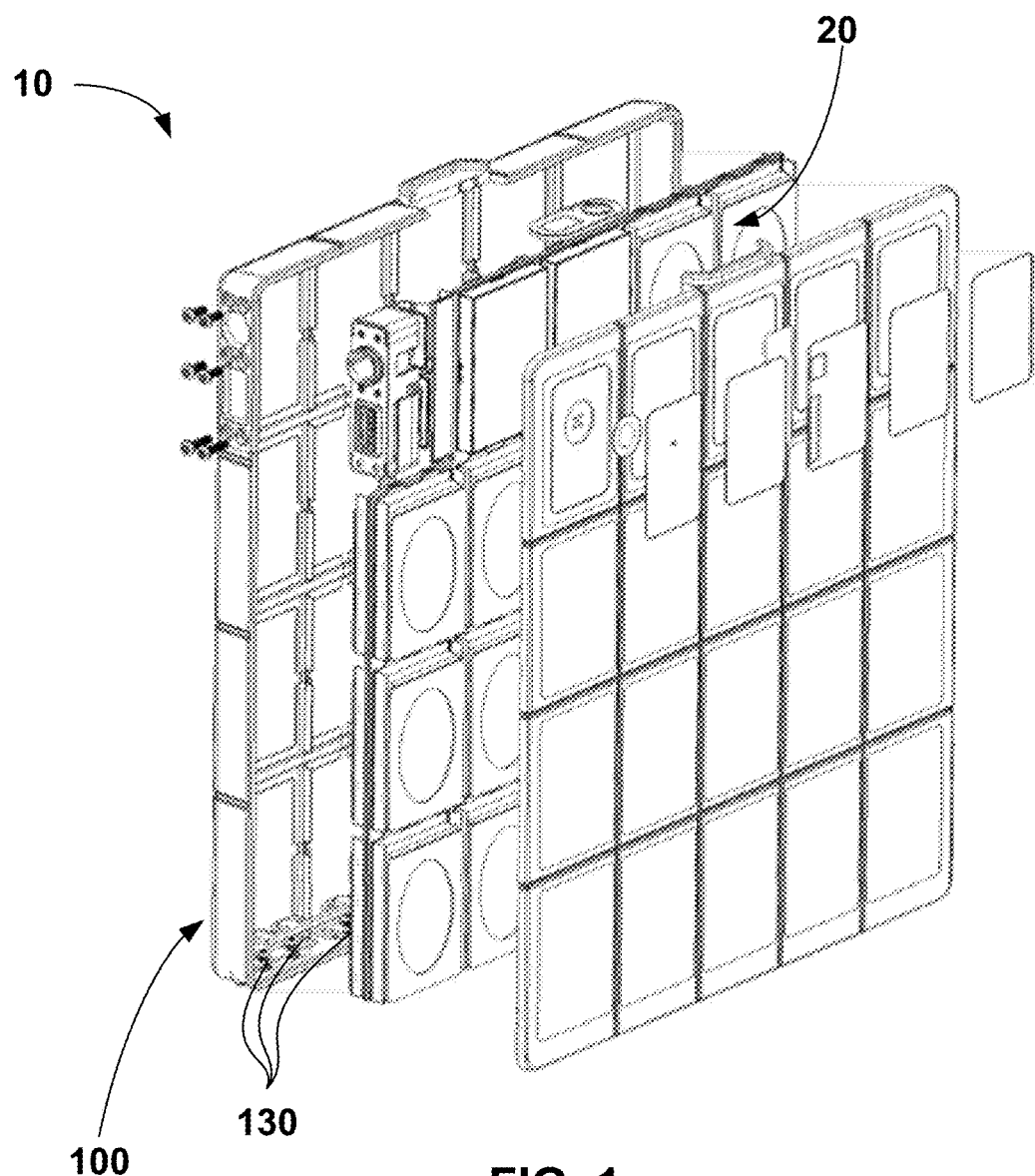
FIG. 1 illustrates an exploded perspective view of an exemplary conformal wearable battery (CWB) according to aspects described herein.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure. The drawings may not be shown to scale.

It is noted that various connections between elements are discussed in the following description. It is noted that these connections are general and, unless specified otherwise, may be direct or indirect, and that the specification is not intended to be limiting in this respect.

For a product and/or case in which a sealed fit is a useful feature, typical sealing techniques that use glue, adhesives, welding, or soldering may not always form a robust seal especially around complex shapes. When a seal's integrity is compromised, contaminants may breach the seal and cause damage within the product. The seal's integrity may be compromised by cracks, voids, stress fractures, and/or other defects associated with or caused by the sealing techniques within a material associated with the seal. For example, a glue or an adhesive may lose adhesion to the material associated with the seal, stress fractures in the material may be caused by heat associated with welding or soldering, or a void leading to a breach of the seal may form when performing soldering or welding. Heat from welding or soldering techniques may cause the material of the case to liquify and flow at the location of the desired seal, thereby preventing a reliable seal from being formed. As a result, attempts to seal an electrical conductor, for example, passing through a material enclosing a product using typical sealing techniques may result in failure of the seal, breaching of the seal by fluid and/or contaminants, and/or damage to the product protected by the seal.

Disclosed herein is a method of installing an electrically conductive component passing through an exterior wall of a sealed case or housing by an insert molding process. An insert molding process may provide greater reliability and integrity of the seal, as well as an improved cosmetic appearance of the seal compared to typical sealing techniques. The electrically conductive component may include a plurality of knurled regions for making a friction fit with a wall of the molded case to create a seal between the electrically conductive component and the material of the molded case, which may be a polymeric material. The friction fit produced by the insert molding process may avoid the above-mentioned failure modes associated with sealing a space between an electrically conductive component and an edge of a material of a case with glue, adhesive, welding, or soldering. For example, the insert molding process may avoid application of high levels of heat at the joint between the electrically conductive component and the material of the case as may be applied in a soldering or welding process.

The seal produced between the electrically conductive component and the material of the molded case may satisfy requirements of an International Electrotechnical Commission (IEC) IP67 rating for preventing dust and water ingress to the case and creating a water-tight fit between the electrically conductive component and the case in which the electrically conductive component is disposed. The IP67 rating is specified by the Ingress Protection Code (IP Code) IEC standard 60529. The equivalent European standard is EN 60529. The IP Code also may be referred to as the International Protection Code. The IP Code classifies and rates a degree of ingress protection provided by mechanical casings and electrical enclosures for electronic equipment against intrusion, dust, accidental contact, and liquid (e.g., water). In the IP67 rating, the first digit (i.e. '6') specifies a level of protection offered against ingress of solid objects, while the second digit (i.e. '7') specifies a level of protection offered against ingress of liquids. The larger the value of the digit specifying the level of protection, the greater the amount of protection offered. For example, an IP67 rating specifies total protection against dust ingress and protection against short periods of immersion in water. An IP68 rating specifies dust resistance and immersion in 1.5 meters of freshwater for up to 30 minutes duration.

A reliable seal, for example, an IP67 rated seal, may be desirable and beneficial for protection and maintenance of batteries enclosed in environmentally protected housings. Such a battery for powering electronic devices in outdoor environments, for example, in dusty, sandy, rainy, and/or wet environments, may fail early if contaminants such as water, dust, dirt, and/or sand get into the battery enclosed in the housing. A rechargeable conformal wearable battery (CWB) assembly may be worn by a user to power electronic devices that the user carries. The CWB assembly may be subjected to environmental conditions that may cause the CWB (and its housing) to physically deform or bend while also being exposed to moisture. A reliable seal may facilitate longer battery life and utility for the user regardless of environmental conditions that the CWB may be subjected.

A CWB assembly may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be separate from other battery cells. A battery cell as described herein may include a plurality of individual battery cell elements that are electrically connected together to form a compound battery cell that electrically performs as a single unit. Each of the battery cells may be physically connected to adjacent battery cells by flexible elements (e.g., a flexible printed circuit board), thereby facilitating a surface outline or shape of the array of battery cells to generally conform to a surface outline or shape of a user wearing the CWB assembly. One or more of the battery cells may include a positive-charge electrical terminal and a negative-charge electrical terminal that are electrically connected with the battery cell within an interior of the battery cell and provide electrical power to electrical devices disposed exterior to the battery cell. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the housing. The CWB assembly may include a set of positive-charge and negative-charge electrical terminals that are shared among the plurality of the battery cells of the array of battery cells. The plurality of the battery cells may be electrically coupled together, for example, in series, in parallel, or in groups of series connected battery cells connected in parallel, etc.

The CWB housing may be formed from molded components. The molded housing components may form a sealed case. Each of the housing components may be formed by a molding process, for example, an injection molding process. The molded casing may be formed of a polymeric material, for example. The casing may be sealed to prevent ingress of solid material and/or liquid material, for example, according to an IP67 rating, IP68 rating, or other ingress protection rating. The casing may feature a seam between two components or portions of the casing that is sealed to encase the battery cell within the casing. The positive-charge terminal and the negative-charge terminal may each include a conductive contact component that passes between the interior of the CWB housing and the exterior of the CWB housing. The conductive region may include a flexible circuit, wiring or PCBA that is affixed and electrically connected to the battery cells in an interior of the housing at one end, and electrically connected to a contact component that passes through a wall of the casing, and electrically couples with electrical devices at an exterior of the CWB housing. The details of the housing are described in more detail below.

The contact component may include a textured region on an exterior of the contact component that is adjacent to and/or interfaces with the wall of the housing. In some examples, the textured region may include two separate knurled areas and a recessed groove between the two knurled areas. The contact component may include a threaded element that mates with a corresponding threaded conductive element that electrically connects to conductive region (i.e. flexible circuit, wiring) of the battery cells. The threaded element of the contact component may include a female threaded element. The female threaded element of the contact component may mate with a corresponding male threaded conductive element. A thread pitch or thread count of the threaded element of the contact component may match a thread pitch or thread count of the corresponding threaded element of the conductive element. The contact component may be physically and electrically accessible outside of the housing, for example, at an exterior of the cell housing. For example, the contact component may have an outward facing surface that is accessible outside housing. The contact component may be in direct physical and electrical contact with the conductive region inside the housing. The textured region of the exterior of the contact component may form a seal at an interface with the casing, for example, at a wall of the casing that prevents ingress of solids and/or liquids into the interior region of the casing according to an IP rating.

Figure 2:
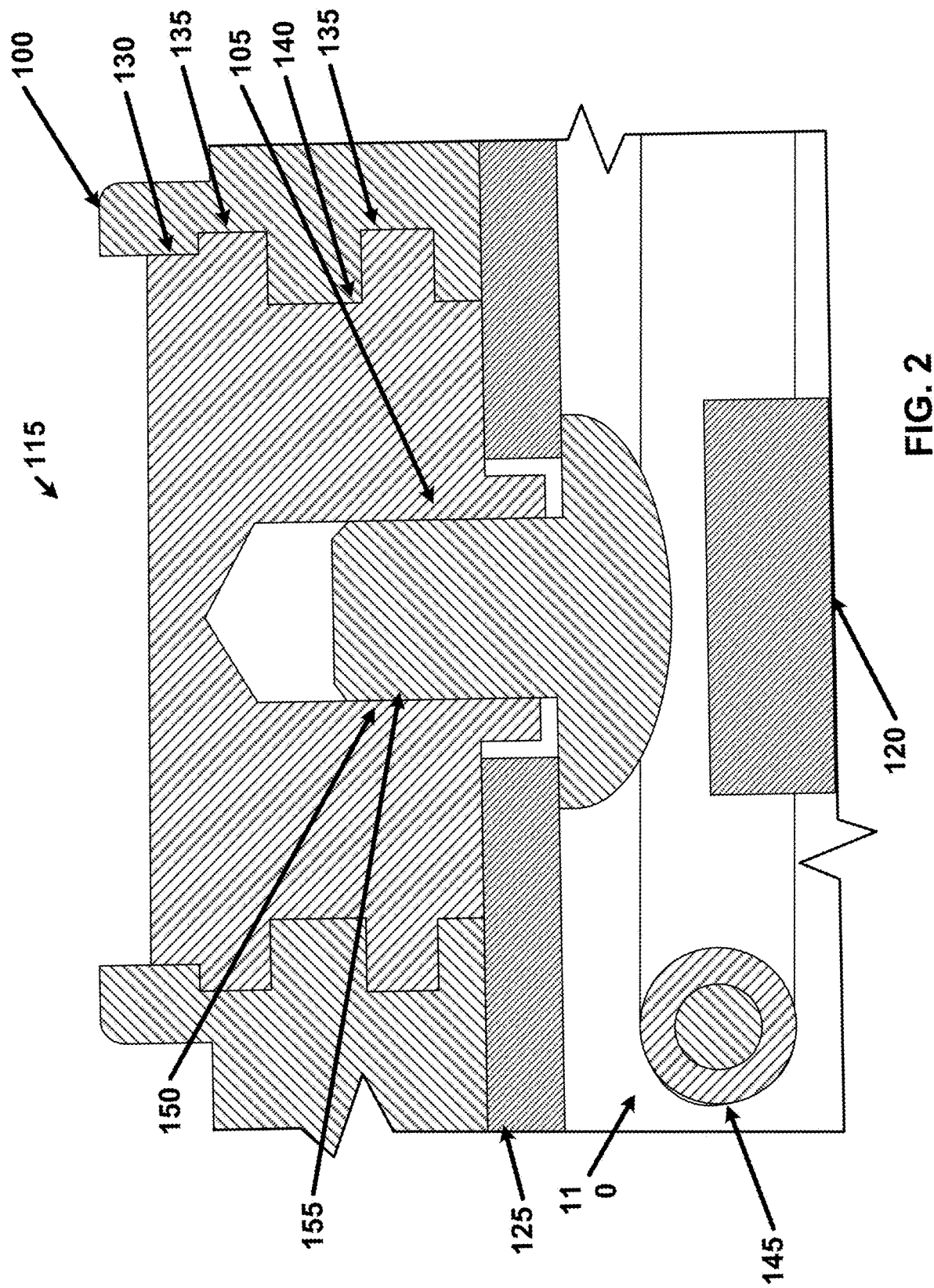
FIG. 2 illustrates a cross-sectional view of an electrical contact region of an exemplary CWB housing according to aspects described herein.

FIG. 1 illustrates an exploded perspective view of an exemplary conformal wearable battery (CWB) 10 according to aspects described herein. FIG. 2 illustrates a cross-section view of an electrical contact region of an exemplary CWB housing 100. The battery cells 20 may be installed into the housing 100. An electrically conductive fastener 105 (e.g., a screw or a bolt) may provide an electrically conductive path from an interior 110 of the CWB housing 100 to an exterior 115 of the CWB housing 100. A battery cell terminal 120 may be electrically connected with one end (e.g., a head) of the electrically conductive fastener 105 in the interior 110 of the CWB housing 100. The electrically conductive fastener 105 may have a shaft portion 150 that passes through an opening in a printed circuit board assembly (PCBA) 125 and mates with a corresponding hole 155 in a contact component 130 in electrical and physical communication with an exterior 115 of the CWB housing 100. Alternatively, the PCBA may be a flexible circuit board assembly or maybe, at least partially replaced by a wiring harness. The shaft portion 150 of the electrically conductive fastener 105 may include a threaded region (e.g., a male threaded region) that mates with a corresponding threaded region (e.g., a female threaded region) of the contact component 130. The contact component 130 may include two or more knurled regions 135 that are separated by one or more groove regions 140. Diameters and/or widths of the two or more knurled regions 135 may be equal or different. Diameters and/or widths of the one or more groove regions 140 may be equal or different. Dimensions associated with different aspects and regions of the contact component 130 may vary. A difference in diameter between a groove region 140 and a knurled region 135 may be within a range of one to three (1.0 to 3.0) times a width of a knurled region 135, for example. A width of the groove region 140 may be within a range of one-half to four (0.5 to 4.0) times a width of a knurled region 135, for example. A wire 145 may electrically connect with an interior side of the PCBA 125 on one or more of the sides of the electrically conductive fastener 105.

While the preceding example of FIG. 1 refers to a female threaded element of the contact component 130 for receiving a male conductive element 105, the disclosure is not so limited. Rather, the male and female elements may be reversed in that the contact component 130 may consist of the male element and the conductive region may be secured using a female threaded element. Moreover, while some embodiments may describe a threaded means for mating the male and female element, in other embodiments the means for mating may comprise other methods available to those of ordinary skill such as friction fitting, an expandable/collapsible that latches the two elements together, or other mating techniques.

Figure 3:
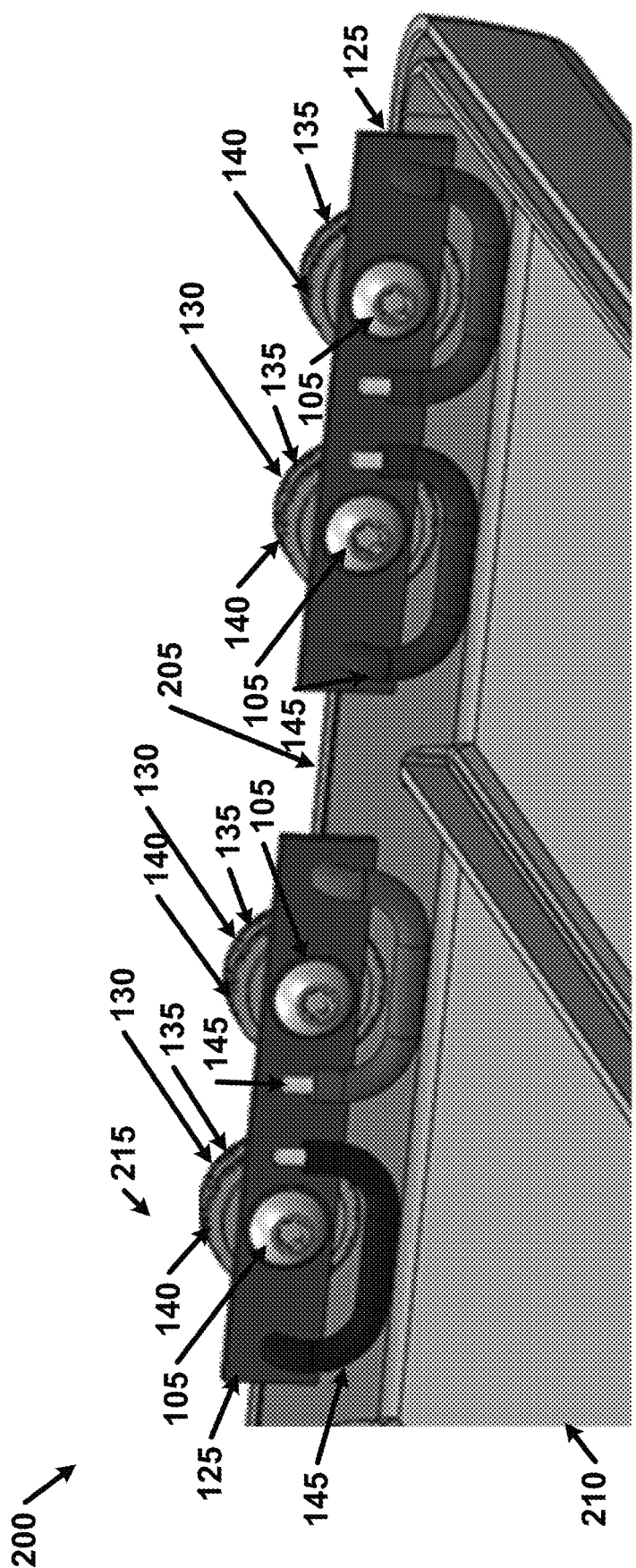
FIG. 3 illustrates a partial perspective view of the electrical contact region of an exemplary CWB housing according to aspects described herein.

FIG. 3 illustrates a perspective view of the electrical contact region of one lower housing 205 of the exemplary CWB housing 100. The lower housing 205 may be illustrated as a cut-away for ease of viewing the contact components 130 embedded within the wall of the lower housing 205. The lower housing 205 may comprise the contact components 130 seated and encased in the exterior wall after an injection molding process. The material of the molded walls may be formed by the injection molding process to closely and tightly fit the shape of the knurled regions 135 and the groove regions 140 of the contact components 130. The lower housing 205 may be formed by an injection molding process in which the contact components 130 are positioned and fixed in place in a mold prior to forming the lower housing 205 in the mold. When the material for the lower housing 205 is injected into the mold, the material flows around the knurled regions 135 and the groove regions 140 of the contact components 130 forming a mechanical lock around the contact components 130 after the material solidifies.

An upper housing (not shown) that mates with the lower housing 205 may be seated over the lower housing 205 of the CWB housing 200 and fit together during assembly. A seam between the upper housing and the lower housing 205 may be formed to seal (e.g., by laser welding) the upper housing and lower housing 205 of the CWB housing 200 to each other, while the knurled regions 135 and the groove regions 140 of the contact components 130 may be fully encased and sealed within the lower housing 205 of the CWB housing 200.

One or more of the electrically conductive fasteners 105 may pass through a hole in a corresponding PCBA 125, with a head end of the electrically conductive fasteners 105 disposed on a side of the PCBA 125 facing an interior 210 of the CWB housing 100, and an opposite (e.g., threaded or shaft end) of the electrically conductive fasteners 105 inserted through the PCBA 125 and into and/or mated with corresponding contact components 130 on an opposite side of the PCBA 125 that faces the exterior 215 of the CWB housing 100. The electrically conductive fasteners 105 may secure the PCBA 125 against the inward facing surface of the contact components 130. The electrically conductive fasteners 105 may electrically connect an electrically conductive plate and/or electrical trace of the PCBA 125 with a corresponding interior-facing side of the contact component 130. One end of the wires 145 may be electrically connected to electrically conductive traces and/or electronic circuitry disposed on the PCBA 125. The one or more of the wires 145 may be directly and/or electrically connected to the fasteners 105. In some examples (not shown), the PCBA 125 may be replaced by a washer to which a corresponding end of a wire 145 is connected. An opposite end of the wires 145 may be connected to one of a positive battery cell terminal, negative battery cell terminal, protection circuitry, data circuitry, clock circuitry, or other circuitry associated with the battery cells 20. Circuitry associated with the battery cells 20 may include battery charging control circuitry, for example. The wires 145 may carry electrical current and/or data signals between the battery cell and/or associated circuitry within the interior 210 of the CWB housing 100 and the contact component accessible on the outside 215 of the CWB housing 100. Dimensions of the various components shown in FIGS. 1-3 may vary and may have different relative scales than shown in the drawings without departing from the disclosure herein.

Figure 4B:
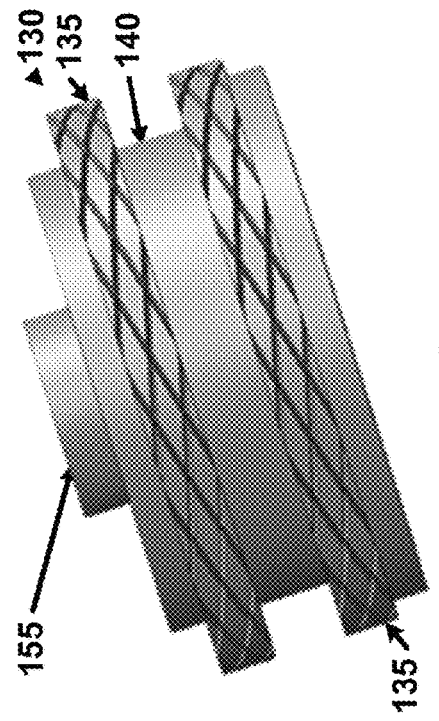
FIGS. 4A and 4B illustrate perspective views of an exemplary contact component from different vantage points according to aspects described herein.
Figure 5B:
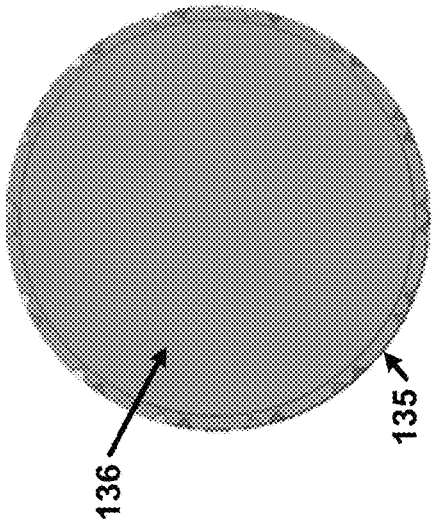
FIGS. 5A and 5B illustrate side and front views of an exemplary contact component according to aspects described herein.
Figure 4A:
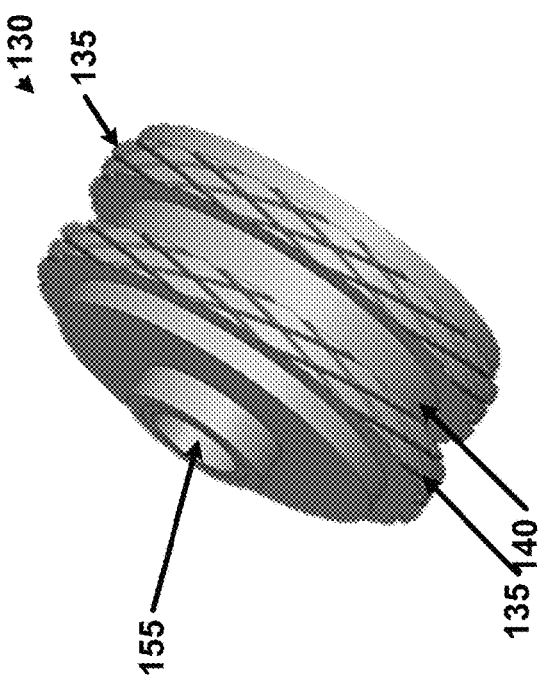
Figure 5A:
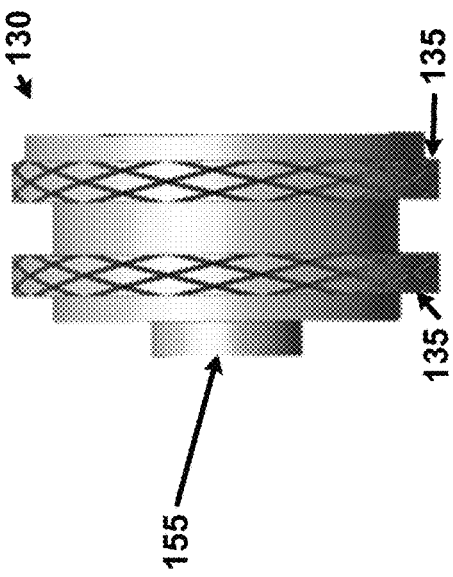

FIGS. 4A, 4B, 5A, and 5B illustrate views of an exemplary contact component 130 from different vantage points. A plurality of knurled regions 135, for example, two as shown in FIGS. 4A, 4B, and 5A, may be separated by one or more groove regions 140. The knurled regions 135 of the contact component 130 may have a greater diameter than the one or more groove regions 140. A width of the knurled regions 135 may be greater than, the same as, or less than a width of the one or more groove regions 140. The knurled regions 135 may include crossed lines that form a surface texture of the knurled regions 135. The crossed lines may be formed by machining, drilling, laser cutting, or milling operations performed on the contact component 130. The crossed lines may create triangular and/or diamond-shaped regions in the knurled regions 135. The crossed lines of the knurled regions 135 and the one or more groove regions 140 may assist with the adhesion of the material with which the molded CWB housing is formed to the contact component 130. When the contact component 130 is inserted into the mold for the CWB housing 100 and the material for the lower housing 205 is flowed through the interface between the curved exterior surface of the contact component 130 (e.g., comprising the knurled regions 135 and the one or more groove regions 140) and a edge of the CWB housing 100, the material may enter and solidify within at least a portion of the cross-hatched grooves of the knurled regions 135 and the groove region 140 to form a solid attachment to and high quality seal (e.g., IP67, IP68, or better) with the curved exterior surface of the contact component 130. The outward facing surface 136 may interface with an external electrical device that uses the CWB 10.

At least one advantage of the aforementioned method is that a high-quality friction fit is produced without exposing the materials to glue, adhesive, welding, and/or soldering. For example, by avoiding soldering and welding, the aforementioned process avoids application of high levels of heat at the joint between the electrically conductive component and the edge of the material of the case as may be applied in a soldering or welding process. Unlike systems that may rely upon an application of heat, the aforementioned embodiment is an improvement because, inter alia, it creates a high-quality seal without relying upon an application of heat or a messy, potentially manual application of glue to join two or more pieces of a casing/housing.

The contact component 130 may have features and characteristics that vary from those illustrated in FIGS. 4A, 4B, 5A, and 5B without departing from the disclosure herein. The material of the contact component 130 may comprise brass, gold, copper, silver, aluminum, steel, or other electrically conductive material or combination of one or more electrically conductive materials. Relative dimensions of one or more portions of the contact component 130 may vary from those shown. The hole 155 may be optionally included or omitted. The hole 155 may comprise a fitting portion configured to mate with the electrically conductive fastener 105. For example, the hole 155 may comprise threaded walls that mate with a threaded shaft of the electrically conductive fastener 105. The hole 155 and the shaft of the electrically conductive fastener 105 may both have a same or compatible thread count or thread pitch. The hole 155 may be replaced by a protrusion, shaft, bolt, or the like, and the mating electrically conductive fastener 105 may be replaced by a socket, nut, crimp, or other fastener that mates with a protrusion, shaft, bolt, or the like, for example, by having corresponding thread pitch or thread count. The hole 155 or replacement may facilitate robust, secure, and reliable attachment of the contact component to interior components, for example, electrical conductors, electrical or electronic circuits, mechanical components such as screws that hold components such as PCBAs in position, etc.

Figure 6:
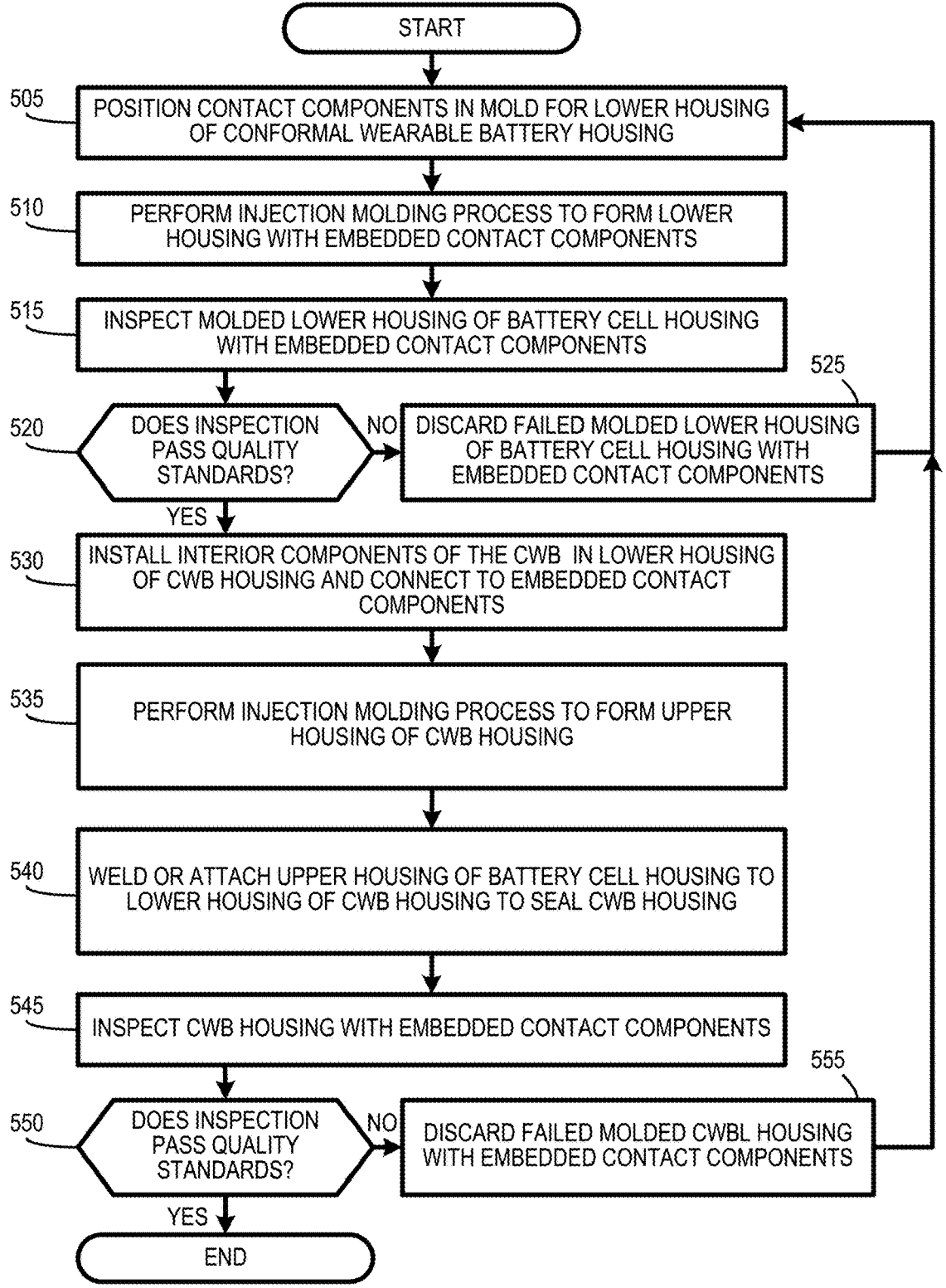
FIG. 6 illustrates a flowchart of exemplary assembly steps performed to encase the contact component into a portion of the CWB housing before the CWB housing is sealed closed in a molding process according to aspects described herein.
Figure 7:
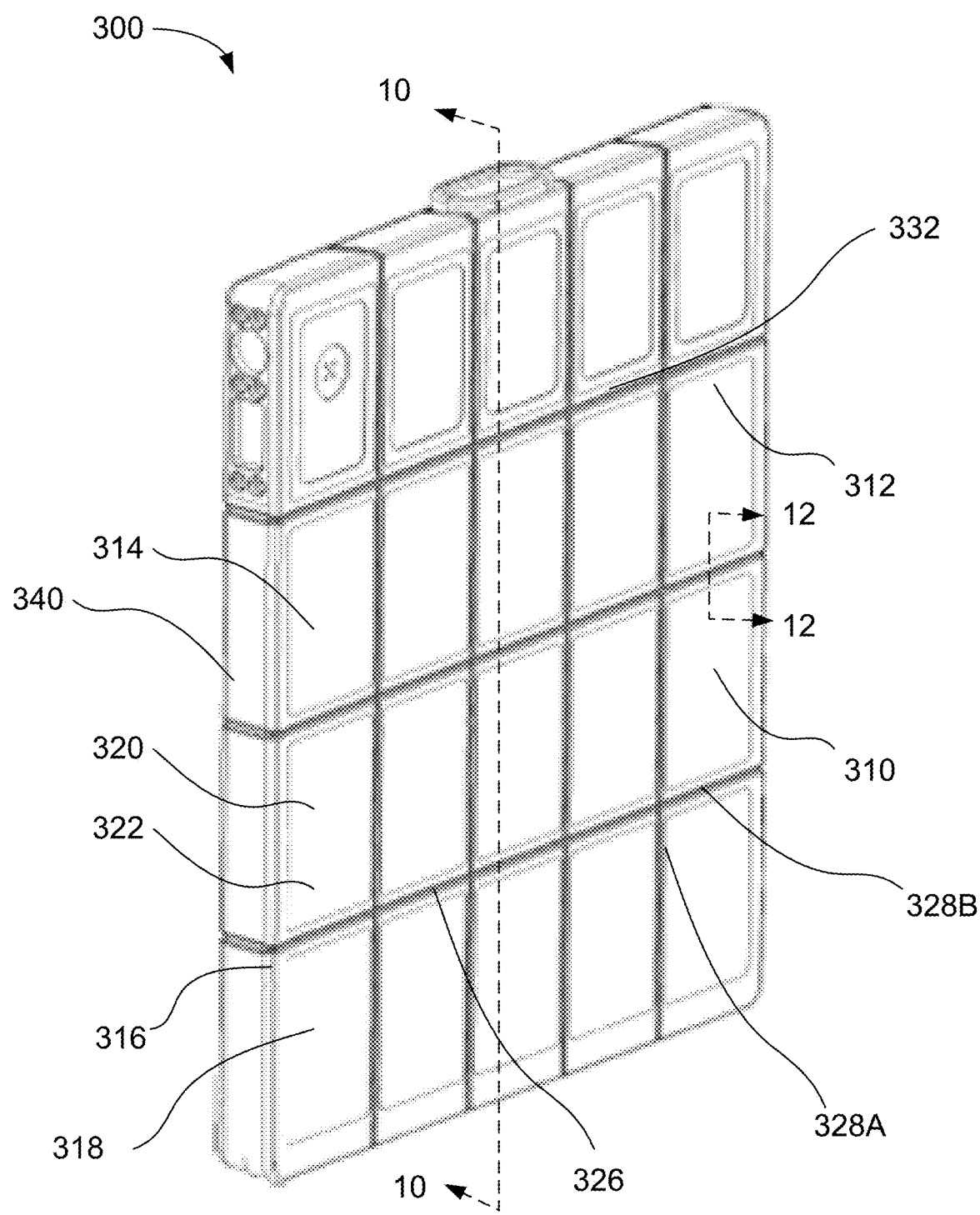
FIG. 7 illustrates a front perspective view of another exemplary housing of the CWB of FIG. 1 according to aspects described herein.
Figure 8:
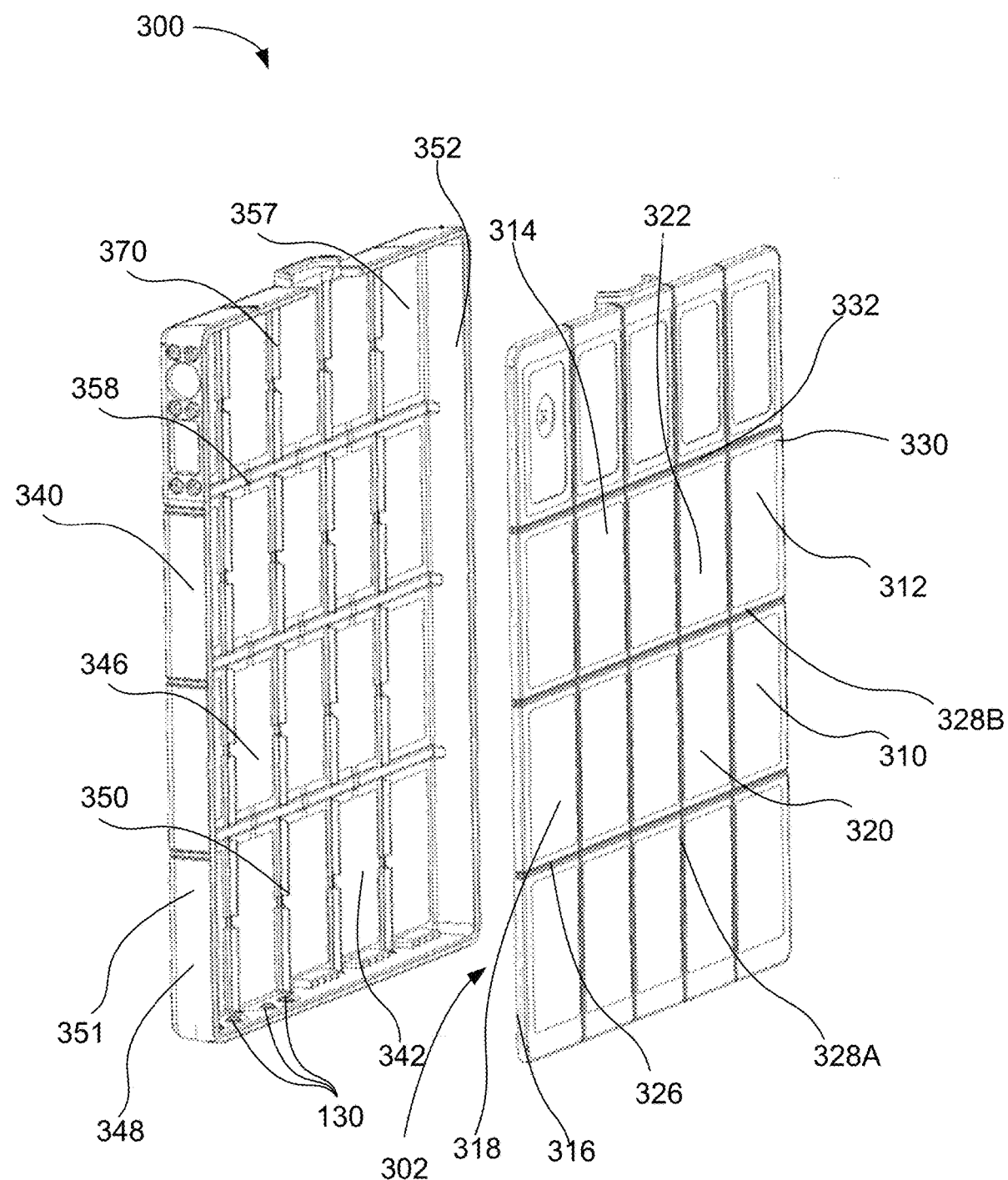
FIG. 8 illustrates an exploded front perspective view of the exemplary housing of FIG. 7 according to aspects described herein.

FIG. 6 illustrates a flowchart of exemplary assembly steps performed to encase the contact component 130 into the CWB housing 100 using an injection molding process.

In operation 505, contact components (e.g., compact components 130) may be positioned in a mold for forming the lower housing of the CWB housing (e.g., lower housing 205). The contact components 130 may be seated in a portion of the mold that forms an outer wall of the lower housing 205. The mold may be arranged to keep the contact components 130 from moving during the molding process.

In operation 510, an injection molding process may be performed to form the lower housing 205 of the CWB housing with the contact components embedded within the edge or side of the lower housing of the CWB housing. A polymeric material may be injected into the mold and flow through the mold to form the lower housing 205. The material may flow around the edges of the contact components 130 that are positioned in the mold. For example, the material may flow around and/or through the crossed lines or cross-hatching of the knurled regions and into the groove regions between the knurled regions of the contact components 130 to form a seal between the lower housing 205 of the molded CWB housing and the contact components 130. As the material solidifies, the material may form a strong, robust, and reliable seal with the contact components 130. The lower housing 205 may be molded to encase the curved walls of the contact components 130 that comprise the knurled regions 135 and the one or more groove regions 140 while exposing opposite ends of the contact components 130 to the interior and the exterior of the lower housing 205.

The knurled regions 135 and one or more groove regions 140 may improve the seal between the contact components 130 and the lower housing 205 by forming a mechanical lock to secure the contact components 130 within the lower housing 205. The mechanical lock may be formed by the variations in radius of the contact components 130 through the knurled regions 135 and the one or more groove regions 140. The knurled regions 135 and one or more groove regions 140 may improve a seal between the contact components 130 and the lower housing 205 compared to traditional contact components that do not include the features of the knurled regions and one or more groove regions. A path length along a surface of the contact component 130 including the knurled regions 135 and one or more groove regions 140 from an end facing the interior of the lower housing 205 to an end facing the exterior of the lower housing 205 may be longer than a corresponding path length in the traditional contact component that does not include the features of the knurled regions and one or more groove regions. The variations in radius of the contact components 130 through the knurled regions 135 and the one or more groove regions 140 may increase the path length along the surface of the contact component 130 including the knurled regions 135 and one or more groove regions 140 compared to traditional contact components that do not include the features of the knurled regions and one or more groove regions. The increased path length may also increase a surface area of the contact component 130 that contacts and forms a seal with the wall of the lower housing 205 in which the contact component 130 is embedded, and this surface area may be greater than a corresponding surface area of the traditional contact component, that does not include the features of the knurled regions and one or more groove regions, adjacent to a wall of a housing. The increase surface area may improve adhesion between the mold material that directly contacts the contact components 130 compared to an alternative similarly sized traditional contact component lacking the knurled regions and one or more groove regions. Flowing the material around and through the knurled regions 135 and the one or more groove regions 140 during the injection molding process of the lower housing 205 may form a stronger, more reliable, and tighter bond between the material of the housing 205 and the contact components 130 than using glue, adhesive, or reflowing a liquid material between alternative similarly-sized contact components and a previously molded housing.

In operation 515, the molded lower housing 205 of the CWB housing having the embedded contact components 130 may be inspected. The inspection may include visual inspection, machine vision, and/or image processing to identify any voids, cracks, or regions of the molded lower housing 205 that do not meet minimum thickness requirements. The inspection may be performed using light in a visual spectrum region, infrared spectrum region, or other spectrum region.

In operation 520, a determination may be made regarding whether the molded lower housing of the CWB housing passes specified quality standards. If the inspection does not pass the specified quality standards, the failed molded lower housing 205 of the CWB housing with embedded contact components may be discarded in operation 525. The parts of the failed molded lower housing 205 of the CWB housing with embedded contact components 130 may be recycled. Following the discard and/or recycling of operation 525, the method may return to operation 505 to begin again with another set of materials. If the inspection does pass the specified quality standards in operation 520, the method may proceed to operation 530.

In operation 530, interior components 20 of the CWB 10, for example, one or more battery cell elements, PCBAs, wires, electronic circuits, and electrically conductive fasteners 105 that mate with the contact components 130, may be assembled and installed in the dried and solidified lower housing 205 of the molded CWB housing. The interior components 20 of the CWB 10 may be seated against and/or attached to the interior wall(s) of the molded CWB housing. The interior components 20 of the CWB 10 may be electrically coupled with the contact components 130 via the electrically conductive fasteners 105 being mated with corresponding holes of the contact components 130 accessible from the interior of the lower housing 205. The interior components 20 of the CWB may be tested for functionality before or when being installed, and any problems discovered by testing the interior components 20 may be identified and corrected before advancing to the next assembly operation.

In operation 535, a mold for an upper housing of the CWB housing, for example, a mold for forming an upper housing that mates with lower housing 205, may be used to form the upper housing by an injection molding process. A polymeric material may be injected into the mold for the upper housing of the CWB housing and flow through the mold while being molded into a shape of the upper housing of the CWB housing.

In operation 540, the molded upper housing may be disposed adjacent to the molded lower housing 205 of the CWB housing having the contact components encased therein. The upper housing and the lower housing may be attached, glued, welded, or laser welded together to secure and form a seal between the upper housing and the lower housing to seal the interior of the CWB housing. The attachment process may form a strong, robust, and reliable seal between the upper housing and the lower housing of the CWB housing.

In operation 545, the molded lower housing 205 having the embedded contact components 130 may be inspected. The inspection may include both the upper housing and the previously inspected lower housing 205 of the molded CWB housing, including seams between the upper and lower housings. The inspection may include visual inspection, machine vision, and/or image processing to identify any voids, cracks, or regions of the molded CWB housing that do not meet minimum thickness requirements. The inspection may be performed using light in a visual spectrum region, infrared spectrum region, or other spectrum region. The inspection may include immersion tests according to a standard, for example, the IP Code, to detect whether any solids and/or liquids are able to enter the interior of the CWB housing within test conditions.

In operation 550, a determination may be made regarding whether the molded CWB housing passes specified quality standards. If the inspection does not pass the specified quality standards, the failed molded CWB housing with embedded contact components may be discarded in operation 555. The parts of the failed molded CWB housing with embedded contact components may be recycled. Following the discard and/or recycling of operation 555, the method may return to operation 505 to begin again with another set of materials. If the inspection does pass the specified quality standards in operation 550, the method may end with a completed molded CWB housing.

While aspects of the disclosure have been described with reference to battery cells and/or a CWB comprising battery cells, arrangements and methods as described herein may also be applied to other devices and systems having one or more objects or inserts that communicate between an interior region and an exterior region of a housing. For example, the arrangements and methods described herein may apply to any electronic device disposed within a housing for which protection against immersion in liquids and/or intrusion of solids or fluids is desired. Example electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, solar cell based power generation devices, wave motion based power generation devices, fuel cell based power generation devices, and/or portable chemical batteries for powering electronic or electrical devices.

Turning now to another exemplary housing 300 for the exemplary conformal wearable battery (CWB) 10 shown in FIG. 1. Housing 300 may have similar properties as housing 100, 200 described above with respect to the contact components 130 being insert molded to one of the shells of housing 300 to seal around the contact component 130. The CWB 10 may bend or move in both a horizontal and/or vertical direction, or move in some combination thereof to meet the requirements of MIL-PRF-32383/4A. For instance, CWB 10 may be required to flex at least 800 times under load to a 7-inch radius curved surface, such that an edge of the CWB may be capable of deflecting, in each direction, at least a specified distance (i.e., 1 inch) from a centerline of the CWB without sustaining physical or electrical damage. Accordingly, housing 300 may be able to withstand repeated bending or flexing cycles to allow the CWB to meet the requirements of MIL-PRF-32383/4A. The housing 300 may include an upper housing or upper shell 310 and a lower housing or lower shell 340 that connect to each other to form an interior cavity 302 to receive the battery cells 20 and other electronics of the conformal wearable battery 10. Once the plurality of battery cells 20 and other required components are installed inside the interior cavity 302, the upper shell 310 and the lower shell 340 may be attached to each other with the perimeter edges being sealed together to enable the CWB 10 to meet the environmental requirements of MIL-PRF-32383/4A.

To meet these requirements, each shell 310, 340 may be constructed such that each shell 310, 340 may bend and flex. In addition to allowing the CWB 10 to bend and flex, the housing 300 may also protect the internal battery cells 20 and other components to keep the CWB 10 working properly. In some examples, each shell 310, 340 may be constructed to include rigid regions to strengthen localized area of each shell 310, 340 while having some areas that are more flexible to allow housing 300 to bend and move. In particular, the upper shell 310 may be formed from multiple materials and may include a first member 318 formed from a first material and a second member 326 that is formed from a second material, and the lower shell 340 may be similarly formed to include a first member 342 formed from a first material and a second member 350 that is formed from a second material. In both of the shells 310, 340, the first material may have a higher stiffness or hardness (i.e. durometer) than the second material. For example, the first material may have a durometer of approximately 50 Shore D or greater, or within a range of 40 Shore D and 70 Shore D, or in some cases within a range of 30 Shore D and 80 Shore D, while the while the second material may have a durometer of approximately may have a durometer of approximately 70 Shore A, or within a range of 55 and 90 Shore A. Accordingly, the second member 326, 350 of each shell 310, 340 may bend easier or be more flexible than its corresponding first member 318, 342. In addition, as discussed above, the contact component 130 may be molded into one of the shells 310, 340 in either its corresponding members when the shell is formed. For instance, as illustrated in FIG. 1, the contact component 130 may be molded with the first member 342 in the perimeter walls 348 of the lower shell 340.

In the illustrated examples of FIGS. 1 and 7-13, the upper shell 310 may include a front wall 312 that forms an exterior or front outward facing surface 314 of the housing 300 and an interior surface 315 opposite the outward facing surface 314. The outward facing surface 314 may be formed from outward facing surfaces 322 of a plurality of rigid regions 320 of the first member 318 and an outward facing surface 330 of the second member 326. A perimeter surface 316 may extend from a perimeter of the outward facing surface 314 towards the interior surface 315. The first member 318 may have a plurality of rigid regions 320 that are spaced apart from each other, where the plurality of rigid regions 320 may be arranged in an array with the plurality of rigid regions 320 in both a horizontal direction and a vertical direction. For example, in the illustrated example of FIG. 7, the rigid regions 320 are arranged in an array of five columns of rigid regions 320 arranged in a horizontal direction and four rows of rigid regions 320 arranged in a vertical direction. The arrangement of the rigid regions 320 may have fewer than four rows and five columns or may have greater than four rows and five columns depending upon the desired battery output requirements. The second member 326 may be located between each of the rigid regions 320, such that the second member 326 forms a grid-like structure with vertical regions 328A and horizontal regions 328B that are arranged in the spaces between the neighboring rigid regions 320. The vertical flexible regions 328A may have a width between neighboring rigid regions 320 when measured along the outward facing surface 314 on the front wall 312 that is the approximately 10 percent of the width of each rigid region 320, or within a range of 7 percent and 15 percent of the width of each rigid region 320. Additionally, the horizontal flexible regions 328B may have a height between neighboring rigid regions that is approximately 14 percent of the height of each rigid region 320, or within a range of 10 percent and 20 percent of the height of each rigid region 320.

As discussed above, the second member 326 may form flexible regions within the front wall 312 of the upper shell 310 that promotes bending within these regions while allowing the rigid regions 320 to remain substantially planar when the housing 300 is in a deformed state. In addition, the thickness of the second member 326 may be substantially the same thickness as the rigid regions 320 such that when the housing 300 is in an undeformed or unstressed state the outward facing surface 330 of the second member 326 may be substantially coplanar with the outward facing surface 322 of the rigid regions 320. In order to further promote bending within the vertical regions 328A or horizontal regions 328B of the second member 326, a plurality of grooves 332 may be located within the outward facing surface 330 of the second member 326. In some examples, the grooves 332 may only be located in the outward facing surface 314, or in other examples, the grooves 332 may be located in both the outward facing surface 314 and the inward facing surface 315. The grooves 332 in the horizontal regions 328B may have a width that is greater than a width of the grooves 332 in the vertical regions 328A. For example, the width of the grooves 332 in the horizontal regions 328B may be 1.2 to 1.5 times greater than the width of the grooves 332 in the vertical regions 328A. In addition, the grooves 332 in both the horizontal and vertical regions 328A, 328B may have the same depth, such that the grooves 332 may have a constant depth. The width of the grooves 332 may be greater than a depth of the grooves 332. For example, the depth of the grooves 332 may be that is within a range of 50 percent and 85 percent of the overall width of the groove 332 to help promote flexing in the proper locations. In some examples, the depth of the grooves may be within a range of 2 mm and 4 mm. Alternatively, such as in the housing 300 shown in FIG. 15, the flexible member 326 may not include grooves.

Figure 9:
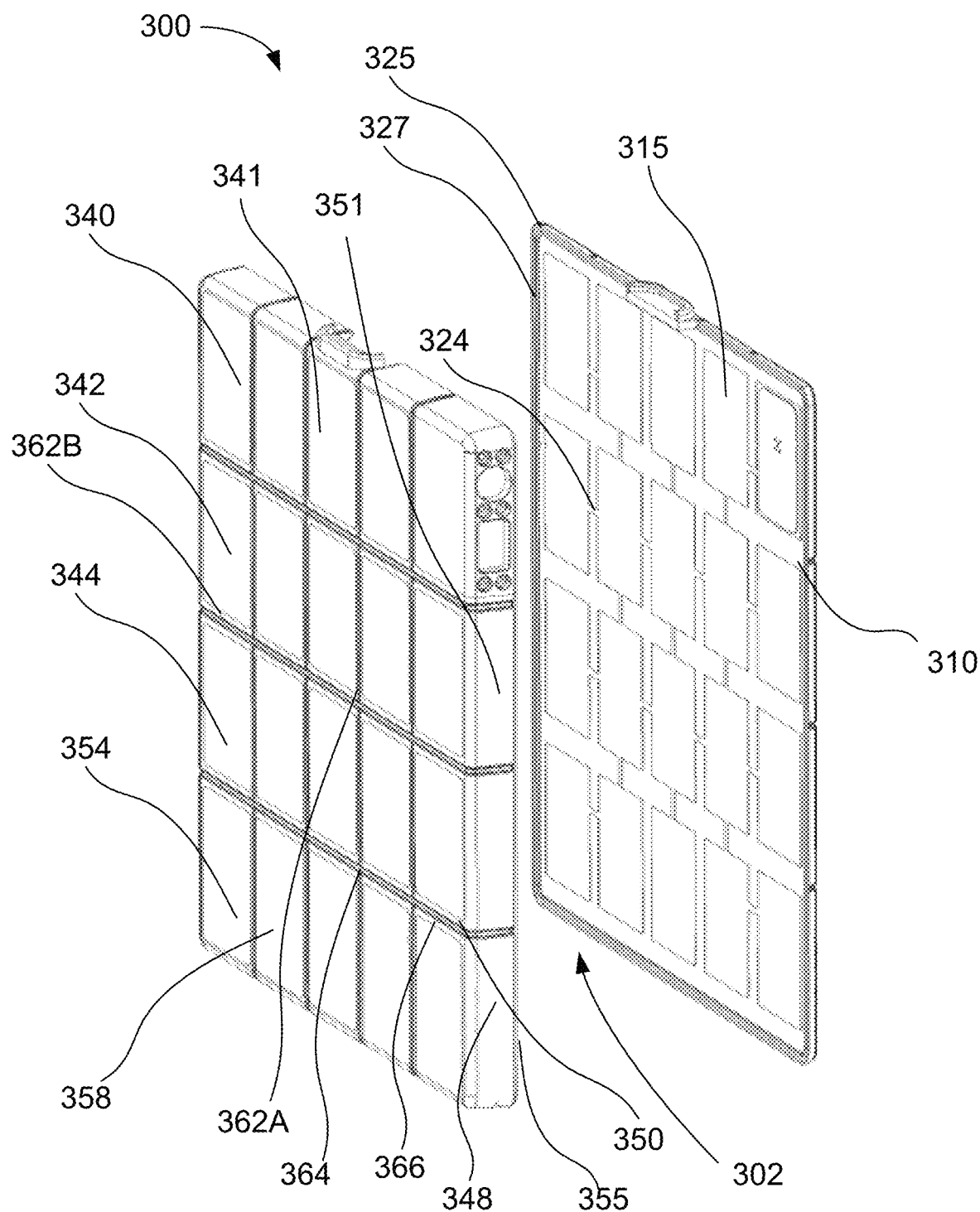
FIG. 9 illustrates an exploded rear perspective view of the exemplary housing of FIG. 7 according to aspects described herein.
Figure 10:
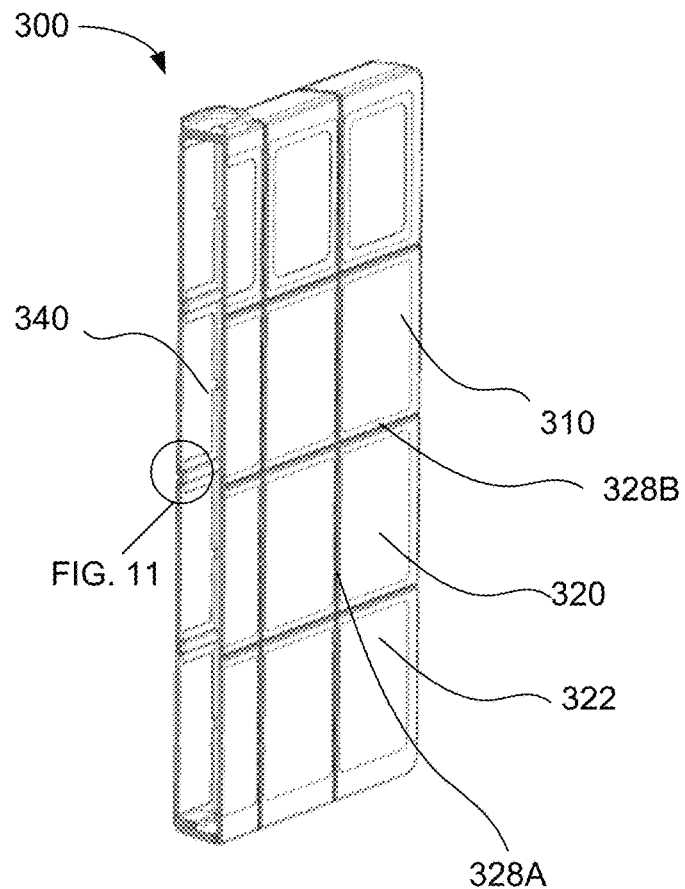
FIG. 10 illustrates a cross-sectional perspective view of the exemplary housing of FIG. 7 along line 10-10 according to aspects described herein.
Figure 13:
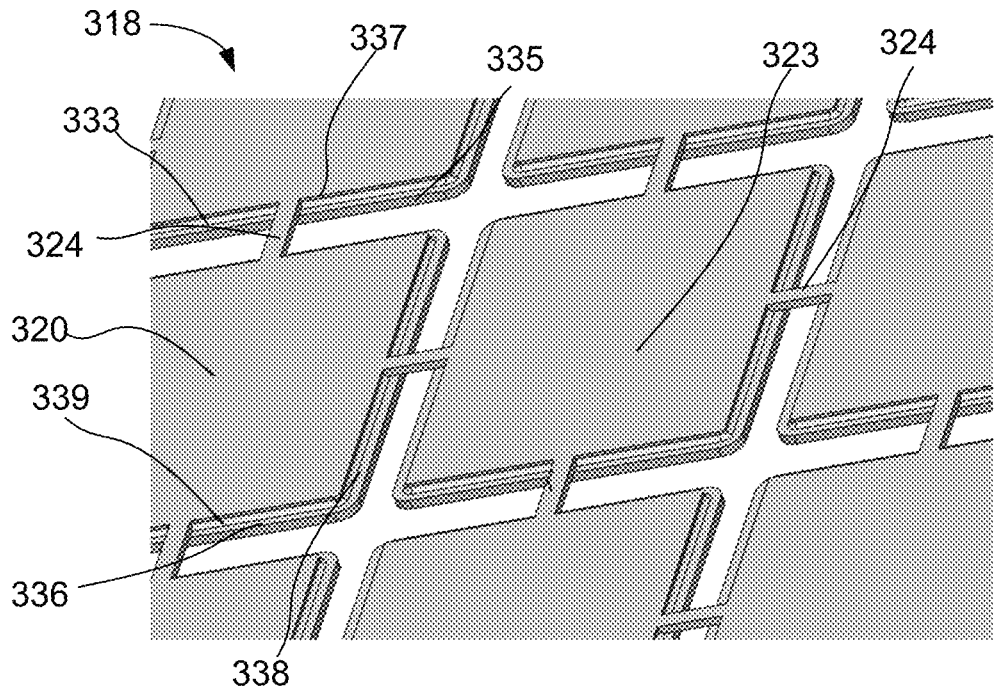
FIG. 13 illustrates a partial perspective view of a first member of one of the shells of the exemplary housing of FIG. 7 according to aspects described herein.

Each of the rigid regions 320 may be sized to correspond to the size of each of the battery cells. For instance, a length and/or a width of each rigid regions 320 may be within a range of 0.95 and 1.05 of a corresponding length and/or width of a corresponding battery cell. In other examples, the length of width of each rigid region 320 may be within a range of 0.90 and 1.10 of the corresponding length and/or width of the corresponding battery cell. In addition, each rigid region 320 may be substantially aligned (where the center of the rigid region 320 and the center of the battery cell are substantially coaxial with each other) with the corresponding battery cell located behind it. Each rigid region 320 may be connected to an adjacent rigid region 320 by a channel 324. The channel 324 may help to form a living hinge between the rigid regions 320 and may have a thickness that is less than the thickness of the rigid region 320. As illustrated in FIGS. 9 and 13, the channels 324 may connect to neighboring rigid regions 320. The channels 324 may also assist in manufacturing by providing a pathway for material to flow from one rigid region 320 to a neighboring rigid region 320 when the first member 318 is formed using a molding process. The channels 324 may be visible along the inward facing surface 315 of the front wall 312.

Additionally, the second member 326 may form the outer perimeter surfaces 316 along with the outer surfaces of the front wall 312 to provide some flexibility along the outer edges of the upper shell 310. The interior perimeter edges 325 of the upper shell 310 may include a receiver 327 or other feature to mate with a corresponding engaging member 355 on the lower shell 340. The engaging member 355 may engage the receiver 327 on the upper shell to help provide a mechanical connection to assist with securing the upper shell 310 to the lower shell 340.

As discussed above, the lower shell 340 may connect to the upper shell 310 to form the interior cavity 302 that receives the battery cells and other electronics. The lower shell 340 may include a rear wall 341 that forms an exterior or rear outward facing surface 344 of the housing 300 and an interior surface 346 opposite the exterior surface 344. The lower shell 340 may also include a perimeter wall 348 that extends away from the exterior surface 344 forming exterior side surfaces 351 and interior side surfaces 352. The lower shell 340 may be similarly constructed as the upper shell 310 with a first member 342 and a second member 350. The first member 342 may include a plurality of rigid regions 354, where the plurality of rigid regions 354 may be arranged in an array with the plurality of rigid regions 354 in both a horizontal direction and a vertical direction similar to the array of the upper shell 310. Each of the rigid regions 354 may be sized to correspond to the size of each of the battery cells. The length and width of the rigid regions 354 may be similarly sized with the rigid regions 320 of the upper shell 310. Similar to the upper shell 310 each rigid region 354 may be connected to an adjacent rigid region 354 by a channel 358. The second member 350 may be located between each of the rigid regions 354, such that the second member 350 forms a grid-like structure with vertical regions 362A and horizontal regions 362B that are arranged in the spaces between the array of rigid regions 354. The flexible regions 362A, 362B of the second member 350 may promotes bending within these regions while allowing the rigid regions 354 to remain substantially planar when the housing 300 is in a deformed state. The length and width of the flexible regions 362A, 362B may be similarly sized with the flexible regions 328A, 328B of the upper shell 310.

Figure 15:
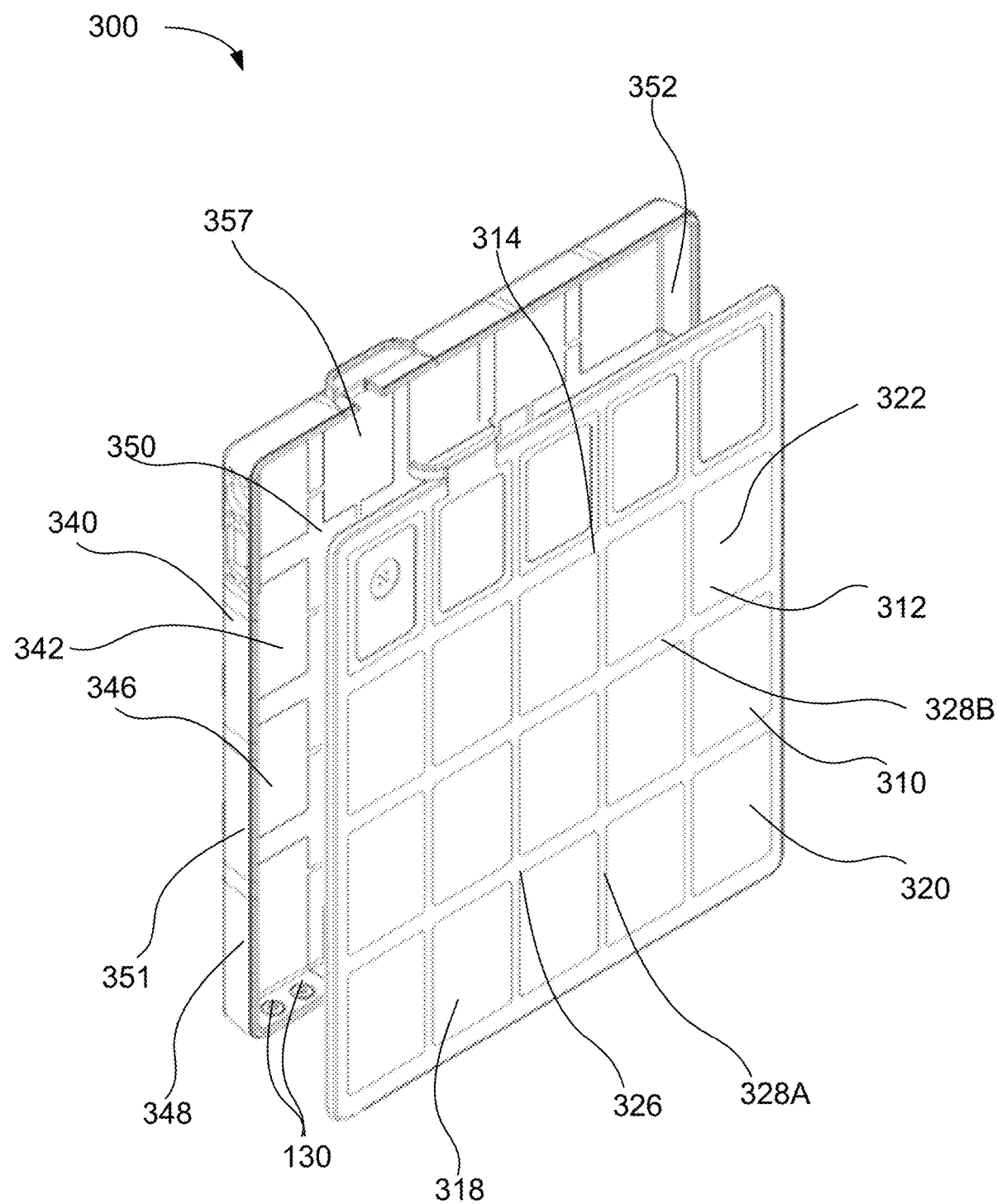
FIG. 15 illustrates an exploded perspective view of another exemplary housing of the CWB of FIG. 1 according to aspects described herein.
Figure 16:
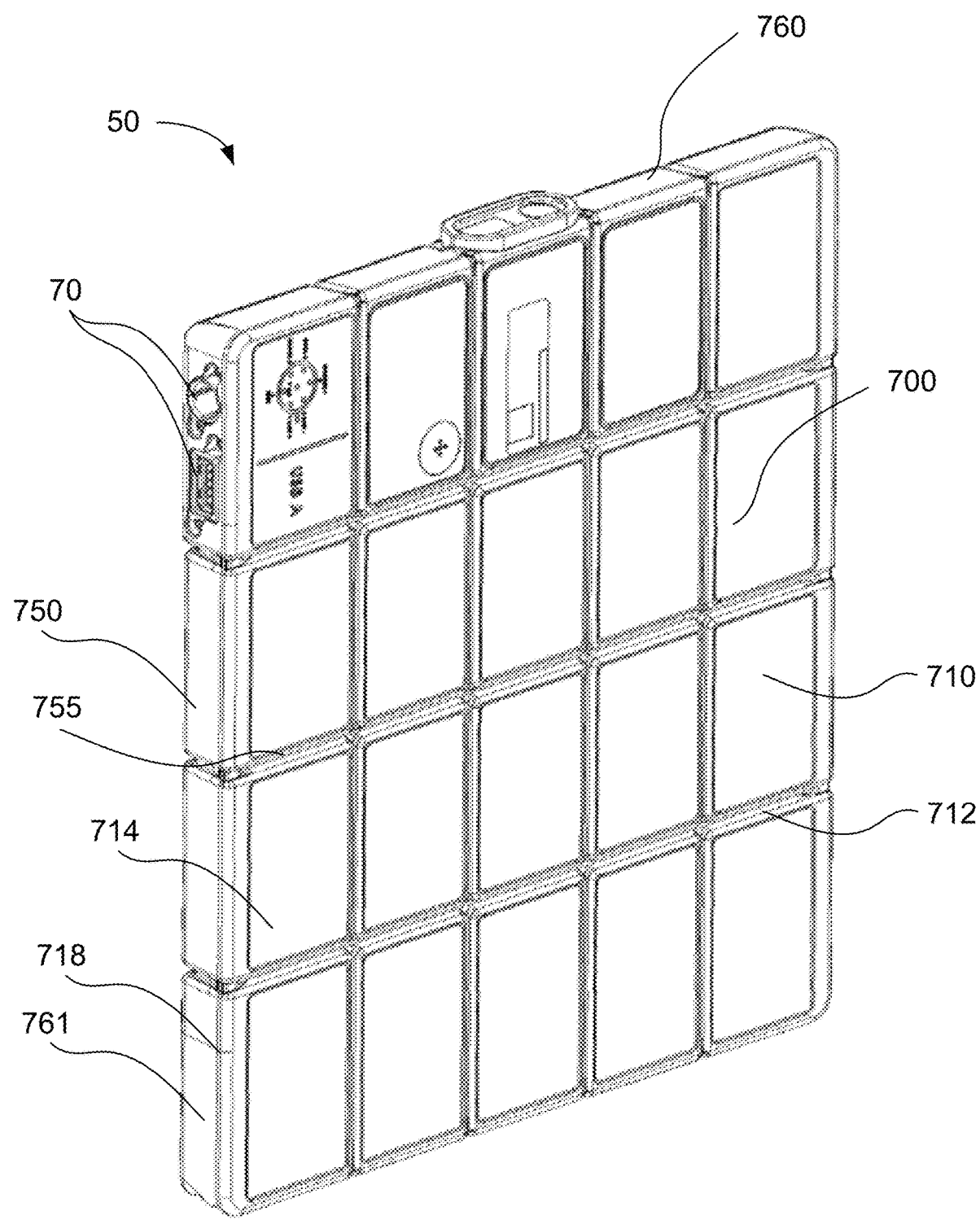
FIG. 16 illustrates a front top perspective view of another exemplary conformal wearable battery (CWB) according to aspects described herein.
Figure 17:
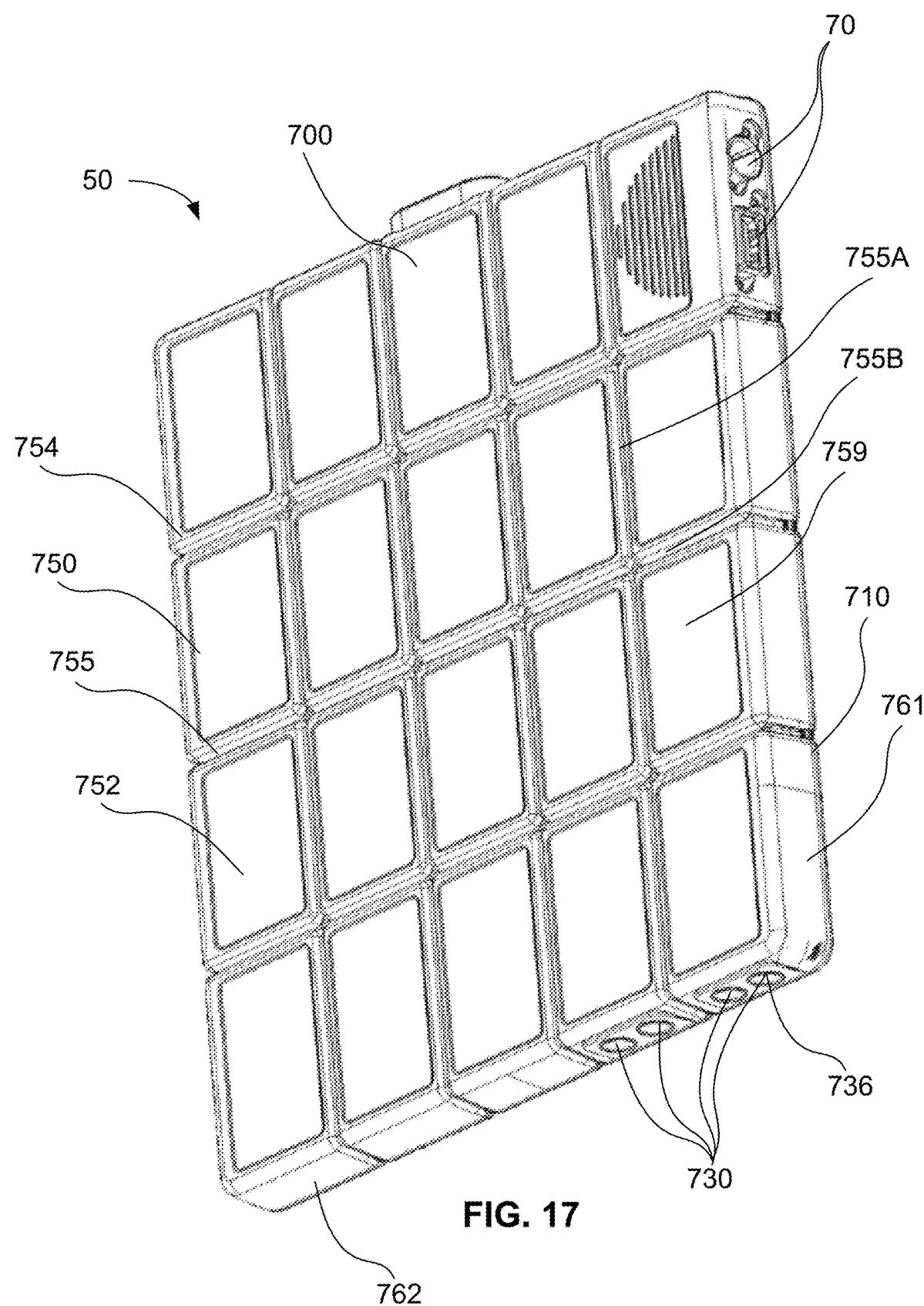
FIG. 17 illustrates a rear bottom perspective view of the conformal wearable battery of FIG. 16 according to aspects described herein.

In order to further promote bending within the vertical regions 362A or horizontal regions 362B of the second member 350, a plurality of grooves 364 may be located within the outward facing surface 366 of the second member 350. In some examples, the grooves 364 may only be located in the outward facing surface 366 or in other examples, the grooves 364 may be located in one of or both the outward facing surface 366 and the inward facing surface 368 of the second member 350. The grooves 364 may be sized similarly to the grooves 332 of the upper shell 310 as described above, or may have a different size than grooves 332. Optionally, in some examples, a plurality of ribs 370 may extend from the inward facing surface 368 of lower shell 340 along the vertical regions 362A. These ribs 370 may be intermittent and run substantially along a vertical length of each rigid region 354 while being absent across the horizontal regions 362B of the second member 350. In addition, as shown in the illustrated example of FIG. 11, the channels 358 may extend from a first rigid region 354A to an adjacent rigid region 354B and the channels 358 may extend inward may not be planar with the adjacent rigid regions 354A, 354B where an inward facing surface 360 of the channel 358 that connects from the first rigid region 354A to the second rigid region 354B may be further inward than the inward facing surface 357 of each of the rigid regions 354A, 354B. Alternatively, as shown in FIGS. 13 and 15, the channels 324, 358 may be planar with the inward facing surfaces 323, 357 of the corresponding rigid region 320, 354.

Both the upper shell 310 and the lower shell 340 may be formed in a similar manner. For example, each shell 310, 340 may be formed using an injection molding process, in particular, each shell 310 may be formed using a two-shot molding or overmolding technique. Using this process, the first members 318, 342 of each shell 310, 340 may be formed using an injection molding technique by filling a first mold with the first material, thereby forming the first member as a single unitary member. The first members 318, 342 may then be removed from the first mold and placed into a second mold. A second material may then be injected into the second mold where the second material flows over the first member 318, 342 whereby the second member 326, 350 is formed onto its respective first member 318, 342 also using an injection molding process. For example, second member 326 is formed onto the first member 318 to form the upper shell 310, and second member 350 is formed onto first member 342 to form the lower shell 340. In some examples, the first mold may have additional slides or components that can be arranged such that the second member 326, 350 may be formed onto its corresponding first member 318, 342 without removing the first member 318, 342 from the first mold and placing it into a second mold. Alternatively, the second members 326, 350 may be molded separately from their corresponding first members 318, 342 and joined using adhesives, welding, or other methods for attachment. Optionally, the first members 318, 342 and second members 326, 350 may be stamped, machined, or formed using other production methods.

Figure 11:
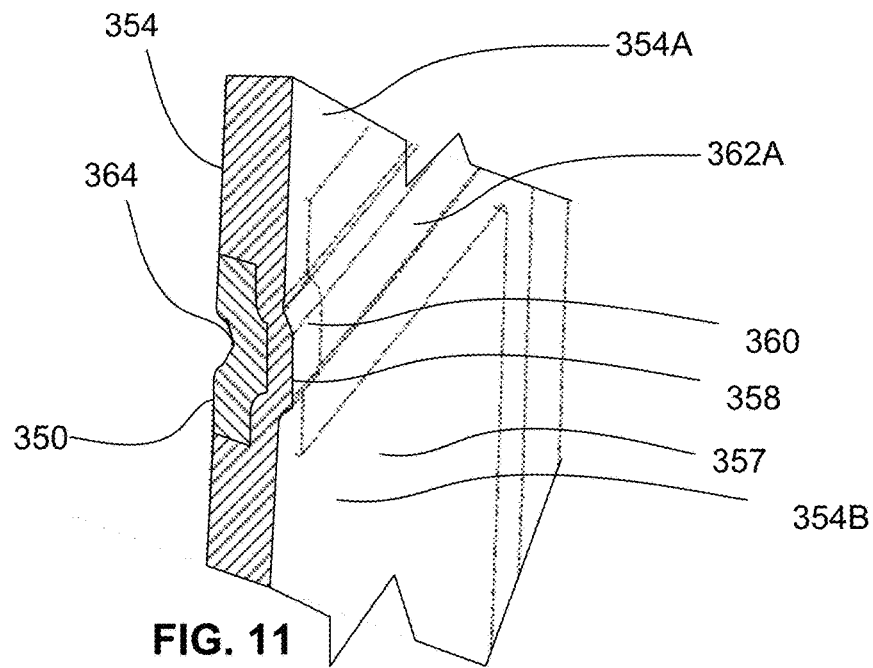
FIG. 11 illustrates an enlarged view of FIG. 10 according to aspects described herein.
Figure 12:
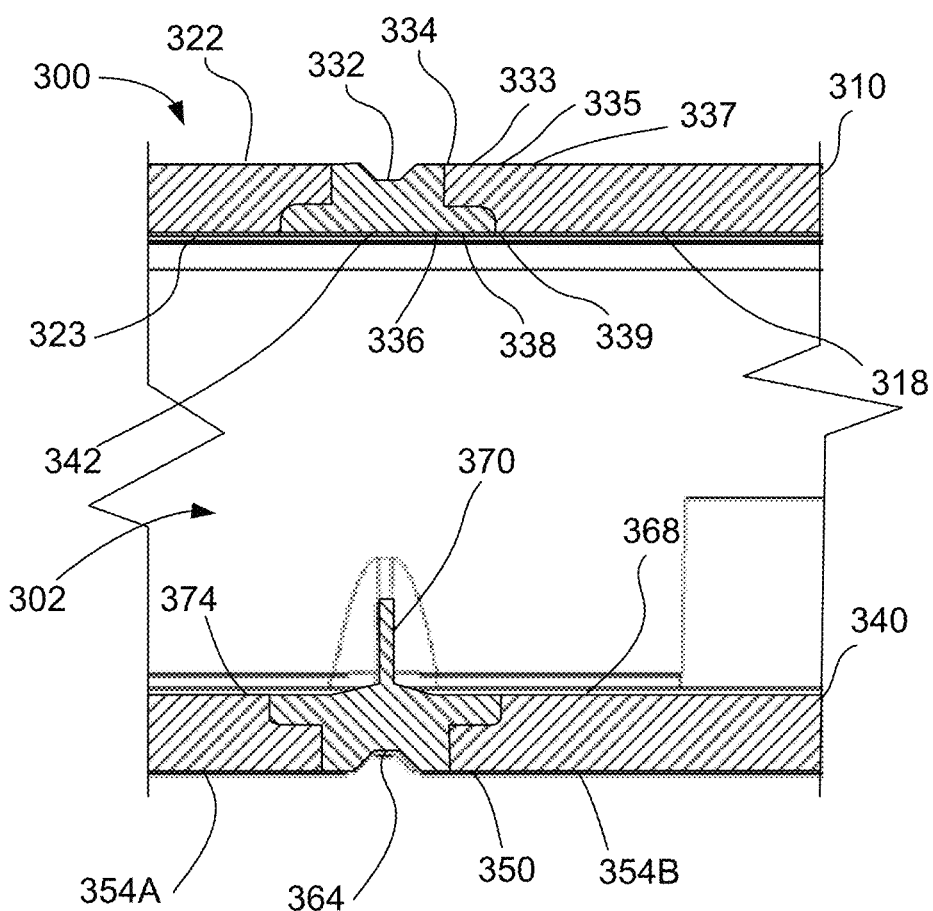
FIG. 12 illustrates a partial cross-sectional view of the exemplary housing of FIG. 7 along line 12-12 according to aspects described herein.

The interface between the first member 318, 342 and its corresponding second member 326, 350 may be arranged to help secure the members together and to handle the stresses created in this joint to prevent any separation between the two members during repeated bending cycles. As shown in FIGS. 11 and 12, each rigid region 320 may have an edge region 333 along the perimeter of that extends between the outward facing surface 322 and the inward facing surface 323 along a perimeter of each rigid region 320. This edge region 333 may extend completely around the perimeter of each rigid region 320 except for the areas where the channel 324 of each rigid region 320 may extend to a neighboring rigid region 320. The edge region 333 may include a first edge surface 335 and a second edge surface 337, where the first edge surface 335 and the second edge surface 337 may extend in different directions. The first edge surface 335 may extend substantially perpendicular from the outward facing surface 322 an end 336 approximately 50 percent of a thickness of the rigid region 320. The second edge surface 337 may have a first portion 338 that extends from end 336 in a direction that is substantially perpendicular to the first edge surface 335. The second edge surface 337 may also have a curved portion 339 that connects from the first portion 338 to the inward facing surface 323. The second member 326 may have a second edge region 334 that has a complementary structure to the first edge region 333 such that the first member 318 and the second member 326 may be substantially coplanar on adjacent surfaces of the first edge region 333. This edge region 333 may allow the second member 326 to have a width adjacent the inward facing surfaces 323 of the rigid regions 320 that is greater than a width of the second member 326 adjacent the outward facing surfaces 322 of the rigid regions 320. In some examples, the distance across the horizontal flexible regions 328B may be greater than the distance across the vertical flexible regions 328A. Because the width of the horizontal flexible regions 328B may be greater than the width of the vertical flexible regions 328A, the ratio of the width of the second member 326 at the horizontal flexible regions 328B adjacent the inward facing surfaces 323 of the rigid regions 320 may be within a range of 125 percent and 160 percent of the width of the second member 326 adjacent the outward facing surfaces 322 of the rigid regions 320, while the ratio of the width of the second member 326 at the vertical flexible regions 328A adjacent the inward facing surfaces 323 of the rigid regions 320 may be within a range of 170 percent and 200 percent of the width of the second member 326 adjacent the outward facing surfaces 322 of the rigid regions 320. While the above description uses only the reference numbers and features of the upper shell 310, the edge region 374 of the rigid regions 354 may have similar if not identical surfaces such that the second member 350 of the lower shell 340 may have similar dimensions and dimensional relationships as the second member 326.

Figure 14:
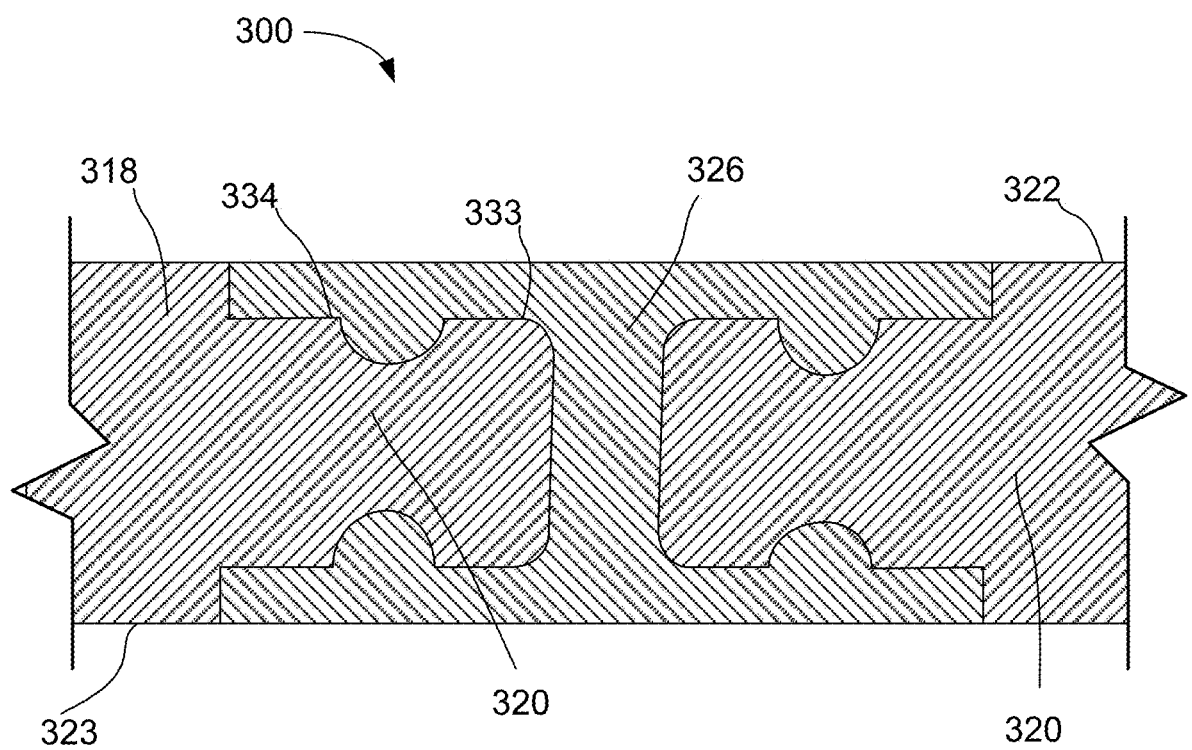
FIG. 14 illustrates a cross-sectional view of an alternate example of a joint between a first member and a second member of one of the shells of the exemplary housing of FIG. 7 according to aspects described herein.

Alternatively, the interface between rigid member 318 and the flexible members 326 may have different edge geometry along the rigid regions 320 to promote a robust and durable joint. For instance, as shown in FIG. 14 where the edge region 333 may have a sinusoidal or curved surface on both the outward facing surface 322 and the inward facing surface 323, such that the flexible member 326 has a corresponding sinusoidal or curved surface shape, then the flexible member 326 may be formed onto each of the rigid regions. As another option, the rigid region 320 may also include an opening, such as a hole, that extends either partially or completely through the thickness of the rigid region that receives the material of the flexible member to help in forming a secure joint between the flexible member 326 and the rigid member 318.

As discussed above, the shells 310, 340 utilize rigid members 318, 342 and flexible members 326, 350 to form a bendable housing 300. The rigid members 318, 342 may be formed by a molding technique such as injection molding and may be formed from a material with a greater stiffness or rigidity than a material used to form the flexible members 326, 350. For instance, the rigid members 318, 342 may be formed from a first material that may be a polymeric material such as polycarbonate (PC), polypropylene (PP), or similar materials known to one skilled in the art. The polymeric material may be a filled or unfilled polymer. The second material may be molded onto the rigid member 318, 342 that forms the flexible member 326, 350. The second material may be a thermoplastic elastomer (TPE), a thermoplastic urethane (TPU), thermoplastic vulcanizates (TPV), or other similar material. Optionally, the second material may have a deep red aniline dye colorant that appears black. This aniline dye may be an infrared transmitter that allows the upper shell 310 and the lower shell 340 to be laser welded to permanently join the shells 310, 340 together to seal the CWB 10.

FIGS. 16-28 illustrate another exemplary conformal wearable battery (CWB) 50. CWB 50 may include internal battery cells 60 and other electronic components such as a battery-charging controller, and a computing processor to allow the CWB 50 to operate properly similar to CWB 10 described above. These electronic components may be received in an interior cavity 702 of housing 700 to protect the battery cells 60. Also, similar to CWB 10 described above, CWB 50 may bend or move in both a horizontal and/or vertical direction, or bend in some combination thereof to meet the requirements of MIL-PRF-32383/4A. For instance, CWB 10 may be required to flex at least 800 times under load to a 7-inch radius curved surface, such that an edge of the CWB may be capable of deflecting, in each direction, at least a specified distance (i.e., 1 inch) from a centerline of the CWB 10 without sustaining physical or electrical damage. Accordingly, housing 700 may be flexible or bendable to be able to withstand repeated bending or flexing cycles to allow CWB 50 to meet the requirements of MIL-PRF-32383/4A. The housing 700 may include an upper housing member or upper shell 710 and a lower housing member or lower shell 750 that connect to each other to form an interior cavity 702 that receives the battery cells 20 and other electronics of the conformal wearable battery (CWB) 50. Once the plurality of battery cells 60 and other required components are installed inside the interior cavity 702, the upper shell 710 and the lower shell 750 may be joined together along their perimeters to seal the housing 700 to enable the CWB 50 to meet the environmental requirements of at least IP67 or to meet MIL-PRF-32383/4A requirements.

The upper shell 710 may have a front wall 712 with an outward facing surface 714, an inward facing surface 716 opposite the outward facing surface 714, and a perimeter surface 718 may extend from a perimeter of the outward facing surface 714 towards the inward facing surface 716. In addition, the lower shell 750 may have a rear wall 752 with an outward facing surface 754, an inward facing surface 756 opposite the outward facing surface, and a plurality of perimeter sidewalls 760, 761, 762, 763 that extend from a perimeter of the outward facing surface 754 beyond the interior surface 756, where sidewalls 760 and 762 are arranged opposite each other on a top and bottom of the housing 700 and sidewalls 761 and 763 are arranged opposite each other on a first and second side of the housing 700.

As discussed above, CWB 50 may provide power to various electrical devices by transmitting power from the battery cells 60 through a connector 70 and may be rechargeable through the connector 70 or through the contact components 730. Contact components 730 may be electrically connected with the battery cells 60 through a conductive region 62 (i.e. flexible circuits or wiring) connected to the battery cells 60 and may have similar electrical connections as discussed above regarding contact components 130, such as a conductive element 105 (i.e. a mechanical fastener) inserted into openings of the conductive regions 62 to electrically connect the battery cells 60 and the contact components 730. The CWB 50 may include a plurality of contact components 730 that each have an outward facing surface 736 accessible from outside of the CWB 50 of the housing 700 and an inward facing surface 740 that may be connected with the conductive region 62 to the battery cells 60. Each outward facing surface 736 of the plurality of contacts 730 may be substantially planer with each other, meaning each outward facing surface 736 may be within a range +/−5 degrees with the outward facing surface of the neighboring contact 730. In the illustrated example, CWB 50 includes four contact components 730, although the CWB 50 may include fewer contacts such as one, two, or three contacts, or greater than four contacts like five contacts, six contacts, or more than six contacts. Each of the contact components 730 may be secured to the lower shell 750 of housing 700 where the lower shell 750 forms a seal around each contact component 730 to prevent ingress of moisture and debris.

Figure 21:
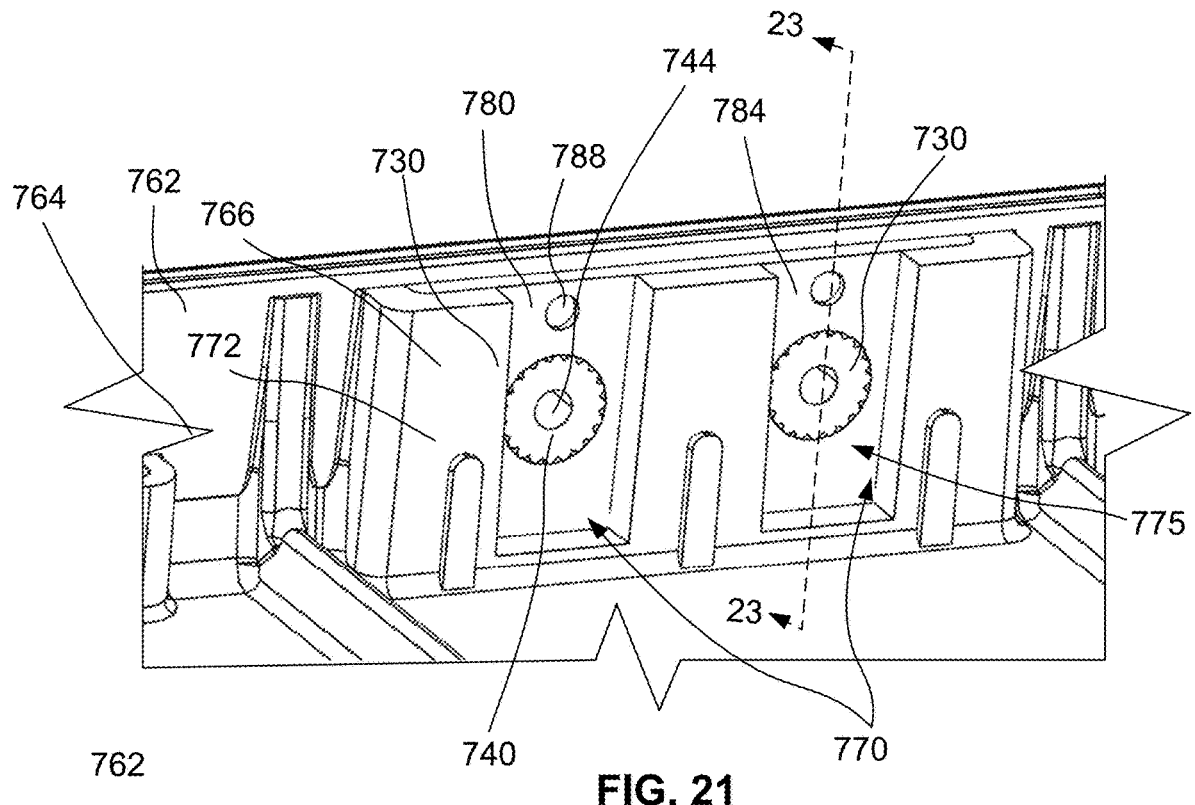
FIG. 21 illustrates an enlarged perspective view of a portion of the lower shell of FIG. 19 according to aspects described herein.
Figure 22:
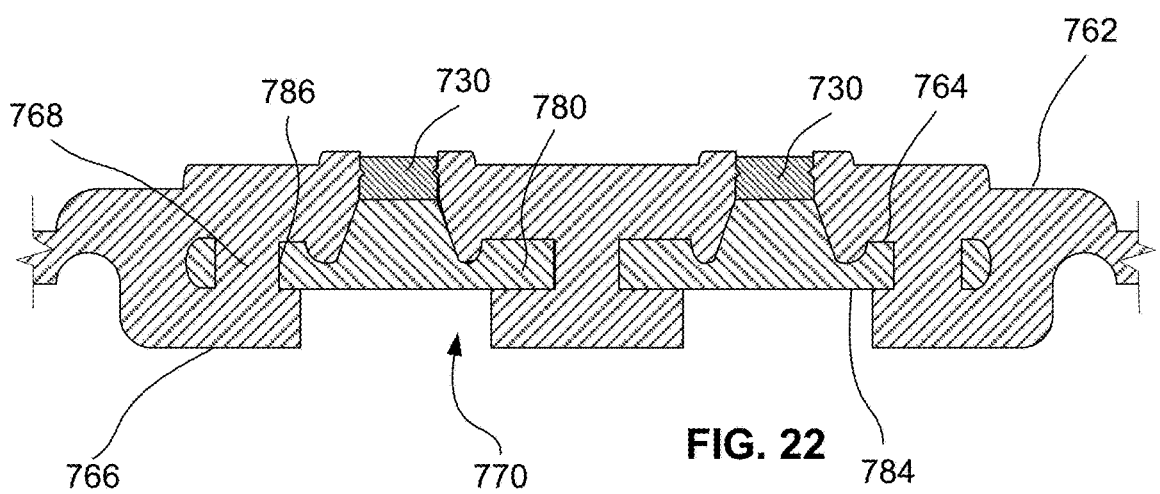
FIG. 22 illustrates a cross-sectional perspective view of a portion of the lower shell of the housing along line 22-22 of FIG. 19 according to aspects described herein.

As shown in FIGS. 18A-23, lower shell 750 of the housing 700 may include a plurality of contact carrier assemblies 775, where each contact carrier assembly 775 includes a contact carrier 780 that secures a plurality of contact components 730. In addition, the lower shell 750 may also include a connector plate 720 that is configured to receive one or more connectors 70 that are connected to the battery cells 60. As shown in the illustrated example, the lower housing 750 may include a pair contact carrier assemblies 775, where each contact carrier 780 secured two contact components 730. Further, in the illustrated example, each contact component 730 is individually connected to a plurality of conductive regions 62 that electrically connect the contact components 730 to the plurality of battery cells 60. As previously discussed, each shell 710, 750 of the housing 700 may be formed using a molding process, such as injection molding from a polymeric material that can flex and bend. The lower shell 750 may be formed around each contact carrier assembly 775 (i.e. the contact carrier 780 and its corresponding contact components 730) to secure contact carrier assembly 775 within to the lower shell 750. Each contact carrier 780 may be secured to a sidewall 762 of the lower shell 750 between a rear surface 764 of sidewall 762 and a rear flange 766 that is spaced rearward of rear surface 764. As shown in cross-sectional view of FIG. 22, a plurality of plugs 768 may extend from rear surface 764 of sidewall 762 through openings 786 of the contact carrier 780 to the rear flange 766 of the lower shell 750. By lower shell 750 being formed around the contact carrier 780, the plurality of plugs 768, rear flange 766, and the sidewall 762 may be a single unitary member. As shown in FIG. 21, each rear flange 766 may include an opening 770 that extends from a rear surface 772 of the rear flange 766 to enable access to an inward facing surface 740 of a contact component 730. Each opening 770 may have a slightly greater width than a width of the conductive regions 62 and conductive element 105 that connect to the inward facing surface 740 and also align each conductive region 62 such that it may be easily connected to its corresponding contact component 730.

The lower housing 750 may also be formed around the connector plate 720 to secure the connector plate 720 to the lower housing 750. For instance, the connector plate 720 may have a front surface 722, a rear surface 724 opposite the front surface, and a plurality of openings 726 extending through the front and rear surfaces 722, 724. The connector plate 720 may have a connector opening or plurality of connector openings 728 to receive a connector 70 from the battery cells 60. Similar to the contact carrier(s) 780, the lower shell 750 may be formed around the connector plate 720 and may be secured to a sidewall 761 of the lower shell 750 between a rear surface 765 of sidewall 761 and a rear flange 767 that is spaced rearward of rear surface 765. In addition, a plurality of plugs may extend from rear surface 765 of sidewall 761 through an opening 726 of the connector plate 720 to the rear flange 767 of the lower shell 750.

To enhance the upper and lower shells 710, 750 ability to bend, the upper and lower shells 710, 750 may include a plurality of vertically and horizontally intersecting grooves 755. The grooves 755 may be located within the front walls 712, 752 of the respective shells 710, 750. In some examples, the grooves 755 may be located in the outward facing surfaces 714, 754, and may have corresponding inward protrusions 757 that extend from inward facing surfaces 716, 756 of the respective upper and lower shells 710, 750. The grooves 755 may be arranged in the spaces that are between the individual battery cells within the array of battery cells 60. The grooves 755 may be arranged in both a vertical oriented grooves 755A and horizontal oriented grooves 755B. The horizontal grooves 755A may have a width that is greater than a width of the vertical grooves 755B. For example, the width of the horizontal grooves 755B may be 1.2 to 1.5 times greater than the width of the vertical grooves 755A. In addition, the vertical and horizontal grooves 755A, 755B may have the same depth, such that the grooves 755 may have a constant depth. The width of the grooves 755 may be greater than the depth of the grooves 755. For example, the depth of the grooves 755 may be that is within a range of 50 percent and 85 percent of the overall width of the groove 755 to help promote flexing in the proper locations. In some examples, the depth of the grooves 755 may be within a range of 2 mm and 4 mm. In addition, both of the upper and lower shells 710, 750 may also include a plurality of substantially rectangular shaped pockets 759 may be located in a grid-like pattern that substantially matches the layout of the plurality of battery cells 60.

Figure 24:
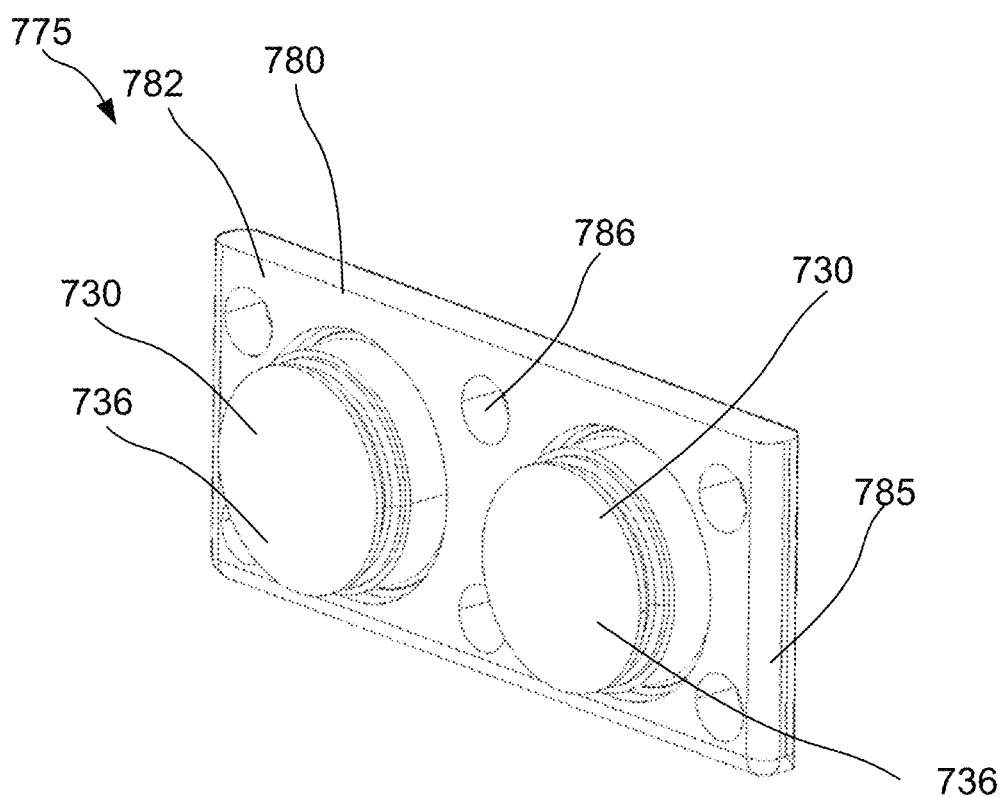
FIG. 24 illustrates a perspective view of a contact carrier assembly of the conformal wearable battery (CWB) of FIG. 16 according to aspects described herein.
Figure 25:
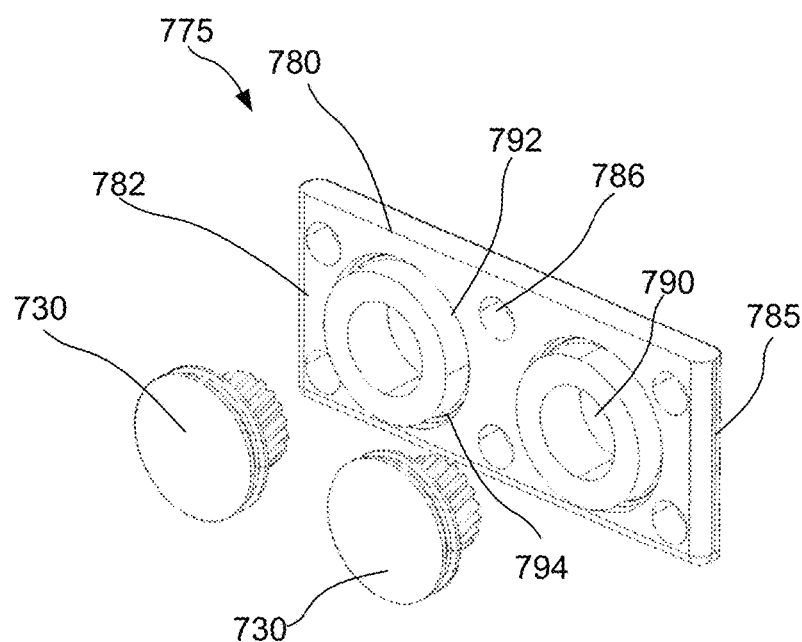
FIG. 25 illustrates an exploded perspective view of the contact carrier assembly of FIG. 24 according to aspects described herein.
Figure 26A:
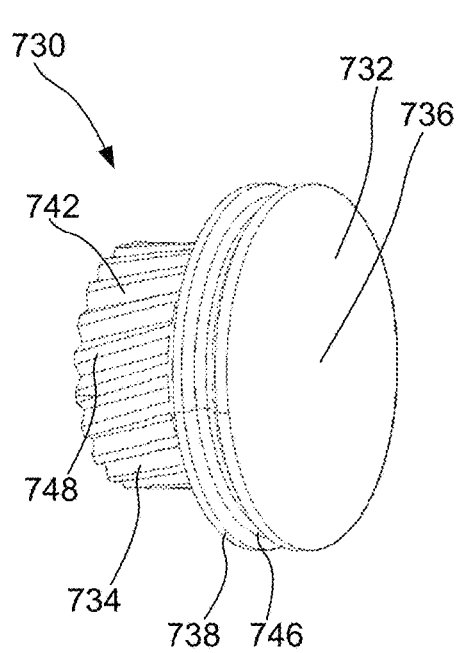
FIGS. 26A and 26B illustrate front and rear perspective views of a contact component of the contact carrier assembly of FIG. 24 according to aspects described herein.
Figure 26B:
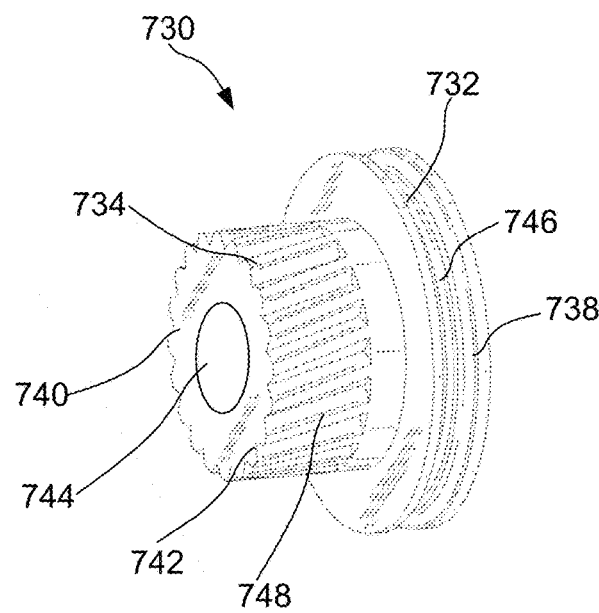
Figure 27A:
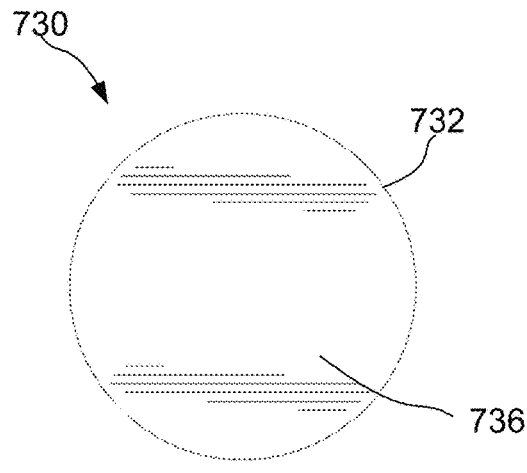
FIGS. 27A-27D illustrate front, rear, and side views of a contact component of the contact carrier assembly of FIG. 24 according to aspects described herein.
Figure 27B:
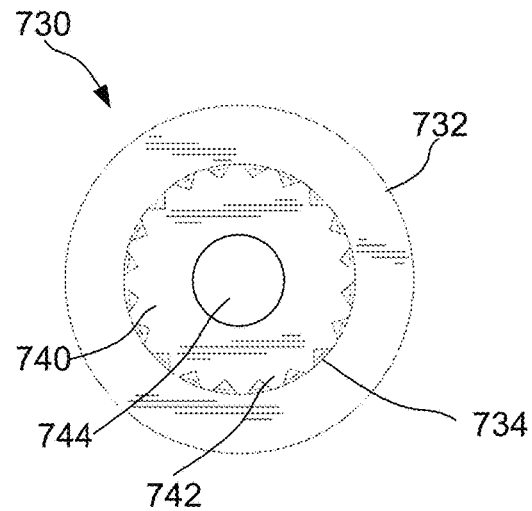
Figure 27C:
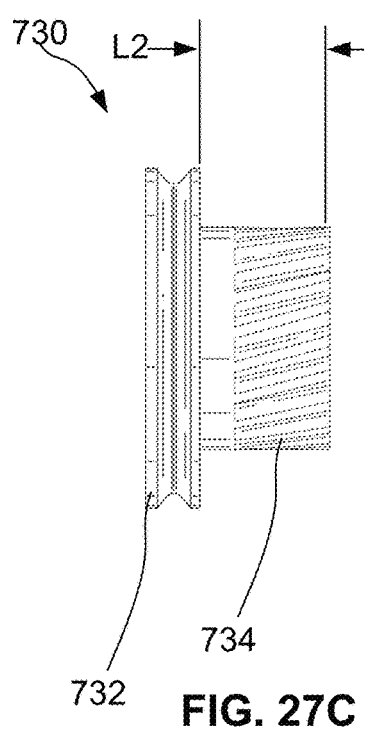
Figure 27D:
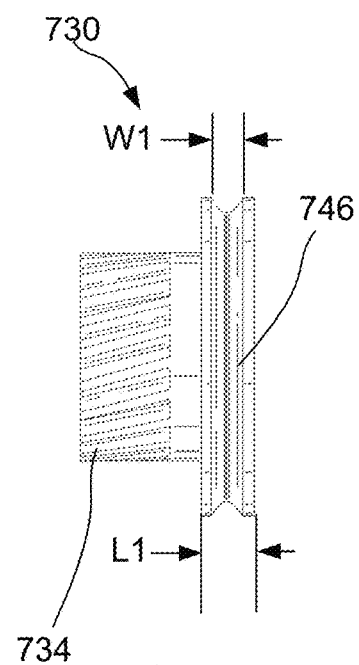

As shown in FIGS. 24-25, each contact carrier assembly 775 may include a contact carrier 780 and a pair of contact components 730. Each contact carrier assembly 775 may be formed separately from the lower shell 750 using a molding process. In some examples, the contact components 730 may be placed in a mold where the contact carrier 780 is formed at least partially around a rear portion 734 of each contact component 730 to secure the contact component 730 to the contact carrier 780. Alternatively, each contact carrier 780 may be formed separately from the contact components 730, and the contact components 730 being installed into the contact openings 790 of the carrier 780 to form the contact carrier assembly 775. For instance, the contact components 730 may be installed using an adhesive, heat staking, ultrasonic welding, or other process known to one skilled in the art. In this manner, each contact component 730 may be integrally joined to its respective contact carrier 780 to form a mechanical lock securing contact component 730 to its respective carrier 780 making these components integrally joined such that such that separation of the joined pieces cannot be accomplished without structural damage to either the carrier 780 and/or contact components 730.

Each contact carrier 780 may include features to ensure the proper alignment of the contact components 730 and to secure the carrier 780 to the lower shell 750. For instance, each contact carrier 780 may have a front surface 782, a rear surface 784 opposite the front surface 782, a sidewall surface 785 extending between the front surface 782 and the rear surface 784, and a plurality of openings 786, at least one contact opening 790, a plurality of alignment apertures 788 on the rear surface 784 above the contact openings 790, an engaging member 792 extending from the front surface 782, and a recess 794 extending around the engaging member 792 below the front surface 782. The engaging member 792 may have a tapered outer surface such that when the lower shell 750 is formed around the engaging member 792, a corresponding tapered surface 774 is formed in the lower shell 750. This pair of tapered surfaces may further help to secure the carrier 780 within the shell 750 to prevent any movement of the contact components 730 during use. Alternatively, the engaging member 792 may have an outer surface that is orthogonal to the front surface 782. In addition, recess 794 may allow a corresponding protrusion 776 to be formed within the recess to help secure the carrier 780 in shell 750. As discussed above, the contact carrier 780 may have a plurality of openings 786. As shell 750 is formed around carrier 780, the material forming shell 750 may flow through each of the openings 786 to form a mechanical lock securing the carrier 780 to shell 750 making these components integrally joined. Each opening 786 may be a cylindrical hole or may be a truncated conical shape such that the inner wall has a taper, or may be a different geometric shape. In the illustrated example, the openings 786 are symmetrically arranged about a center plane of the carrier 780, although in other examples, the openings 786 may be asymmetrically arranged. Further, the openings 786 may all be the same size or may have different shapes. For instance, the openings 786 may be larger on an upper portion of the carrier 780 than a bottom portion of the carrier 780 or may be larger on a bottom portion than an upper portion, or may be larger on a left side than a right side, or may be larger on a right side than a left side. The alignment aperture 788 may help to align and secure the contact carrier 780 within a mold when the lower shell 750 is formed. The alignment aperture 788 may engage a corresponding feature within the mold to secure the contact carrier assembly 775 within the mold to ensure proper alignment of the contact components 730.

Figure 23:
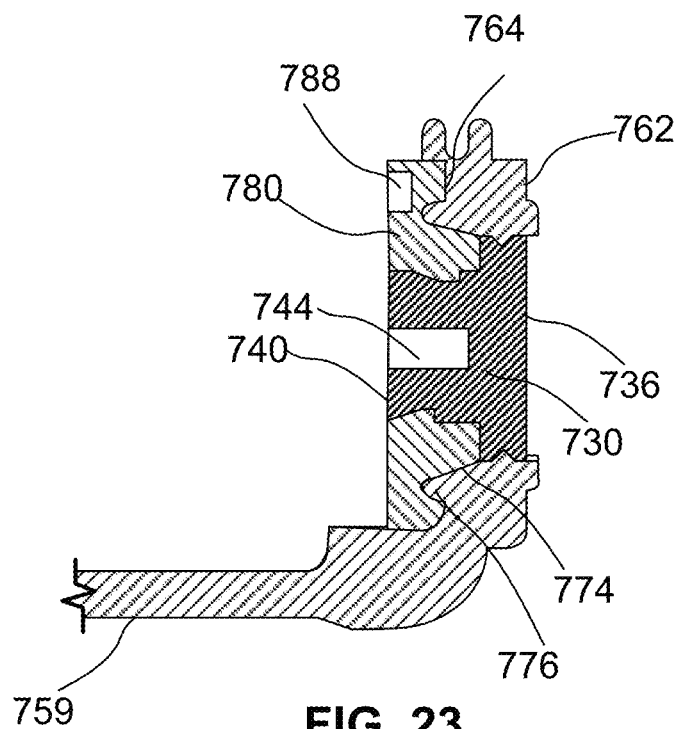
FIG. 23 illustrates a cross-sectional perspective view of a portion of the lower shell of the housing along line 23-23 of FIG. 21 according to aspects described herein.

Each contact component 730 may have a front portion 732 and a rear portion 734, where the front portion 732 includes the outward facing surface 736 and a forward perimeter region 738 surrounding the outward facing surface 736, and the rear portion includes the inward facing surface 740, a rear perimeter region 742 surrounding the inward facing surface 740, and an opening 744 on the inward facing surface 740. In addition, the forward perimeter region 738 of each contact component 730 may be secured to sidewall 762 of lower shell 750 to form a sealed edge to prevent ingress of liquids into the interior cavity 702 to protect the electronic components and prolong the life of the battery cells 60. In some examples, each contact component 730 may be encased by different materials. For instance, as shown in FIG. 23, the forward perimeter region 738 may be partially or fully encased within sidewall 762 of the lower shell 750, where sidewall 762 is formed from a first material and the rear perimeter region 742 may be partially or fully encased within contact carrier 780 that is formed from a second material. The first material may have a lower stiffness or lower hardness than the second material. For example, the first material (i.e. the material forming shells 710, 750) may be a rubber or elastomeric material. For example, the first material (i.e. for the shells 710, 750) may be thermoplastic vulcanizates (TPV), a thermoplastic elastomer (TPE) such as a thermoplastic elastomeric olefin (TEO), or other similar material. The second material (i.e. the material of the contact carrier 780) may be a more rigid polymeric material, such as a polycarbonate (PC) or polypropylene (PP). For example, the first material forming the shells 710, 750 may have a durometer of approximately 70 Shore A, or within a range of 55 and 90 Shore A, while the second material forming the contact carrier 780 may have a durometer of approximately 50 Shore D or greater, or within a range of 40 Shore D and 70 Shore D, or in some cases within a range of 30 Shore D and 80 Shore D. This combination provides an elastomeric material around the outboard portion 732 to help with sealing, while the more rigid carrier 780 provides a support to the rear portion 734 to keep the contacts 730 aligned and prevent any contact movement when the contacts 730 are connected to a charger.

As shown in FIGS. 26A-27D, the contact component 730 may have multiple features to help secure and seal the contact component 730 to both the lower shell 750 and contact carrier 780. Both the forward and rear portions 732, 734 may have a generally cylindrical in shape. Although, these portions 732, 734 may have any geometric shape while still providing adequate surface area to make an electrical connection. The forward portion 732 may have a larger diameter than the rear portion 734. In addition, the forward perimeter region 738 may have a groove 746 that extends around the entire forward perimeter region 738. The groove 746 may have a width, W1, which is approximately 50 percent of the length, L1, of the forward portion 732, or within a range of 25 percent and 75 percent of the length, L1. The groove 746 may also have a depth of approximately 50 percent of the width, W1, or within a range of 25 percent and 75 percent of the width, W1. While the contact component 730 illustrated in FIGS. 26A through 27D has only a single groove 746, other exemplary contact components 730 may have a plurality of concentric grooves 746. Still other exemplary contact components 730 may have a different texture or contours along the forward perimeter region 738 such as knurling, longitudinal or angled gear teeth, or other similar texturing. The rear portion 734 may have a textured region 748 around the rear perimeter region 742 that in some examples may be an arrangement of angled or helical gear teeth. The gear teeth extend along a majority of the rear perimeter portion 742 and may also extend into the inward facing surface 740. The gear teeth 748 may be arranged at an acute angle to the inward facing surface 740. In some examples, the acute angle may be greater than zero to provide a bearing surface at an angle to any type of direct pullout force. The angled teeth also help to secure against any rotation of the contact component 730 in the contact carrier 780. In some examples, as an alternative to gear teeth, the textured region 748 may include knurling, grooves, or some combination of the textures. The rear portion 734 may have a length, L2, which is over two times greater than the length, L1, the forward portion 732. Opening 744 may be configured to receive conductive element to connect the flexible circuit 62 to the contact component 730, which may be a mechanical fastener. In this example, the opening 744 may have female threads such that when the mechanical fastener is inserted into the opening 744, an electrical connection between the contact component 730 and battery cells 60 is made while also providing a mechanical connection between them. The diameter of the outer facing surface 736 may be within a range of 0.29 inches and 0.31 inches, or in some examples, may be within a range of 0.25 inches and 0.35 inches.

Figure 28:
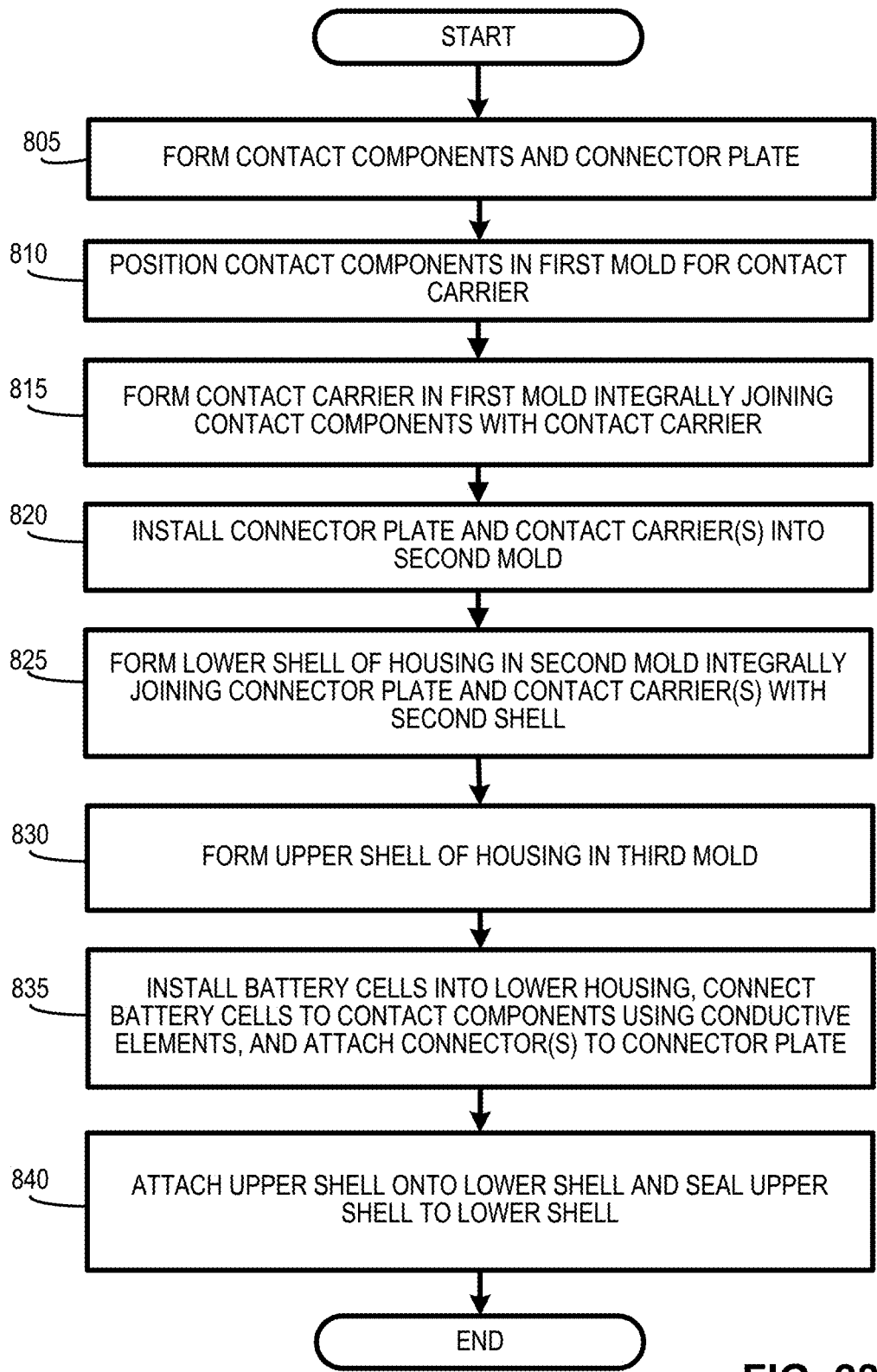
FIG. 28 illustrates a flowchart of exemplary steps to form the housing and assemble the battery cells into the housing to form the CWB.

FIG. 28 illustrates an exemplary method for forming the housing 700 for CWB 50 and assembling the battery cells 60 into the housing. In operation 805, the contact components 730 may be formed using a machining, forging, stamping, or other processes known to one skilled in the art. The contact components 730 may be formed from a conductive material, such as a brass, gold, copper, silver, aluminum, steel, or other electrically conductive material or combination of one or more electrically conductive materials. The connector plate 720 may be formed from a metallic or non-metallic material and may be formed using a machining, forging, molding, stamping, or other process known to one skilled in the art.

In operations 810 and 815, the contact components 730 may be inserted into a first mold configured to form the contact carrier 780. The contact carrier 780 may be formed using a molding process such as injection molding from a non-metallic material. The contact carrier 780 may be formed from a polymeric material as described above that may a stiffness that is greater than the stiffness of the material that forms the shells 710, 750. For example, the material forming the contact carrier 780 may have a modulus (i.e. stiffness) that is 1.5 times greater than a modulus (i.e. stiffness) of the material forming the lower shell 750 (or upper shell 710). Because the contact carrier 780 may be formed from a rigid impact absorbing material, the contact carrier 780 may be easier to hold within the mold. With the contact components 730 installed within the mold, the contact carrier 780 is formed within the mold. As the contact carrier 780 is formed, the material forming the contact carrier 780 flows around the rear portion 734 of each contact component 730 including between the helical gear teeth 748 to form a mechanical lock around the rear portion 734 of each contact component 730 to secure them to the contact carrier 780.

In operations 820 and 825, after removing contact carrier 780 from the first mold, the contact carrier 780 and a connector plate 720 may be installed into a second mold. The lower shell 750 is then formed using injection molding or similar type process from a non-metallic material different from the material of the contact carrier 780. As the lower shell 750 is formed, the material forming the lower shell 750 flows around the contact carrier 780 forming the rear flange 766 and also the plugs 768 may be formed by flowing through the openings 786 to secure the contact carrier(s) 780 to the lower shell 750. Similarly, as the lower shell 750 is formed, the material forming the lower housing 750 may flow around the connector plate 720 to secure the connector plate 720 to the lower housing 750.

Figure 18A:
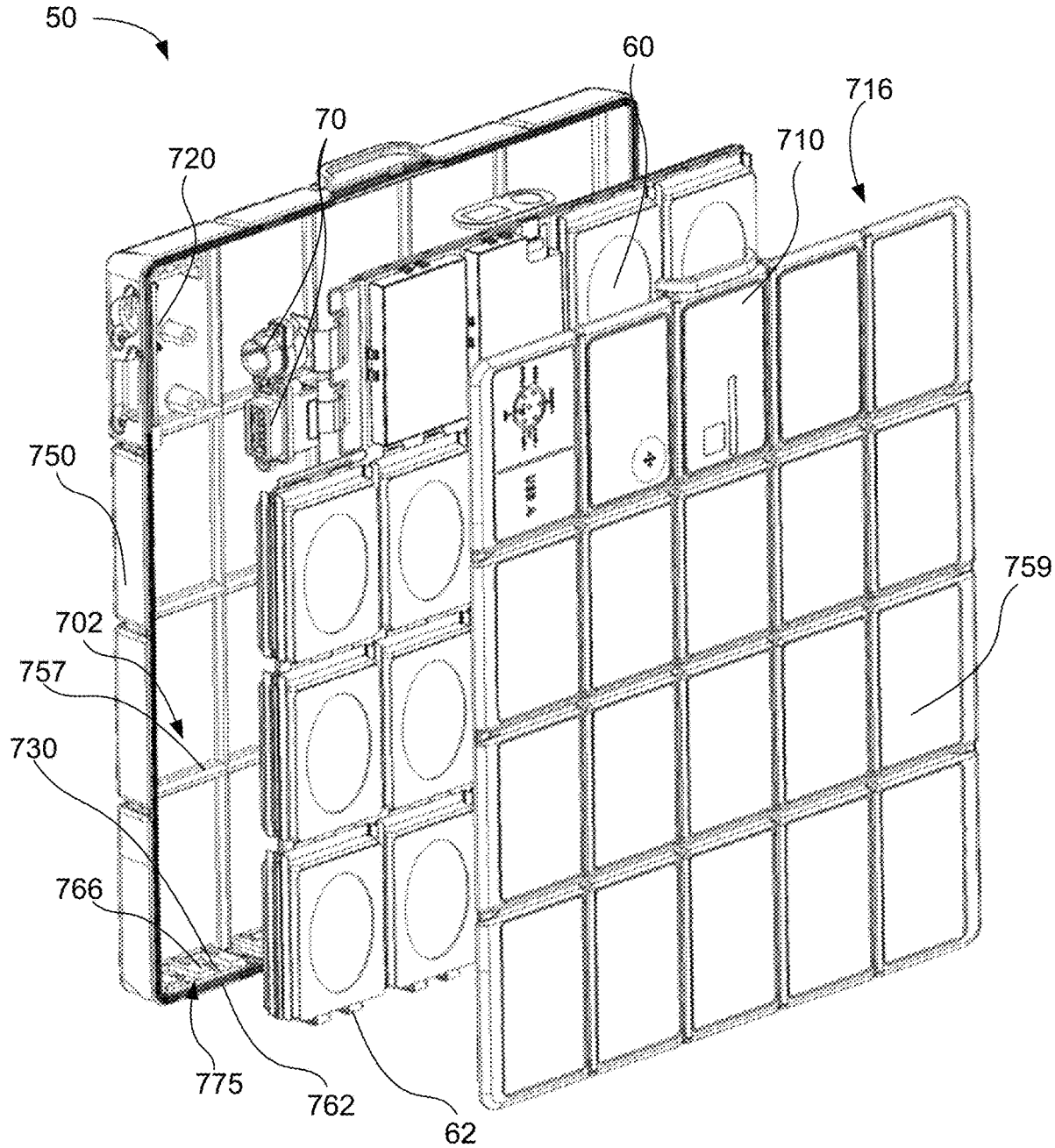
FIG. 18A illustrates an exploded perspective view of the exemplary conformal wearable battery of FIG. 16 according to aspects described herein.
Figure 18B:
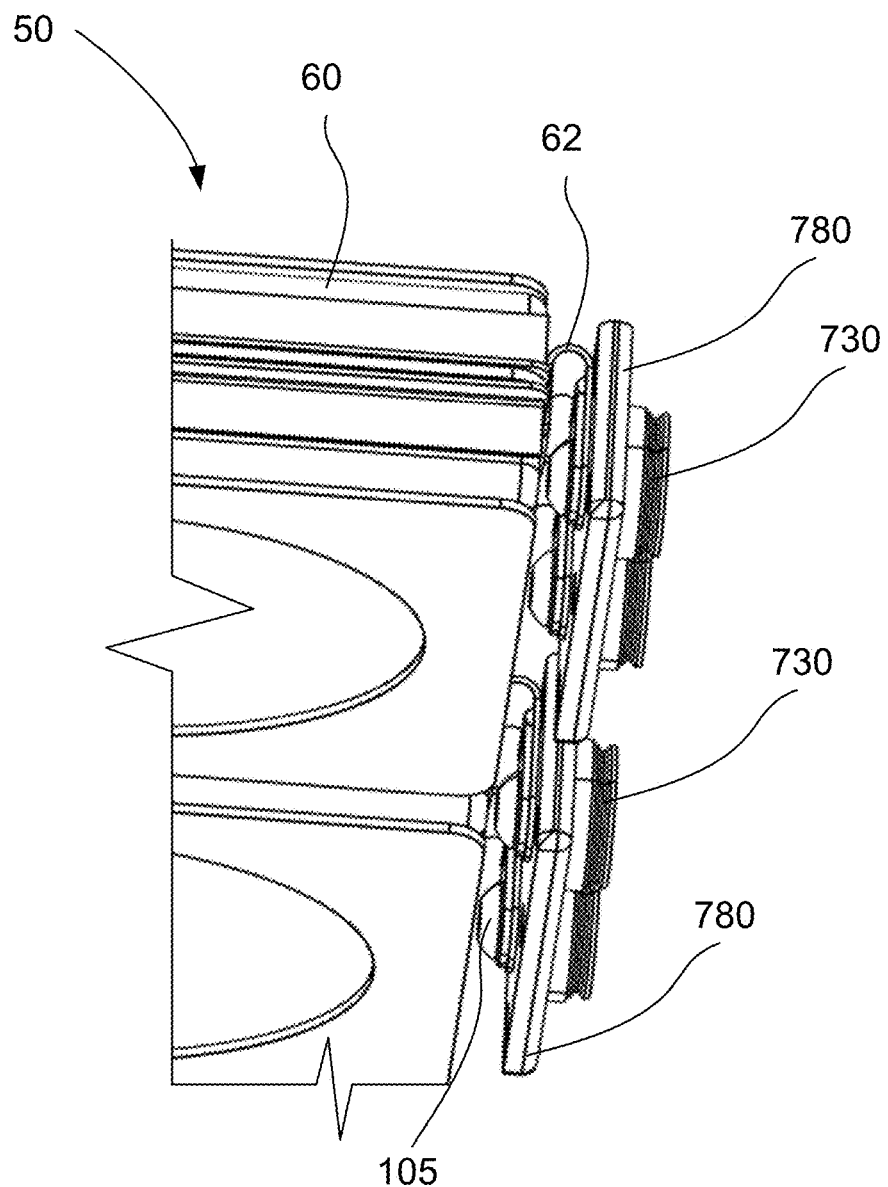
FIG. 18B illustrates a partial perspective view of the exemplary CWB of FIG. 16 with some components removed for clarity according to aspects described herein.
Figure 19:
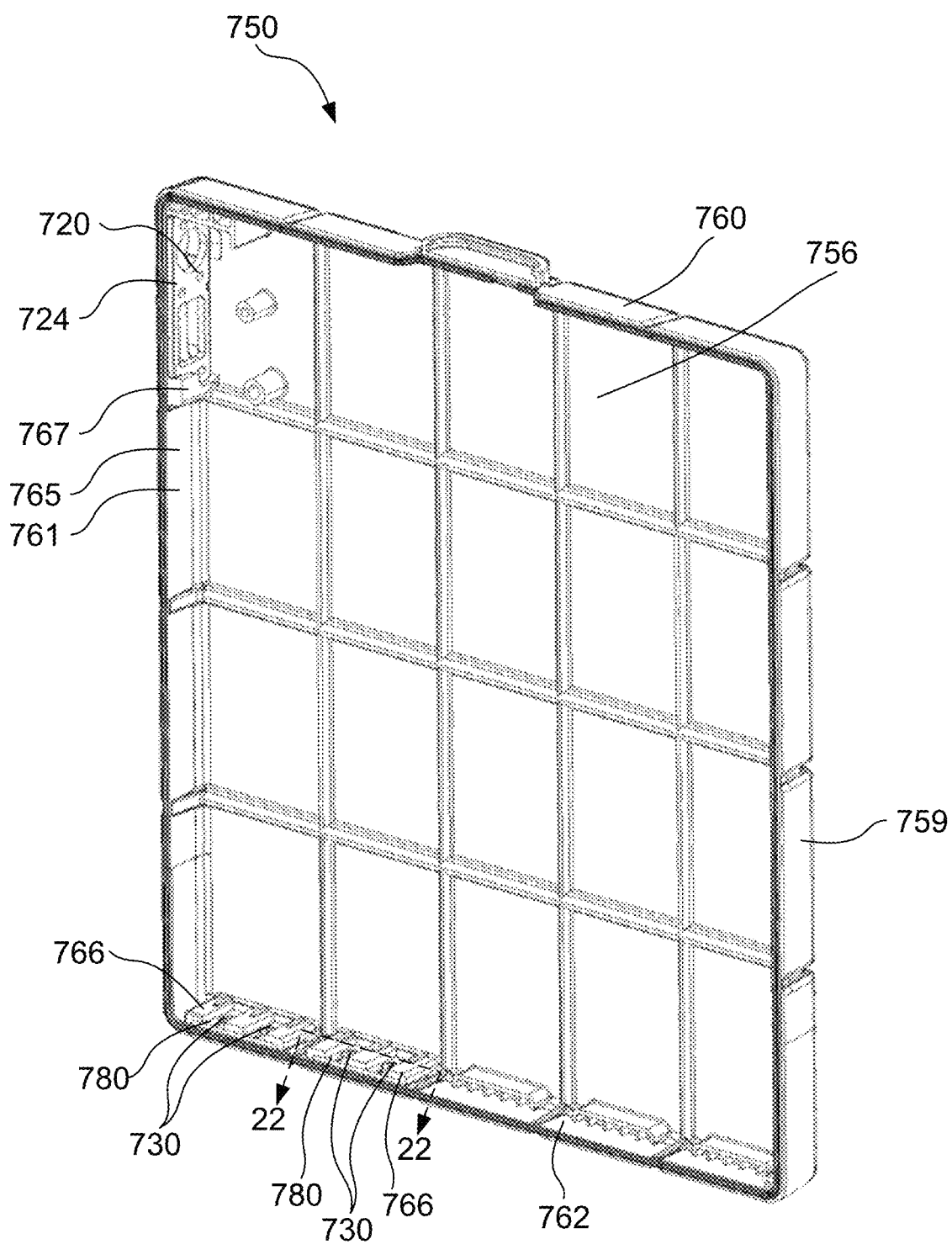
FIG. 19 illustrates a perspective view of a lower shell of a housing for the exemplary conformal wearable battery of FIG. 16 according to aspects described herein.
Figure 20:
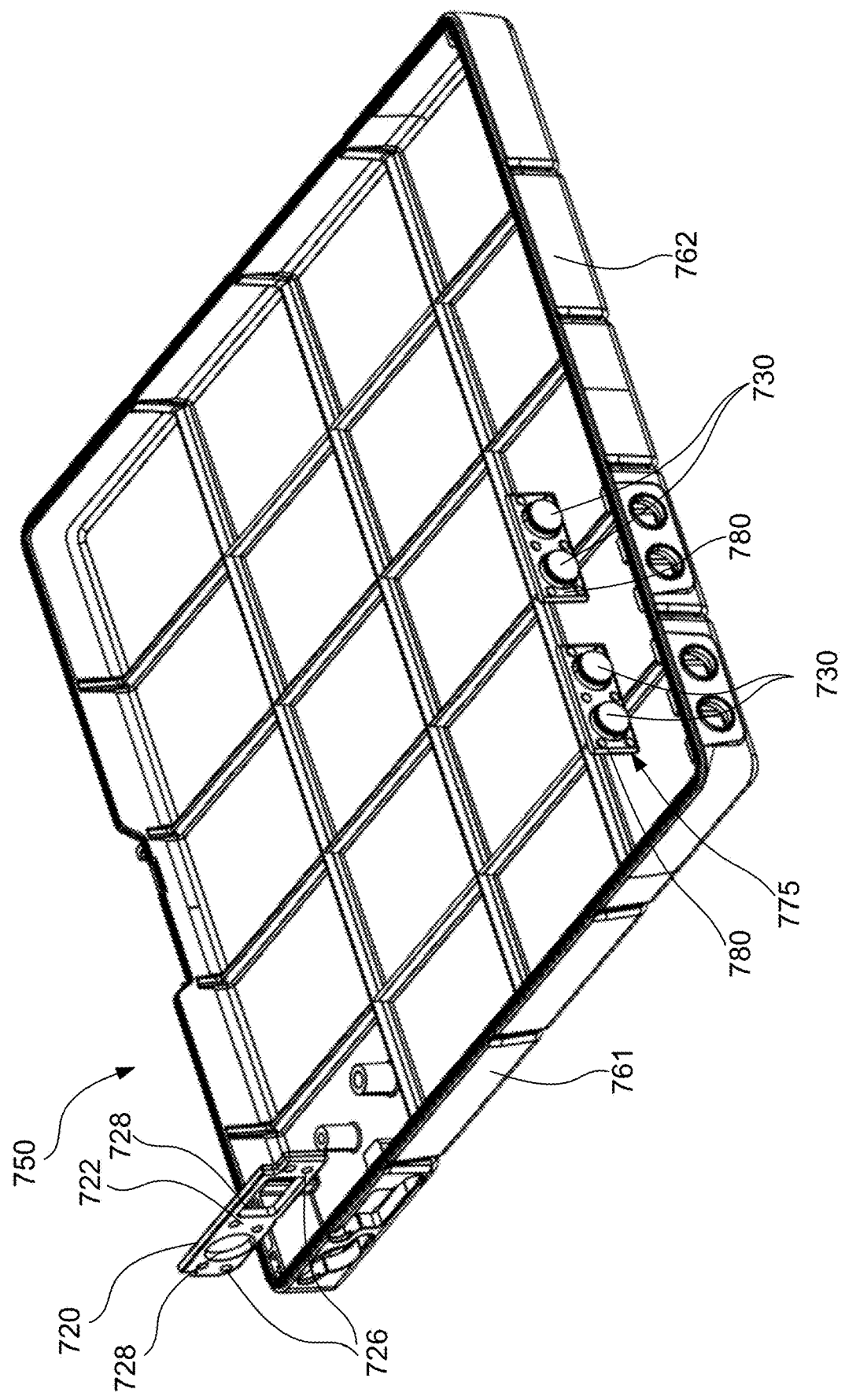
FIG. 20 illustrates an exploded perspective view of the lower shell of FIG. 19 according to aspects described herein.

In operations 830 and 835, the upper shell 710 may be formed using injection molding or similar type process from the same or similar material similar forming the lower shell 750 in a third mold. Next, the battery cells 60 may be installed into the lower housing 750. A connector 70 from the battery cells 60 may be inserted into an opening of the connector plate 720 and then secured to the connector plate 720. In addition, the battery cells 60 may be electrically connected through a conductive element 105 (i.e. mechanical fastener) inserted into opening 744 of each contact component 730. As shown in FIG. 18B, the battery cells 60 may include a plurality of flex circuits 62 that have conductive features such that each flex circuit 62 may receive a conductive element to provide an electrical connection between the battery cells 60 and each contact component 730.

Lastly, in operation 840, the upper shell 710 may be attached to the lower shell 750 along with the two shells 710, 750 being sealed together to help the CWB 50 meet the environmental requirements. In some examples, the upper shell 710 and/or the lower shell 750 may have a second polymeric material molded along the perimeter of either or both shells 710, 750 that has a dye, such as a deep red aniline dye, that causes the material to be an infrared transmitter This second material may allow the upper shell 710 and the lower shell 750 to be laser welded to permanently join the shells together to seal the CWB 50.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure.

It is noted that various connections between elements are discussed in the following description. It is noted that these connections are general and, unless specified otherwise, may be direct or indirect, and that the specification is not intended to be limiting in this respect.

A rechargeable conformable wearable battery (CWB) assembly may be worn by a user to power electronic devices that the user carries. The CWB assembly may be subjected to environmental conditions that the user is also subjected to. A sealed housing and a reliable seal may facilitate longer battery life and utility for the user regardless of environmental conditions that the CWB may be subjected to. To provide a desired power output, the CWB assembly may include a plurality of battery cells, each with a rated power capacity and when electrically connected, may allow the CWB to provide a desired power output.

A CWB assembly may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB assembly. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

The battery cell housing may be formed of a molded casing. The molded casing may be a sealed case that is formed by a molding process, for example, an injection molding process. The molded casing may be formed of a plastic material, for example. The casing may be sealed to prevent ingress of solid material and/or liquid material, for example, according to an IP67 rating, IP68 rating, or other ingress protection rating. The casing may feature a seam between two halves of the casing that is sealed to encase the battery cell within the casing. The positive-charge terminal and the negative-charge terminal may each include a conductive region that passes between the interior of the cell housing and the exterior of the cell housing at a seam of the casing. The conductive region may be affixed and electrically connected to the battery cell in an interior of the cell housing at one end, pass through the sealed seam of the casing, and affix to a contact component that electrically couples with electrical devices at an exterior of the cell housing.

Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

The battery cell housing may be formed of a molded casing. The molded casing may be a sealed case that is formed by a molding process, for example, an injection molding process. The molded casing may be formed of a plastic material, for example. The casing may be sealed to prevent ingress of solid material and/or liquid material, for example, according to an IP67 rating, IP68 rating, or other ingress protection rating. The casing may feature a seam between two halves or portions of the casing that is sealed to encase the battery cell within the casing.

The positive-charge terminal and the negative-charge terminal may each include a conductive region that passes between the interior of the cell housing and the exterior of the cell housing at an outer wall of the casing. The conductive region may be affixed and electrically connected to the battery cell in an interior of the cell housing at one end, pass through the sealed wall of the casing, and affix to a contact component that electrically couples with electrical devices at an exterior of the cell housing.

In some cases, the CWB assembly may be provided in a form factor easily carried by a person, such as within a pocket or with other means of securing the CWB assembly to a person's clothing, uniform, or the like. To provide the specified power output, while also providing flexibility for conforming to a shape of person's body or equipment when carried, the matrix of battery cells may be arranged on, and affixed to, a flexible printed circuit board. To fit within the housing of the CWB assembly, the flexible printed circuit board assembly may be configured to be folded along an axis (e.g., a center line), such that battery cell modules may be on an exterior surface of the flexible printed circuit board assembly closest to the housing, while the electrical connections may be made on an interior surface of the folded printed circuit board assembly. An electrical insulator (e.g., foam, insulating tape, etc.) may be placed between the folded sections to provide electrical insulation for the electrical contacts.

Figure 29:
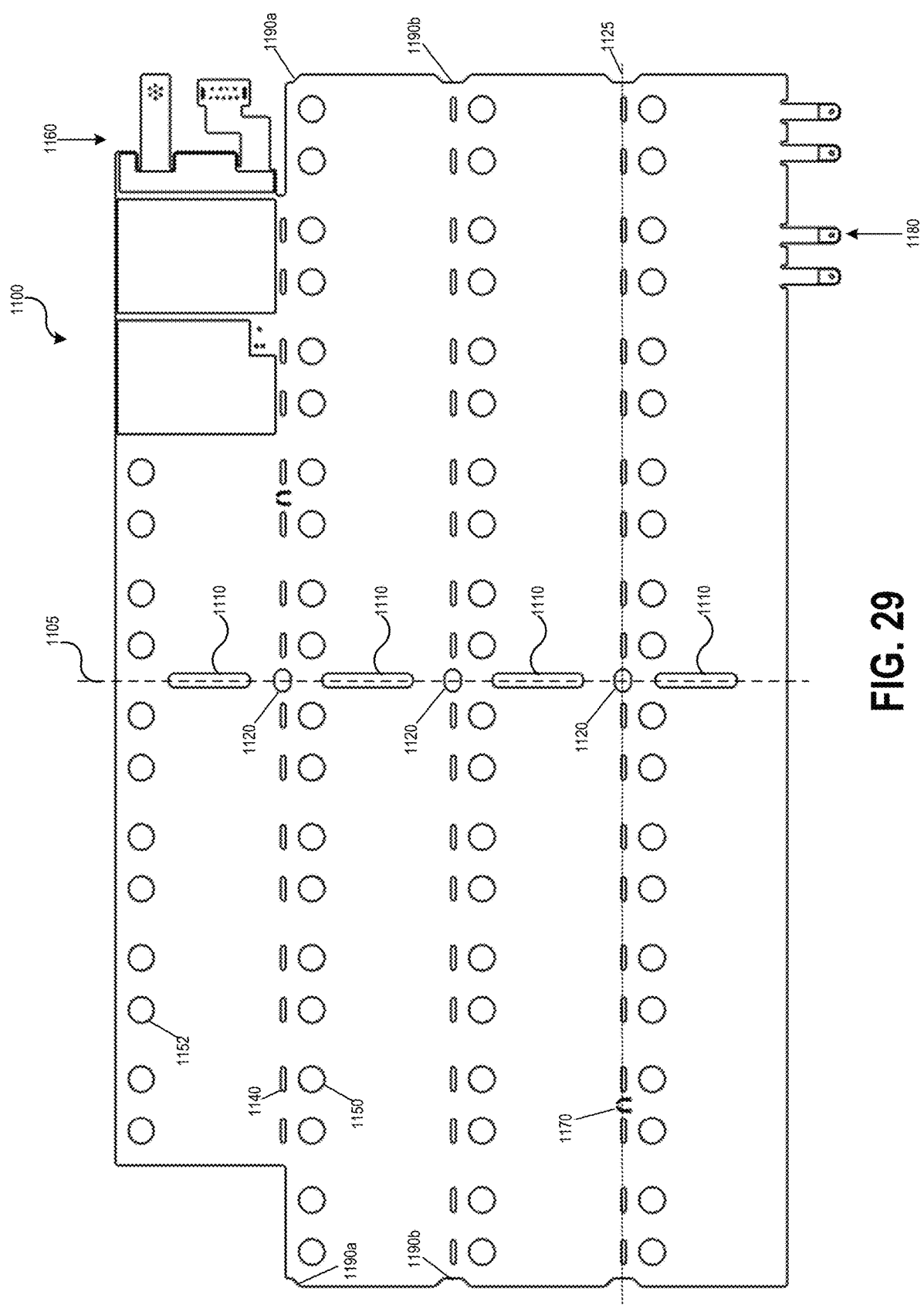
FIG. 29 shows a first view of an illustrative flexible printed circuit board for an illustrative conformal wearable battery system according to aspects of the present disclosure.

FIG. 29 shows a first view of an illustrative flexible printed circuit board (PCB) 1100 for an illustrative conformal wearable battery system according to aspects of the present disclosure. The flexible PCB may be configured to provide power and/or electrical signals from a plurality of battery cells and/or other components of a CWB. The flexible PCB 1100 may be formed of one or more layers of a flexible polymer or plastic material, such as a polyimide or other such flexible substrate. In some cases, markings showing locations of placement of battery cells may be formed through a silk-screening process, or other like method. In some cases, markings may not be present on a surface of the flexible PCBA. Electrical conductors may be included in one or more layers of the flexible PCBA. In some cases, electrical conductors may be configured as a conductive pattern (e.g., a copper overlay, a conductive ink, etc.) on the surface of the substrate of the flexible PCB 1100. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties.

The flexible PCB 1100 may be configured to bend along a bend line 1105 located at or near a center line of the flexible PCB 1100. One or more elongated cut-outs may be disposed parallel to the bend line 1105 (e.g., cut-out 1110) and/or perpendicular to the bend line 1105 (e.g., cut-out 1120), where the cut-outs perpendicular to the bend line 1105 may be aligned with a flex line 1125 perpendicular to the bend line 1105. In some cases, the flex line may correspond to a section of the flexible PCB 1100 located between rows of components (e.g., battery cells) along which the CWB may bend during use. Such cut-outs may provide additional flexibility to the flexible PCB 1100 to allow for easier formation of a 180-degree bend such as by folding the right half of the flexible PCB 1100 over the left half of the flexible PCB 1100. In the illustrative example, relief cuts, such as the cut-out 1110 may be formed as a rounded elongated rectangular cutout and the cut-out 1120, may be formed in a generally obround shape (e.g., two substantially semi-circular sections connected by a rectangular section). As mentioned, the elongated rounded rectangular cut-outs (e.g., cut-out 1110) parallel to the bend line 1105 may reduce stress on the plastic substrate when forming the about 180-degree bend. Additionally, the obround-shaped cut-outs (e.g., cut-out 1120) may reduce stresses placed on the flexible PCB substrate during use, such as by reducing stresses along a line of deformation (e.g., the flex line 1125) between battery cells. In some cases, additional cut-outs may be included to reduce stresses along the flex line, such as at an edge of the flexible PCB 1100, such as a corner notch 1190*a* located near a corner formed in the edge of the flexible PCB 1100 near a flex line and/or a notch 1190*b* located along an edge of the flexible PCB 1100 and aligned near a flex line. By reducing the bending stress at locations along the bend line, a probability of a catastrophic failure of the substrate (e.g., cracking, delamination, and the like) is reduced. While cut-out 1110 is shown as a rounded rectangular shape and the cut-out 1120 is shown as an obround shape, other shapes may be used to reduce stress due to bending and/or flexing of the flexible PCB 1100. While an obround shape is shown on the illustrative example, other cut shapes may be used to achieve a same or similar purpose. Such other shapes may include circular cuts which may be used, for example, for removing more weight, oval cuts which may provide additional stress relief, for example, based on the curves, elongated slots which, for example, may be similar to the rectangular cuts but with even more filet on corners to reduce additional stresses, a dog-bone shape (e.g., two substantially circular sections connected by a rectangular section, or the like).

The flexible PCB 1100 may also include a plurality of solder pads (e.g., pads 1150) to provide electrical connection for the cathode and anode of each battery module. For battery cells located near an edge of the flexible PCB 1100, the cathode an anode connectors may be bent over the edge of the flexible PCB 1100. For battery cells located away from the edge of the flexible PCB, a plurality of cut-outs (e.g., cut-out 1140) are located near a corresponding pad 1150 to allow for solder or weld connection of the battery cathode or anode connector to the flexible PCB 1100. Additionally, the flexible PCB 1100 may include charging connection portion 1190 that may be used to connect to one or more charging tabs on an exterior portion of a case of the conformal wearable battery enclosure and/or a flexible connector portion 1160 that may include one or more flexible connectors to connect to additional circuitry, such as a control module, a display module, or the like). The flexible PCB 1100 may also include one or more semi-circular cut-out sections 1170 to provide an area of low mechanical stress at an interior portion of the flexible PCB 1100. In some cases, an electrical component 1280, shown in FIG. 30, (e.g., a thermistor) may be physically connected to the flexible PCB 1100 in this area such that the electrical component does not receive stress loads while the CWB is flexed during use. Such stress loads, without the stress relief provided by the semi-circular cut-outs, may cause the electrical component to detach from the flexible PCB 1100.

Figure 30:
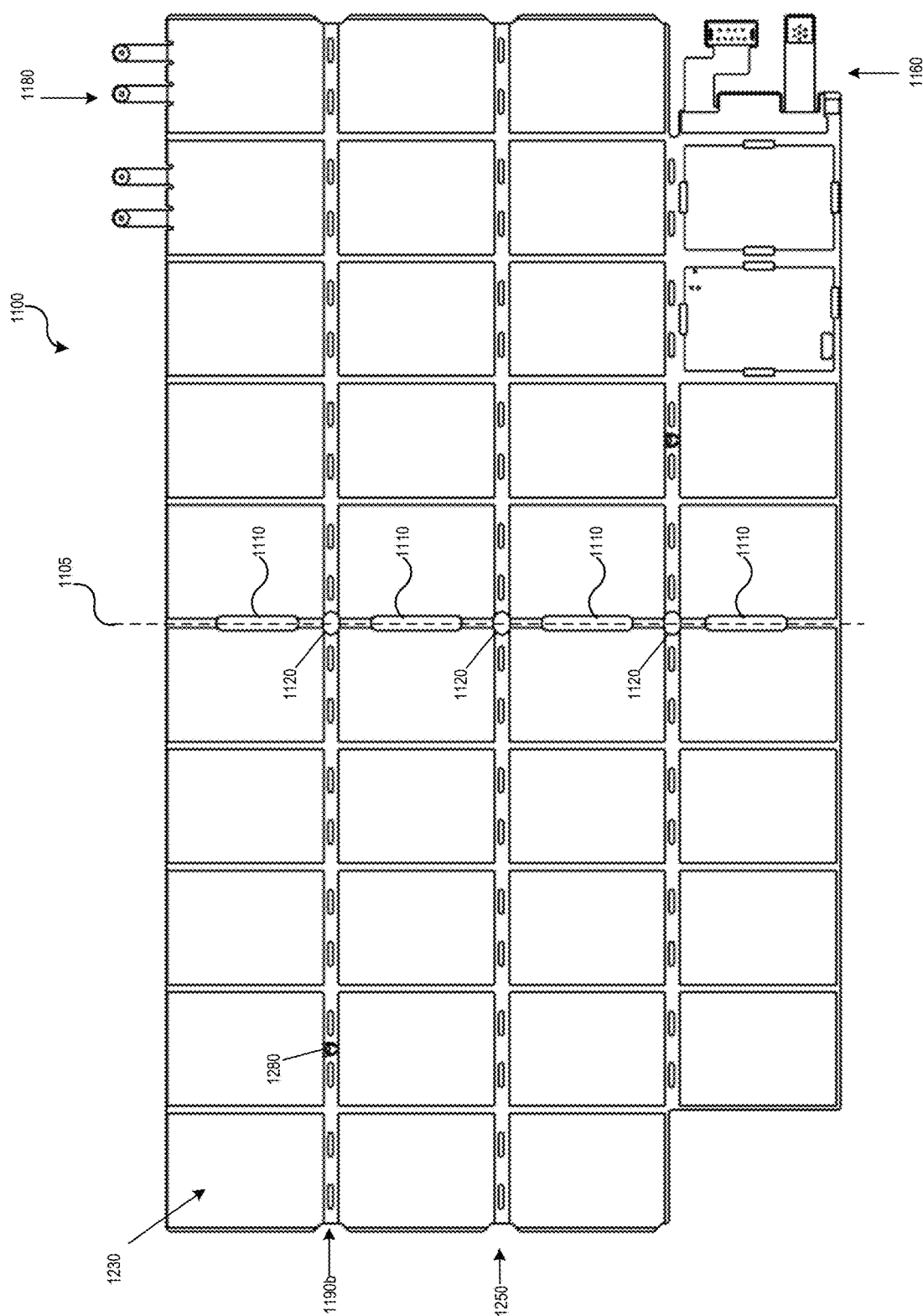
FIG. 30 shows a second view of the illustrative flexible printed circuit board for the illustrative conformal wearable battery system according to aspects of the present disclosure.

FIG. 30 shows second view of the illustrative flexible printed circuit board 1100 for the illustrative conformal wearable battery system according to aspects of the present disclosure. In some cases, connection locations for each battery cell may be marked. Additionally or alternatively battery cell connection locations may include a rigidizing material, or may be otherwise reinforced. Each battery cell location 1230 may be associated with a pair of cut-outs for the anode and cathode connections, as discussed above. Here, a battery cell module may be physically attached to the substrate of the flexible PCB 1100, such as by use of an adhesive material (e.g., glue, tape, etc.). The cathode and anode connection tabs may be inserted through a corresponding cut-out 1140 so that the connection tabs may be soldered, laser welded, or otherwise connected to the connection pad 1150 on the other side of the flexible PCB 1100.

The electrical connection cut-outs (e.g., cut-out 1140) and/or end cut outs (e.g., cut-out 1190a, 1190b) may be disposed near or offset from a flex line 250 between rows of battery cell locations 1230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 1250 allow for the CWB to be flexed within a designed range of motion, when in use. To provide stress relief along these flex lines between the rigid battery cell portions, the obround-shaped cut-outs 1120 are disposed within each flex line 1250 and may be aligned with a portion of the battery cell connection cut-outs (e.g., cut-out 1140) and the edge cut-outs 1190a, 1190b may be aligned to the flex lines 1250 and located at an edge of the flexible PCB 1100.

Figure 31:
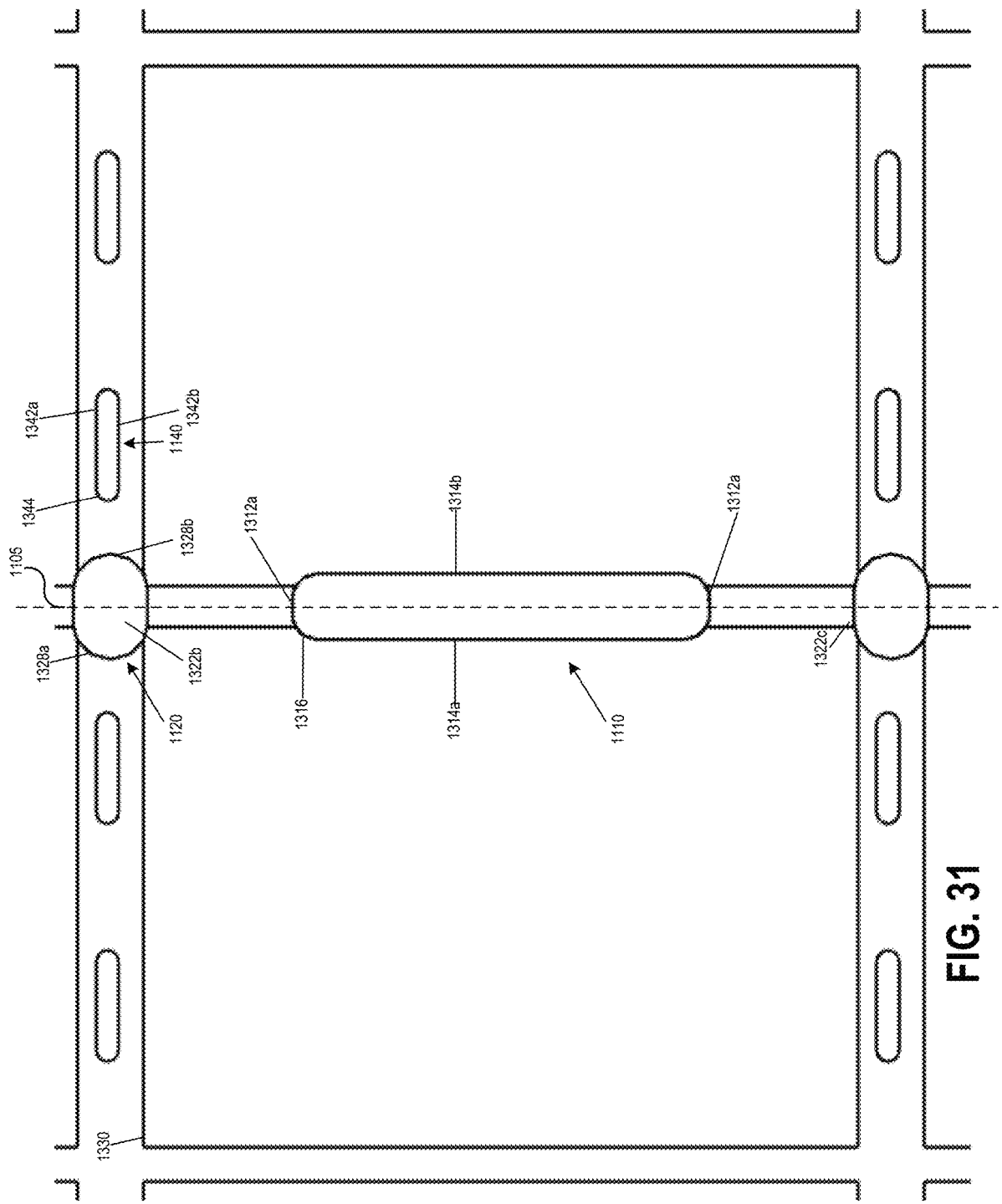
FIG. 31 shows a partial second view of the illustrative flexible printed circuit board including cut-outs providing strain relief along a center line according to aspects of the present disclosure.

FIG. 31 shows a partial second view of the illustrative flexible printed circuit board 1100 including cut-outs providing strain relief along a center line and/or along a flex line perpendicular to the center line according to aspects of the present disclosure. As discussed above, the rectangular cut-out 1110 may be disposed centered on and parallel to the bend line 1105 at the center of the flexible PCB 1100, where at least a portion of the cut-out 1110 may be disposed underneath a battery cell module when installed. In an illustrative example, a battery cell connection area 1330 may be about 50 mm in length, where the cut-out 1110 may be located near a mid-point of the battery cell connection area 1330. In an illustrative example, a first edge 1312a of the cut-out 1110 may be located at a first distance (e.g., about 11.5 mm, about 12 mm, etc.) from a first edge of the battery cell connection area 1330, the second edge 1312b of the cut-out 1110 may be located at a second distance (e.g., about 11.5 mm about 10 mm) from the second edge of the battery cell connection area 1330, and the length of the cut-out 1110 between the first edge 1312a and the second edge 1312b may be a first dimension (e.g., about 25 mm, about 28 mm, or the like). In some cases, cut-outs of a similar type may have different sizes and/or relative locations. A width of the cut-out between the left edge 1314a and the right edge 1314b may be a second dimension (e.g., about 4.5 mm), and a radius of each rounded corner 1316 may be a third dimension (e.g., about 1.1 mm). The specific distances and/or dimension are given for illustrative purposes and other distances and/or dimensions may be contemplated within the scope of this disclosure.

The illustrative obround-shaped cut-out 1120 may be formed as a rectangular area 1322b (e.g., a rectangular area of about 2.2 mm×about 5 mm) connecting two semi-circular areas 1328a and 1328b (e.g., semicircular areas having a diameter of about 5 mm). For example, the obround-shaped connector 1120 may be centered on and perpendicular to the bend line 1105. The rectangular area 1322b may larger than the distance between adjacent battery cell connection areas. Each semi-circular area 1328a and 1328b may overlap at least a portion of adjacent battery connection areas.

The illustrative battery connection cut-out 1140 may be formed as an elongated oval shape, such as an illustrative shape of about 1.5 mm high and having a distance of about 6 mm between a center point of each circular end portion (e.g., 1344) and an overall length of about 9 mm. In some cases, a second edge 1342 of the cut-out 1140 may align with a center line through the obround shaped cut-out 1120. Additionally, the obround-shaped cut-out 1120 may be located a distance (e.g., about 4 mm) from the battery connection cut-out 1140.

Figure 32:
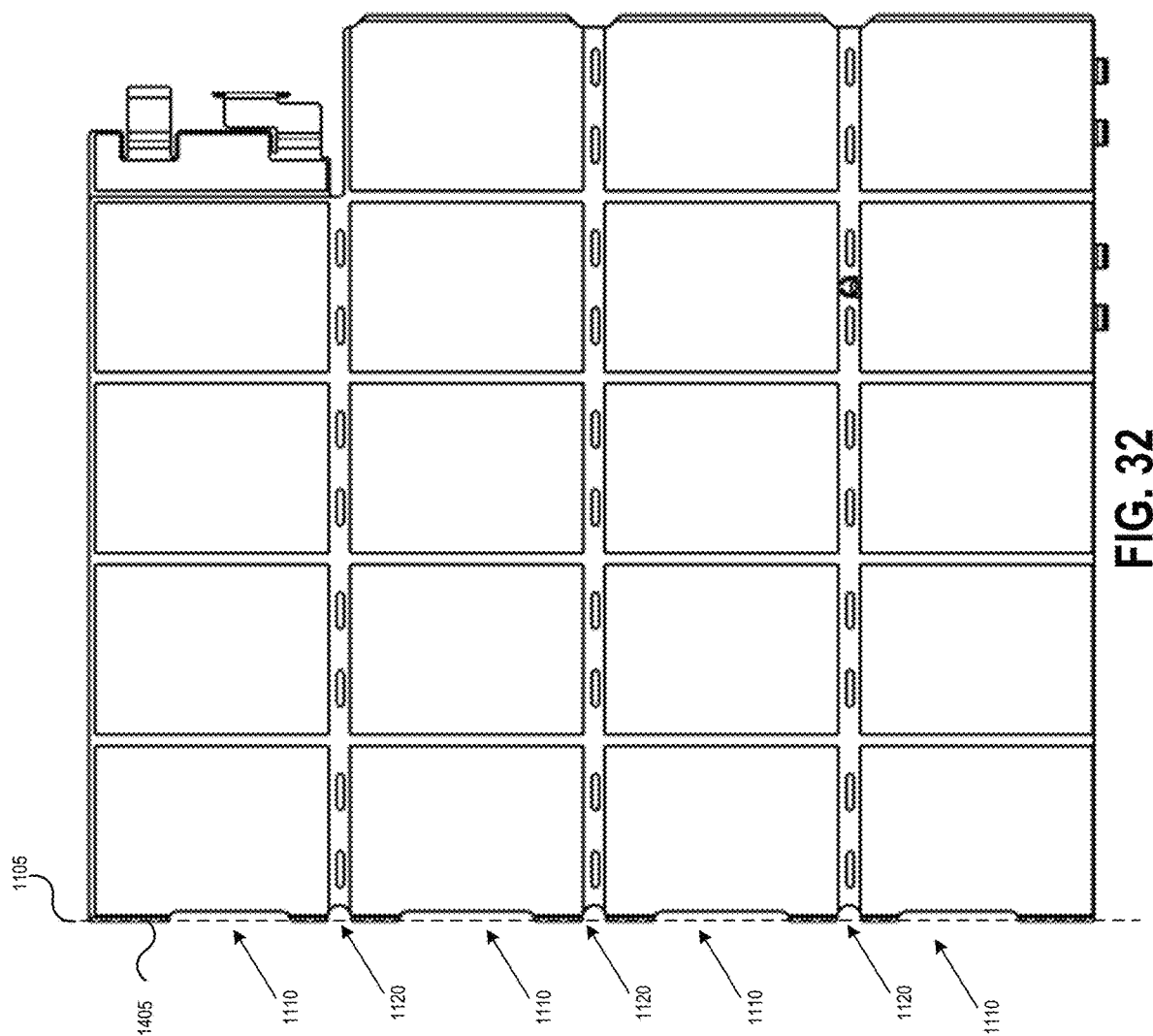
FIG. 32 shows a first view of the illustrative flexible printed circuit board folded along the center line according to aspects of the present disclosure.
Figure 33:
FIGS. 33 and 34 show a partial side view of the flexible printed circuit board when folded along the center line according to aspects of the present disclosure.
Figure 34:
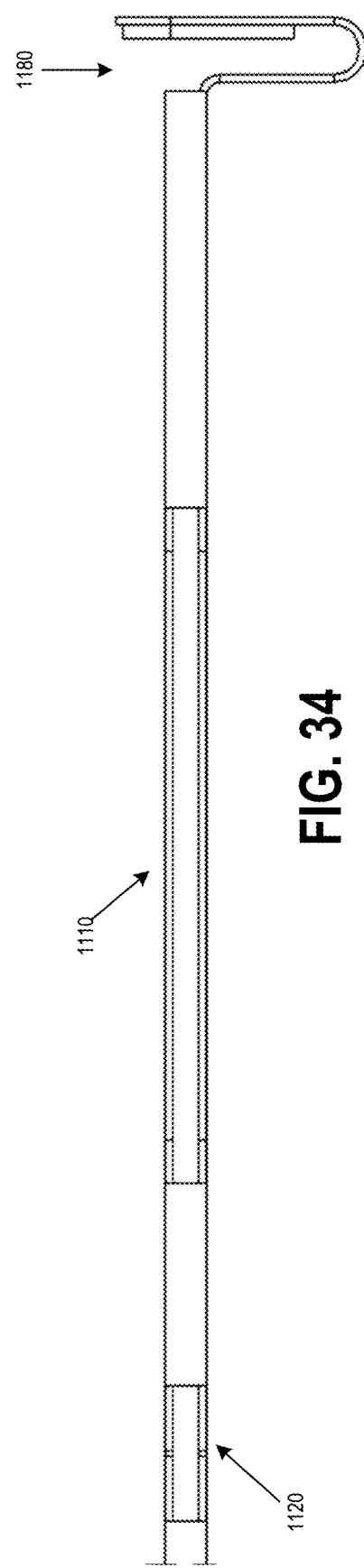
Figure 35:
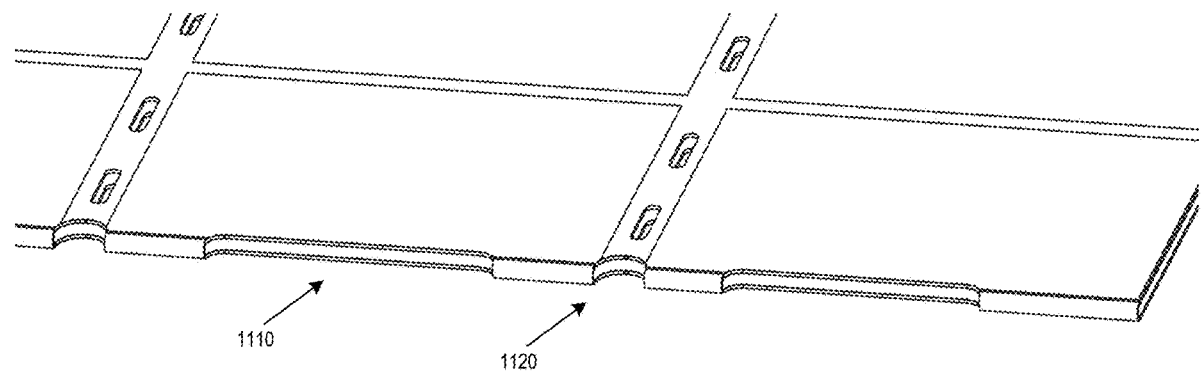
FIGS. 35 and 36 show partial views of the flexible printed circuit board when folded along the center line according to aspects of the present disclosure.
Figure 36:
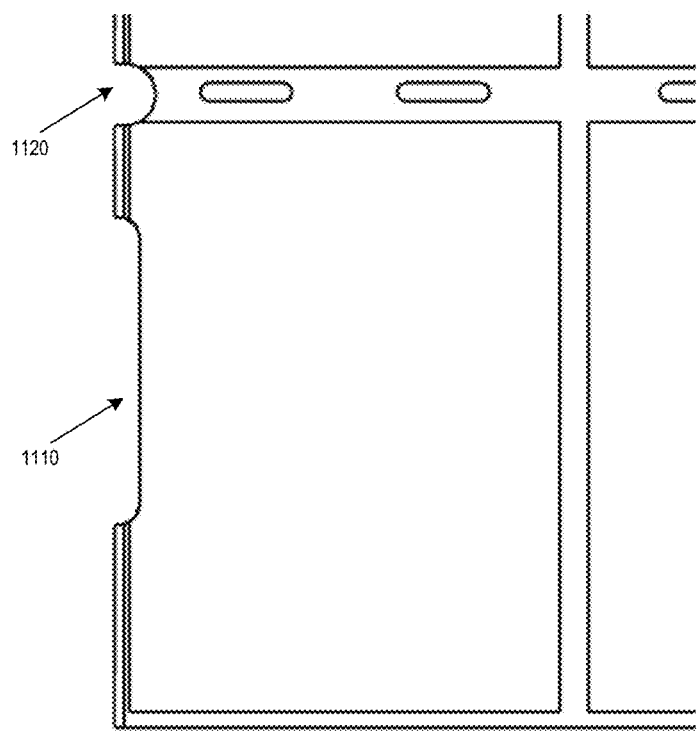

FIG. 32 shows a first view of the illustrative flexible printed circuit board 1100 folded along the bend line 1105 according to aspects of the present disclosure. For example, a 180-degree bend 1405 may be formed along the bend line 1105, such as when a left half of the flexible printed circuit board 1100 is folded over a right half of the flexible printed circuit board 1100 such that the battery modules are located on the exterior portion of the folded flexible printed circuit board 1100 and the electrical connections for the battery modules are disposed on an interior portion of the folded flexible printed circuit board 1100. FIGS. 33, 34, 35, and 36 show a partial side view of a magnified view of the flexible printed circuit board 1100 when folded along the bend line 1105 according to aspects of the present disclosure. As can be seen, a diameter of the bend 1405 corresponds the length of the rectangular portion of the obround-shaped cut-out 1120. In the illustrative example, the diameter of the bend 1405 is about 2.25 mm.

Figure 37A:
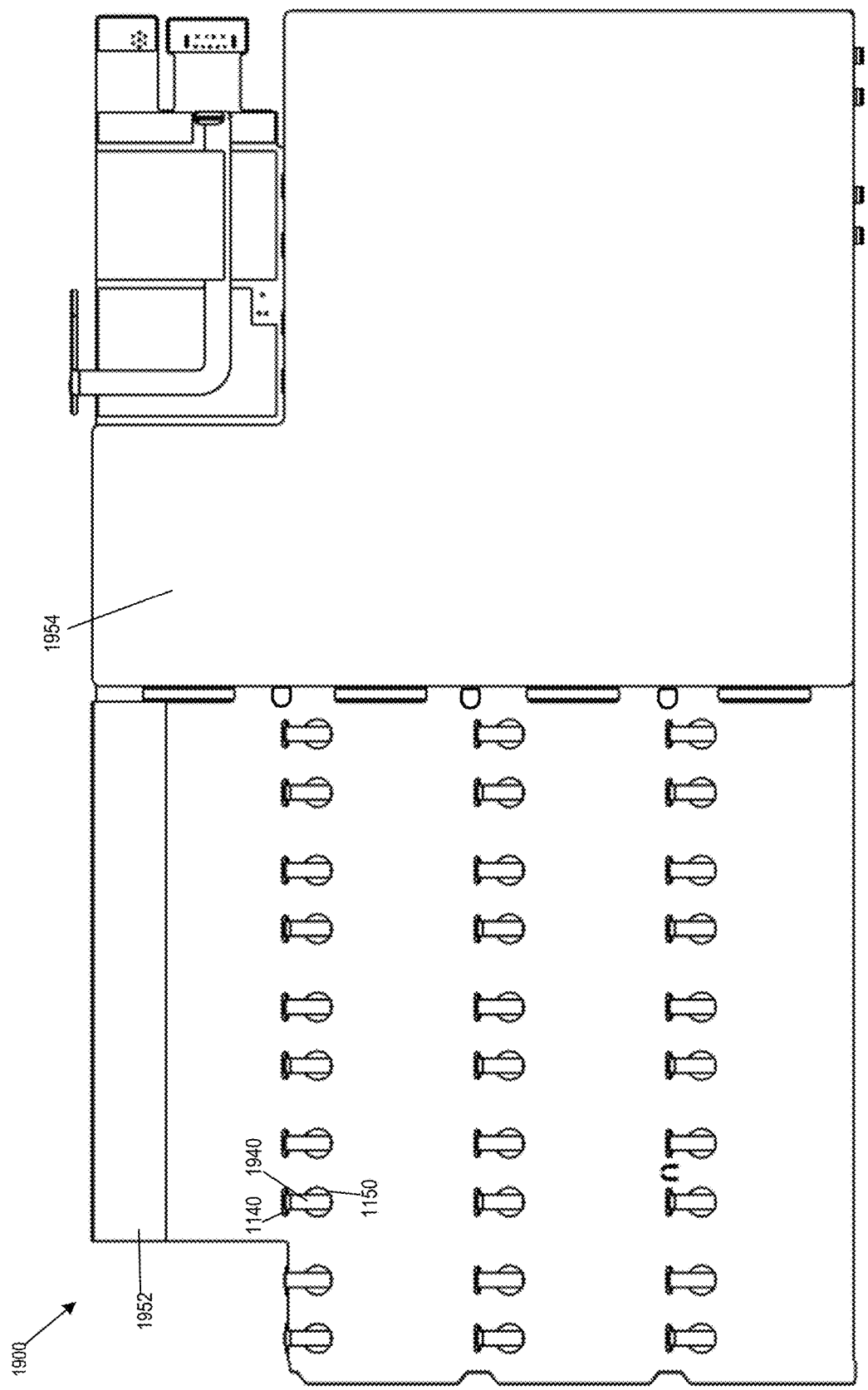
FIGS. 37A and 37B show first views of a flexible printed circuit board assembly before folding along the center line according to aspects of the present disclosure.
Figure 37B:
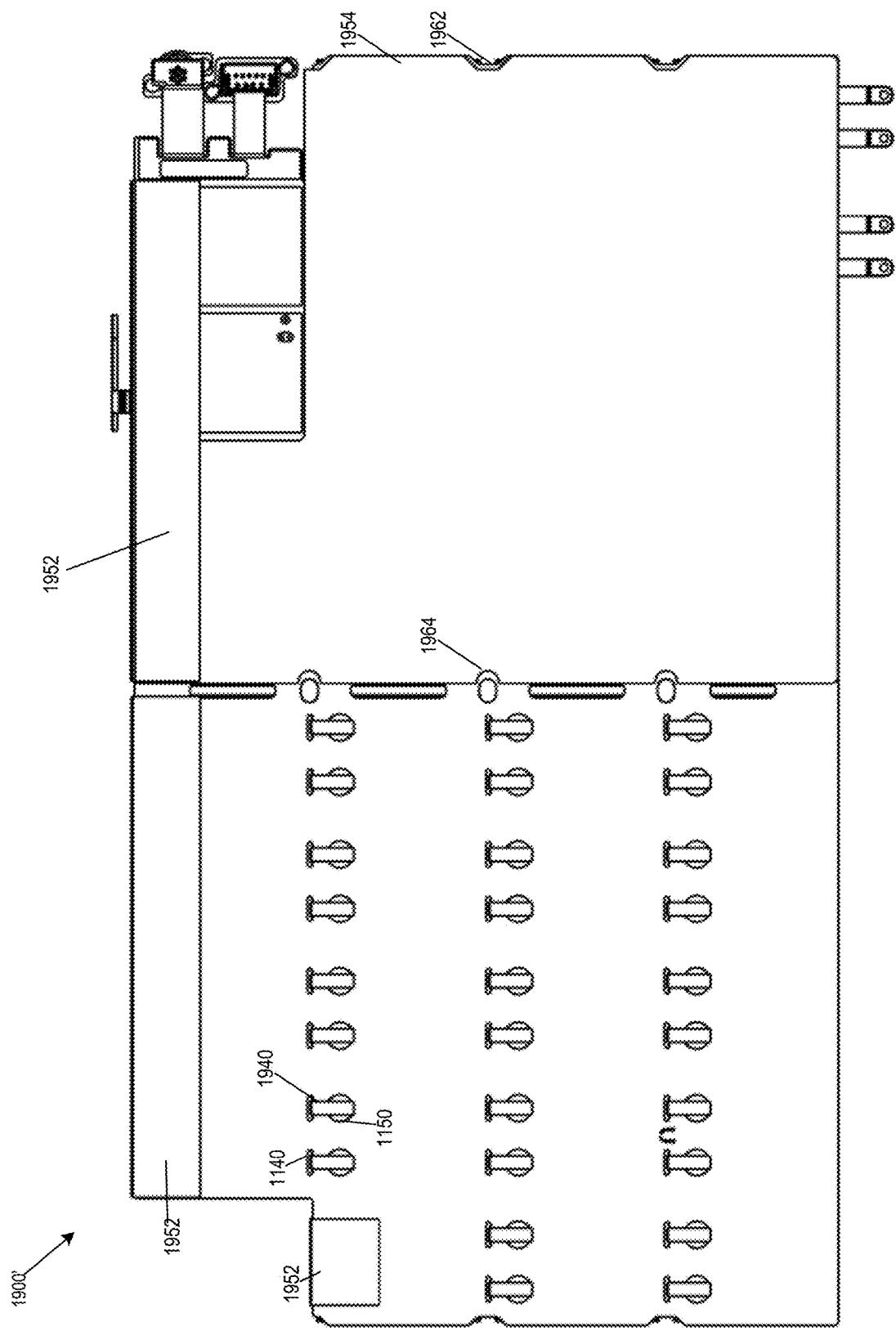

FIGS. 37A and 37B show first views of a flexible printed circuit board assembly (PCBA) 1900 and 1900' before folding along the bend line according to aspects of the present disclosure. As can be seen, cathode tabs and anode tabs extend from corresponding battery cell modules through a cut-out 1140 so that each tab 1940 may be soldered, welded, or otherwise connected to the electrical connection pad 1150 forming an electrical connection for each battery cell. To protect against short circuits and/or to provide additional protection and/or structural integrity for the CWB, while maintaining flexibility, an insulating material 1954 (e.g., a polymeric material, a foam, etc.), may be placed over a first half of the flexible PCBA 1900 before folding and/or a second insulating material 1952 may be placed over one or more of the tabs 1940 that may be bent around an edge of the flexible PCBA 1900. In some cases, the first insulating material 1954 may include a plurality of cut-outs (e.g., cut-out 1964, cut-out 1962) that may align with similar cut-outs on the flexible PCBA 1900' (e.g., cut-out 1190a, cut-out 1190b, cut-out 1120, etc.). The first insulating material may have a cut-out section such that a portion of the first insulating material 1954 may not overlap areas of the flexible PCBA 1900' corresponding to an electrical circuit and/or a connector. In some cases, the second insulating material 1952 may be a flexible material, a semi-flexible material electrically insulating material that may be bent around an edge of the flexible PCBA 1900 or 1900' such that at least an edge or another portion of the second insulating material is adjacent an opposite side of the flexible PCBA 1900. The first insulating material 1954 may be the same material or a different material than the second insulating material 1952.

Figure 38A:
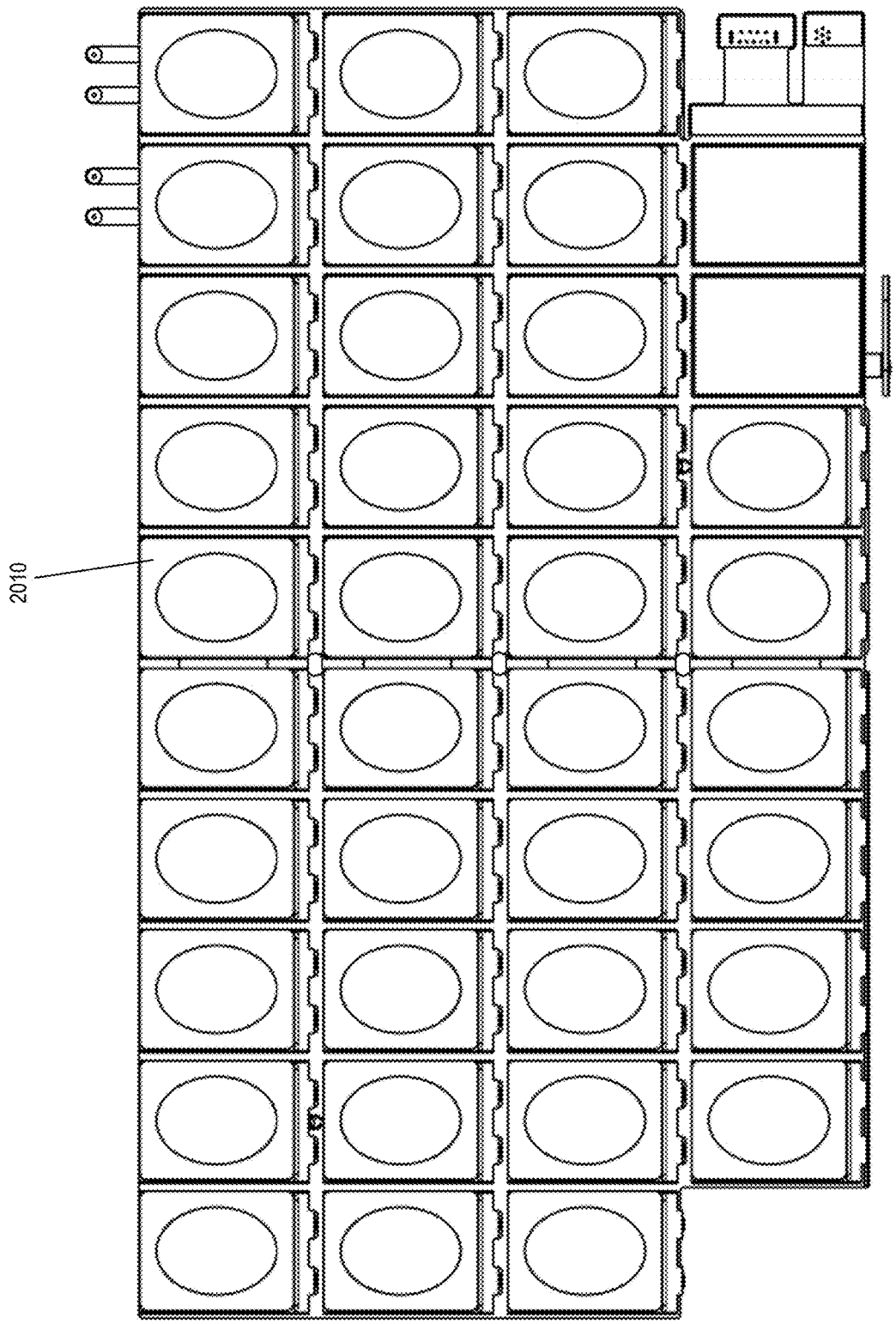
FIGS. 38A and 38B show second views of the flexible printed circuit board assembly before folding along the center line according to aspects of the present disclosure.
Figure 38B:
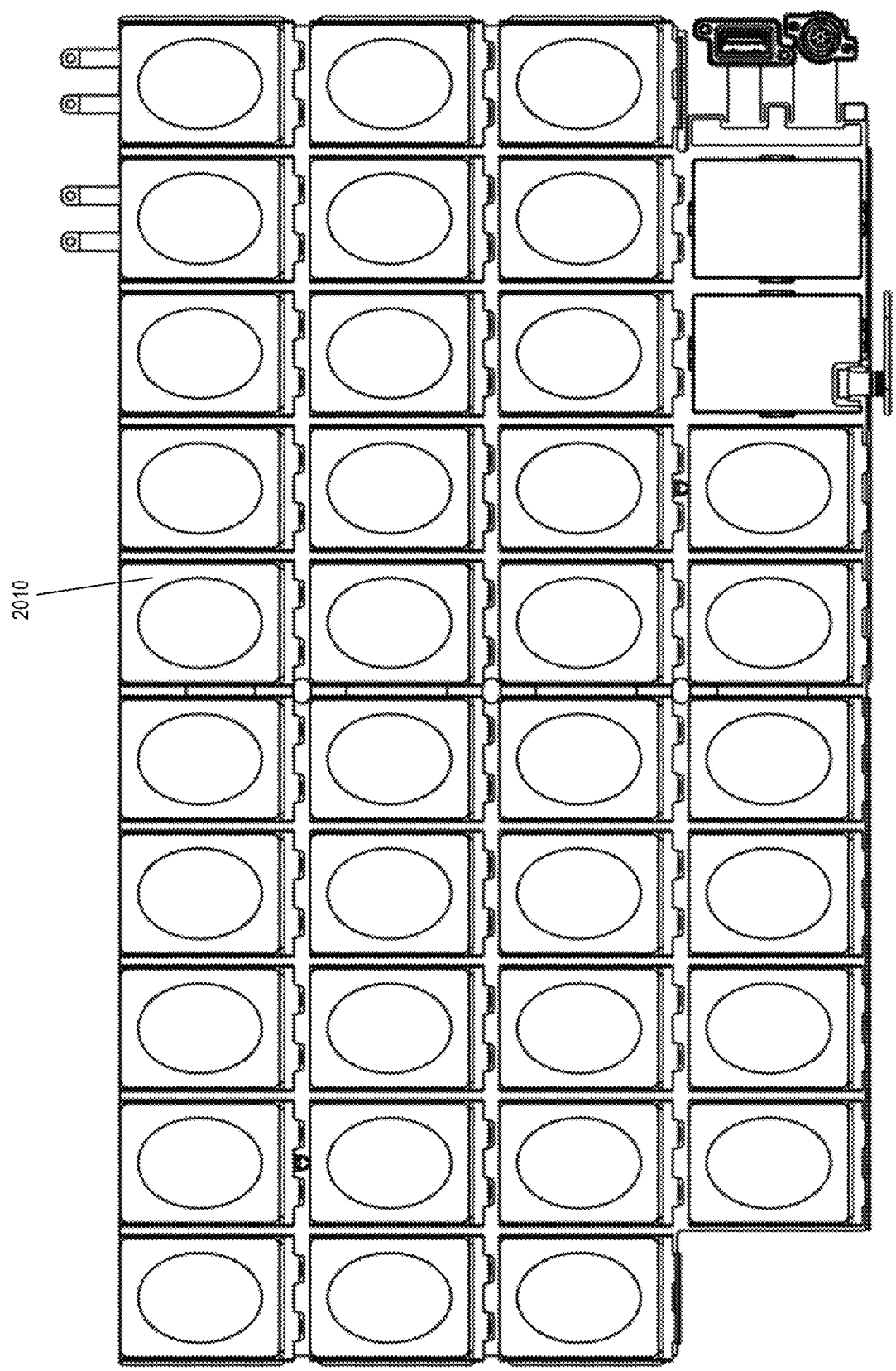
Figure 39:
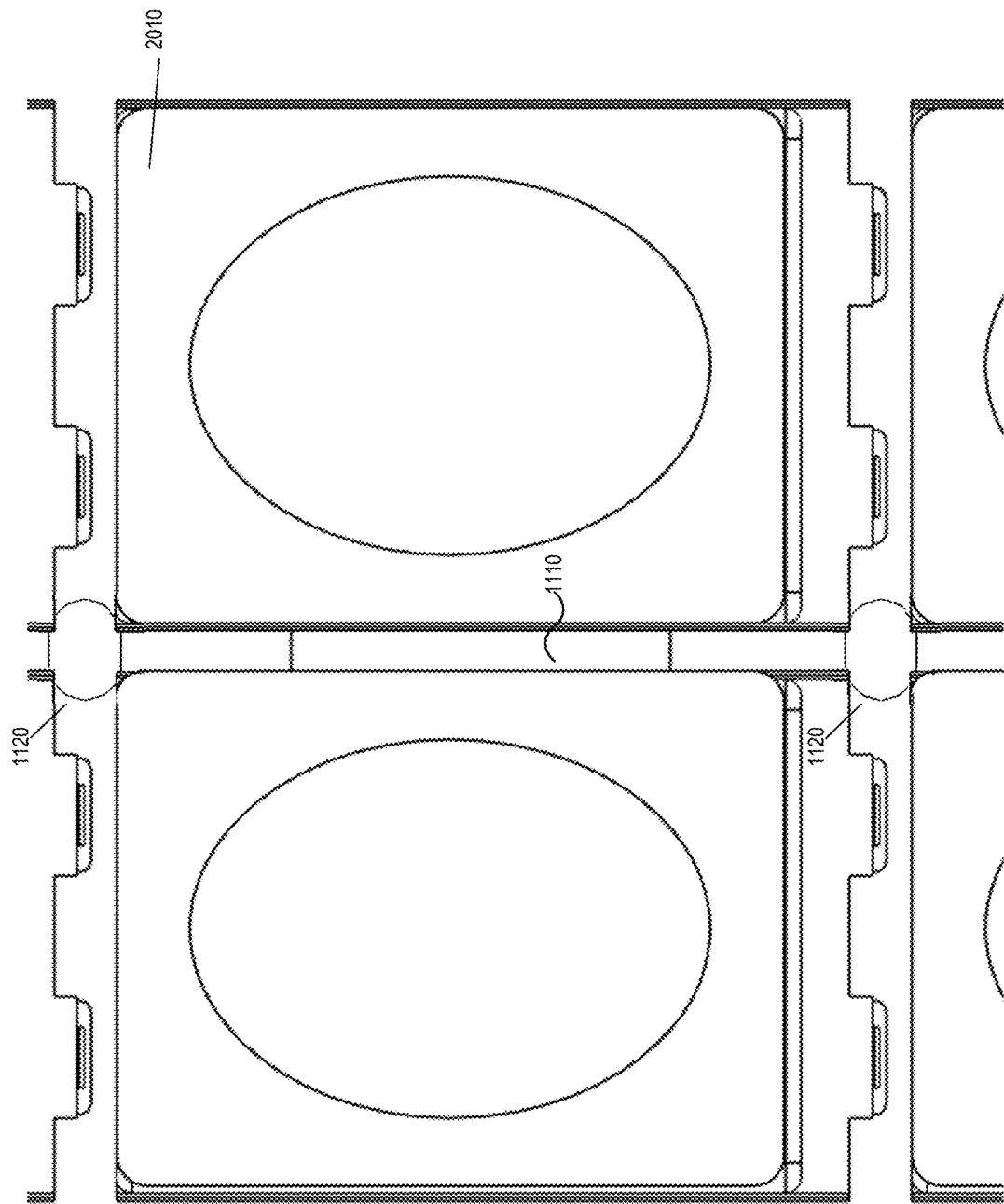
FIG. 39 shows a partial first view of the flexible printed circuit board assembly according to aspects of the present disclosure.
Figure 40:
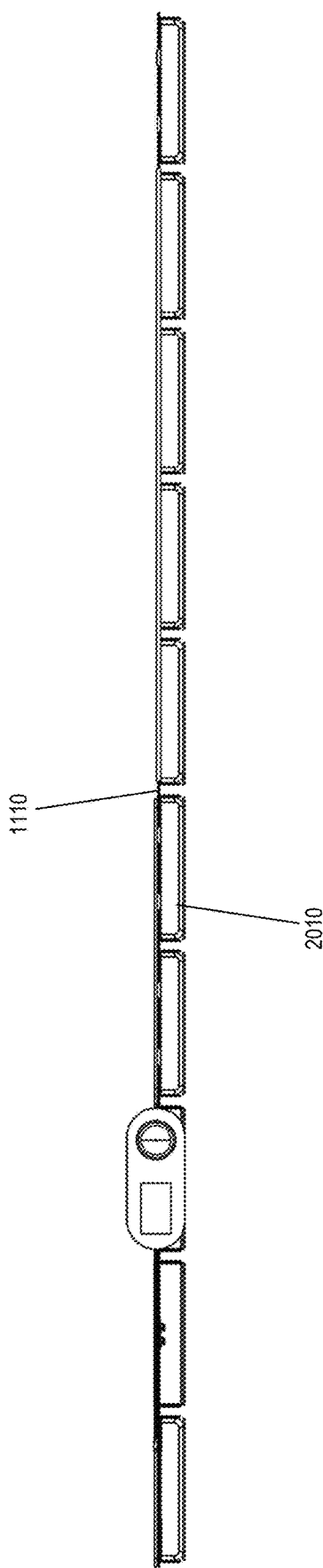
FIG. 40 shows a side view of the flexible printed circuit board assembly before folding along the center line according to aspects of the disclosure.
Figure 41:
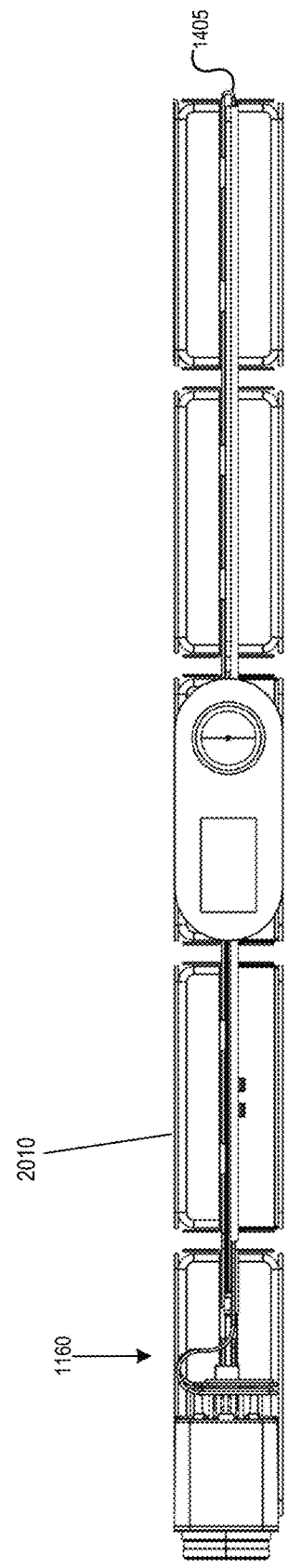
FIG. 41 shows a side view of the flexible printed circuit board assembly after folding along the center line according to aspects of the disclosure.
Figure 42A:
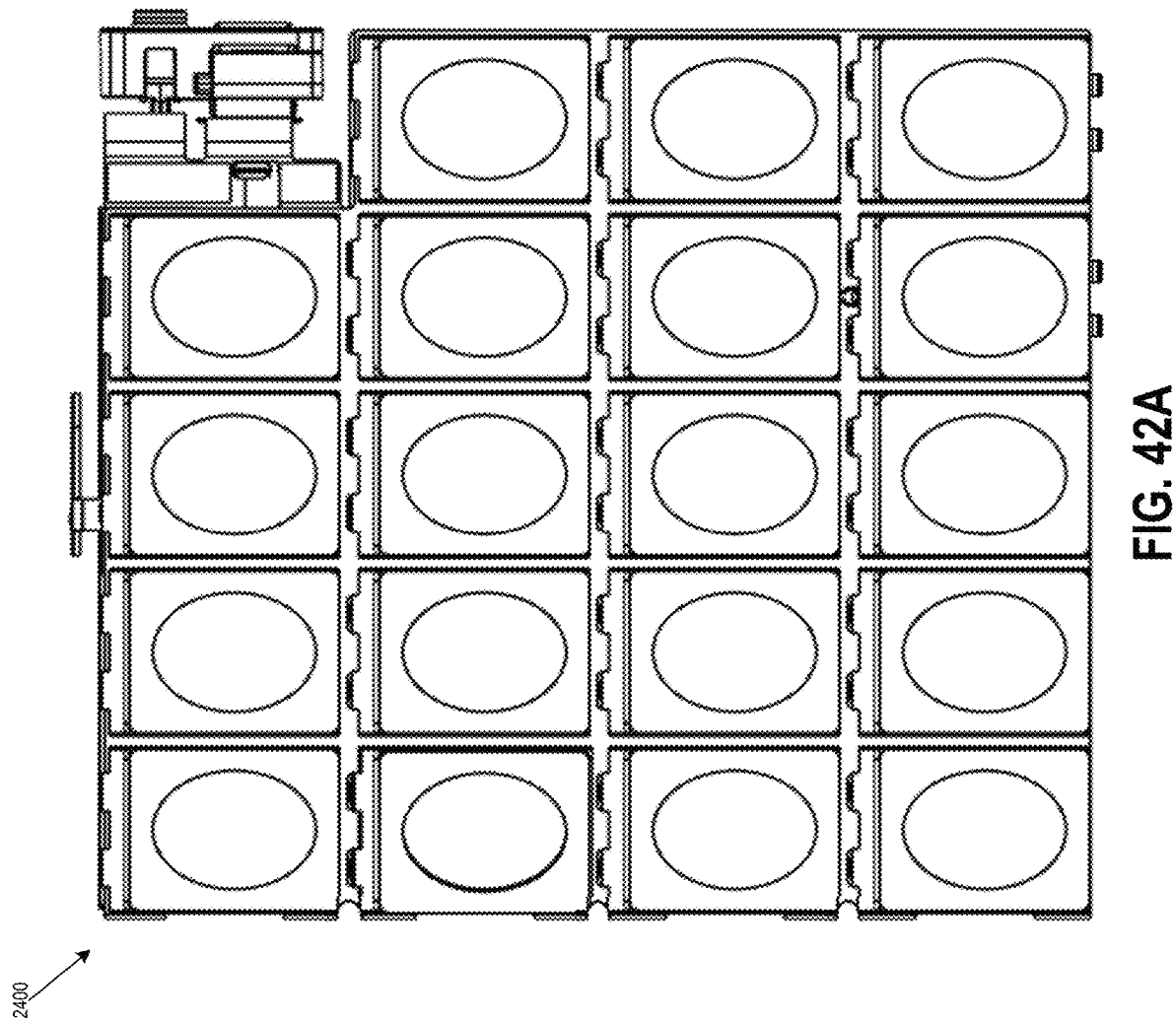
FIGS. 42A and 42B show first views of the flexible printed circuit board assembly after folding along the center line according to aspects of the disclosure.
Figure 42B:
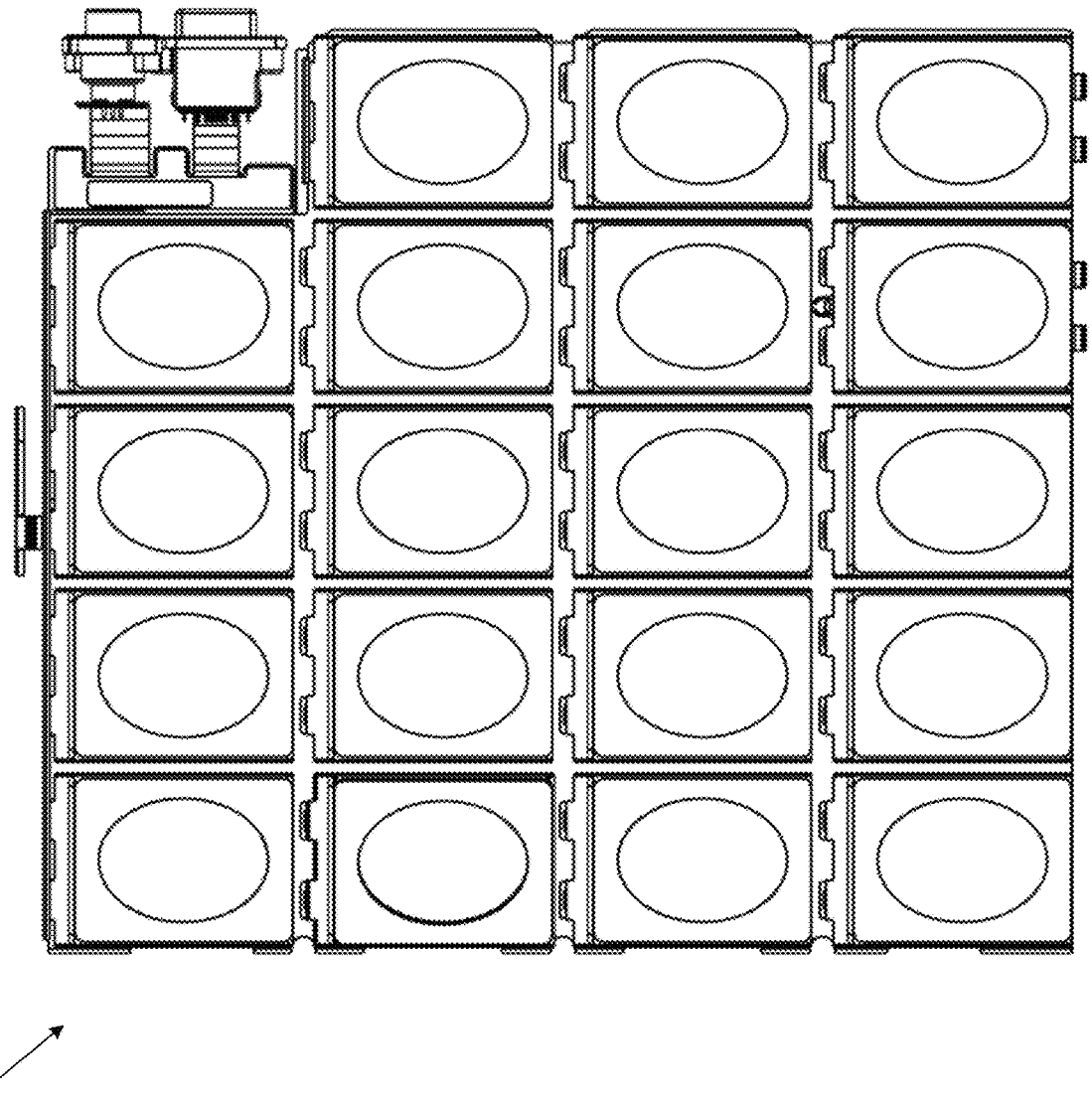

FIGS. 38A and 38B show second views of the flexible printed circuit board assembly 1900, 1900' before folding along the bend line according to aspects of the present disclosure. Here an array of battery cells 2010 may be physically and electrically attached to the flexible PCBA 1900 and flexible PCBA 1900'. FIG. 39 shows a partial first view of the flexible printed circuit board assembly showing the location of the cut-out 1110 and the cut-out 1120 with respect to battery cell modules 2010, when installed. FIG. 40 shows a side view of the flexible PCBA 1900 before folding along the bend line according to aspects of the disclosure and FIG. 41 shows a side view of the flexible PCBA 1900 after folding along the center line according to aspects of the disclosure. FIGS. 42A and 42B show first views of the flexible printed circuit board assembly 2400 and 2450 after folding along the bend line according to aspects of the disclosure.

Figure 43:
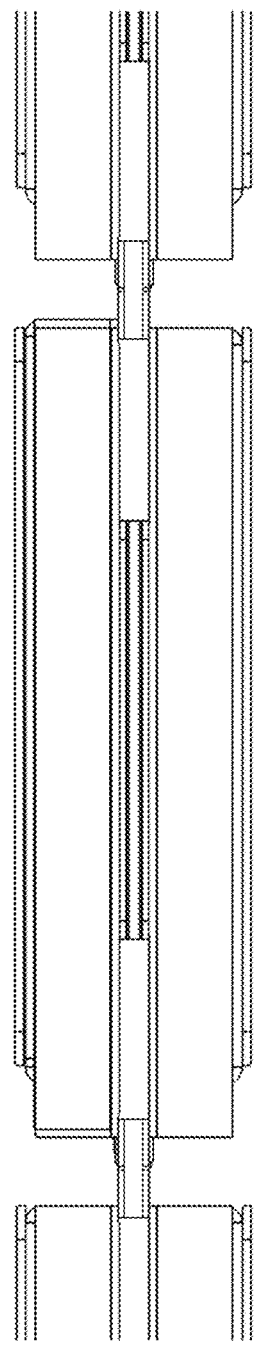
FIG. 43 shows a partial side view of the flexible printed circuit board assembly after folding along the center line according to aspects of the disclosure.
Figure 44:
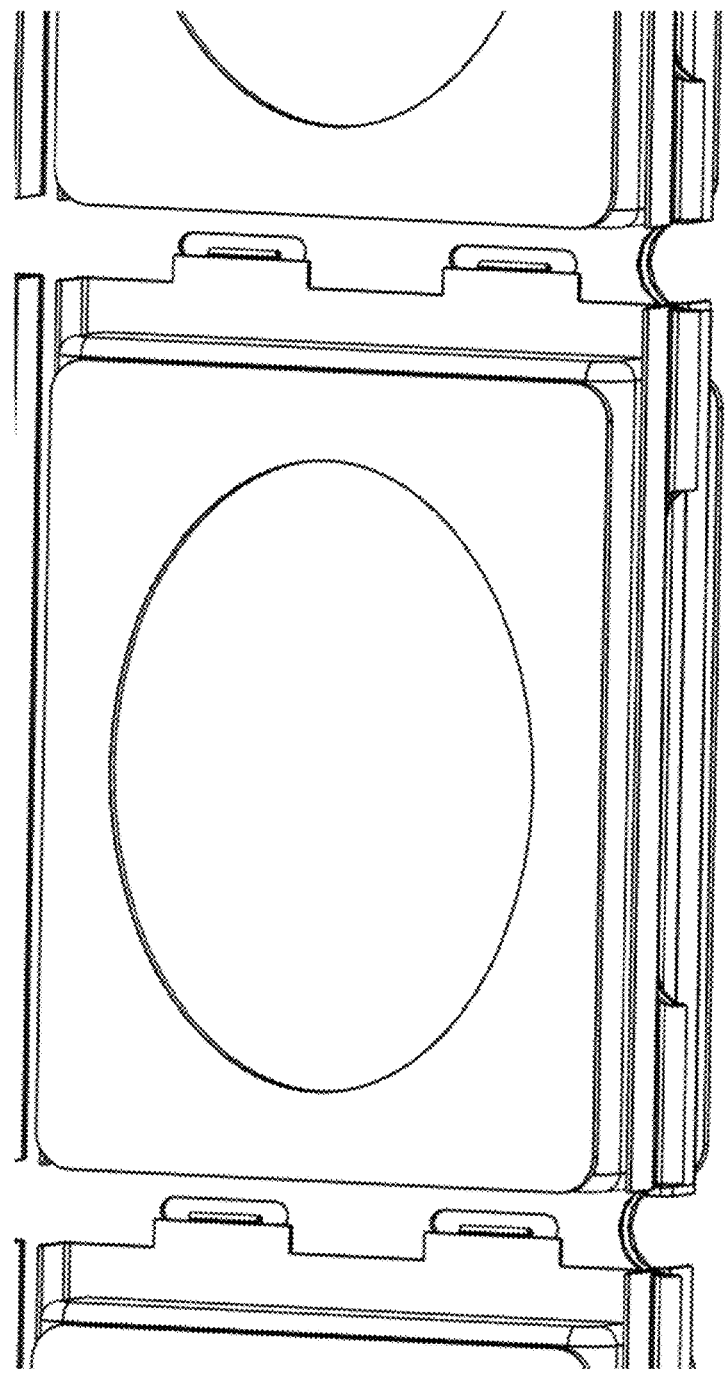
FIG. 44 shows a partial first view of the flexible printed circuit board assembly after folding along the center line according to aspects of the disclosure.

FIG. 43 shows a partial side view of the flexible PCBA 1900' after folding along the bend line and FIG. 44 shows a partial first view of the flexible PCBA 1900' after folding along the bend line according to aspects of the disclosure.

Figure 45:
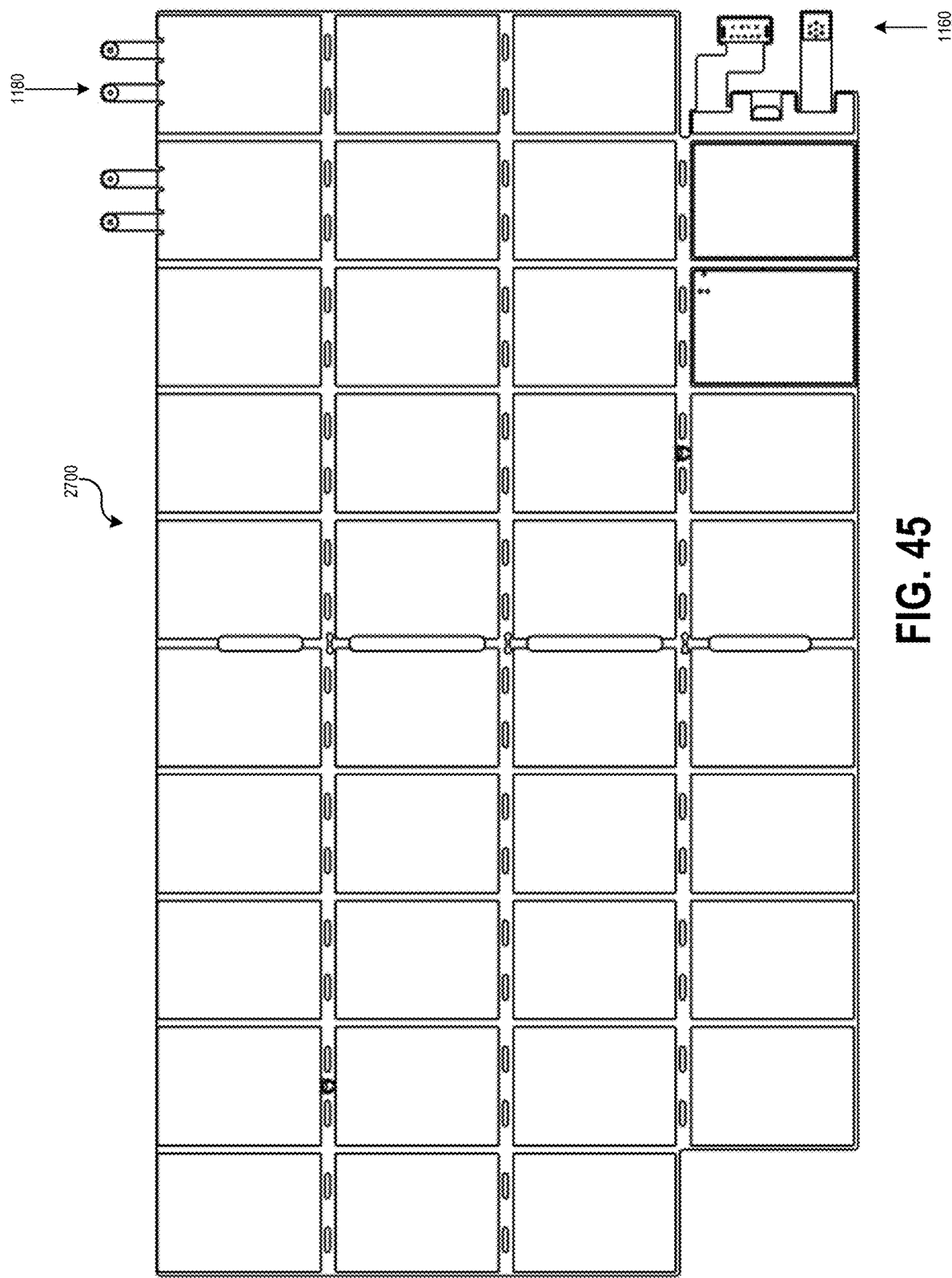
FIG. 45 shows a view of another flexible printed circuit board for an illustrative conformal wearable battery system according to aspects of the present disclosure.

FIG. 45 shows a view of another flexible printed circuit board 1700 for an illustrative conformal wearable battery system according to aspects of the present disclosure, where the configuration of the flexible PCB 1700 is similar to that of the flexible PCB 1100, where differences are primarily noted in a configuration of the charging connection portion 1180 and the flexible connector portion 1160. FIG. 46A shows a folded configuration of the flexible printed circuit board of FIG. 45 according to aspects of the present disclosure. FIG. 46B shows a view of the illustrative flexible connection portion 1160 in a folded configuration and FIG. 46C shows a view of the illustrative charging connection portion 1180 of the flexible printed circuit board 2700 according to aspects of the present disclosure.

Figure 46D:
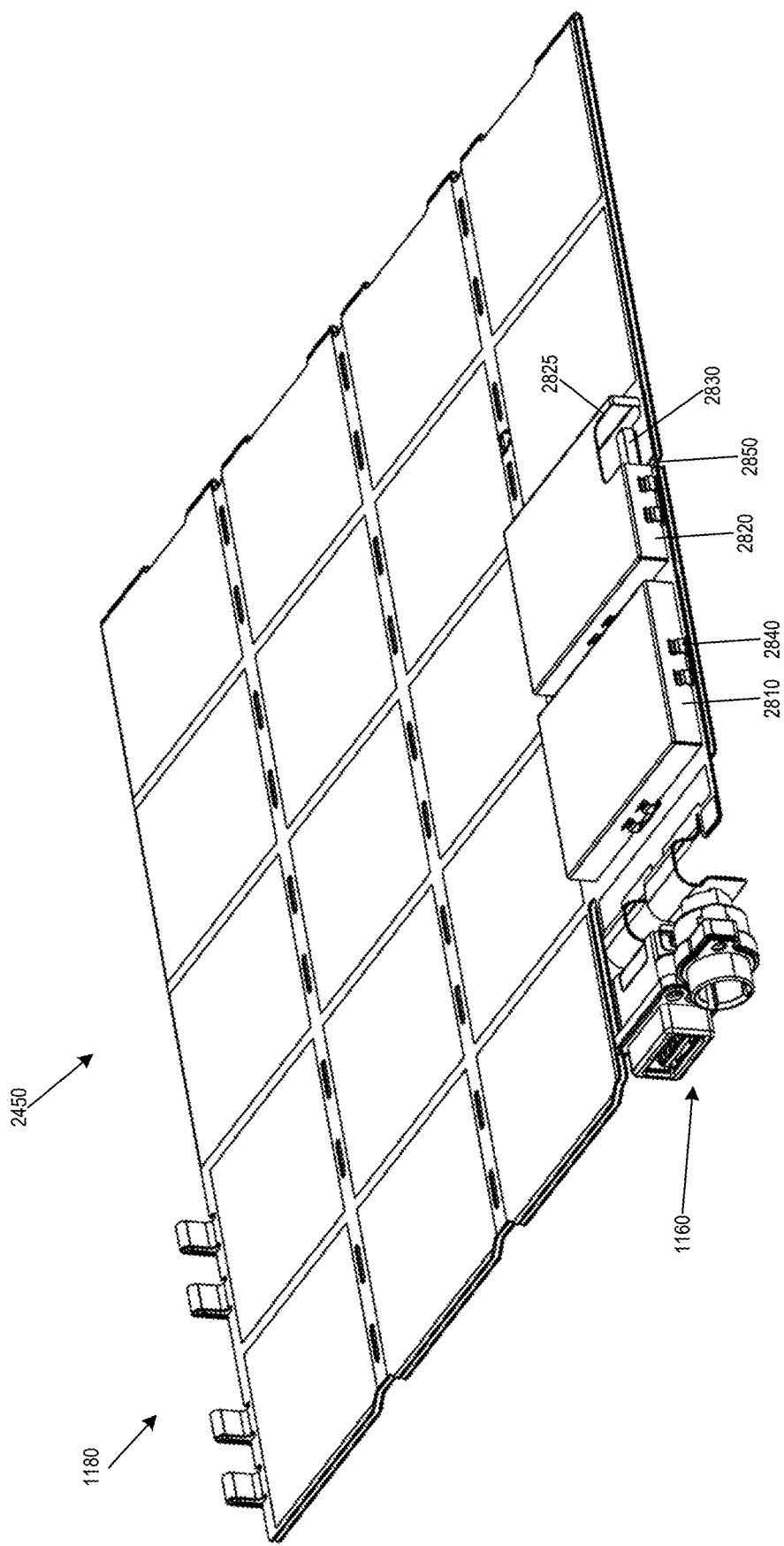
FIG. 46D shows a view of the illustrative flexible printed circuit board of FIG. 42B according to aspects of the disclosure.

The flexible PCB 1100 with the rectangular and/or circular cuts may allow for an improved manufacturable bend along the bend axis 1105. In addition, the flexible PCB 1100 allows for an improved configuration for the connection of a plurality of cells (e.g., 36 cells) in as flat a pattern as possible and within a minimized area, while maintaining flexibility. Generally, printed circuit boards such as the flexible PCB 1100 are not useful for other battery packs, particularly if the other battery pack does not have to be flexible. A main advantage to the disclosed flexible PCB 1100 is that the flexible PCB 1100 allows for easy connection of each cell, both physically and electrically to the flexible PCB 1100, while allowing a finished product incorporating the flexible PCB 1100 (e.g., a conformal wearable battery) to meet or exceed flexibility requirements defined for the conformal wearable battery. FIG. 46D shows a view of the illustrative flexible printed circuit board of FIG. 42B according to aspects of the disclosure. The flexible printed circuit board assembly 2450 may include one or more circuit protection components (e.g., circuit enclosure 2810, circuit enclosure 2820) that may be used to enclose electrical circuit components of the CWB. The circuit enclosure 2810 and the circuit enclosure 2820 may be constructed of a rigid or semi-rigid material capable of providing mechanical protection to the electrical circuit components. Additionally, the circuit enclosure 2810 and/or the circuit enclosure 2820 may be constructed of an electrically conductive material (e.g. aluminum, steel, copper, a conductive polymeric material, a foil covered plastic, etc.) that may provide electromagnetic interference (EMI) protection for the CWB. Each of the circuit enclosure 2810 and/or the circuit enclosure 2820 may be physically and/or electrically connected to the flexible PCBA 2450. For example, one or more clips may be used to mechanically attach one or both of the circuit enclosure 2810, 2820 to the flexible PCBA 2450. In some cases, one or more or the clips may be an EMI clip 2840 made of a conductive material that may additionally facilitate an electrical connection between the circuit enclosure 2810, 2820 to an electrical ground (e.g., a ground plane) of the flexible PCBA 2450. In some cases, at least one EMI clip 2840 may be positioned on each side of the connected circuit enclosure 2810, 2820. In some cases, a circuit enclosure (e.g., circuit enclosure 2820) may include a cut-out portion 2830 to facilitate an electrical connection from an electrical connector on the flexible PCBA 2450 to an additional component of the CWB, such as an input/output module (e.g., a display module) capable of providing status information from a controller of the CWB to a user of the CWB. In some cases, the circuit enclosure 2810, 2820 may be of a similar size and/or shape (e.g., similar dimensions) to that of a battery cell.

Figure 47A:
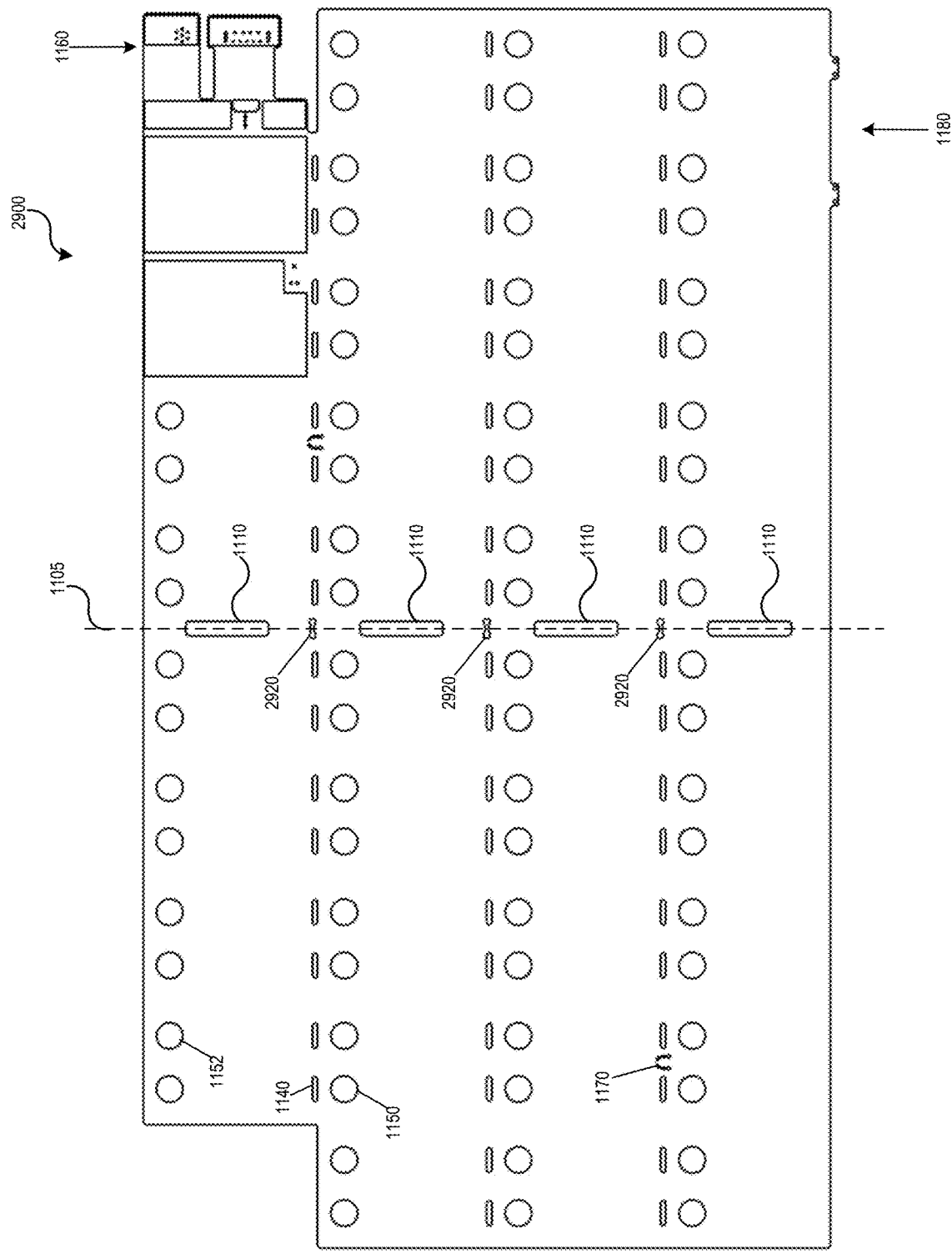
FIGS. 47A-47D show illustrative views of a second design of an illustrative flexible printed circuit board assembly according to aspects of the disclosure.

FIGS. 47A-47D show illustrative views of an illustrative flexible PCB 2900 according to aspects of the disclosure. FIG. 47A shows a first view of an illustrative flexible printed circuit board (PCB) 2900 for an illustrative conformal wearable battery system according to aspects of the present disclosure. The flexible PCB 2900 may be configured to provide power and/or electrical signals from a plurality of battery cells and/or other components of a CWB. The flexible PCB 2900 may be formed of one or more layers of a flexible polymer or plastic material, such as a polyimide or other such flexible substrate. In some cases, markings showing locations of placement of battery cells may be formed on a surface of the flexible PCB, such as through a silk-screening process, or other like method. Electrical conductors may be included in one or more layers of the flexible PCBA. In some cases, no markings showing battery placement may be present. In some cases, electrical conductors may be configured as a conductive pattern (e.g., a copper overlay, a conductive ink, etc.) on the surface of the substrate of the flexible PCB 2900. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an Electroless nickel immersion gold (ENIG) finish, a lead-free immersion silver finish or other substances with improved conductive properties.

The flexible PCB 2900 may be configured to bend along a bend line 1105 located at or near a center line of the flexible PCB 2900. One or more elongated cut-outs may be disposed parallel to the bend line 1105 (e.g., cut-out 1110) and/or perpendicular to the bend line 1105 (e.g., cut-out 2920). Such cut-outs may provide additional flexibility to the flexible PCB 2900 to allow for easier formation of a 180-degree bend such as by folding the right half of the flexible PCB 2900 over the left half of the flexible PCB 2900. In the illustrative example, relief cuts, such as the cut-out 1110 may be formed as a rounded elongated rectangular cutout and the cut-out 2920, may be formed in a "dog bone" shape (e.g., two substantially circular sections connected by a rectangular section). As mentioned, the elongated rounded rectangular cut-outs (e.g., cut-out 1110) parallel to the bend line 1105 may reduce stress on the plastic substrate when forming the about 180-degree bend. Additionally, the dog bone-shaped cut-outs (e.g., cut-out 2920) may reduce stresses placed on the flexible PCB substrate during use, such as by reducing stresses along a line of deformation between battery cells. By reducing the bending stress at locations along the bend line, a probability of a catastrophic failure of the substrate (e.g., cracking, delamination, and the like) is reduced. While cut-out 1110 is shown as a rounded rectangular shape and the cut-out 2920 is shown as a dog bone shape, other shapes may be used to reduce stress due to bending and/or flexing of the flexible PCB 2900. While a dog bone shape is shown on the illustrative example, other cut shapes may be used to achieve a same or similar purpose. Such other shapes may include circular cuts which may be used, for example, for removing more weight, ovular cuts which may provide additional stress relief, for example, based on the curves, elongated slots, which, for example, may be similar to the rectangular cuts but with even more filet on corners to reduce additional stresses, or the like.

The flexible PCB 2900 may also include a plurality of solder pads (e.g., pads 1150) to provide electrical connection for the cathode and anode of each battery module. For battery cells located near an edge of the flexible PCB 2900, the cathode an anode connectors may be bent over the edge of the flexible PCB 2900. For battery cells located away from the edge of the flexible PCB, a plurality of cut-outs (e.g., cut-out 1140) are located near a corresponding pad 1150 to allow for solder or weld connection of the battery cathode or anode connector to the flexible PCB 2900. Additionally, the flexible PCB 2900 may include charging connection portion 1180 that may be used to connect to one or more charging tabs on an exterior portion of a case of the conformal wearable battery enclosure and/or a flexible connector portion 1160 that may include one or more flexible connectors to connect to additional circuitry, such as a control module, a display module, or the like). The flexible PCB 2900 may also include one or more semi-circular cut-out sections to provide an area of low mechanical stress at an interior portion of the flexible PCB 2900. In some cases, an electrical component 1280, shown in FIG. 30, (e.g., a thermistor) may be physically connected to the flexible PCB 2900 in this area such that the electrical component does not receive stress loads while the CWB is flexed during use. Such stress loads, without the stress relief provided by the semi-circular cut-outs, may cause the electrical component to detach from the flexible PCB 2900.

Figure 47B:
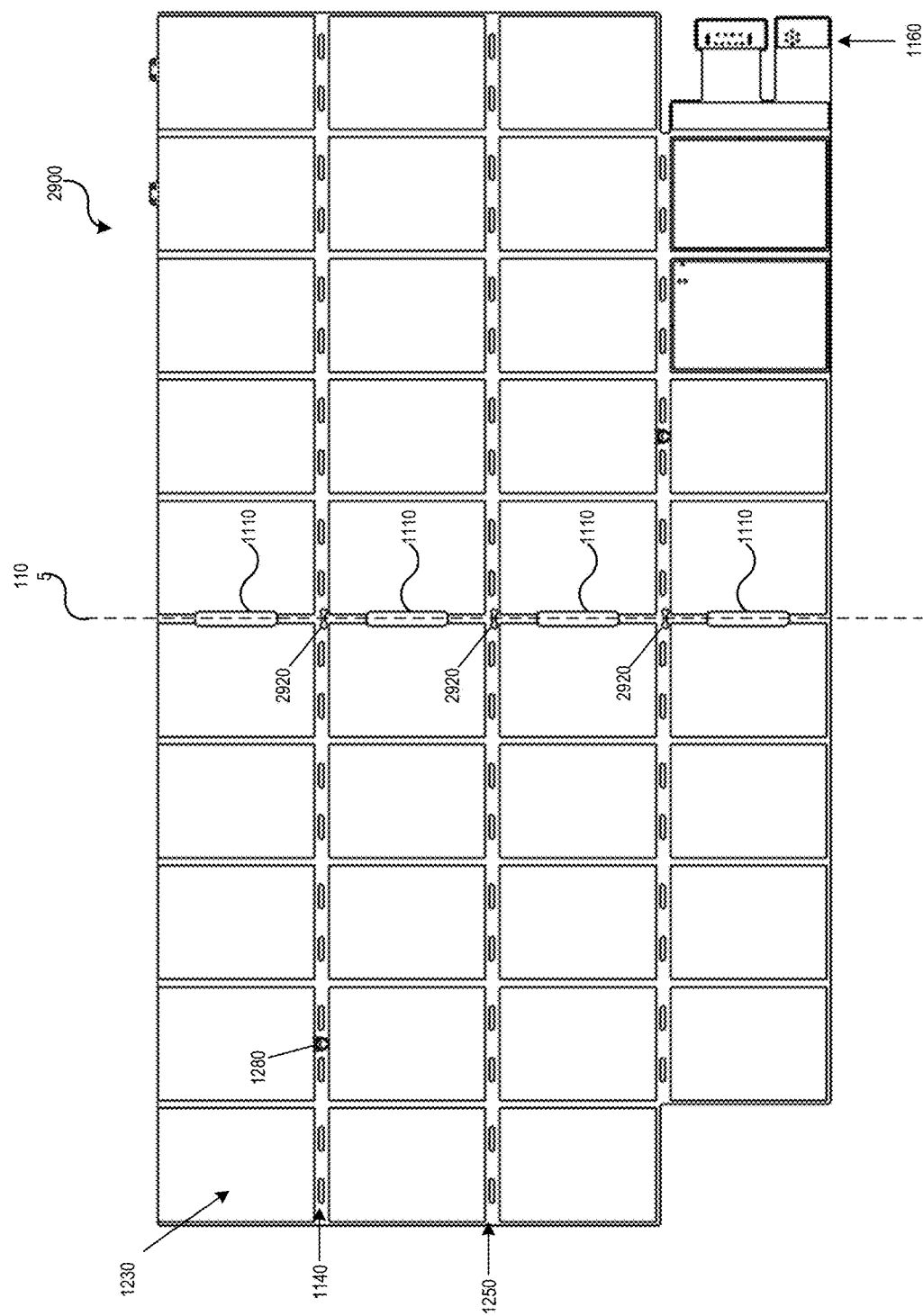

FIG. 47B shows second view of the illustrative flexible printed circuit board 2900 for the illustrative conformal wearable battery system according to aspects of the present disclosure. In some cases, connection locations for each battery cell may be marked and/or may include a rigidizing material, or may be otherwise reinforced. Each battery cell location 1230 may be associated with a pair of cut-outs for the anode and cathode connections, as discussed above. Here, a battery cell module may be physically attached to the substrate of the flexible PCB 2900, such as by use of an adhesive material (e.g., glue, tape, etc.). The cathode and anode connection tabs may be inserted through a corresponding cut-out 1140 so that the connection tabs may be soldered, welded, or otherwise connected to the connection pad 1150 on the other side of the flexible PCB 2900.

The electrical connection cut-outs (e.g., cut-out 1140) may be disposed near a flex line 1250 between rows of battery cell locations 1230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 1250 allow for the CWB to be flexed within a designed range of motion, when in use. To provide stress relief along these flex lines between the rigid battery cell portions, the dog bone-shaped cut-outs 2920 are disposed within each flex line 1250 and may be aligned with a portion of the battery cell connection cut-outs (e.g., cut-out 1140).

Figure 47C:
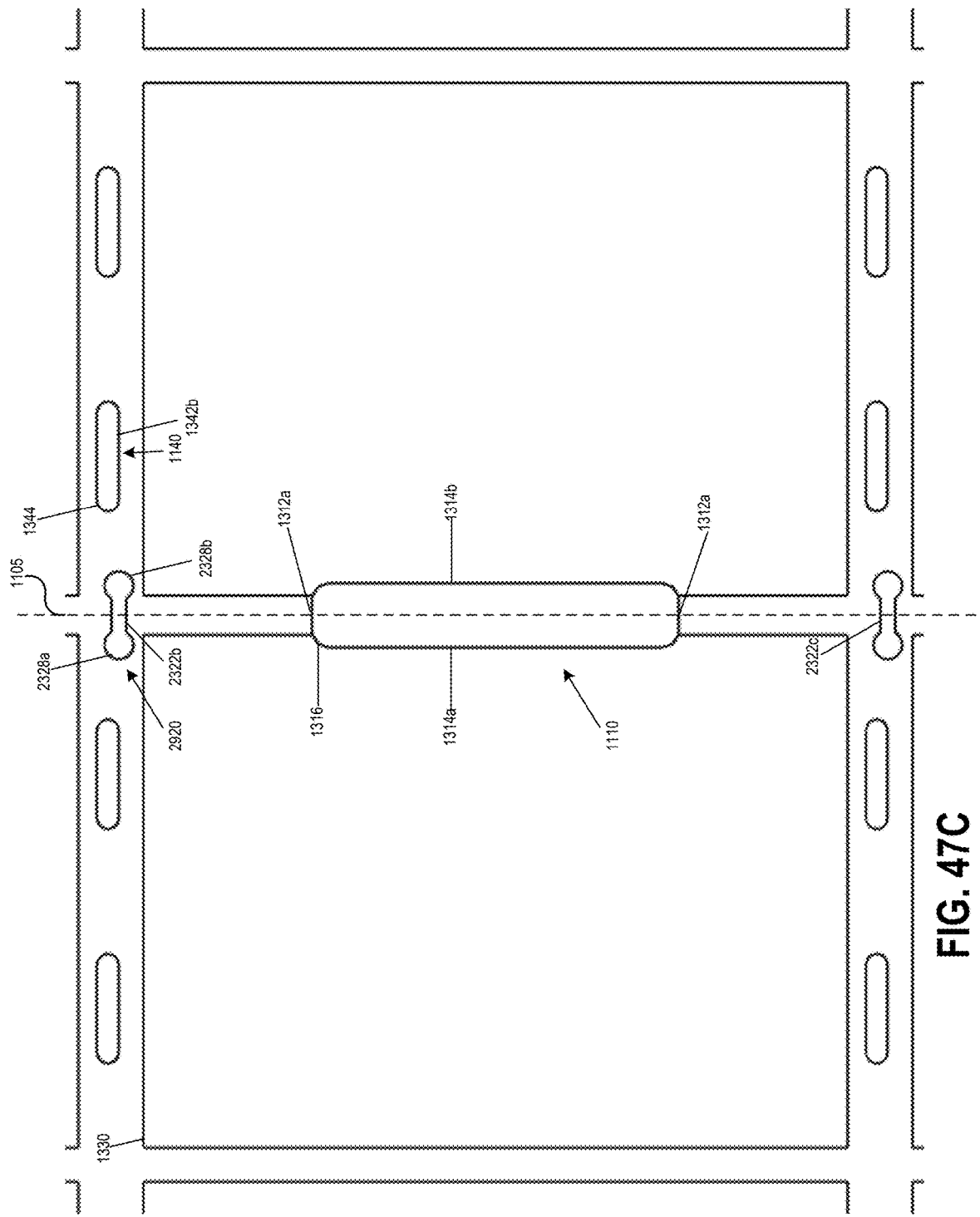

FIG. 47C shows a partial second view of the illustrative flexible printed circuit board 2900 including cut-outs providing strain relief along a center line according to aspects of the present disclosure. As discussed above, the rectangular cut-out 1110 may be disposed centered on and parallel to the bend line 1105 at the center of the flexible PCB 2900, where at least a portion of the cut-out 1110 may be disposed underneath a battery cell module when installed. In an illustrative example, a battery cell connection area 1330 may be about 50 mm in length, where the cut-out 1110 may be located near a mid-point of the battery cell connection area 1330. In an illustrative example, a first edge 1312*a* of the cut-out 1110 may be located at a first distance (e.g., about 11.5 mm) from a first edge of the battery cell connection area 1330, the second edge 1312*b* of the cut-out 1110 may be located at a second distance (e.g., about 11.5 mm) from the second edge of the battery cell connection area 1330, and the length of the cut-out 1110 between the first edge 1312*a* and the second edge 1312*b* may be a first dimension (e.g., about 25 mm). In some cases, locations and/or sizes of cut-outs may differ between locations on the flexible PCB. A width of the cut-out between the left edge 1314*a* and the right edge 1314*b* may be a second dimension (e.g., about 4.5 mm), and a radius of each rounded corner 1316 may be a third dimension (e.g., about 1.1 mm). The specific distances and/or dimension are given for illustrative purposes and other distances and/or dimensions may be contemplated within the scope of this disclosure.

The illustrative dog bone-shaped cut-out 2920 may be formed as a rectangular area 2322*b* connecting two circular areas 2328*a* and 2328*b*. For example, the dog bone-shaped connector 2920 may be centered on and perpendicular to the bend line 1105. The rectangular area 2322*b* may be about 1 mm high and about 2.25 mm wide. Each circular area 2328*a* and 2328*b* may have a radius of about 2 mm.

The illustrative battery connection cut-out 1140 may be formed as an elongated oval shape of about 1.5 mm high and having a distance of about 6 mm between a center point of each circular end portion (e.g., 1344) and an overall length of about 9 mm. In some cases, a second edge 1342*b* of the cut-out 1140 may align with a center line through the dog bone-shaped cut-out 2920. Additionally, the dog bone-shaped cut-out 2920 may be located about 4.8 mm from the battery connection cut-out 1140.

Figure 47D:
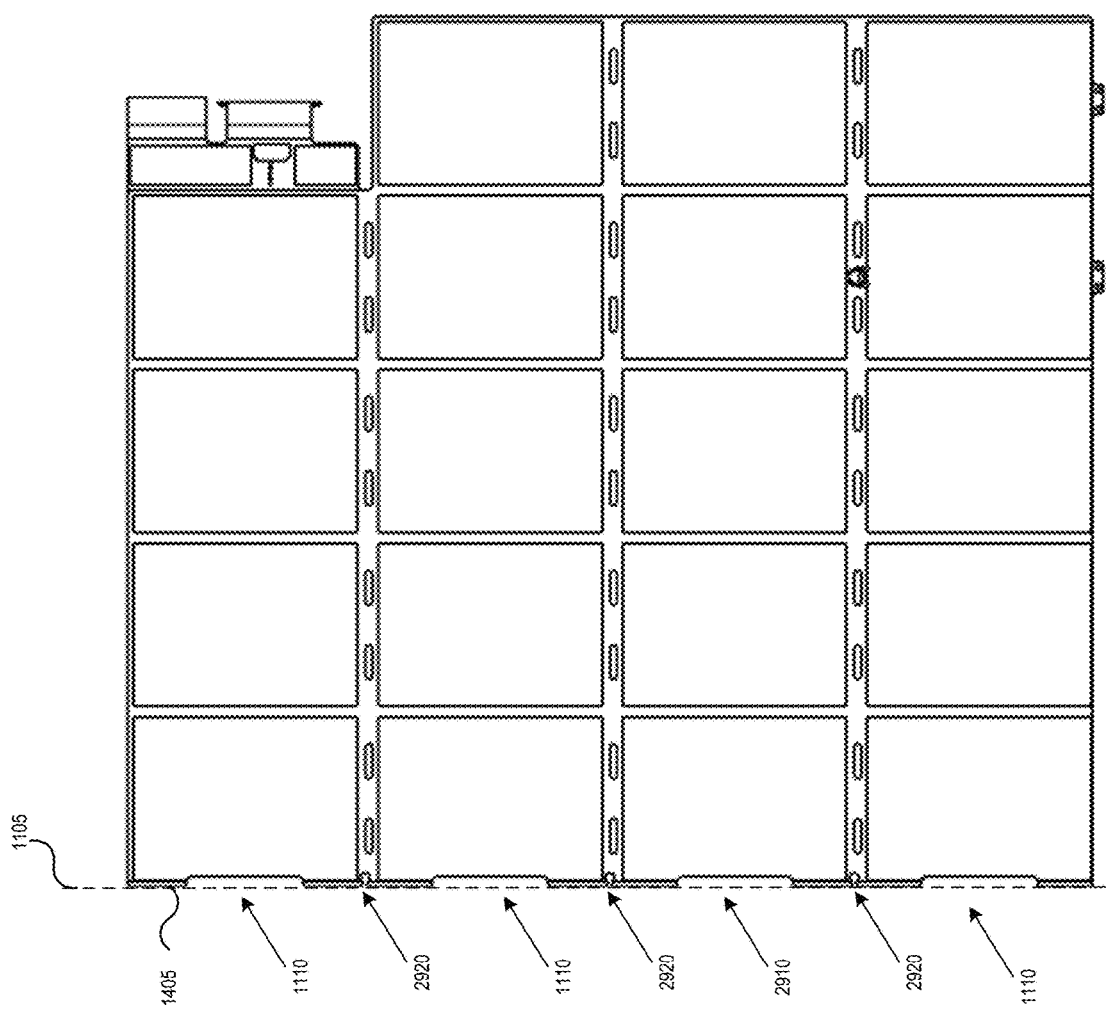

FIG. 47D shows a first view of the illustrative flexible printed circuit board 2900 folded along the bend line 1105 according to aspects of the present disclosure. For example, a 180-degree bend 1405 may be formed along the bend line 1105, such as when a left half of the flexible printed circuit board 2900 is folded over a right half of the flexible printed circuit board 2900 such that the battery modules are located on the exterior portion of the folded flexible printed circuit board 2900 and the electrical connections for the battery modules are disposed on an interior portion of the folded flexible printed circuit board 2900.

While aspects of the disclosure have been described with reference to battery cells and/or a CWB comprising battery cells, arrangements and methods as described herein may also be applied to other devices and systems having a flexible PCBA to maximize space within a housing. For example, the arrangements and methods described herein may apply to any electronic device disposed within a housing for which maximizing usable interior space within a housing by folding a flexible PCBA within the available interior space is desired. Examples of such electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, computing processors, solar cell based power generation devices, wave motion based power generation devices, fuel cell based power generation devices, battery charging controllers, and/or portable chemical batteries for powering electronic or electrical devices.

In an illustrative example, a conformal wearable battery may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

The conformal wearable battery of the illustrative example may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery of the illustrative example, may include a bend axis where the bend axis comprises a center portion of the grid like pattern of the physical connection sections.

The conformal wearable battery of the illustrative example, may include the plurality of cut-outs where each first cut-out of the plurality of first cut-outs is rectangular-shaped, and where a longer edge of each first cut-out is disposed parallel to the bend axis.

The conformal wearable battery of the illustrative example, where each corner of each first cut-out of the plurality of first cut-outs is rounded.

The conformal wearable battery of the illustrative example, where each second cut-out of the plurality of second cut-outs comprises a first semi-circular section, a second semi-circular section and a rectangular section.

The conformal wearable battery of the illustrative example, where the rectangular section is disposed between the first semi-circular section and the second semi-circular section.

The conformal wearable battery of the illustrative example, where the rectangular section is disposed laterally across the bend axis, wherein a mid-point of the rectangular section is located near the bend axis.

The conformal wearable battery of the illustrative example, where each of the plurality of battery cells is physically attached to a first side of the flexible PCBA.

The conformal wearable battery of the illustrative example, where the plurality of battery cells is disposed on an outside surface of the flexible PCBA, when the flexible PCBA is in a folded configuration.

The conformal wearable battery of the illustrative example may further include a sealed flexible housing wherein the flexible PCBA is disposed within an interior cavity of the sealed flexible housing and wherein the flexible PCBA is in a folded configuration.

A second illustrative example of a system may include a plurality of battery cell modules and a flexible printed circuit board assembly (PCBA). The flexible PCBA includes a plurality of battery cell connection sections disposed in a grid-like pattern along a first surface of the flexible PCBA, a bend axis configured to divide the flexible PCBA in half when the flexible PCBA is in a folded configuration, and a plurality of cut-outs disposed along the bend axis, wherein each of the plurality of cut-outs reduce a bending force placed on the flexible PCBA when a flexing force is applied to the flexible PCBA.

The system of the second illustrative example, where the plurality of cut-outs comprises a plurality of first cut-outs having a first shape, and a second plurality of cut-outs having a second shape.

The system of the second illustrative example, where the first shape comprises a substantially rectangular shape having rounded corners.

The system of the second illustrative example, where the second shape comprises at least one semi-circular section and a rectangular section.

The system of the second illustrative example, where the second shape comprises a rectangular section disposed across the bend axis and a first semi-circular section disposed at an end of the rectangular section on a first side of the bend axis and a second semi-circular section disposed at an opposite end of the rectangular section and on an opposite side of the bend axis.

The system of the second illustrative example, where a first plurality of cut-outs of the plurality of cut-outs are located near an approximate mid-point of a battery cell module.

The system of the second illustrative example, where a portion of the plurality of cut-outs is disposed on a bend line that is perpendicular to the bend axis and between two adjacent battery cell modules A third illustrative example may include a flexible printed circuit board assembly (PCBA) comprising a plurality of battery modules physically affixed to the flexible PCBA, wherein the plurality of battery modules are arranged in a grid-like pattern, a bend axis near an approximate mid-point of the flexible PCBA, wherein bending the flexible PCBA along the bend axis folds the flexible PCBA in half, and a plurality of cut-outs disposed along the bend axis, wherein the cutouts reduce a force exerted on the flexible PCBA along the bend axis when the flexible circuit board is flexed.

The flexible PCBA of the third illustrative example, where the plurality of cut-outs disposed along the bend axis comprise a plurality of first cut-outs having a first shape and a plurality of second cut-outs having a second shape and wherein the plurality of first cut-outs are disposed along a flexible portion of the flexible PCBA between adjacent rows of the grid-like pattern that are perpendicular to the bend axis and the plurality of second cut-outs are disposed between adjacent battery modules in columns of the grid-like pattern, wherein the columns are on opposite sides of the bend axis.

Aspects of the disclosure have been described in terms of illustrative examples thereof.

Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

In the following description of various illustrative arrangements, reference is made to the accompanying drawings, which form a part hereof, and in which is shown, by way of illustration, various arrangements in which aspects of the disclosure may be practiced. It is to be understood that other arrangements may be utilized, and structural and functional modifications may be made, without departing from the scope of the present disclosure. It is noted that the accompanying drawings may not be drawn to scale.

It is noted that various connections between elements are discussed in the following description. It is noted that these connections are general and, unless specified otherwise, may be direct or indirect, and that the specification is not intended to be limiting in this respect.

A rechargeable conformal wearable battery (CWB) may be worn by a user to power electronic devices that the user carries. The CWB may be subjected to a multitude of environmental conditions such as harsh shock and vibration, moisture exposure, and extreme temperatures. The CWB may have a housing that is sealed to facilitate longer battery life and utility for the user regardless of environmental conditions it may encounter. To provide a desired power output, the CWB may include a plurality of battery cells, each with a rated power capacity and when electrically connected, may allow the CWB to provide a desired power output.

A CWB may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing (e.g., a pouch, a metal enclosure, etc.) separate from other battery cells. A battery cell as described herein may include a plurality of individual battery cell elements that are electrically connected together to form a compound battery cell that electrically performs as a single unit. Each of the battery cells may be physically connected to adjacent battery cells by flexible elements (e.g., a flexible printed circuit board), thereby facilitating a surface outline or shape of the array of battery cells to generally conform to a surface outline or shape of a user wearing the CWB. For example, the CWB may include one or more flex lines along which the CWB may flexibly conform to a shape of an object adjacent to the CWB, such as a portion of a user's body. One or more of the battery cells may include a positive-charge electrical terminal and a negative-charge electrical terminal that are electrically connected with the battery cell within an interior of the battery cell and provide electrical power to electrical devices disposed exterior to the battery cell. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell. The CWB may include a set of positive-charge and negative-charge electrical terminals that are shared among the plurality of the battery cells of the array of battery cells. The plurality of the battery cells may be electrically coupled together, for example, in series or in parallel.

In some cases, each battery cell may be formed of electrodes and a solid electrolyte that are stacked in layers or laminations and enclosed in a foil envelope housing, which is then sealed. The positive-charge terminal and the negative-charge terminal may each include a conductive region that passes between the interior of the cell housing and the exterior of the cell housing.

The CWB housing may secure a plurality of the battery cells within an interior region may be formed from a molding process such as injection molding. The CWB housing may be formed of a polymeric material, for example. The CWB housing may be sealed to prevent ingress of solid material and/or liquid material, for example, according to an IP67 rating, IP68 rating, or other ingress protection rating. The CWB housing may include a plurality of electrically conductive contacts and/or connectors that may pass between the interior region of the CWB housing and the exterior of the CWB housing. The IP67 rating is specified by the Ingress Protection Code (IP Code) IEC standard 60529. The equivalent European standard is EN 60529. The IP Code also may be referred to as the International Protection Code. The IP Code classifies and rates a degree of ingress protection provided by mechanical casings and electrical enclosures for electronic equipment against intrusion, dust, accidental contact, and liquid (e.g., water). In the IP67 rating, the first digit (i.e., '6') specifies a level of protection offered against ingress of solid objects, while the second digit (i.e., '7') specifies a level of protection offered against ingress of liquids. The larger the value of the digit specifying the level of protection, the greater the amount of protection offered. For example, an IP67 rating specifies total protection against dust ingress and protection against short periods of immersion in water. An IP68 rating specifies dust resistance and immersion in 1.5 meters of freshwater for up to 30 minutes duration.

Figure 48:
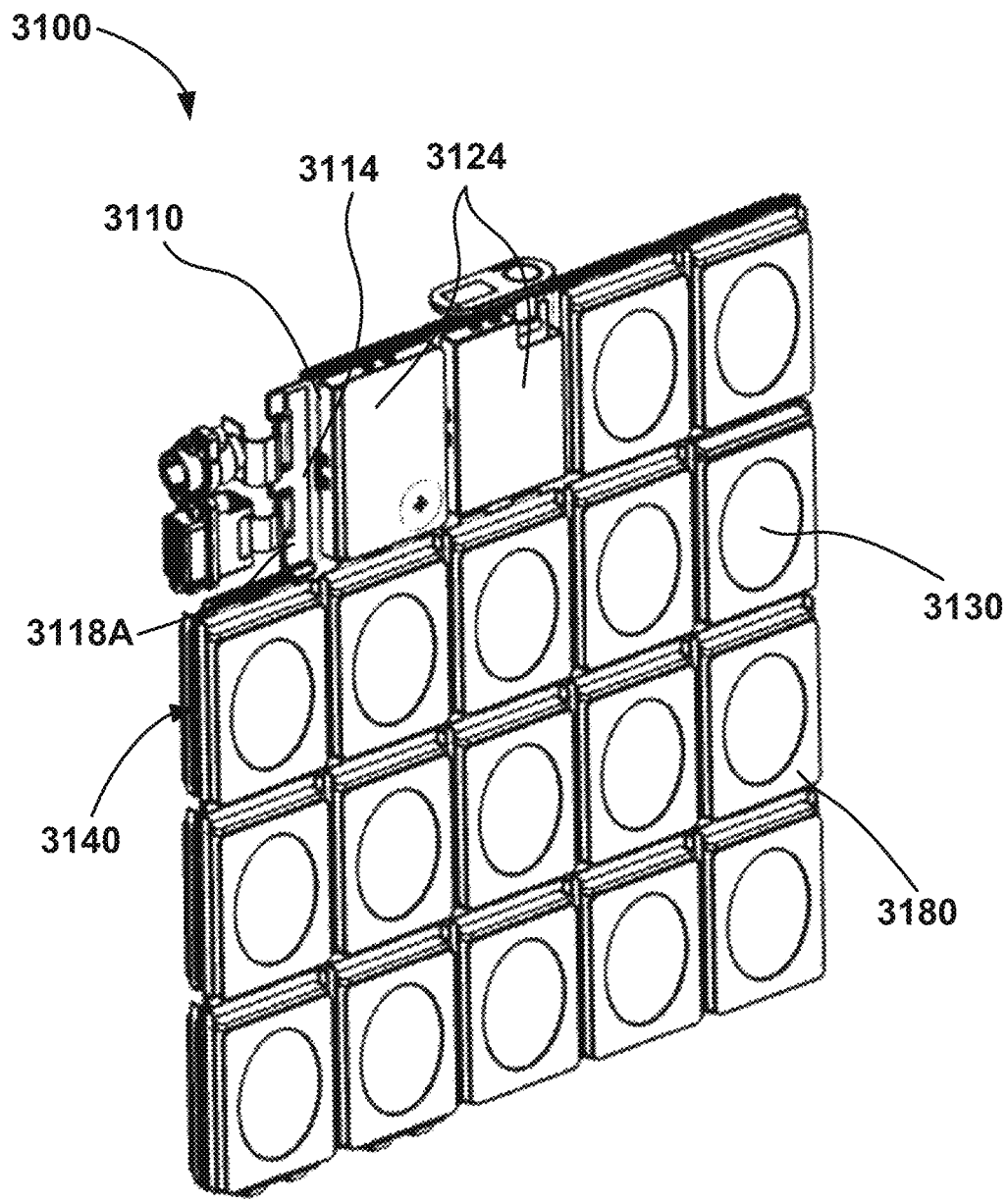
FIG. 48 illustrates a front perspective view of a battery cell assembly for a conformal wearable battery (CWB) according to aspects described herein.
Figure 49:
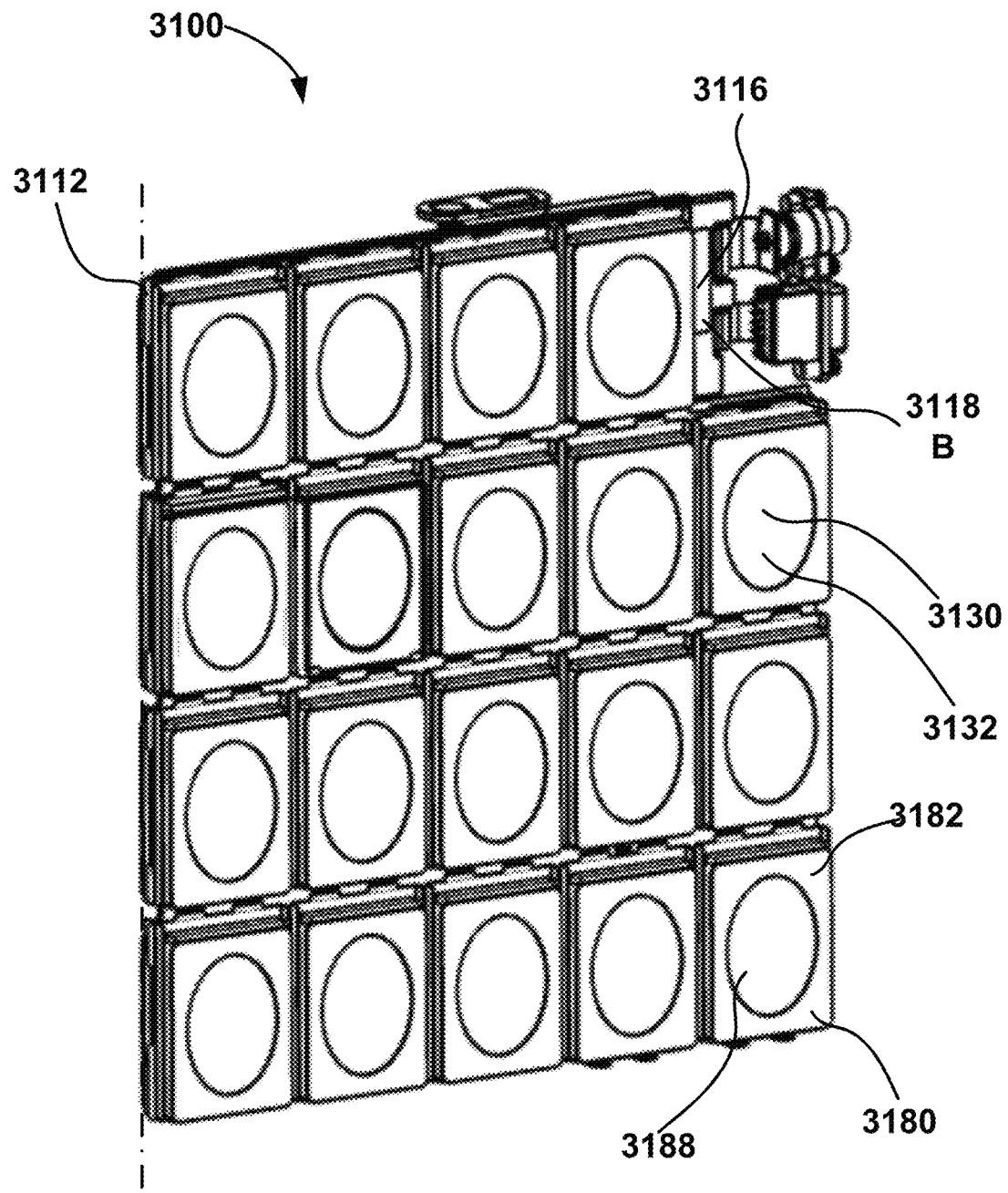
FIG. 49 illustrates a rear perspective view of the battery cell assembly of FIG. 1 according to aspects described herein.

FIGS. 48 and 49 illustrate an exemplary battery cell assembly or flexible printed circuit board assembly (PCBA) 3100 of an exemplary CWB 3010. In some examples, the CWB 3010 may be provided in a form factor easily carried by a person, such as within a pocket or other means of securing the CWB 3010 to a person's clothing, uniform, or the like. As shown in FIGS. 48 and 49, the battery cell assembly or PCBA 3100 may include a flexible printed circuit board (PCB) 3110 with a plurality of battery cells 3130 connected both electrically and physically to the PCB 3110. To provide the specified power output, while also providing flexibility for conforming to a shape of person's body or equipment when carried, a matrix of battery cells 3130 may be arranged on, and affixed to, a flexible printed circuit board 3110. To fit within the housing 3160 of the CWB 3010, the flexible printed circuit board 3110 may have a bend axis 3112 (e.g. a centerline) that facilitates folding of the flexible PCB 3110 to form a upper portion 3114 of the flexible PCB 3110 and a lower portion 3116 of the flexible PCB 3110. Each portion 3114, 3116 may be substantially the same size (i.e., same surface area). The battery cell 3130 may be mounted on an outward facing surface 3118A, 3118B of each respective portion 3114, 3116 of the flexible printed circuit board 3110 while the electrical connections may be made on an inward facing surface 3120A, 3120B of the respective upper and lower portions 3114, 3116 of the folded PCB 3110. A central shock-attenuating or shock-absorbing member 3140 may be positioned between the upper portion 3114 and the lower portion 3116 to prevent the upper portion 3114 from contacting the lower portion 3116. The central shock-attenuating member 3140 may absorb or dampen any shock and/or vibrational loading the CWB 3010 may receive while also providing electrical insulation for the electrical contacts.

Figure 50A:
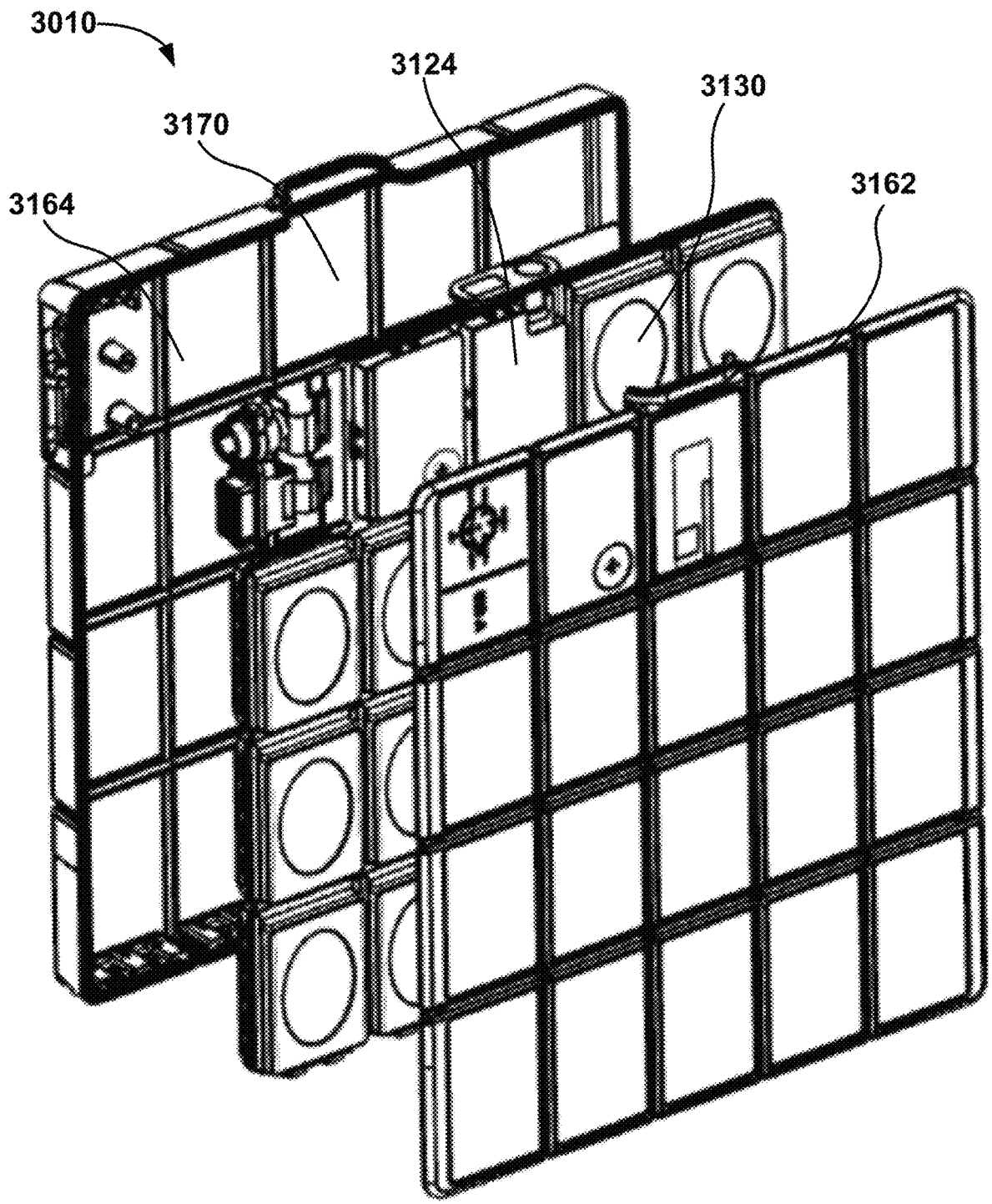
FIG. 50A illustrates a front exploded perspective view of a conformal wearable battery with the battery cell assembly of FIG. 48 according to aspects described herein.
Figure 50B:
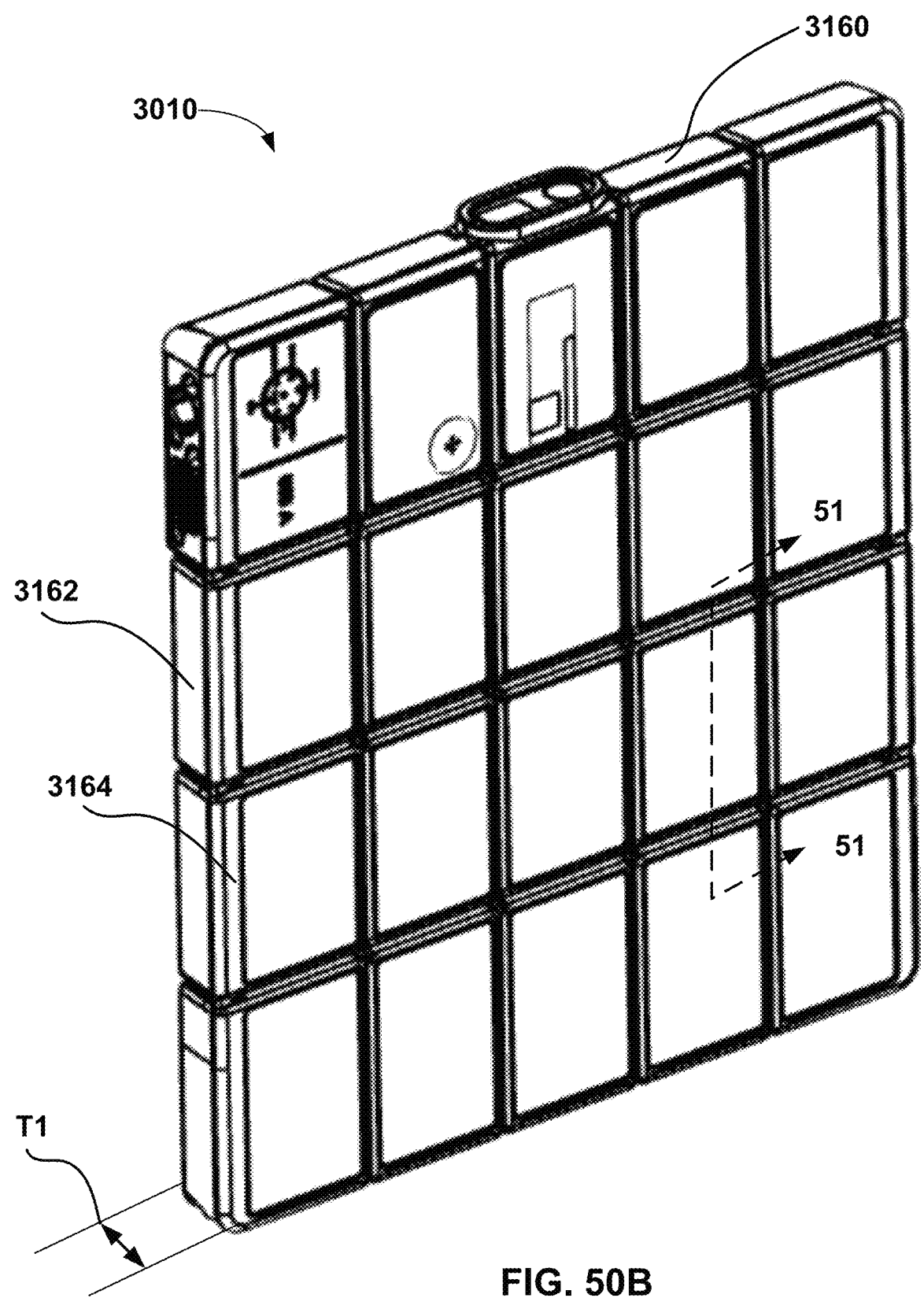
FIG. 50B illustrates a front perspective view of the conformal wearable battery of FIG. 50A according to aspects described herein.

As shown in FIGS. 50A-50B, the battery cell assembly 3100 may be received into an interior cavity 3166 of a housing 3160 to provide protection for the CWB 3010. The housing 3160 may include an upper housing member 3162 and a lower housing member 3164 that may be connected together to form the interior cavity 3166. In addition, the upper housing member 3162 and lower housing member 3164 may be sealed together along the perimeter to protect the battery cell assembly 3100 to prevent ingress of solid material and/or liquid material. A damaged battery cell 3130 may be a fire hazard and/or could render the CWB 3010 inoperable. Accordingly, CWB 3010 may meet the requirements of MIL-PRF-32383/4A. Each housing member 3162, 3164 may be flexible and may be formed from a polymeric material using an injection molding or other technique known to one skilled in the art. Accordingly, housing 3160 (and each housing member 3162, 3164) may be flexible or bendable to be able to withstand repeated bending or flexing cycles to allow CWB 3010 to meet the requirements of MIL-PRF-32383/4A. The CWB 3010 may be required to flex at least 800 times under load to a 7-inch radius curved surface, such that an edge of the CWB 3010 may be capable of deflecting, in each direction, at least a specified distance (i.e., 1 inch) from a centerline of the CWB 3010 without sustaining physical or electrical damage. MIL-PRF-32383/4A is incorporated by reference in its entirety. The housing members 3162, 3164 may be injection molded from a polymeric material that has elastomeric properties to allow the housing members 3162, 3164 and housing 3160 to flex and bend. For example, the housing members 3162, 3164 may be formed from a thermoplastic elastomer (TPE), a thermoplastic urethane (TPU), thermoplastic vulcanizates (TPV), or other similar material.

The arrangement of the battery cells 3130 on the outward facing surfaces 3118A, 3118B of the flexible PCB 3110 positions an outward facing surface 3132 of each battery cell 3130 to face an interior surface 3168 of the upper housing member 3162 or an interior surface 3170 of the lower housing member 3164 as shown in FIG. 51. Additionally, a plurality of battery cell shock-attenuating members 3180 may be individually attached to the outward facing surface 3132 of each battery cell 3130. Similar to the central shock-attenuating member 3140, each battery cell shock-attenuating member 3180 may be electrically insulating. Each battery cell shock-attenuating member 3180 may be positioned between the outward facing surface 3132 and one of the interior surfaces 3168, 3170. In addition, each battery cell shock-attenuating member 3180 may also contact one of the interior surfaces 3168, 3170 of the housing members 3162, 3164. The central shock-attenuating member 3140 may be located between the battery cells 3130 arranged on the upper and lower portions 3114, 3116 of PCB 3110, where shock-attenuating member 3140 may be in contact with both inward facing surfaces of the upper portion 3114 and the lower portion 3116 of the flexible PCB 3110. The battery cell shock-attenuating members 3180 may located between the battery cells 3130 and the housing 3160. The central shock-attenuating member 3140 and/or the battery cell shock-attenuating members 3180 may help to protect the battery cells 3130 by absorbing the forces received by the CWB 3010 from any impacts or collisions. As shown in FIG. 51, this arrangement of having three distinct shock-attenuating members 3140, 3180 spaced apart from each other through a cross-section of the CWB 3010 to provide protection from impacts for the battery cells 3130 throughout the CWB 3010. Each shock-absorbing member 3140, 3180 may compress up to 80 percent when subjected to an impact load. For instance, each shock-absorbing member 3140, 3180, when compressed 80 percent, may absorb up to 400 N of force over an area of 1140 mm$^2$ area, or 0.35 N/mm$^2$ (0.35 MPa). In addition, at higher strain rates, such as impact or shock loading, each shock-absorbing member 3140, 3180 may be compressed up to 80 percent of the thickness, where the member 3140, 3180 may push back against the impact with a pressure of less than or up to 0.40 N/mm$^2$ (0.40 MPa). In some cases, the shock-attenuating members 3140, 3180 may absorb up to 30 percent and in some cases up to 50 percent of an impact force applied to the CWB 3010 to protect the battery cells 3130 from the impact force.

The battery cells 3130 may be a pouch cell type battery (i.e., a packaged polymer lithium-ion battery or similar type battery). For instance, each battery cell 3130 may include a pouch cell portion 3134 and a foil portion 3136 that wraps around at least three sides of the pouch cell portion 3134. The foil portion 3136 may have a length that is greater than a length of the pouch battery portion. In addition, the foil portion 3136 may contact the sides of the pouch cell portion 3134 across the width of the battery cell 3130 and/or may be integrated into a pouch cell package. Each battery cell 3130 may have a non-cylindrical shape and may have generally rectangular cuboid shape or a substantially parallelepiped shape. Further, a chemical system of battery cell 3130 may include one of a lithium cobalt oxide, nickel cobalt manganese, nickel cobalt aluminum, or other such chemical systems. In an illustrative example, the dimensions of the battery cell 3130 may be about 43 mm in length, about 34 mm in width, and about 6 mm in height, but battery cells of other dimensions may be used within the scope of this disclosure. Additionally, the battery cell 3130 may weigh between 22.5 grams and 24.5 grams (i.e., 23.5 grams) and may have an energy storage capacity between 1400 mAh and 1500 mAh (i.e., about 1,435 mAh). The size, weight, and energy storage capacity of each battery cell 3130 of the CWB 3010 may be designed such that the overall size, weight, and energy storage capacity of the flexible PCBA 3100 for the CWB 3010 meets an energy storage capacity specification, weight specification, and/or size specification for a CWB 3010. For example, the height, width, and length of each battery cell 3130 may be designed, at least in part, to meet a flexibility requirement of the CWB 3010. Additionally, the size, and/or shape of the battery cells may allow for a specified number of battery cells (e.g., about 36 battery cells) and/or configuration of the battery grid such that the energy capacity for the CWB 3010 may be at least 148 Watt-hours (Wb) (e.g., about 150 Wh, about 170 Wh, about 190 Wh, about 200 Wh, etc.) and/or where the maximum weight of the CWB 3010 is less than a specified maximum weight (e.g., about 2.6 pounds). In some cases, a configuration of the battery cells 3130 of the CWB 3010 may allow the CWB 3010 to output a voltage between about 10 and about 20 V, (e.g., about 14.8V) within a specified size and/or shape of the CWB. For example, an illustrative CWB 3010 may have an overall dimensions of between about 8.5 in. and 9.0 inches (i.e., about 8.7 in.)×between about 7.5 in and 8 in. (i.e., about 7.66 in.)×between about 0.5 in. and 0.8 in. (i.e., 0.70 in.).

As the battery cells 3130 go through cycles of discharging and recharging, the chemical reaction inside the battery cells 3130 may cause the battery cells 3130 to swell or increase in volume. In some examples, the battery cells 3130 may also go through cycles of swelling and then shrinking (i.e., increasing and decreasing in volume) as it goes through the discharging and recharging cycles. When a battery cell 3130 swells, the cell 3130 may expand into a cavity or void 3178 created by an opening 3188 in the battery cell shock-attenuating member 3180. In some cases, the battery cells 3130 may encounter swelling of less than 4 percent. In other cases, the battery cells 3130 may swell in a range between 4 percent and 10 percent. In still other cases, the battery cells 3130 may encounter swelling of about 15 percent or less. In addition, each battery cells 3130 may swell different amounts in various locations of the battery cell 3130. For instance, each battery cell 3130 may experience a greater amount of swelling in a central region than along its edges.

The flexible PCB 3110 for the conformal wearable battery 3010 according to aspects of the present disclosure. The flexible PCB 3110 may be configured to provide power and/or electrical signals from a plurality of battery cells and/or other components of a CWB. The flexible PCB 3110 may be formed of one or more of a flexible polymer or plastic material, such as a polyimide or other such flexible substrate. In some cases, markings showing locations of placement of battery cells may be formed through a silk screening process or other like method. Electrical conductors may be included in one or more layers of the flexible PCB 3110. In some cases, electrical conductors may be configured as a conductive pattern (e.g., a copper overlay, a conductive ink, etc.) on the surface of the substrate of the flexible PCB 3110. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties. The flexible PCB 3110 may have a plurality of physical connection sections disposed in a grid like pattern, where each of the plurality of battery cells 3130 is physically affixed to the flexible PCB 3110 at a corresponding physical connection section of the plurality of physical connection sections.

Figure 52:
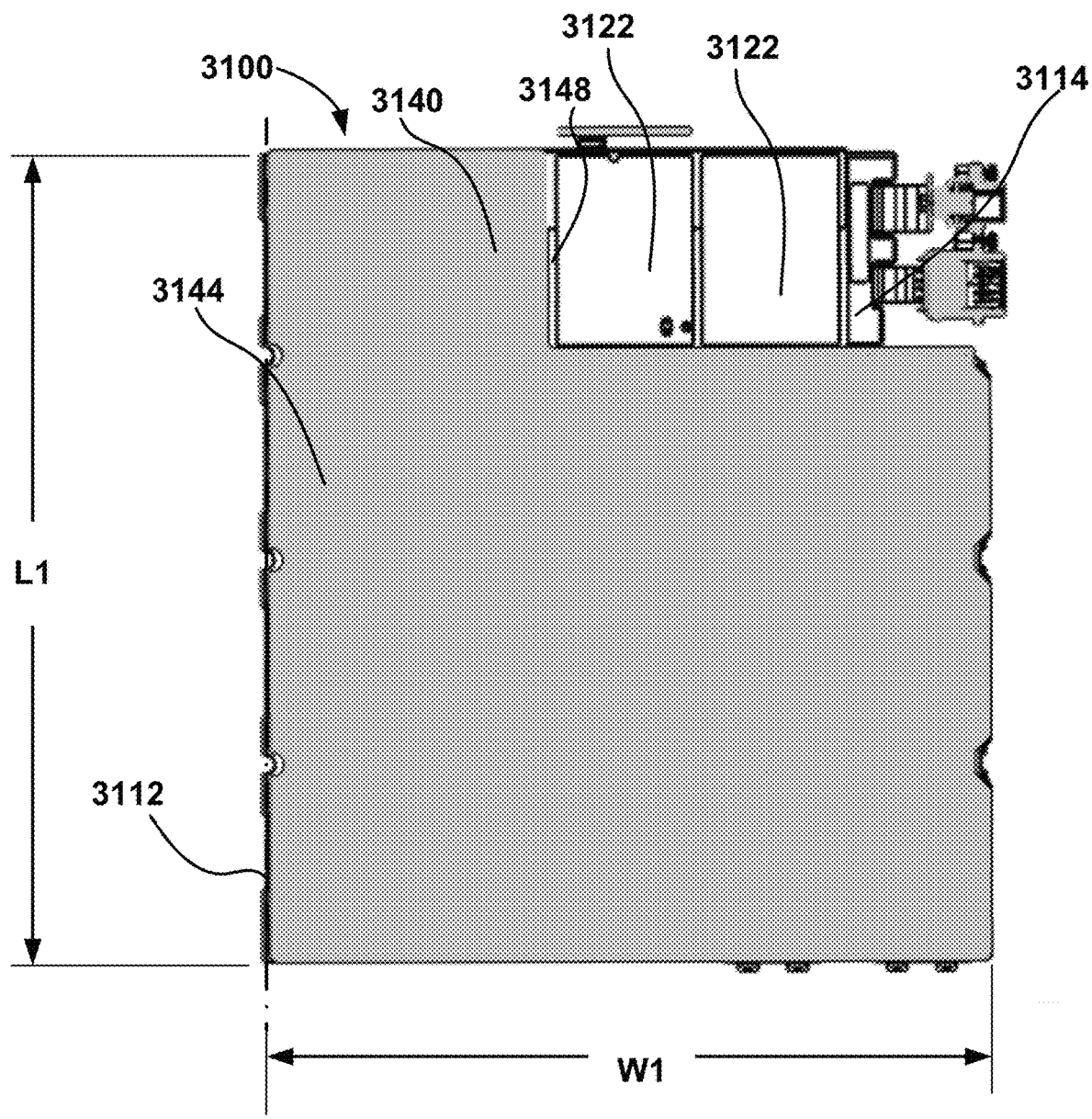
FIG. 52 illustrates a rear view of the battery cell assembly of FIG. 48 with some components removed for clarity according to aspects described herein.
Figure 53:
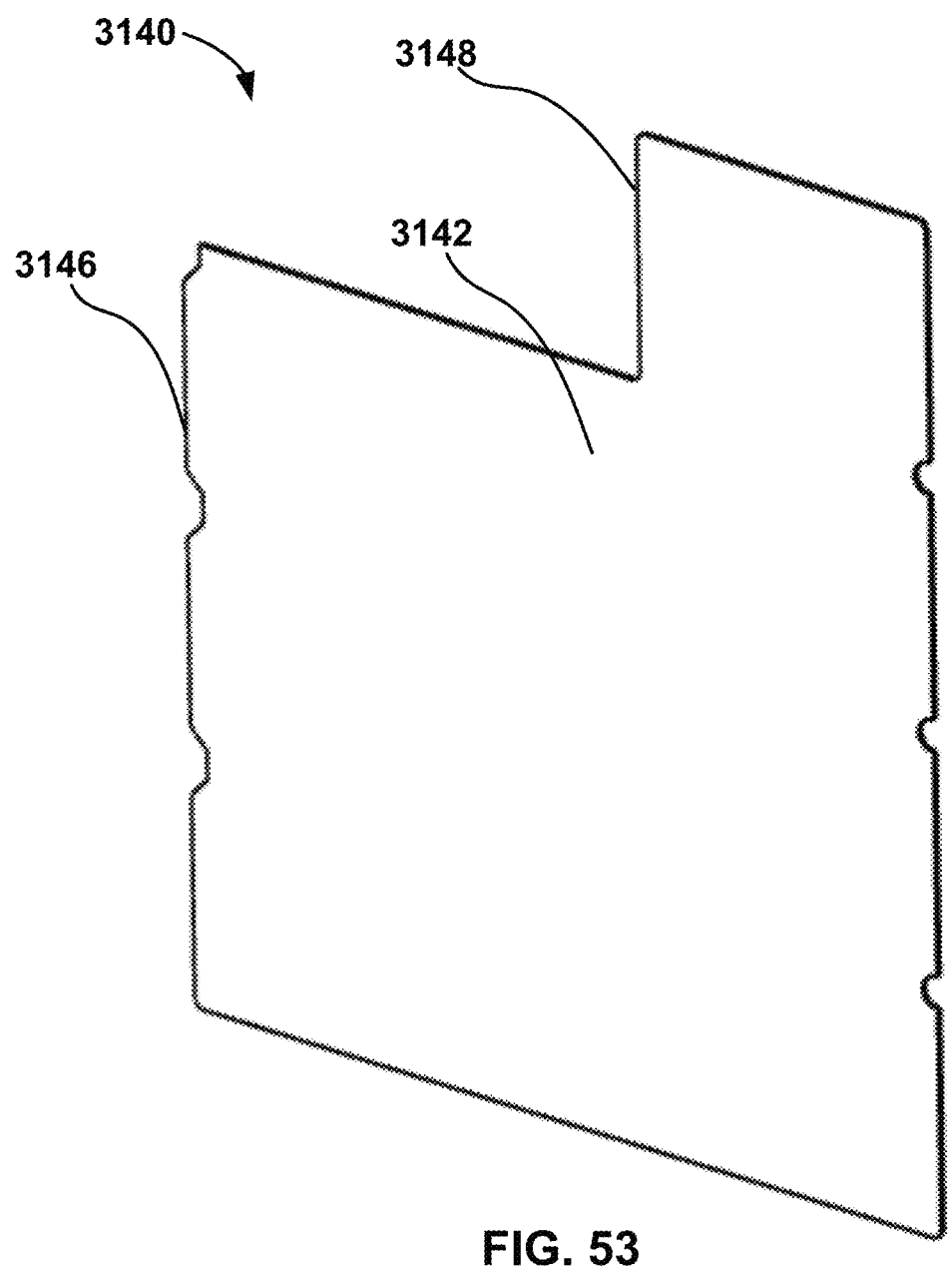
FIG. 53 illustrates a front perspective view of an exemplary central shock-attenuating member of the battery cell assembly of FIG. 48 according to aspects described herein.

The central shock-attenuating member 3140 may be positioned between the upper and lower portions 3114, 3116 and may also contact the inward facing surfaces 3120A, 3120B of the PCB 3110. The central shock-attenuating member 3140 may compress to absorb any impacts or forces that are received by the CWB 3010. As shown in FIGS. 52 and 53, the central shock-attenuating member 3140 may be a continuous layer free of openings or holes that extend through the central shock-attenuating member 3140 in the region that corresponds to the PCB 3110. The central shock-attenuating member 3140 may also serve to electrically insulate the upper and lower portions 3114, 3116 from each other. The central shock-attenuating member 3140 may have a front surface 3142, a rear surface 3144 opposite the front surface 3142, and a perimeter surface 3146 extending between the front surface 3142 and the rear surface 3144. The central shock-attenuating member 3140 may have a geometric shape that generally follows the overall footprint or outline of the plurality of battery cells 3130 arranged on the upper portion 3114 of the PCB 3110. The central shock-attenuating member 3140 may have a rectangular shaped cutout 3148 at one corner to accommodate stiffeners 3122 arranged on the inward facing surface 3120A of upper portion 3114 of PCB 3110. The stiffeners 3122 may help to stabilize the region of the flexible PCB 3110 where the CWB control circuitry 3124 is mounted.

Figure 54:
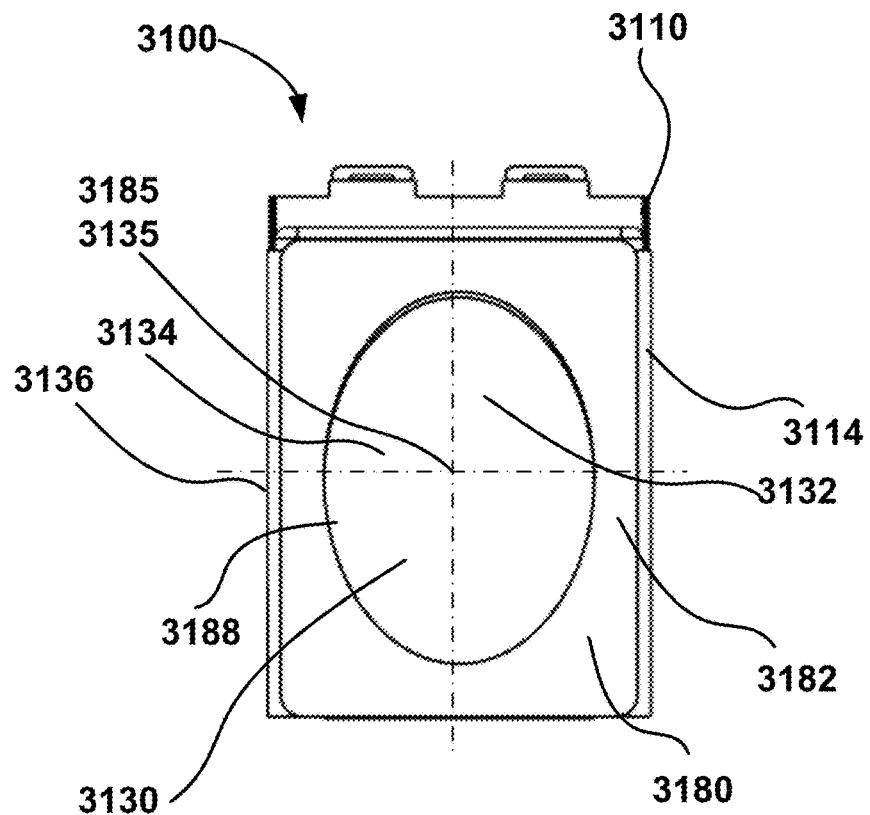
FIG. 54 illustrates a front view of a portion of the battery cell assembly of FIG. 48 according to aspects described herein.
Figure 55:
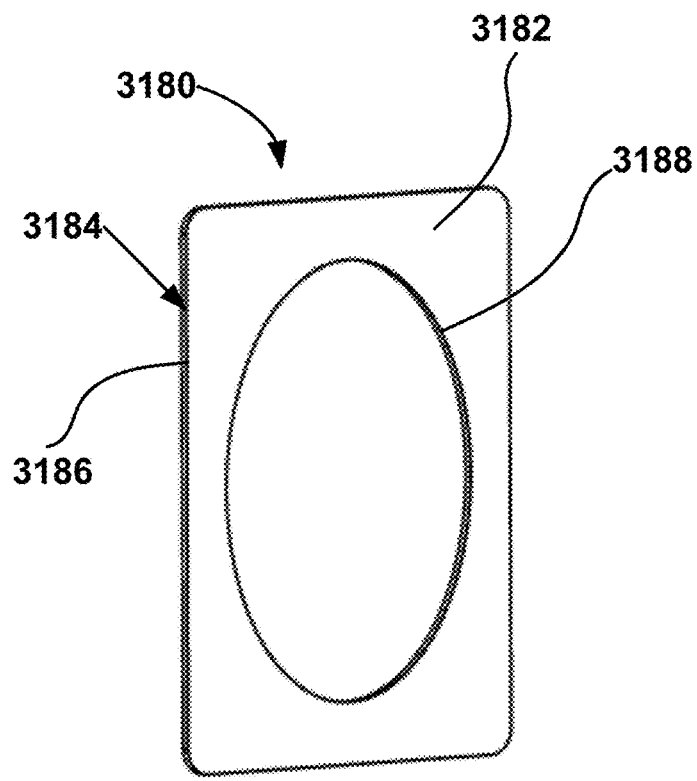
FIG. 55 illustrates a front perspective view of an exemplary battery cell shock-attenuating member of the battery cell assembly of FIG. 48 according to aspects described herein.

FIG. 52 illustrates the battery assembly 3100 with the lower portion 3116 of PCB 3110 along with its attached battery cells 3130 removed for clarity. FIG. 53 illustrates a front perspective view of an illustrative central shock-attenuating member of the battery cell assembly of FIG. 48 and FIG. 54 illustrates a front view of a portion of the battery cell assembly of FIG. 48. FIG. 55 illustrates a front perspective view of an exemplary battery cell shock-attenuating member of the battery cell assembly of FIG. 48. As shown in FIG. 52, the central shock-attenuating member 3140 may have a length, L1, and width, W1, that extends substantially the same length and width of one of the upper and lower portions 3114, 3116 of the PCB 3110. For example, the central shock-attenuating member 3140 may have a width that extends at least 90 of a width of the upper portion 3114 and/or the lower portion 3116 of PCB 3110. The central shock-attenuating member 3140 may be affixed to one or both of the inward facing surfaces 3118A or 3118B of the PCB 3110 with an adhesive, such as with a glue, an epoxy, an acrylic, or a tape. In some examples, the central shock-attenuating member 3140 may be free floating between the inward facing surface 3118A and 3118B or only attached along its perimeter.

Each battery cell shock-attenuating member 3180 may have an opening 3188 extending through the thickness of the battery cell shock-attenuating member 3180. Each opening 3188 may create a cavity 3178 between the respective outward facing surface 3132 of the battery cell 3130 and one of the interior surfaces 3168, 3170 of the housing 3160. The cavity 3178 may provide room for a battery cell 3130 to expand into the cavity 3178 to prevent any swelling induced stress on the battery cell 3130 as it expands. The thickness of the battery cell shock-attenuating member 3180 may be approximately 10 percent of the thickness of the battery cell 3130, or may be within a range of 4 percent and 12 percent of the thickness of the battery cell 3130. In some examples, the opening 3188 may not extend through the entire thickness of the battery cell shock-attenuating member 3180 creating cavity 3178 within the battery cell shock-attenuating member 3180. For example, the opening 3188 may extend from the rear surface 3184 through at least 50 percent of the thickness, or through at least 75 percent of the thickness. In these cases, the depth of the cavity 3178 may be within a range of 4 percent and 12 percent of the thickness of the battery cell 3130.

In some examples, the battery cell shock-attenuating members 3180 may have a front surface 3182, a rear surface 3184 opposite the front surface, a perimeter surface 3186 extending between the front surface 3182 and the rear surface 3184, and an opening 3188 extending through the front and rear surfaces 3182, 3184. The opening 3188 may be located in substantially the center 3185 of the battery cell shock-attenuating member 3180 and may be substantially aligned with a center 3135 (i.e., a horizontal and/or a vertical centerline) of a pouch cell portion 3134 each battery cell 3130. For purposes of this disclosure, substantially aligned means that a first axis extending normal from a geometric center point of a first component is collinear with a second axis extending in the same direction as the first axis from a geometric center of a second component are within 2 mm of each other. In some examples, the opening 3188 may be offset from a center of the pouch cell portion 3134. The shape of the battery cell shock-attenuating member 3180 may be substantially rectangular although it may have any geometric shape, such as oval, circular, or other polynomial. In general, the shape of the battery cell shock-attenuating member 3180 may correspond to the shape of each battery cell 3130, where the length and width of the battery cell shock-attenuating member 3180 may be substantially the same or within 5 percent of the length and width of the length and width of each battery cell 3130. The perimeter edges of the battery cell shock-attenuating member 3180 may extend to and cover the perimeter edges of the corresponding battery cell 3130 that it is attached. The rear surface 3184 of each battery cell shock-attenuating member 3180 may be affixed the outward facing surface 3132 of each respective battery cell 3130 with an adhesive, such as a glue, an epoxy, an acrylic, or a tape.

As shown in the illustrated example, the opening 3188 may have an oval shape or may have a different shape such as a rectangular shape, circular shape, or other geometric shape. In some examples, the opening 3188 may have a size that has an area that is within a range of 30 percent and 70 percent of an area of the front surface 3182 of the shock-absorbing member 3140, where the area of the front surface 3182 is defined as the area of the front surface 3182 that is free of the opening 3188. While in other examples, the opening 3188 of each battery cell shock-attenuating member 3180 may have an area that is at least 70 percent of the surface area of member 3140.

The central shock-attenuating member 3140 and the battery cell shock-attenuating members 3180 may be formed from a visco-elastic material that can attenuate shock and vibration while also having electrically insulating properties.

In addition, the shock-attenuating members 3140, 3180 may be compressible to assist in absorbing any swelling from the battery cells 3130. The battery cells 3130 may swell on one side or both sides (i.e. a front and rear side of the battery cell 3130). The shock-attenuating members 3140, 3180 may be very compressible at low strain rates, such as a battery cell 3130 swelling, where each member 3140, 3180 may compress less than 50 percent of its thickness, the shock-absorbing members 3140, 3180 may push back against the swelling battery with a pressure of less than or up to 0.05 N/mm2 (0.05 MPa). As such, if any of the battery cells 3130 swell, a portion of the swelling may be absorbed by the compression of the shock-attenuating members 3140, 3180 to prevent any swelling induced stress on the expanded battery cell 3130. In some examples, the shock-attenuating members 3140, 3180 may be compressed within a range of 7 percent and 12 percent. The shock-attenuating members 3140, 3180 may be resilient to resist any permanent deformation caused by any swelling of the battery cells 3130. This resilience allows for the shock-attenuating members 3140, 3180 to compress and expand to accommodate any cycling of a battery cell 3130 swelling and then contracting partly or completely back to its normal size. By compressing and expanding to correspond with the swelling and shrinking of the battery cell 3130, the shock-absorbing members 3140, 3180 may not permanently deform or may have a minimal compression set. In some examples, the shock-attenuating members 3140, 3180 may have a maximum compression set of between 2 percent and 5 percent when tested using ASTM D 1667-90 Test D@73° F.(23° C.).

The visco-elastic material may be formed from a polymeric material such as a polyurethane based material such as Poron®, Sorbothane® or similar material. In some cases, the visco-elastic material may absorb heat to assist in conducting heat away from the batteries. The central shock-attenuating member 3140 and/or the battery cell shock-attenuating members 3180 may be formed from the same material or, in some examples, formed from different materials. The material forming the central shock-attenuating members and/or the battery cell shock-attenuating members 3180 may be a polymeric foam (i.e., porous) or a solid polymeric material. The central shock-attenuating members and/or the battery cell shock-attenuating members 3180 may be formed from a sheet of material and then cut to the final shape using a die cutting, laser cutting, water jet cutting process, or other cutting process known to one skilled in the art. The central shock-attenuating members 3140 and/or the battery cell shock-attenuating members 3180 may have a constant thickness, where the thickness of the central shock-attenuating member 3140 may substantially the same thickness (i.e., within 10 percent) as a thickness of at least one of the plurality of battery cell shock-attenuating members 3180. In some examples, the thickness of the central shock-attenuating member 3140 may be greater than a thickness at least one of the plurality of battery cell shock-attenuating members 3180. For instance, the thickness of the central shock-attenuating member 3140 may be within a range of 1.2 and 1.4 times a thickness of one of the plurality of battery cell shock-attenuating members 3180. Additionally, the thickness of the central shock-attenuating member 3140 may be approximately 3 percent of the overall thickness of the CWB 3010, where the thickness of the housing 3160 is defined as the distance, T1, from an outermost outward facing surface 3174 of the upper housing member 3162 to an outermost outward facing surface 3176 of the lower housing member 3164. In some examples, the thickness of the central shock-attenuating member 3140 may be within a range of 2 percent and 5 percent of the thickness, T1, of the housing 3160. In addition, the combined thicknesses of the shock-absorbing members 3140, 3180 may be approximately 9 percent of the overall thickness T1 of the CWB 3010, or within a range of 7 percent and 11 percent of the overall thickness, T1.

Aspects of the disclosure have been described in terms of illustrative examples thereof. Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

A rechargeable conformable wearable battery (CWB) assembly may be worn by a user to power electronic devices that the user carries. The CWB assembly may be subjected to environmental conditions that the user is also subjected to. The CWB may be subjected to a multitude of environmental conditions such as harsh shock and vibration, moisture exposure, and extreme temperatures. The CWB may have a sealed housing that is sealed to facilitate longer battery life and utility for the user regardless of environmental conditions that the CWB may encounter. To provide a desired power output, the CWB may include a plurality of battery cells, each with a rated power capacity and when electrically connected, may allow the CWB to provide a desired power output and within a specified size range and/or weight range.

A CWB may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing (e.g., a pouch, a metal enclosure, etc.) separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB. For example, the CWB may include one or more flex lines along which the CWB may flexibly conform to a shape of an object adjacent to the CWB, such as a portion of a user's body. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB may include a set of positive-charge and negative-charge electrical terminals that are shared among the plurality of the battery cells of the array of battery cells. The plurality of the battery cells may be electrically coupled together, for example, in series or in parallel.

In some cases, the battery cell may be formed of electrodes and a solid electrolyte that are stacked in layers or laminations and enclosed in a foil envelope housing, which is then sealed. The positive-charge terminal and the negative-charge terminal may each include a conductive region that passes between the interior of the cell housing and the exterior of the cell housing at an outer wall of the casing. The conductive region may be affixed and electrically connected to the battery cell in an interior of the cell housing at one end, pass through the sealed wall of the casing, and affix to conductive elements that electrically couples with electrical devices at an exterior of the cell housing.

The CWB housing may be formed of a molded casing that may be created through a molding process, such as an injection molding process. The molded CWB housing may be formed of a polymeric material, for example. The CWB housing may be sealed to prevent ingress of solid material and/or liquid material, for example, according to an IP67 rating, IP68 rating, or other ingress protection rating. In some cases, the CWB housing may be created through connecting at least two housing portions into a complete sealed housing to encase the battery cells within the casing. The positive-charge terminal and the negative-charge terminal may each include a conductive region that passes between the interior of the CWB housing and the exterior of the CWB housing.

In some cases, the CWB may be provided in a form factor easily carried by a person, such as within a pocket or with other means of securing the CWB assembly to a person's clothing, uniform, or the like. To provide the specified power output, while also providing flexibility for conforming to a shape of person's body or equipment when carried, the matrix of battery cells may be arranged on, and affixed to, a flexible printed circuit board.

To fit within the housing of the CWB assembly, the flexible printed circuit board assembly may be configured to be folded along an axis (e.g., a center line), such that battery cell modules may be on an exterior surface of the flexible printed circuit board assembly closest to the housing, while the electrical connections may be made on an interior surface of the folded printed circuit board assembly. An electrical insulator (e.g., foam, insulating tape, etc.) may be placed between the folded sections to provide electrical insulation for the electrical contacts.

Figure 56:
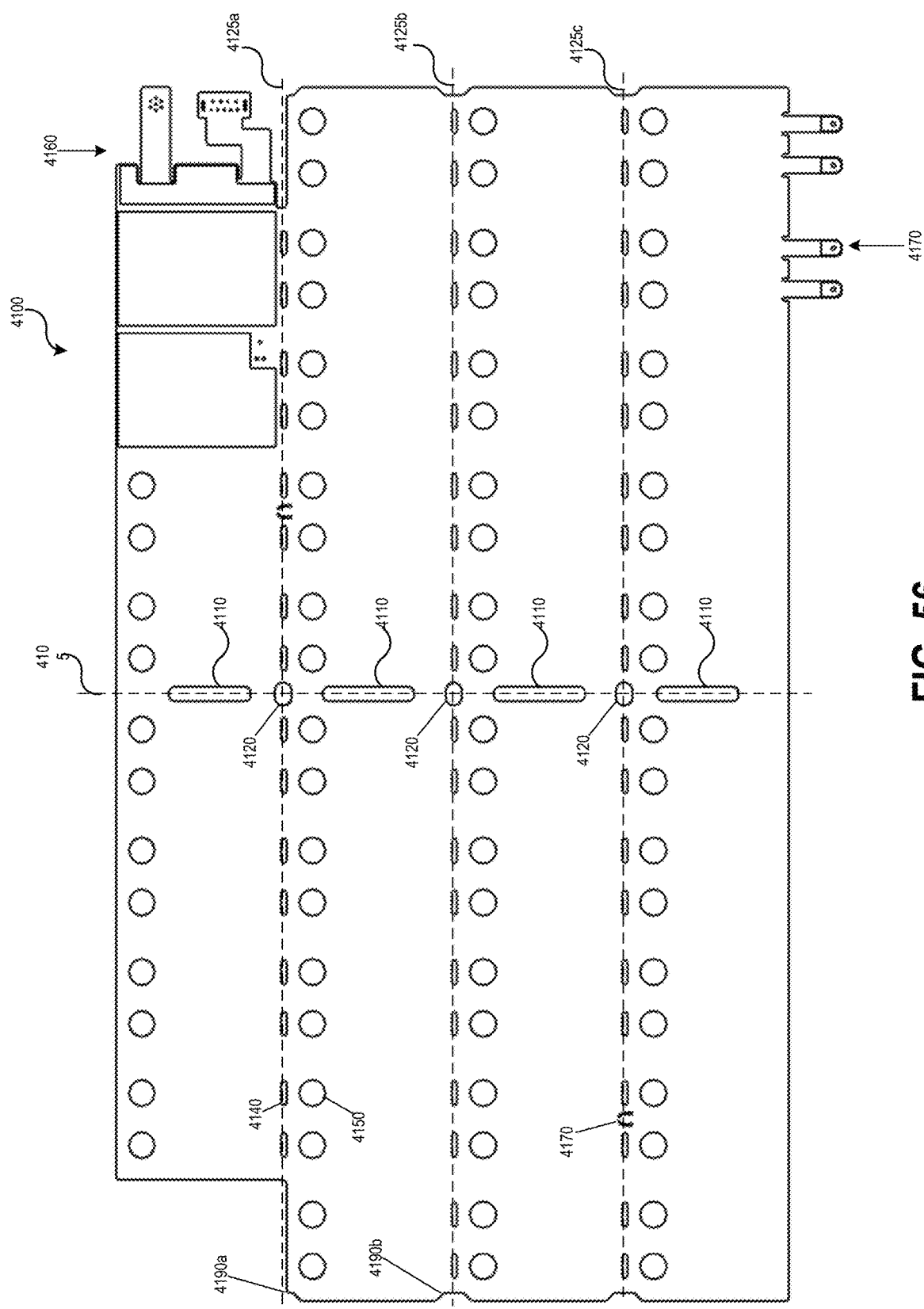
FIG. 56 shows a first view of an illustrative flexible printed circuit board for an illustrative conformal wearable battery system according to aspects of the present disclosure.

FIG. 56 shows a first view of an illustrative flexible printed circuit board (PCB) 4100 for an illustrative CWB according to aspects of the present disclosure. The flexible PCB may be configured to provide power and/or electrical signals from a plurality of battery cells and/or other components of a CWB. The flexible PCB 4100 may be formed of one or more layers of a flexible polymer or plastic material, such as a polyimide or other such flexible substrate. In some cases, markings showing locations to facilitate placement of battery cells may be included on a surface of the flexible PCB 4100, such as those formed through a silk-screening process, or other like method. Electrical conductors may be included in one or more layers of the flexible PCB. In some cases, electrical conductors may be configured as a conductive pattern (e.g., a copper overlay, a conductive ink, etc.) on the surface of the substrate of the flexible PCB 4100. In some cases, exposed conductive features (e.g., conductors, a bare copper surface, a bare aluminum surface, etc.) may be coated with a coverlay substance, such as an electrical insulator. For conductive portions of the flexible PCB not covered with a coverlay, the surface may be plated, such as with an electroless nickel immersion gold (ENIG) finish, a lead-free immersion silver finish or other substances with improved conductive properties.

The flexible PCB 4100 may be configured to bend along a bend line 4105 located at or near a center line of the flexible PCB 4100 such as to form a bend of a desired angle (e.g., a 4180-degree bend). One or more elongated cut-outs may be disposed parallel to the bend line 4105 (e.g., cut-out 4110) and/or perpendicular to the bend line 4105 (e.g., cut-out 4120), where the cut-outs perpendicular to the bend line 4105 may be aligned with a flex line (e.g., a flex line 4125*a*, a flex line 4125*b*, a flex line 4125*c*, etc.) perpendicular to the bend line 4105. In some cases, the flex line may correspond to a section of the flexible PCB 4100 located between rows of components (e.g., battery cells) along which the CWB may bend during use. Such cut-outs may provide additional flexibility to the flexible PCB 4100 to allow for easier formation of the desired bend angle (e.g., the 180-degree bend) such as by folding the right half of the flexible PCB 4100 over the left half of the flexible PCB 4100 and/or flexing along one or more adjacent flex lines. In the illustrative example, relief cuts, such as the cut-out 4110 may be formed as a rounded elongated rectangular cutout and the cut-out 4120, may be formed in a generally obround shape (e.g., two substantially semi-circular sections connected by a rectangular section). As mentioned, the elongated rounded rectangular cut-outs (e.g., cut-out 4110) parallel to the bend line 4105 may reduce stress on the plastic substrate when forming the about 180-degree bend. Additionally, the obround-shaped cut-outs (e.g., cut-out 4120) may reduce stresses placed on the flexible PCB substrate during use, such as by reducing stresses along a line of deformation (e.g., the flex line 4125*a*, a flex line 4225*a* of FIG. 57, etc.) between battery cells.

In some cases, additional cut-outs may be included to reduce stresses along the flex line (e.g., the flex line 4125*a*, the flex line 4125*b*, the flex line 4125*c*), such as at an edge of the flexible PCB 4100, such as a corner notch 4190*a* located near a corner formed in the edge of the flexible PCB 4100 near a flex line and/or a notch 4190*b* located along an edge of the flexible PCB 4100 and aligned near a flex line. By reducing the bending stress at locations along the bend line, a probability of a catastrophic failure of the substrate (e.g., cracking, delamination, and the like) is reduced. While cut-out 4110 is shown as a rounded rectangular shape and the cut-out 4120 is shown as an obround shape, other shapes may be used to remove weight and/or to reduce stress due to bending and/or flexing of the flexible PCB 4100. While an obround shape is shown on the illustrative example, other cut shapes may be used. Such other shapes may include circular cuts which may be used, for example, for removing more weight, oval cuts which may provide additional stress relief, for example, based on the curves, elongated slots which, for example, may be similar to the rectangular cuts but with even more filet on corners that may reduce additional stresses, a dog-bone shape (e.g., two substantially circular sections connected by a rectangular section), and/or the like.

The flexible PCB 4100 may also include a plurality of conductive pads (e.g., pads 4150) to provide electrical connection for the cathode and anode of each battery module connected to the flexible PCB 4100. For battery cells located near an edge of the flexible PCB 4100, the cathode an anode connectors may be bent over the edge of the flexible PCB 4100. For battery cells located away from the edge of the flexible PCB, a plurality of cut-outs (e.g., the cut-out 4140) are located near a corresponding pad 4150 to allow for solder or weld connection of the battery cathode or anode connector to the flexible PCB 4100. Additionally, the flexible PCB 4100 may include charging connection portion 4190 that may be used to connect to one or more charging tabs on an exterior portion of a case of the conformal wearable battery enclosure and/or a flexible connector portion 4160 that may include one or more flexible connectors to connect to additional circuitry, such as a control module, a display module, or the like). The flexible PCB 4100 may also include one or more semi-circular cut-out sections 4180 to provide an area of low mechanical stress at an interior portion of the flexible PCB 4100. In some cases, an electrical component 4280, shown in FIG. 57, (e.g., a thermistor) may be physically connected to the flexible PCB 4100 in this area such that the electrical component does not receive stress loads while the CWB is flexed during use. Such stress loads, without the stress relief provided by the semi-circular cut-outs, may cause the electrical component to detach from the flexible PCB 4100.

Figure 57:
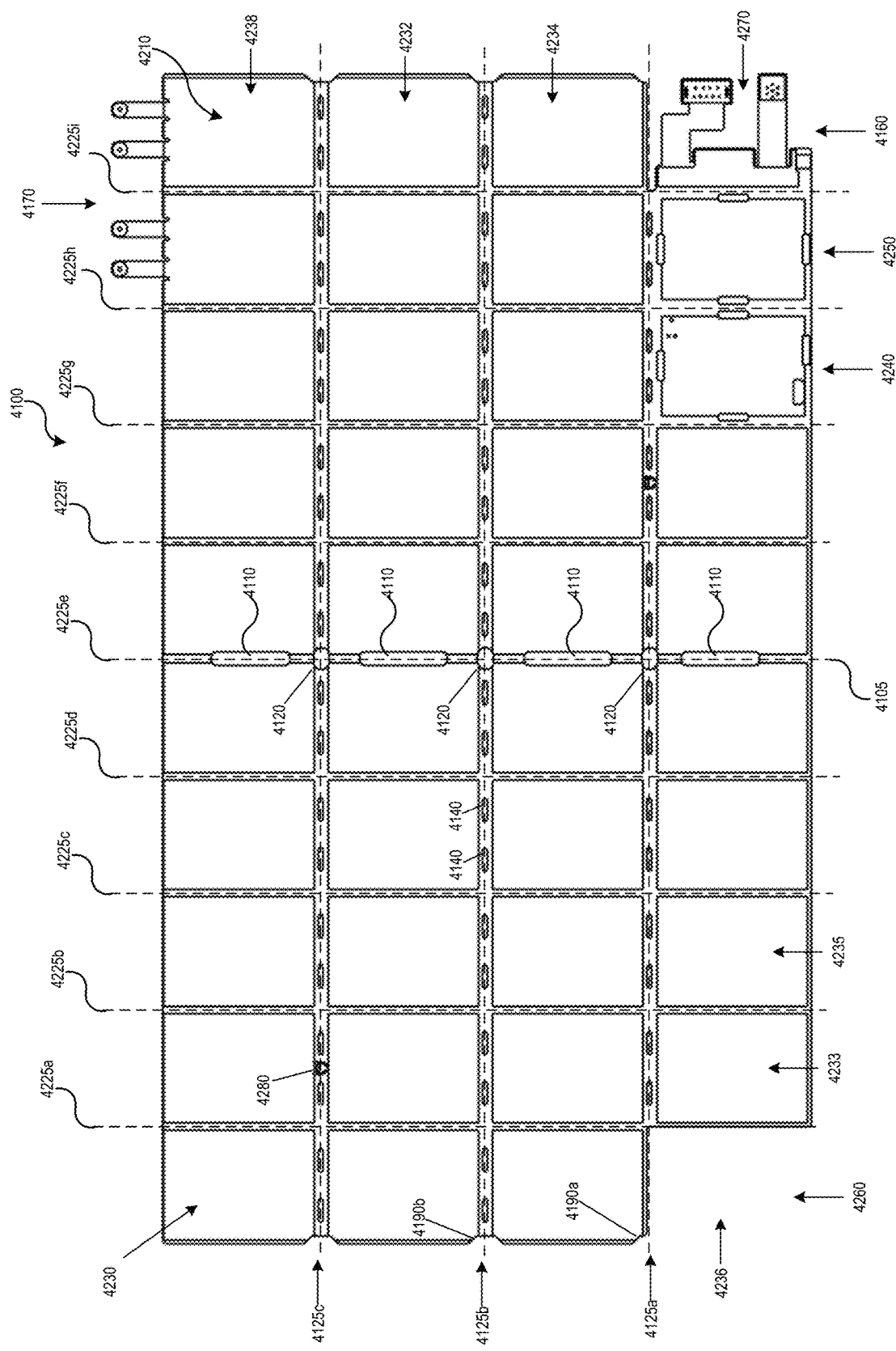
FIG. 57 shows a second view of the illustrative flexible printed circuit board for the illustrative conformal wearable battery system according to aspects of the present disclosure.

FIG. 57 shows second view of the illustrative flexible printed circuit board 4100 for the illustrative conformal wearable battery system according to aspects of the present disclosure. In some cases, physical connection locations for each battery cell may be marked (e.g., battery cell location 4210, 4230, etc.). Additionally, one or more physical connection locations for electrical circuitry may be marked or unmarked (e.g., circuitry module location 4240, circuitry module 4250, etc.). The flexible PCB4 100 may also include one or more cut-out areas of the flexible PCB 4100 (e.g., cut out area 4260, cut out area 4270, etc.) to accommodate inclusion of electrical connectors (e.g., flexible connection portion 4160, etc.), such as those provided to provide, and/or receive, information and/or electrical power to/from one or more external devices. In some cases, one or more of the battery cell connection locations and/or the connection locations for electrical circuitry may include a rigidizing material, or may be otherwise reinforced.

The battery cell locations, circuitry module locations, cut outs, and/or electrical connection locations may be provided in a matrix or grid pattern on an outward facing surface or front side of the flexible PCB 4100. For example, the battery cell locations may be arranged in rows, such as battery cell row 4232, battery cell row 4234, and the like, an/or in columns, such as battery cell column 4233, battery cell column 4235, and the like. Additionally, one or more of the cut-out area 4260, the cut-out area 4270, the circuitry module location 4240, the circuity module 4250, and the like may be aligned in a same row (e.g., row 4236). In some cases, one or more of the cut-out areas, circuitry module areas, and/or electrical connection areas may be located in different rows and/or columns of the matrix or grid pattern. In some cases, a matrix or grid pattern may include a combination of one or more of the battery cell locations, the one or more circuitry module locations and/or the cut-out locations. In the illustrative configuration shown in FIG. 57, the matrix or grid pattern may include 36 battery cell locations, 2 circuitry module locations, and two cut-out locations, where one of the cut-out locations accommodates the flexible connection portion 4160.

In some cases, each battery cell location 4230 may be associated with a pair of cut-outs for the anode and cathode connections, as discussed above. Here, a battery cell module may be physically attached to the substrate of the flexible PCB 1400, such as by use of an adhesive material (e.g., glue, tape, etc.) or other such bonding material. The cathode and anode connection tabs may be inserted through a corresponding cut-out 4140 so that the connection tabs may be soldered, welded, or otherwise connected to the connection pad 4150 on the opposite side of the flexible PCB 4100. Additional to a plurality of battery cell locations (e.g., 36 battery cell locations), the flexible PCB 4100 may include one or more locations, marked or unmarked on the flexible PCB 4100, where electronic circuit modules may be attached, such as the electronic circuit location 4240, the electronic circuit location 4250, and the like. For example, electronic circuit modules may be physically attached to the substrate of the flexible PCB 4100, such as by use of an adhesive material (e.g., glue, tape, etc.) or other such bonding material. Further, the flexible PCB 4100 may include a cut-out section 4260 that is of similar size to a battery cell location 4230 that may also be inclusive of at least a portion of an area associated with one or more flex lines (e.g., a flex line 4125a, a flex line 4225b), and the like. The cut-out section 4270 may be configured to correspond with the flexible connector portion 4160.

In some cases, the electrical connection cut-outs (e.g., cut-out 4140) and/or end cut outs (e.g., cut-out 4190a, 4190b) may be disposed near or offset from the flex line 4125b between rows of battery cell locations 4230 at a distance configured to reduce or eliminate stresses applied to the cell tabs (e.g., a cathode connection tab, an anode connection tab) of each battery cell. Because the battery cell locations are reinforced or otherwise stiffened by the battery modules, the flex lines 4225a-i and 4125a-c may allow for the CWB to be flexed within a designed range of motion, when in use. To provide stress relief along these flex lines between the rigid battery cell portions, the obround-shaped cut-outs 4120 are disposed within each flex line 4125 and may be aligned with a portion of the battery cell connection cut-outs (e.g., cut-out 4140) and the edge cut-outs 4190a, 4190b may be aligned to the flex lines 4125 and located at an edge of the flexible PCB 4100.

Figure 58:
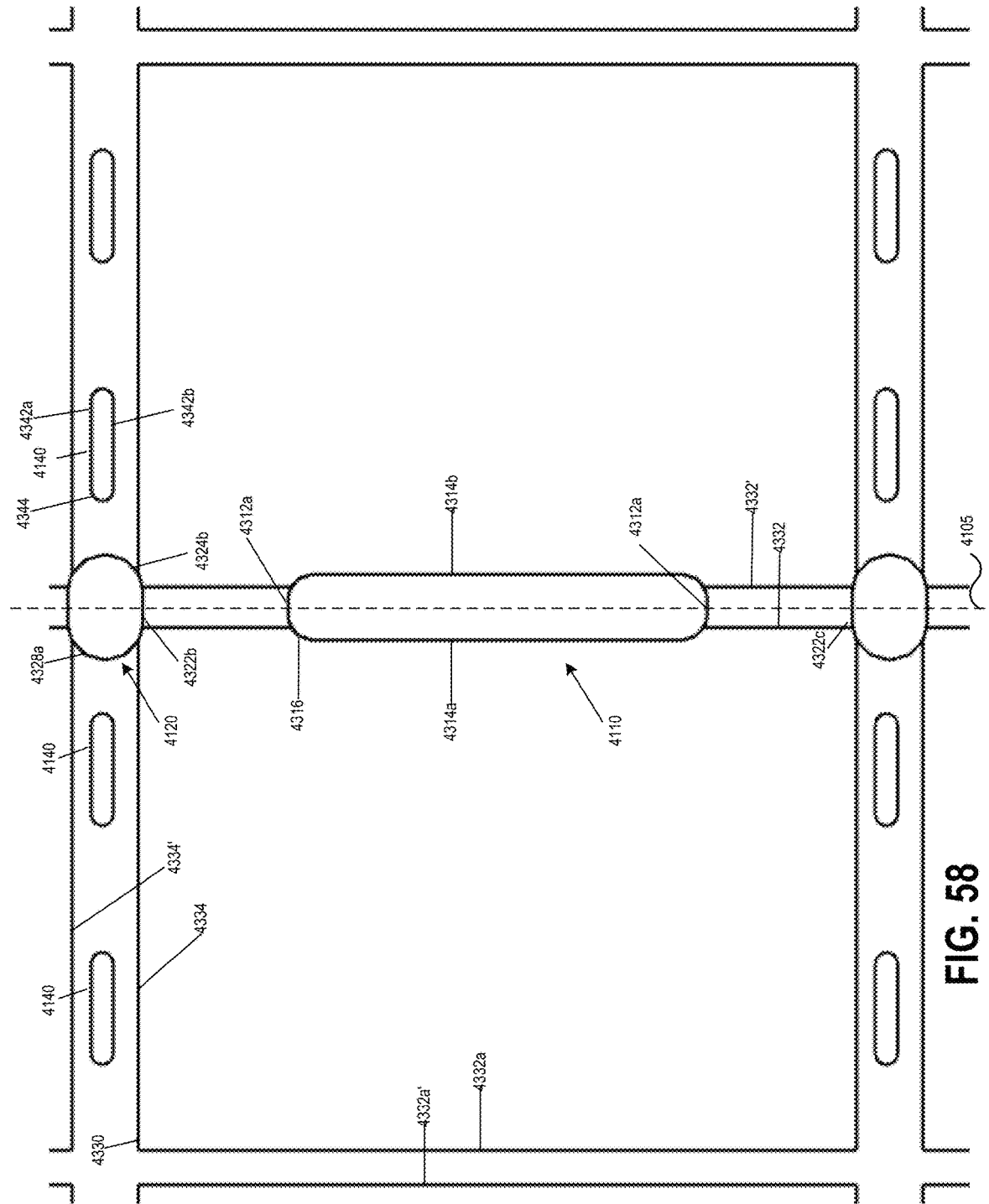
FIG. 58 shows a partial second view of the illustrative flexible printed circuit board including markings for placement of two battery modules.

FIG. 58 shows a partial second view of the illustrative flexible printed circuit board 4100 including markings for placement of two battery modules, cut-outs through which battery cell tabs are placed for connection on the opposite side, and cut-outs providing strain relief along a center line and/or along a flex line perpendicular to the center line according to aspects of the present disclosure. As discussed above, the rectangular cut-out 4110 may be disposed centered on and parallel to the bend line 4105 at the center of the flexible PCB 4100, where at least a portion of the cut-out 4110 may be disposed underneath a battery cell module when installed. In an illustrative example, a battery cell connection area 4330 may be about 50 mm in length along an edge 4332 and about 35 mm in width along an edge 4334. In some cases, along the flex line 4105, the cut-out 4110 may be located near a mid-point of the battery cell connection area 4330.

In the illustrative example of FIG. 58, a first edge 4312a of the cut-out 4110 may be located at a first distance (e.g., about 11.5 mm) from a first edge of the battery cell connection area 4330, the second edge 4312b of the cut-out 4110 may be located at a second distance (e.g., about 11.5 mm) from the second edge of the battery cell connection area 4330, and the length of the cut-out 4110 between the first edge 4312a and the second edge 4312b may be a first dimension (e.g., about 25 mm). A width of the cut-out between the left edge 4314a and the right edge 4314b may be a second dimension (e.g., about 4.5 mm), and a radius of each rounded corner 4316 may be a third dimension (e.g., about 1.1 mm). The specific distances and/or dimension are given for illustrative purposes and other distances and/or dimensions may be contemplated within the scope of this disclosure.

The illustrative obround-shaped cut-out 4120 may be formed as a rectangular area 4322b connecting two semi-circular areas 4328a and 4328b. For example, the obround-shaped connector 4120 may be centered on and perpendicular to the bend line 4105. The rectangular area 4322b may larger than the distance between adjacent battery cell connection areas. Each semi-circular area 4328a and 4328b may overlap at least a portion of adjacent battery connection areas.

The illustrative battery connection cut-out 4140 may be formed as an elongated oval shape, such as an illustrative shape of about 1.5 mm high (e.g., between edge 4342a and edge 4342b) and having a distance of about 6 mm between a center point of each circular end portion (e.g., point 4344) and an overall length of about 9 mm. In some cases, the edge 4342b of the cut-out 4140 may align with a center line through the obround shaped cut-out 4120. Additionally, the obround-shaped cut-out 4120 may be located a distance (e.g., about 4 mm) from the battery connection cut-out 4140.

Spacing of the battery cell connection areas may be configured to allow for construction of the finished CWB and/or for a specified amount of movement (e.g., flexing, bending, etc.) of the CWB when in use. For example, the spacings of the battery cells relative to flex lines 4225a-4225i and/or flex lines 4125a-4125c may allow for an amount of flexing or bending of the CWB as defined in a specification such as, for example, MIL-PRF-32383/4A, while maintaining structural integrity. For example, the spacings of battery cell connection areas may allow for bending of the CWB such that a center section of the CWB to bend while the edges of the CWB are held stationary. In some cases, the edges of the CWB may pivot in the direction of the bend. Upon application of force to the center section of the CWB, e.g., at a distance equidistant between center-line edges of the CWB, the center portion of the CWB may flex up and/or down a specified distance (e.g., at least one inch, between 1 inch and two inches, etc.). For example, spacing of the battery cell connection areas 4330 may be distributed as a grid or matrix pattern such that spacing between allows for uniform distribution of the adjacent battery cell connection areas, along column of battery cell location areas (e.g., column 4235) and/or along rows of battery cell connection areas (e.g., row 4234). In some cases, spacing of adjacent battery cell connection areas adjacent to a central flex line (e.g., flex line 4105) may differ such as to allow for forming a 180-degree bend in the flexible PCB 4100. In the illustrative example shown in FIG. 58, spacing of adjacent columns of battery cell connection areas (e.g., column 4233, column 4235) are illustrated in the spacing between sides 4332a and 4332a' of adjacent battery cell areas and has a distance of about 2.3 mm. As mentioned, to allow for formation of a 180-degree bend in the flexible PCB 4100, spacing along a central line (e.g., flex line 4105, flex line 4225e) may be the same as those between other adjacent columns of battery cell connection areas or may be different. In the illustrative example of FIG. 58, spacing between side 4332 and 4332' may be about 2.68 mm. Spacing between adjacent rows of battery cell connection areas may be configured to allow for flexing and/or bending of the CWB and/or to facilitate electrical connection of a battery cell to the flexible PCB 4100. In the illustrative example of FIG. 58, spacing of adjacent rows of battery cell location areas (the row 4232, the row 4234, the row 4236, the row 4238) are illustrated in the spacing between sides 4334 and 4334' of adjacent battery cell areas and has a distance of about 4.4 mm. The specific distances and/or dimension are given for illustrative purposes and other distances and/or dimensions may be contemplated within the scope of this disclosure.

Figure 59:
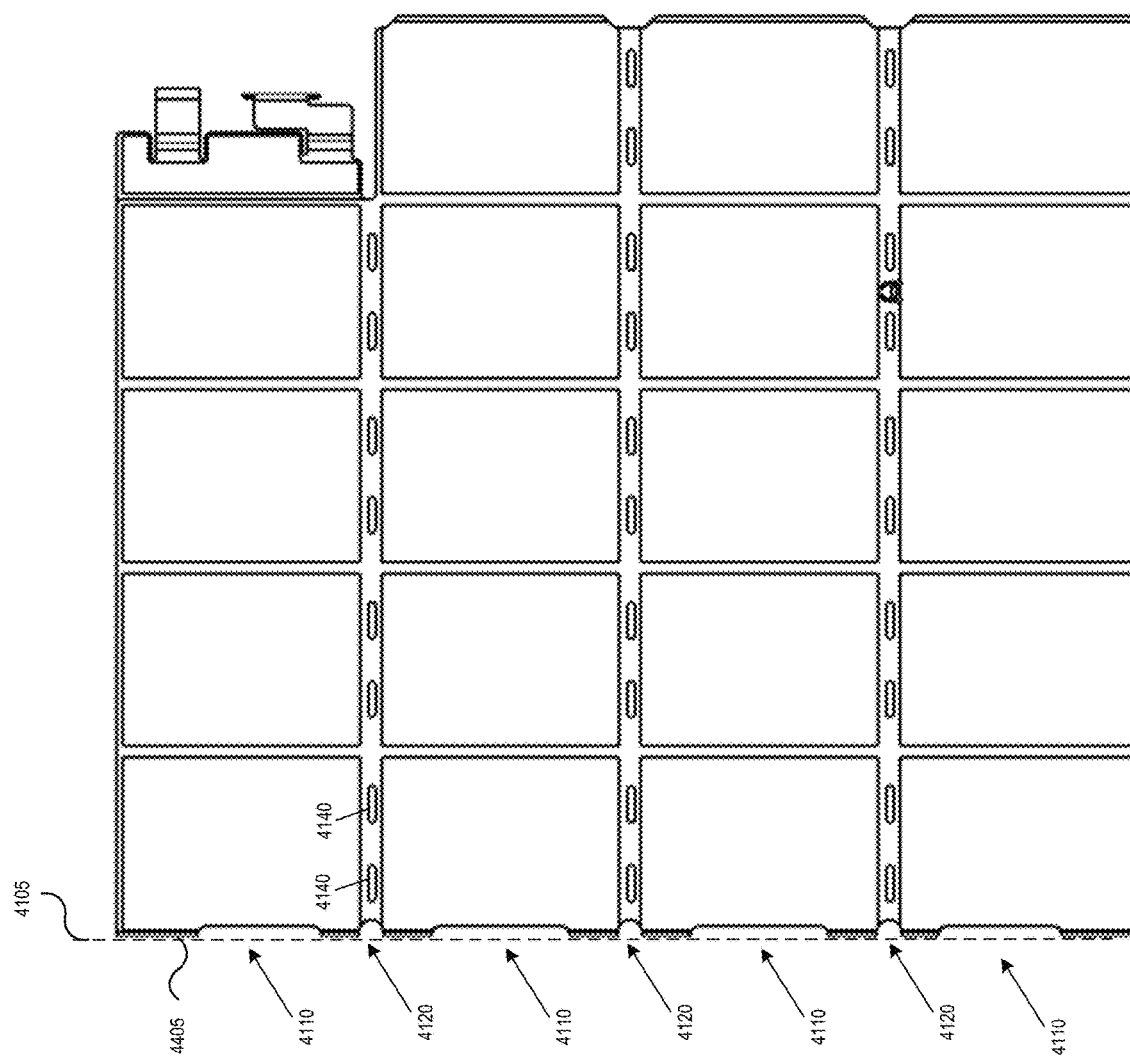
FIG. 59 shows a first view of the illustrative flexible printed circuit board folded along the bend line according to aspects of the present disclosure.

FIG. 59 shows a first view of the illustrative flexible printed circuit board 4100 folded along the bend line 4105 according to aspects of the present disclosure. For example, a 180-degree bend 4405 may be formed along the bend line 4105, such as when a left half of the flexible printed circuit board 4100 is folded over a right half of the flexible printed circuit board 4100 such that the battery modules are located on the exterior portion of the folded flexible printed circuit board 4100 and the electrical connections for the battery modules are disposed on an interior portion of the folded flexible printed circuit board 4100. A diameter of the bend 4405 corresponds the length of the rectangular portion of the obround-shaped cut-out 4120. In the illustrative example, the diameter of the bend 4405 is about 2.25 mm.

Figure 60A:
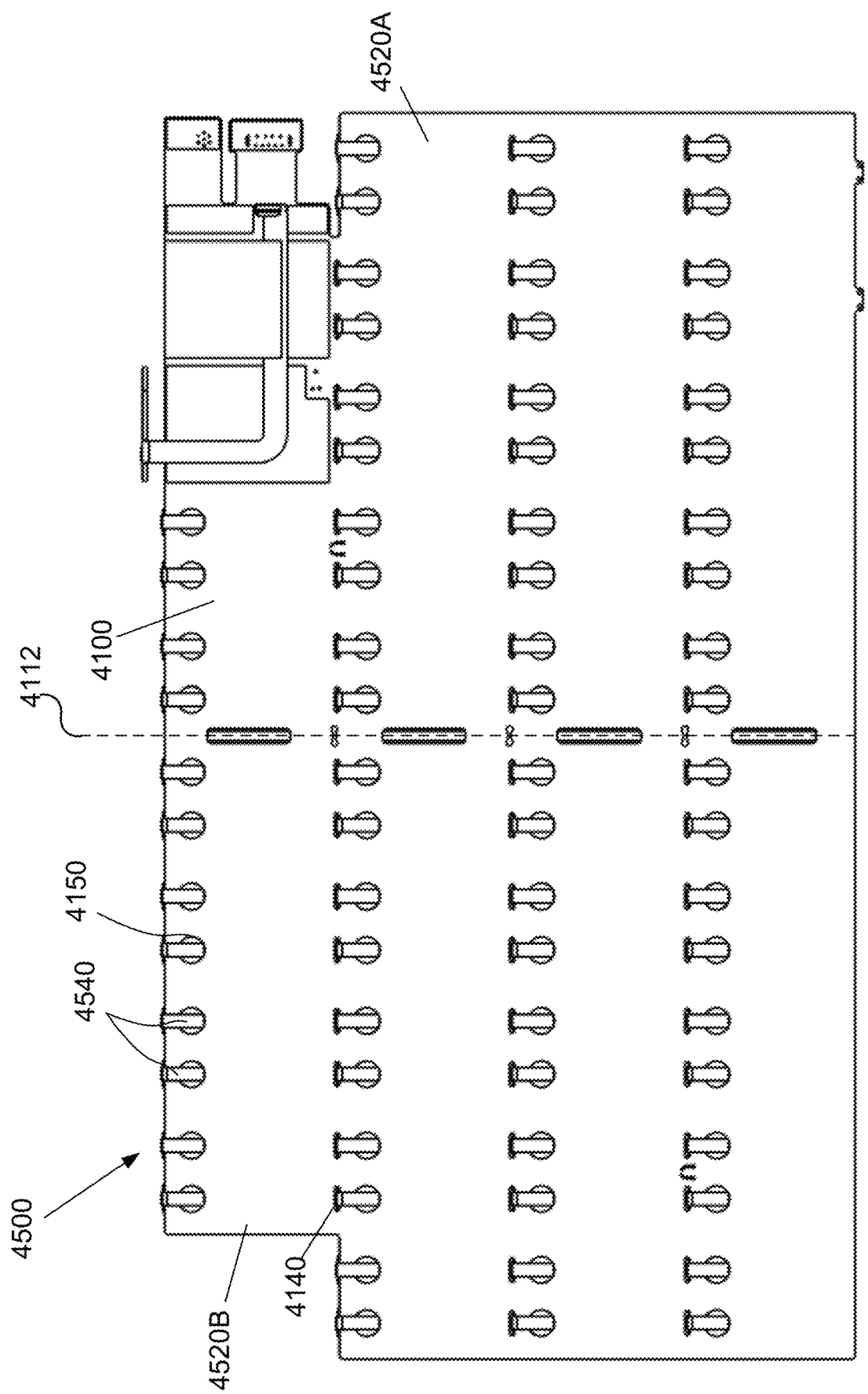
FIGS. 60A-60C show first views of flexible printed circuit board assemblies (PCBA) before folding along the bend line according to aspects of the present disclosure.
Figure 60B:
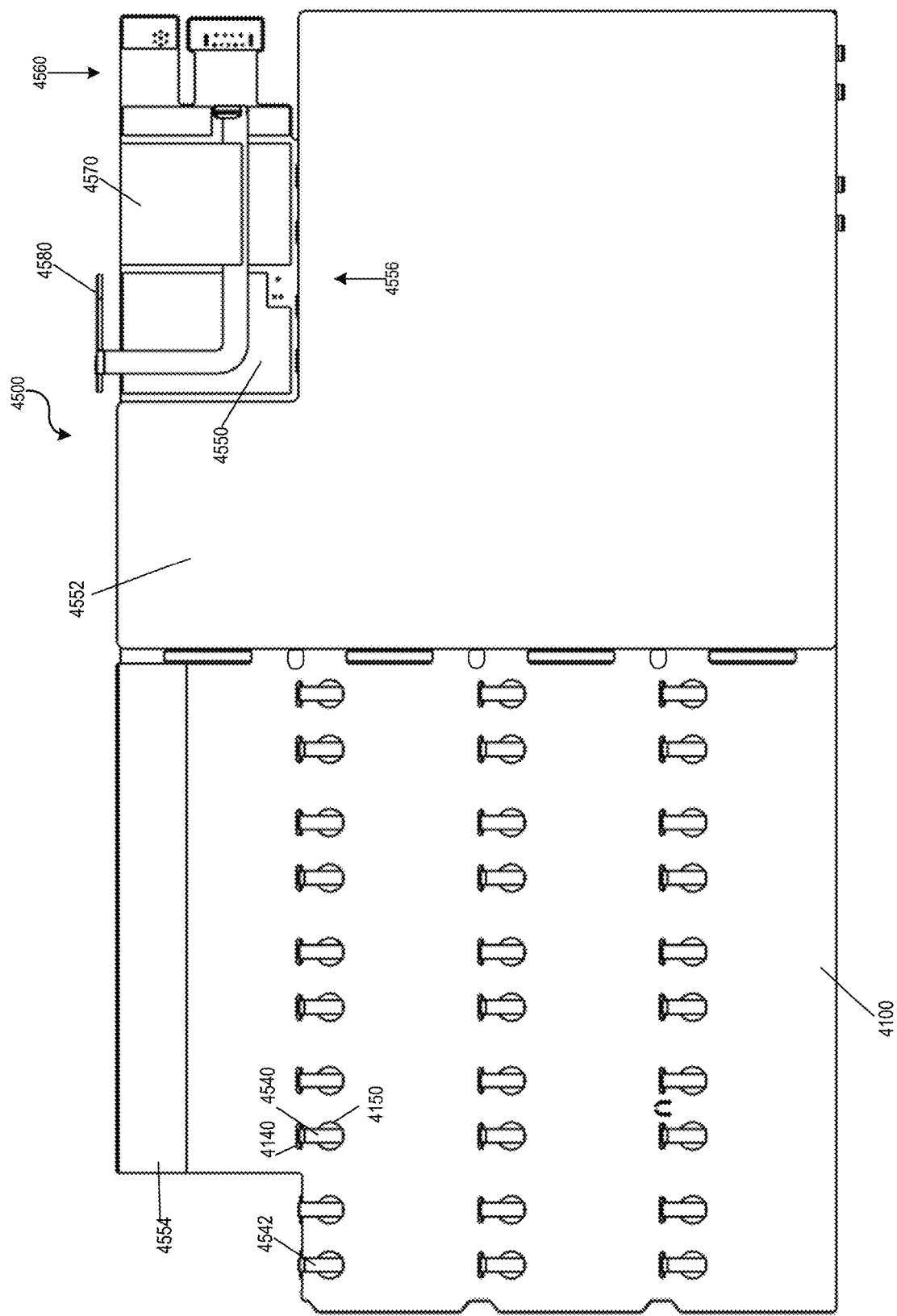
Figure 60C:
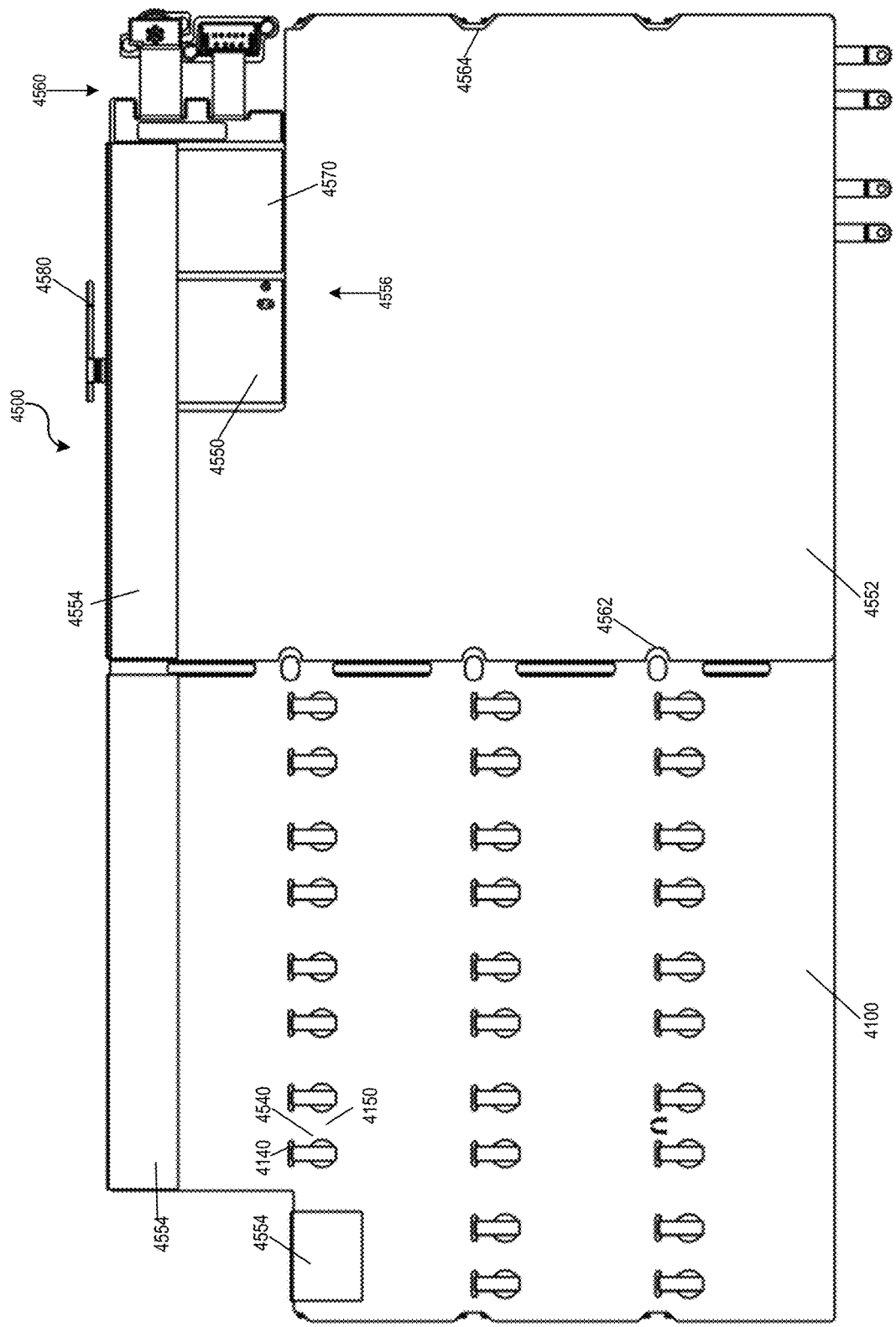

FIGS. 60A-60C show first views of a flexible printed circuit board assembly (PCBA) 4500 before folding along the bend line 4105 according to aspects of the present disclosure. As shown in FIG. 60A, electrically conductive cathode tabs and anode tabs 4540 extend from corresponding battery cell modules through corresponding cut-outs 4140 so that each conductive tab 4540 may be soldered, welded or otherwise connected to a corresponding electrical connection pad 4150 forming an electrical connection for each battery cell to the flexible PCBA 4500. The electrical connection pads 4150 may include an electroless nickel immersion gold (ENIG) surface coating, a lead-free immersion silver surface coating, or other coating that improves electrical connection durability and conductivity between the electrically conductive connection tabs and the electrical connection pads. The connection pad 4150, and/or its surface coating, may allow for individual joining to facilitate connection of aluminum, nickel, or copper battery tabs 4540. The electrically conductive connection tabs 4540 may be connected to corresponding connection pads 4150 using spot welding, ultrasonic welding, laser welding, and/or other welding or connection technique to reduce an amount of heat applied to the surface during the attachment process, an amount of material needed to form the joint while also increasing quality and/or a rate of production compared to typical soldering.

Figure 63:
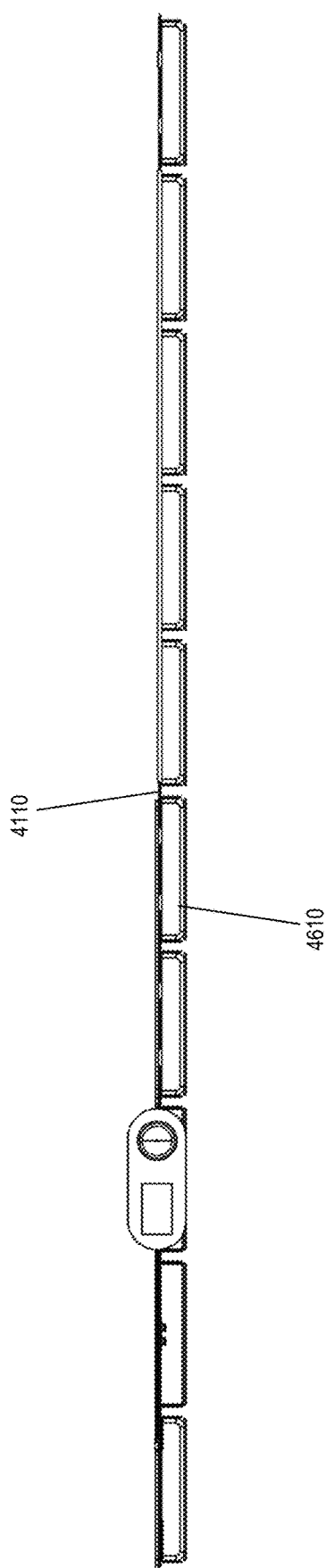
FIG. 63 shows a side view of the flexible PCBA before folding along the bend line according to aspects of the disclosure.

Because of the compact nature of the CWB and the folded configuration of the flexible PCBA 4500, the electrical connection between the connection pads 4150 and the battery connection tabs 4540 may be minimized with respect to the height of the overall connection relative to the inward facing surfaces 4520A, 4520B. For instance, by using a welding technique that applies localized heat over a smaller amount of time compared to traditional soldering, the amount of material, and heat, needed to form a solid connection may be reduced. This means that the outward facing surface of the connection tab 4540 may be have little to no additional material on it after being secured to the pad 4150. Further, by minimizing applied heat during the connection process, a probability that the folded flexible PCBA 4500, the battery cell(s), or other component near the connection site may be damaged is similarly reduced. In some cases, the joint may be formed using only by joining the material of the pad 4150 and the material of the connection tab 4540 without the addition of solder, weld filler, or any additional material. By minimizing the amount of material in the joint, the height, H1, of the connection may be controlled to reduce the overall thickness of the folded flexible PCBA 4500. As shown in FIG. 63, the height, H1, may be defined as the distance between an outward facing surface of each connection tab 4540 and the rear or inward facing surface 4520A or 4520B of the flexible PCBA 4500. For example, the height, H1, of the joint may be approximately 1.5 times the thickness of the connection tab 4540 or may be within a range of 1.2 to 3 times the thickness of the connection tab 4540.

As can be seen in FIGS. 60B and 60C, cathode tabs and anode tabs (e.g., tab 4540, tab 4542, etc.) extend from corresponding battery cell modules through a cut-out 4140 so that each tab 4540 may be soldered, welded or otherwise connected to the electrical connection pad 4150 forming an electrical connection for each battery cell. In some cases, for battery cells located near an edge of the flexible PCBA 4500, the battery tabs (e.g., tab 4542) may be folded over an edge of the flexible PCB 4100 to be physically and electrically connected to the electrical circuitry of the flexible PCBA 4500. To protect against short circuits and/or to provide additional protection and/or structural integrity for the CWB, while maintaining flexibility of the overall assembly, an insulating material 4552, 4554 (e.g., a foam material, a polymeric material, etc.) may be placed over a first half of the flexible PCBA 4500 before folding. The insulating material 4552 may include an insulation cut-out 4556 section, where edges of the insulation cut-out 4556 may be adjacent to a first electrical circuitry module 4550, a second electrical circuitry module 4570, a connector section 4560, and/or an output module 4580 (e.g., an OLED display, and LED display, and the like). In some cases, the insulating material 4552 may include one or more cutouts that may align with a cutout of the flexible PCB 4100, such as cut-out 4562, and cut-out 4564, as shown in FIG. 60C. In some regions of the flexible PCBA 4500, each connection tab 4540 may extend through a cutout 4140 of the flexible PCB 4100 to attach to its corresponding connection pad 4150, while in other regions connection tabs 4540 may extend from its respective battery cell and wrap around an upper edge of the PCB 4100 before attaching to its corresponding connection pad 4540.

Figure 61:
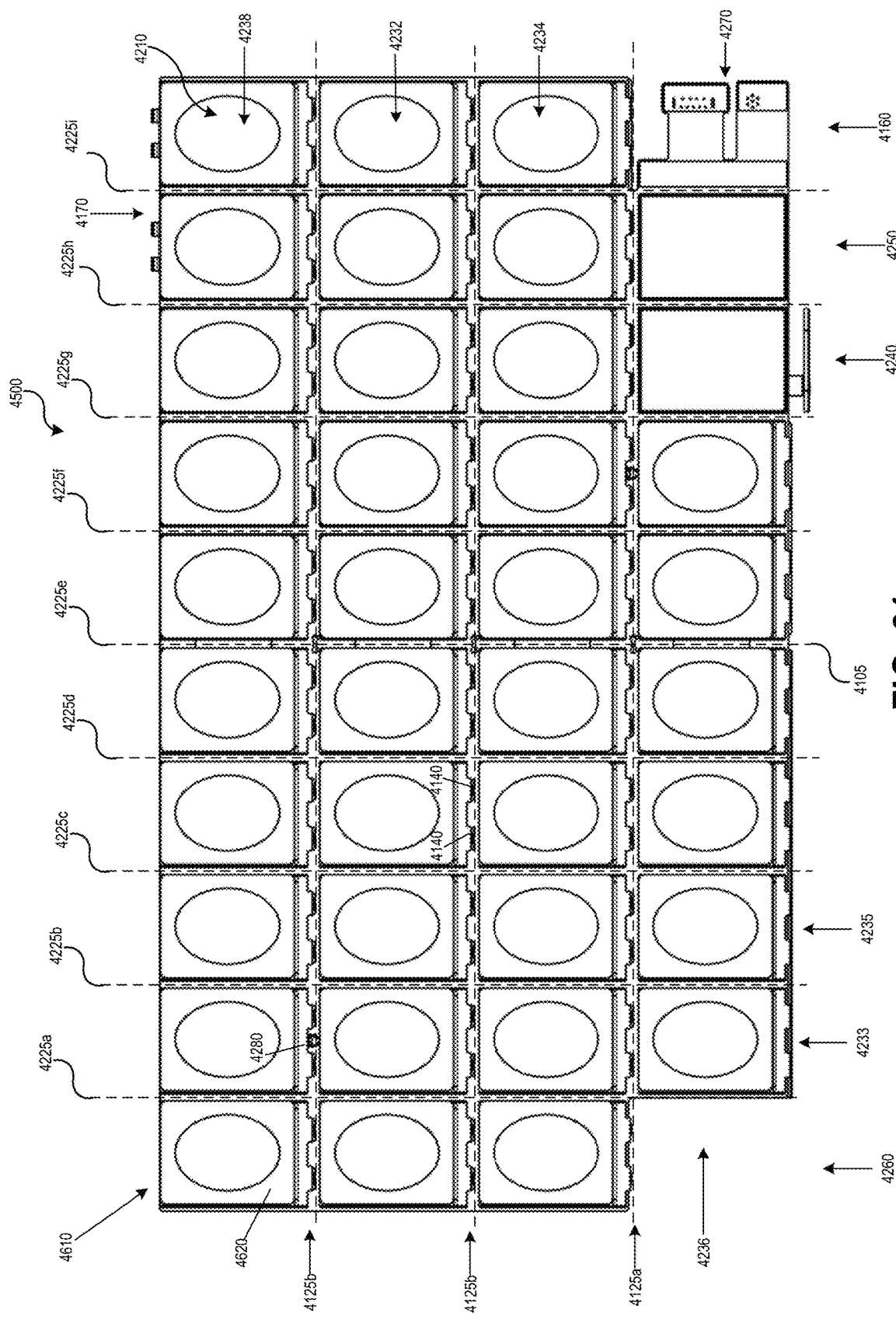
FIG. 61 shows a second view of the flexible PCBA before folding along the bend line according to aspects of the present disclosure.

FIG. 61 shows a second view of the flexible printed circuit board assembly 4500 before folding along the bend line 4105 according to aspects of the present disclosure. Here an array of battery cells 4610 may be physically and electrically attached to the flexible PCBA 4500. For example, each battery cell module 4620 of the battery cell array 4610 may be physically attached to a first side of the flexible PCBA 4500. Electrical connections of each battery cell module 4620 may be passed through a cut-out (e.g., the cut-out 4140 to allow for an electrical and physical connection via a corresponding pad 4150 on an opposite side of the flexible PCBA. Each battery cell module 4620 of the array of battery cells may be connected to an electrical circuit of the flexible PCBA comprising a plurality of conductive paths, where at least a portion of the plurality of conductive paths provide redundant pathways for one of a conductive path electrically connecting the plurality of cathode tabs of the battery cell array 4610 or a conductive path electrically connecting the plurality of anode tabs of the battery cell array 4610. Each battery cell of the battery cell array 4610 may be coupled together to provide electrical power to a desired electrical load that may be removable connected to the CWB. A positive terminal or tab of each battery cell may be coupled to a positive trace pad of a positive trace bus and a negative terminal or tab of each battery cell may be coupled to a negative trace pad of a negative trace bus such that the plurality of battery cell modules of the battery cell array 4610 may be electrically coupled in parallel with one another. In some cases, the positive trace bus and the negative trace bus may each include a plurality of electrical pathways. For example, the positive trace bus and the negative trace bus may each be formed as a conductive mesh. In some cases, the conductive mesh may form a plurality of alternative conductive paths connecting to the plurality of positive trace pads and negative trace pads. Should a portion of the alternate conductive paths of the conductive mesh be damaged, for example by a destructive penetration to the CWB, a tear, a fracture, or other such damage to the flexible PCB, other alternative conductive pathways of the conductive mesh may be capable of providing electrical current around the damaged area.

In some cases, one or more of the alternative conductive pathways may be connected to one of a positive battery cell tab, a negative battery cell tab, protection circuitry, data circuitry, clock circuitry and/or other circuitry associated with operation and/or monitoring of the CWB. Circuitry associated with the battery cell may include battery charging control circuitry, for example. Conductive pathways may carry electrical current and/or data signals between the battery cell and/or associated circuitry within an interior of a CWB housing and one or more contact component accessible on the outside of the CWB housing.

Figure 62:
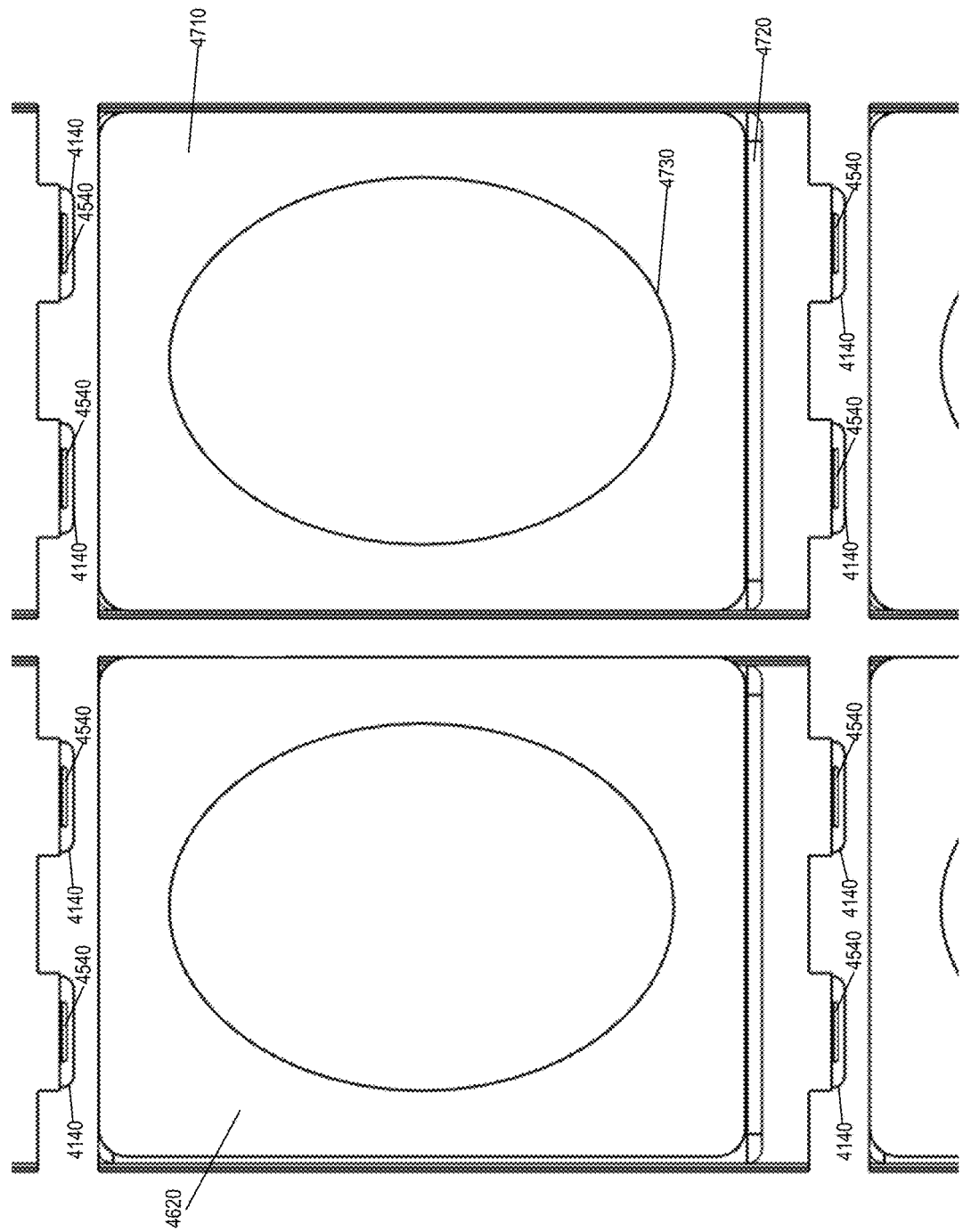
FIG. 62 shows a partial first view of the flexible printed circuit board assembly showing a partial arrangement of adjacent battery cell modules when attached in an array or matrix format on the flexible PCBA according to aspects of the present disclosure.

FIG. 62 shows a partial first view of the flexible printed circuit board assembly 4500 showing a partial arrangement of adjacent battery cell modules (e.g., battery cell module 4620) when attached in an array or matrix format on the flexible PCBA 4500. Each battery cell module 4620 may include an attenuating member 4710 attached to a battery cell 4720 such that when the battery cell module 4620 is physically attached to the flexible PCBA 4500, a first side of the battery cell 4720 may be adhered or otherwise attached to the flexible PCBA 4500 and the attenuating member 4710 may be attached to an opposite side of the battery cell module 4720.

As shown, the plurality of battery cell attenuating members 4710 may be individually attached to the outward facing surface of each battery cell 4720. Each battery cell attenuating member 4710 may be positioned between the outward facing surface of the battery cell 4720 so that a top surface of the attenuating member 4710 faces an interior surface of the CWB, when assembled. In addition, each battery cell attenuating member 4710 may also contact one of the interior surface of the CWB. In short, attenuating member 4710 may be located between the battery cells 4720 arranged on the flexible PCBA 4500, and the battery cell attenuating members 4710 may located between the battery cells 4720 and the housing of the CWB. The attenuating members 4710 may help to protect the battery cells 4720 by absorbing the forces received by the CWB 3010 from any impacts or collisions. The battery cell attenuating members 4710 may be formed from a visco-elastic material that can attenuate shock and vibration. In some cases, the visco-elastic material may include other properties including intumescent properties or other fire blocking and/or suppression characteristics. The visco-elastic material may be formed from a polymeric material such as a polyurethane based material such as Poron®, Sorbothane®, or similar material. In some cases, the battery cell attenuating members 4710 may be made of an electrically insulative material.

Each battery cell attenuating member 4710 may have an opening 4730 extending through the thickness of the attenuating member 4710. Each opening 4730 may create a cavity between the respective outward facing surface of the battery cell 4720 and one of the interior surfaces of the housing of the CWB. As the battery cells 4720 go through cycles of discharging and recharging, the chemical reaction inside the battery cells 4720 may cause the battery cells 4720 to swell or increase in volume. As the battery cells 4720 swell, they may expand into the cavity created by the opening 4730. In some cases, the battery cells 4720 may encounter swelling of less than 4%. In some cases, the battery cells 4720 may swell in a range between 4% and 10%. In some cases, the battery cells 4720 may encounter swelling of about 15% or less. The thickness of the battery cell attenuating member 4710 may be approximately 10 percent of the thickness of the battery cell 4720, or may be within a range of 8 percent and 15 percent of the thickness of the battery cell 4720. In some examples, the opening 4730 may not extend through the entire thickness of the attenuating member 4710 creating cavity within attenuating member 4710. For example, the opening 4730 may extend from the rear surface through at least 50 percent of the thickness, or through at least 75 percent of the thickness. In these cases, the depth of the cavity may be within a range of 4 percent and 15 percent of the thickness of the battery cell 4130.

Figure 64:
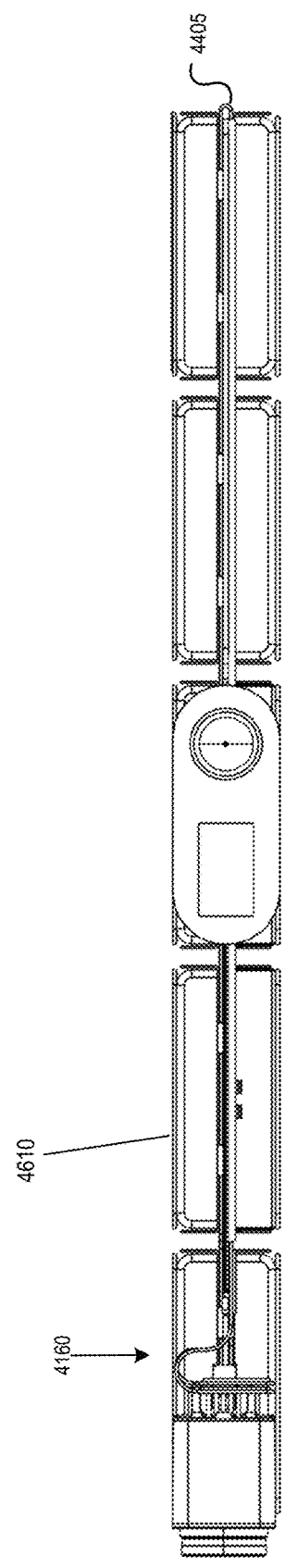
FIG. 64 shows a side view of the flexible PCBA after folding along the center line according to aspects of the disclosure.
Figure 65:
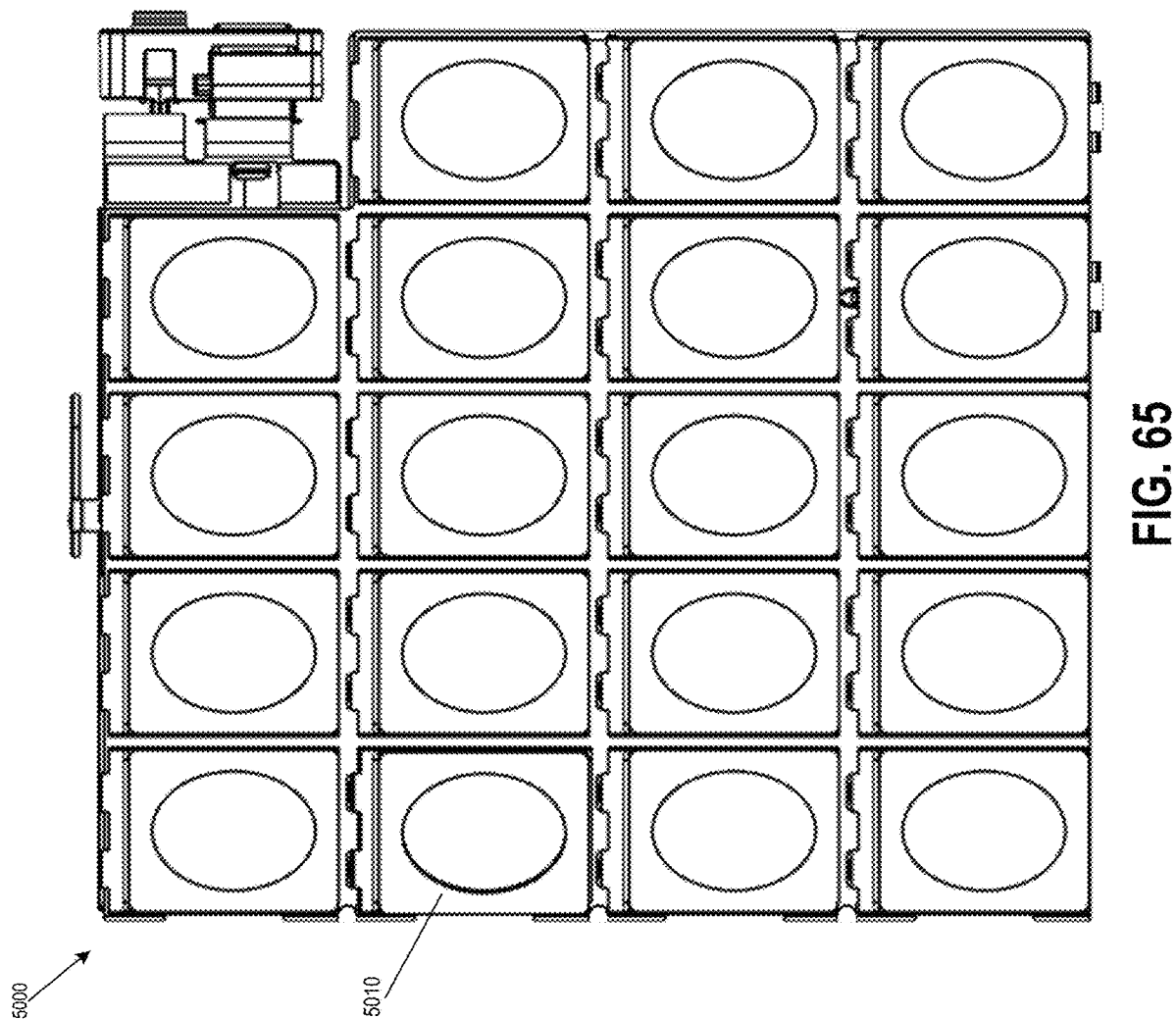
FIG. 65 shows a first view of the flexible printed circuit board assembly after folding along the bend line according to aspects of the disclosure.

FIG. 63 shows a side view of the flexible PCBA 4500 before folding along the bend line according to aspects of the disclosure and FIG. 64 shows a side view of the flexible PCBA 4500 after folding along the center line according to aspects of the disclosure. FIG. 65 shows a first view of the flexible printed circuit board assembly (PCBA) 5000 after folding along the bend line according to aspects of the disclosure. After folding the flexible PCBA 5000, a side of the folded flexible PCBA 4500 is shown to have a battery cell array or matrix having 19 battery cell modules 5010 and an opening including a connector section. In this illustrative example, the battery cell array may be arranged as a 5×4 matrix of battery cells and an opening to accommodate the connector section. While the 5×4 matrix is shown, other arrangements and/or configurations of the battery cell matrix (e.g. a 5×5 matrix, a 4×4 matrix, a 4×3 matrix, a 3×2 matrix, a 4×1 matrix, a 3×3 matrix, etc.) may be contemplated within scope of this disclosure. Once the flexible PCBA 4500 is folded, battery cell modules affixed to either half of the folded flexible PCBA 4500 are positioned opposite to a corresponding battery cell module or a circuitry module.

Figure 66:
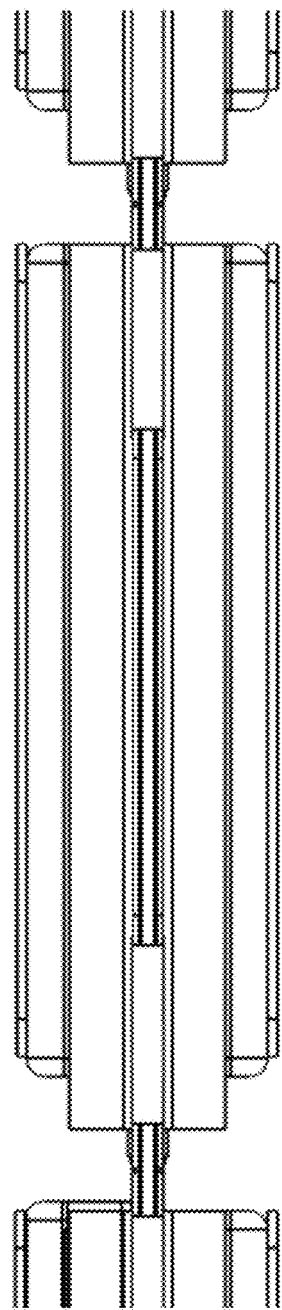
FIG. 66 shows a partial side view of the flexible PCBA after folding along the bend line.
Figure 67:
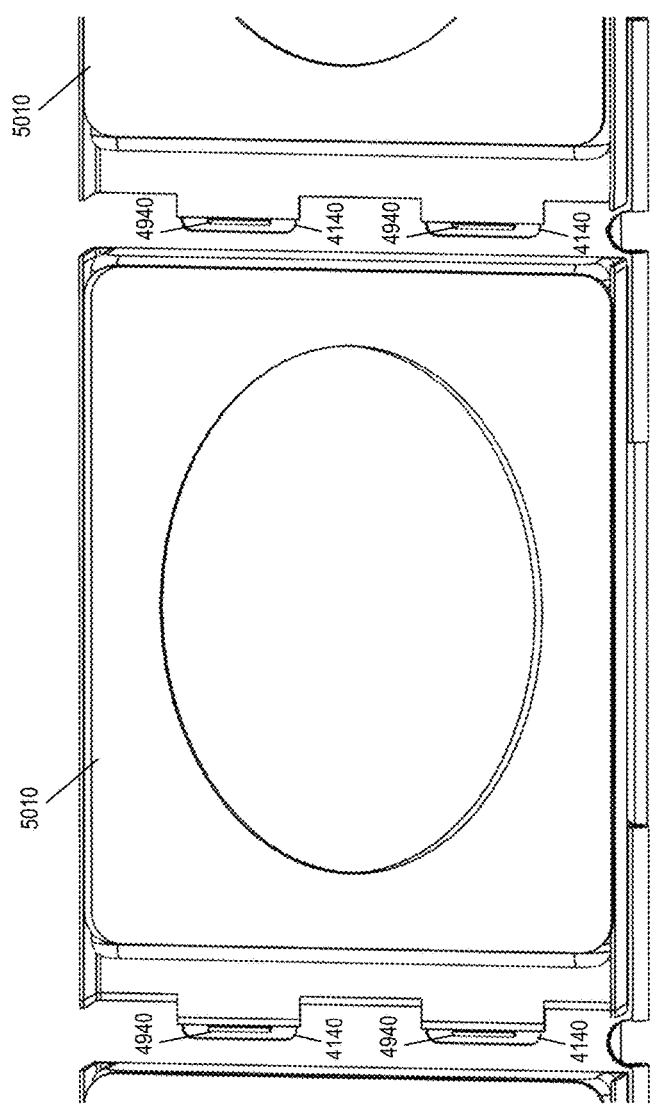
FIG. 67 shows a partial first view of the flexible PCBA after folding along the bend line according to aspects of the disclosure.
Figure 69B:
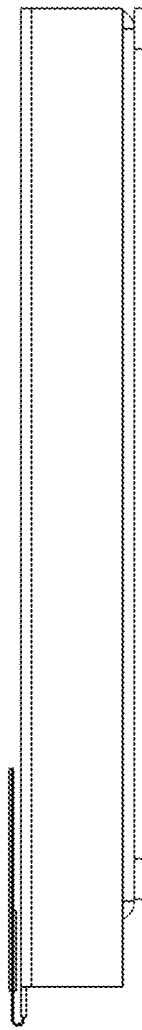
FIGS. 69A-69E show illustrative views of a battery cell module comprising a battery cell and a battery cell attenuating member according to aspects of the disclosure.
Figure 69C:
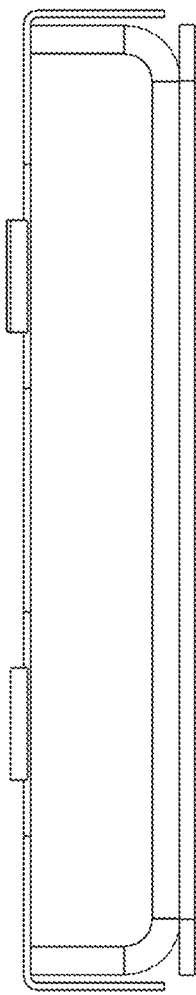
Figure 69D:
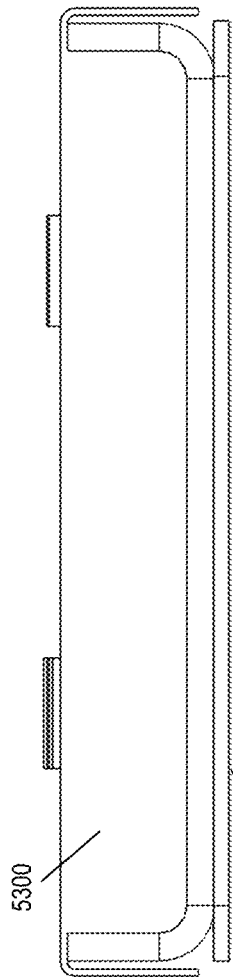
Figure 69A:
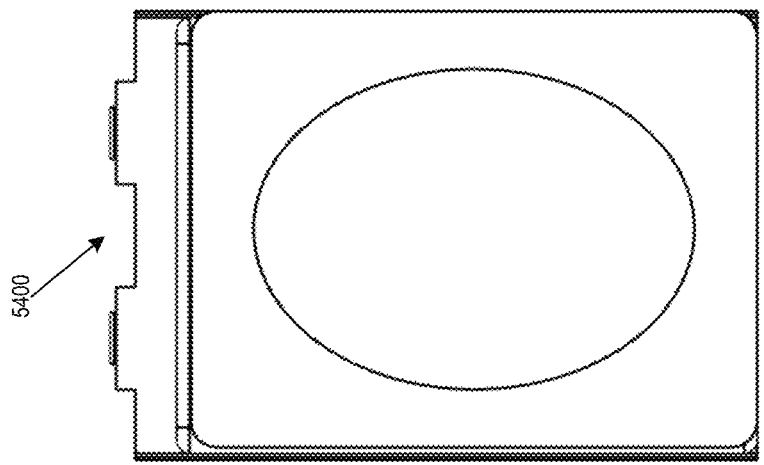
Figure 69E:
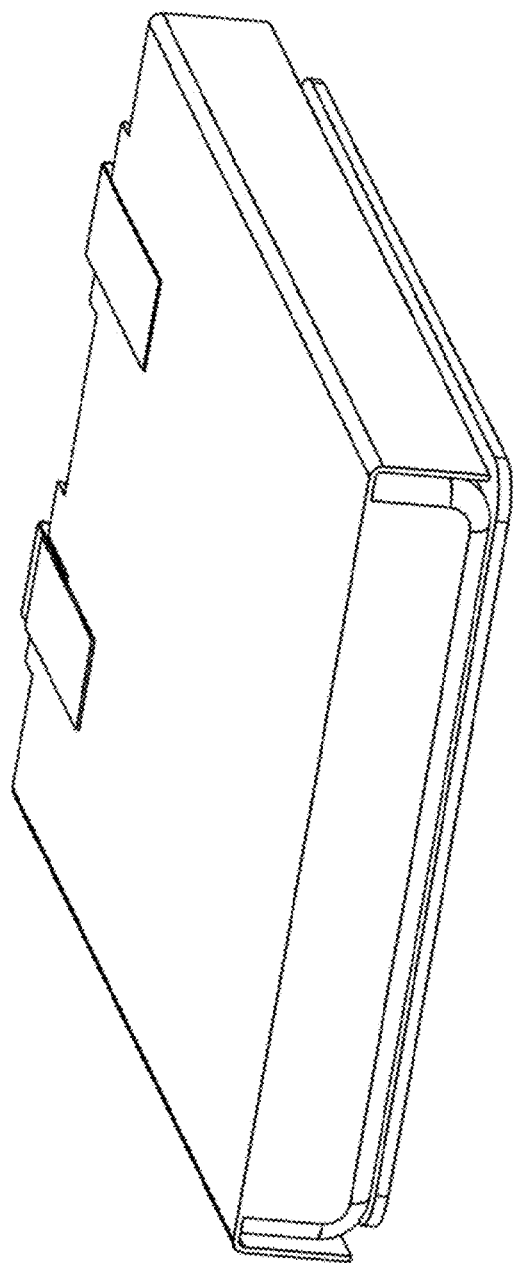

FIG. 66 shows a partial side view of the flexible PCBA 4900 after folding along the bend line and FIG. 67 shows a partial first view of the flexible PCBA 4900 after folding along the bend line according to aspects of the disclosure.

FIGS. 68A-68D show different views of an illustrative battery cell 5300 (e.g., a pouch cell packaged polymer lithium-ion battery), which may be incorporated into a battery cell module as discussed above. In some cases, a chemical system of battery cell 5300 may include one of a lithium cobalt oxide, nickel cobalt manganese, nickel cobalt aluminum, or other such chemical systems. In an illustrative example, the dimensions of the battery cell 5130 may be about 43 mm in length, about 34 mm in width, and about 6 mm in height, but battery cells of other dimensions may be used within the scope of this disclosure. Additionally, the battery cell 5130 may weigh between 22.5 grams and 24.5 grams (e.g., 23.5 grams) and may have an energy storage capacity between 1400 mAh and 1500 mAh (e.g., about 1,435 mAh). The size, weight, and energy storage capacity of each battery cell of the CWB may be designed such that the overall size, weight, and energy storage capacity of the flexible PCBA for the CWB meets an energy storage capacity specification, weight specification, and/or size specification for a CWB. For example, the height, width, and length of each battery cell may be designed, at least in part, to meet a flexibility requirement of the CWB, such that an assembled CWB may conform, under load, to a 7-inch radius curved surface, such that an edge of the CWB may be capable of deflecting, in each direction, at least a specified distance (e.g., 1 inch) from a centerline of the CWB. Additionally, the size, and/or shape of the battery cells may allow for a specified number of battery cells (e.g., about 36 battery cells) and/or configuration of the battery grid such that the energy capacity for the CWB may be at least 148 Watt-hours (Wb) (e.g., about 150 Wh, about 170 Wh, about 190 Wh, about 200 Wh, etc.) and/or where the maximum weight of the CWB is less than a specified maximum weight (e.g., about 2.6 pounds). In some cases, a configuration of the battery cells of the CWB may allow the CWB to output a voltage between about 10 and about 20 V, (e.g., about 14.8V) within a specified size and/or shape of the CWB. For example, an illustrative CWB may have an overall dimensions of between about 8.5 in. and 9.0 inches (e.g., about 8.7 in.)×between about 7.5 in and 8 in. (e.g., about 7.66 in.)× between about 0.5 in. and 0.8 in. (e.g., 0.70 in.).

FIGS. 68A-68D show different views of an illustrative battery cell 5300 (e.g., a pouch cell packaged polymer lithium-ion battery), which may be incorporated into a battery cell module 5010 as discussed above. In some cases, a chemical system of battery cell 5300 may include one of a lithium cobalt oxide, nickel cobalt manganese, nickel cobalt aluminum, or other such chemical systems. In an illustrative example, the dimensions of the battery cell 5300 may be in a range between about 42 mm to about 44 mm (e.g., 43 mm) in length, a range between about 33 mm and 35 mm (e.g., about 34 mm) in width, and in a range between about 5 mm and 7 mm (e.g., about 6 mm) in height, but battery cells of other dimensions may be used within the scope of this disclosure. FIG. 68D shows an illustrative side view of the battery cell 5300. While lithium-ion battery cells in a pouch-cell format are discussed, other battery formats or chemistries may be used, such as prismatic battery cells, can-type battery cells, and the like.

In FIGS. 68A-68D, the battery cell tabs 4540 may include a cathode tab 5302 and an anode tab 5304. The cathode tab 5302 and anode tab 5304 are shown in a bent configuration illustrative of the physical configuration of the cathode tab 5302 and anode tab 5304 for when the battery cell 5300 is physically attached to the flexible PCB 4100, where the cathode tab 5302 and the anode tab 5304 are placed through corresponding cutouts 4140 so that the cathode tab 5302 and the anode tab 5304 each may be electrically connected (e.g., soldered, laser welded, ultrasonic welded, etc.) to a corresponding pad 4150. In some cases, the cathode tab 5302 may be made of a first material (e.g., copper) and may be clad in a second material (e.g., aluminum). In some cases, the cathode tab may be made of a single material (e.g., aluminum, copper, etc.). This cladding arrangement may cause a thickness and/or height of the cathode tab 5302 relative to its respective inward facing surface of the PCB 4100 to be greater than a thickness or height of the anode tab 5304. The anode tab and the cathode tab may be made of or include a similar electrically conductive metal, such as copper, aluminum, nickel and the like. In the illustrative example of FIG. 68A, opposing edges of the cathode tab 5302 and the anode tab 5304 may be positioned approximately 12 mm apart or within a range of 10 mm and 15 mm apart. Further, the cathode tab 5302 and the anode tab 5304 may have a similar length (e.g., about 12.4 mm) and/or a similar width (e.g., about 4 mm), however, one or more dimensions of the cathode tab 5302 or anode tab 5304 may differ from the other within the scope of this disclosure. FIG. 68A shows a front view of the battery cell 5300. The terms "top" 5342 and "bottom" 5344 are terms that refer to specific sides of the battery cell 5300, where the top 5342 and bottom 5344 adjacent the front 5346 and rear sides 5348 of the battery cell 5300 is affixed to the flexible PCB 4100, the outward facing surface 5332 may be on a front 5346 of the battery cell 5300 is opposite the bottom 5344 side and faces towards an interior surface of a housing of the CWB. FIG. 68D shows a top view of the battery cell 5300 that illustrates a thickness of the battery cell 5300. FIG. 68B shows an illustrative side view of the battery cell 5300. While lithium-ion battery cells in a pouch-cell format are discussed, other battery formats or chemistries may be used, such as prismatic battery cells, can-type battery cells, and the like.

In some cases, connection locations for each battery cell 5300 may be marked on the flexible PCB 4100. Additionally or alternatively, battery cell connection locations may include a rigidizing material, or may be otherwise reinforced such as via attachment of a battery cell module. Each battery cell connection location may be associated with a pair of cutouts 4140 for the anode and cathode connections, as discussed above. Here, a battery cell module 5300 may be physically attached to the substrate of the flexible PCB 4100, such as by use of an adhesive material (e.g., glue, tape, etc.). Electrically conductive cathode and anode connection tabs 5302, 5304 may be inserted through a corresponding cutout 4140 so that the connection tabs 4540 may be welded, or otherwise connected to the connection pad 4150 on the rear side of the flexible PCB 4100 to create an electrical connection between the battery cell 5300 and the flexible PCB 4100. The cathode and anode connection tabs 5302, 5304 may be different materials. For instance, the electrically conductive cathode and anode connection tabs 5302, 5304 may comprise one or more of aluminum, copper, nickel, or other materials.

FIGS. 69A-69E show illustrative views of a battery cell module 5400 comprising a battery cell (e.g., the battery cell 5300) and a battery cell attenuating member 4710 (e.g. an attenuating member made of a resilient, shock absorbing material) according to aspects of this disclosure. In the illustrative example, the battery cell attenuating member 4710 may be affixed to a top surface (e.g., top 5320) of the battery cell 5300 to form the battery cell module 5400. In some cases, the battery cell attenuating member 4710 may be affixed with glue, epoxy, tape or other adhesive substance. In some cases, as can be shown between the views of FIGS. 69C and 69D, the attenuating member may be aligned with a center line of the battery cell 5300. For example, one or more center lines of the attenuating member 4710 may be aligned with one or more corresponding center lines of the battery cell 5300. In some cases, the attenuating member may be slightly offset or from a center line of the battery cell 5300. For example, a first edge of the attenuating member 5310 may be aligned with a corresponding edge of the battery cell pouch, while a second opposite edge of the battery cell attenuating member 4710 may be aligned with the foil external to the opposite edge of the battery cell pouch.

FIGS. 70A and 70B show partial illustrative views of at least one battery cell module attachments to the flexible PCBA 4500 according to aspects of this disclosure. For example, battery cell tabs (the cathode tab 5302 and the anode tab 5304) are shown in FIG. 70A as being passed through the cut-out 4140 and/or bent around an edge of the flexible PCB 4100 and electrically and physically attached an associated bonding pad 4150. FIG. 70B shows an edge view of a physical arrangement for a battery cell module 5400 attachment to the flexible PCB 4100.

Figure 70E:
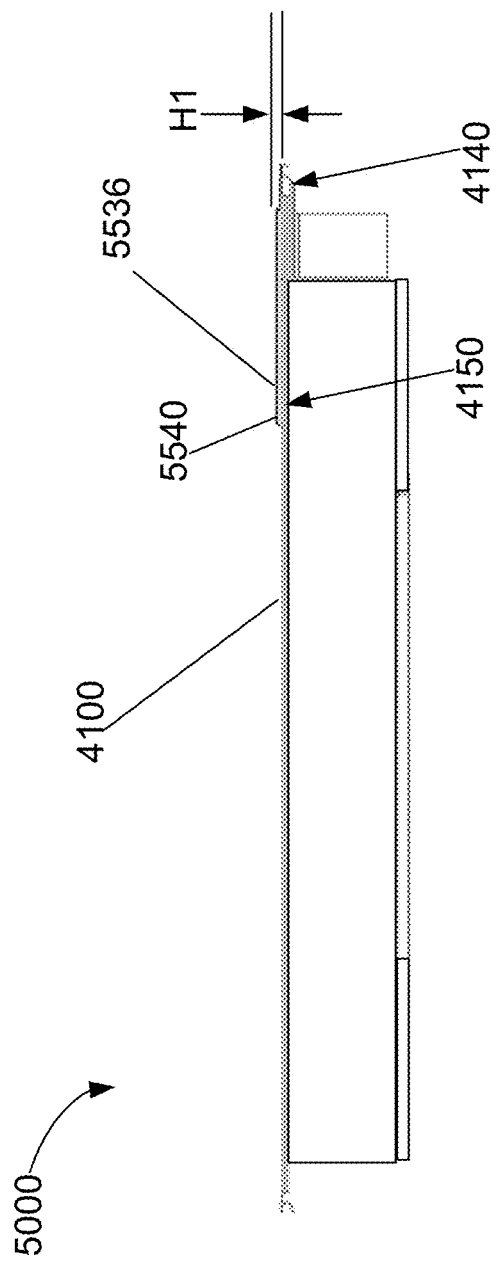

Because of the compact nature of the CWB and the folded PCBA 5000, the electrical connection between the connection pads 4150 and the battery connection tabs (e.g., tabs 5540A, tabs 5540B) may be minimized with respect to the height of the overall connection relative to the inward facing surfaces 4520A, 4520B, as shown in FIGS. 70C and 70D. For instance, by using a welding technique that applies localized heat over a smaller amount of time compared to traditional soldering, the amount of material, and heat, needed to form a solid connection may be reduced. This means that the outward facing surface of the connection tab 5540 may be have little to no additional material on it after being secured to the pad 4150. Further, by minimizing applied heat during the connection process, a probability that the folded PCBA 5000, the battery cell 5300, or other component near the connection site may be damaged is similarly reduced. In some cases, the joint may be formed using only by joining the material of the pad 4150 and the material of the connection tab 4540 without the addition of solder, weld filler, or any additional material. By minimizing the amount of material in the joint, the height, H1 shown in FIG. 70E, of the connection may be controlled to reduce the overall thickness of the PCBA 4100 when folded (e.g., the folded PCBA 5000). As shown in FIG. 70E, the height, H1, may be defined as the distance between an outward facing surface 5536 of each connection tab 5540A, 5540B and the rear or inward facing surface 4520A or 4520B of the flexible PCB 4100. In some cases, the joint formed by joining the material of the pad 4150 with the material of the connection tab 4540 may be made via a process capable of minimizing the height of the joint, such that the joint thickness is much less than the thickness of the connection tab 4540. For example, the height, H1, of the joint may be made via a process (e.g., laser welding) such that at least a portion of the connection tab 4540 and/or a portion of the pad 4150 may be joined together with a joint height that is less than the height of a joint of similar materials made through use of a different process (e.g., soldering). For example, the height H1 may be approximately 30% of the thickness of the connection tab 4540 or may be within a range of 10% to 70% of the thickness of the connection tab 4540.

In some regions of the flexible PCB 4100, such as for battery cell 5300B, each connection tab 4540 may extend through a cutout 4140 of the flexible PCB 4100 to attach to its corresponding connection pad 4150, while in other regions, connection tabs 4540 may extend from respective battery cell 5300 and wrap around an upper edge of the flexible PCB 4100 before attaching to its corresponding connection pad 4150. For example, as shown in FIGS. 70C and 70D, battery cell 5300A that may be positioned near an edge of the flexible PCB 4100 (e.g., a battery cell may not have an adjacent battery cell positioned adjacent to it on the side of the battery cell that has the connecting tabs) may have connection tabs 5540A that extend away from the battery cell and wrap around an upper edge of the flexible PCB 4100 before extending along an opposite side of the flexible PCB 4100 before attaching to connection pad 4150.

Figure 71:
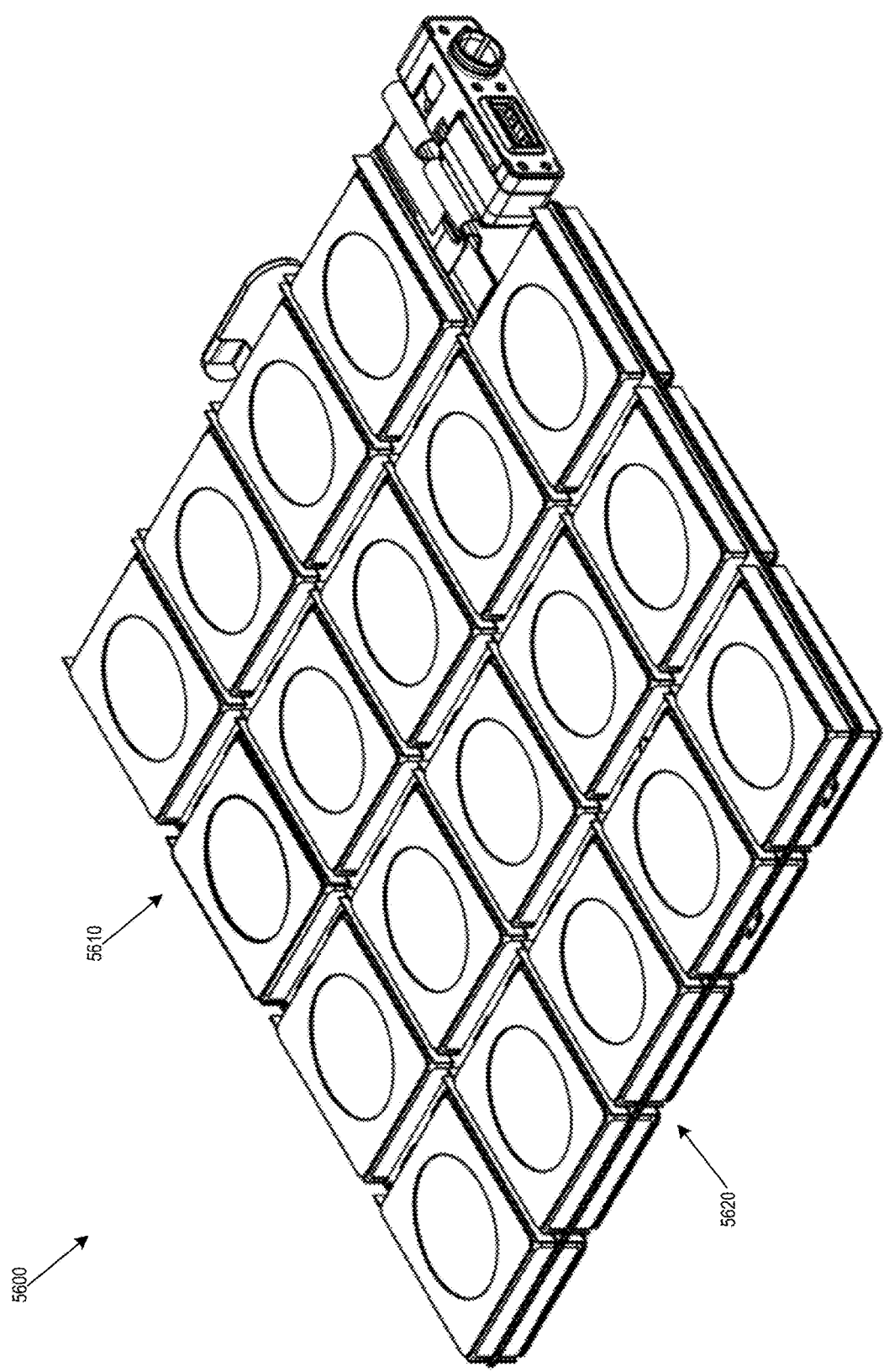
FIGS. 71 and 72 show different perspective views of a battery cell matrix or grid associated with a flexible PCBA according to aspects of the present disclosure.
Figure 72:
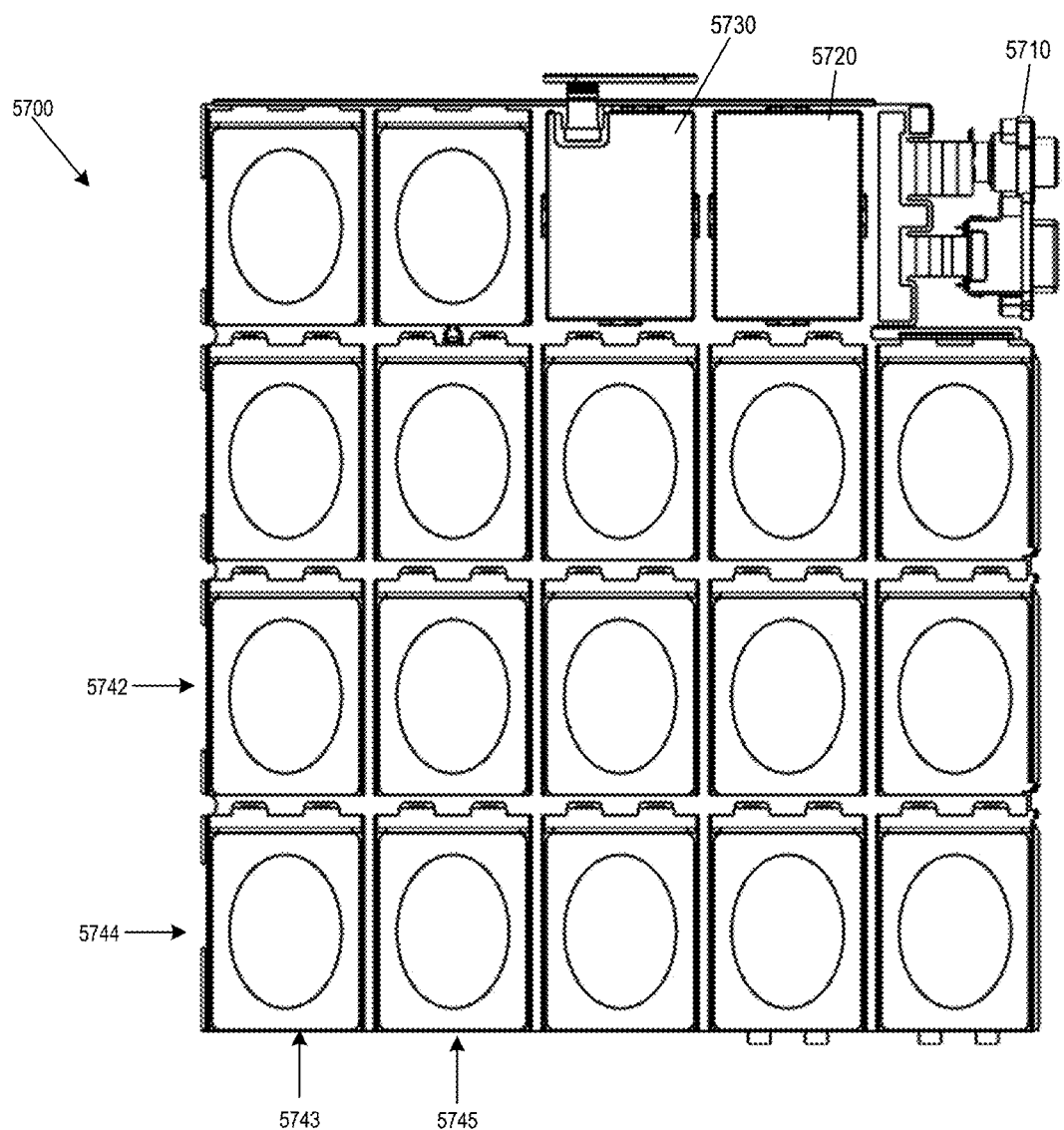

FIGS. 71 and 72 show different perspective views of a battery cell matrix or grid associated with a flexible PCBA according to aspects of this disclosure. For example, the flexible PCBA assembly 5600 may include a number of battery cells arranged in a matrix configuration 5610, such as a 5×4 matrix, with one position having an opening for a connector interface. In some cases, the flexible PCBA 5600 may include a 3-dimensional matrix configuration 5620, such as a 5×4×2 matrix configuration, where some matrix positions may not include battery cell modules, but may include circuitry modules, connection modules, open spaces and/or the like. FIG. 72 shows a view of an opposite side of the flexible PCBA 5600 of FIG. 71, where positions of the matrix may be filled battery cell modules, a connector module 5710, and/or one or more circuitry modules 5720, 5730. Considering the view of FIG. 72, a 3-dimensional (e.g., a 5×4×2) battery cell matrix configuration 5620 may include the 5×4 matrix configuration 5610 of FIG. 71 and the 5×4 matrix configuration 5700 of FIG. 72. In some cases, adjacent columns of the battery cell matrix configuration 5700 (e.g., column 5743, column 5745) may have a spacing between about 4.5 mm to about 5.5 mm (e.g., about 5 mm) and adjacent rows of the battery cell matrix 5700 (e.g., row 5742, row 4174) may have a spacing between about 6.5 mm to about 7.5 mm (e.g., about 7 mm). The spacing between adjacent rows and/or adjacent columns may be determined, at least in part, based on a size and/or shape of a battery module to allow an assembled CWB to meet power, flexing, and/or sizing requirements set forth in a specification and/or standard, such as to meet the requirements of MIL-PRF-32383/4A.

In some cases, a battery cell matrix may include only battery cells, such as a 3×3 battery cell matrix, a 4×4 battery cell matrix, a 5×4 battery cell matrix, or other single-sided or double-sided matrix configuration within a flexible and sealed housing, where control and monitoring circuitry may be externally connected (e.g., via a flexible connector, a cable, and/or the like) to the battery cell matrix, either within or external to a CWB housing. The specific matrix configurations and spacings are given for illustrative purposes and other matrix configurations and spacings may be contemplated within the scope of this disclosure.

Figure 73A:
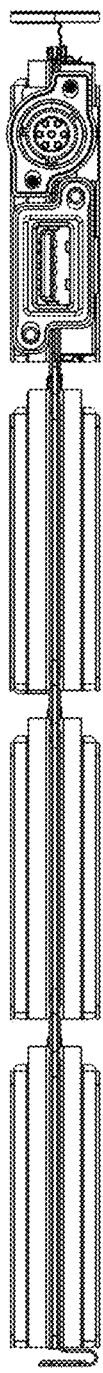
FIGS. 73A-73D show different side views of the flexible PCBA from a perspective of each of four different edges according to aspects of this disclosure.
Figure 73B:
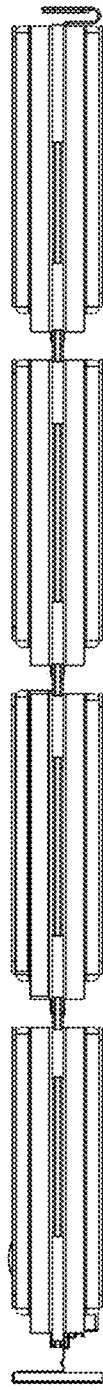
Figure 73C:
Figure 73D:
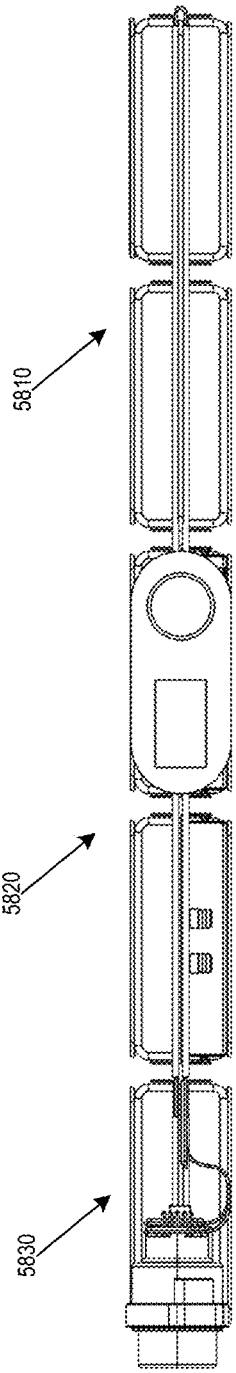
Figure 74:
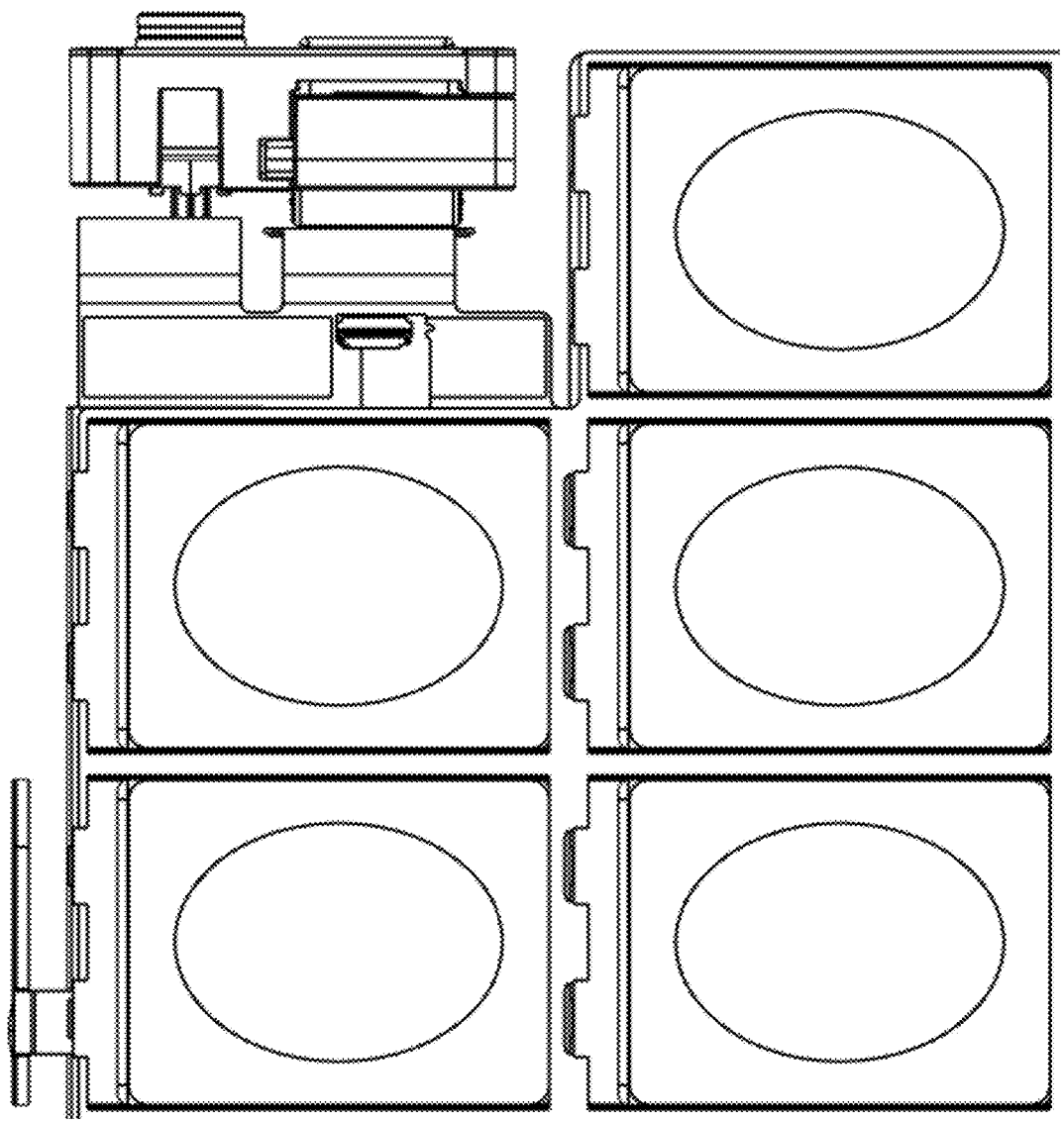
FIGS. 74 and 75 show partial views of the illustrative PCBA of opposite sides near the connector module, according to aspects of this disclosure.
Figure 75:
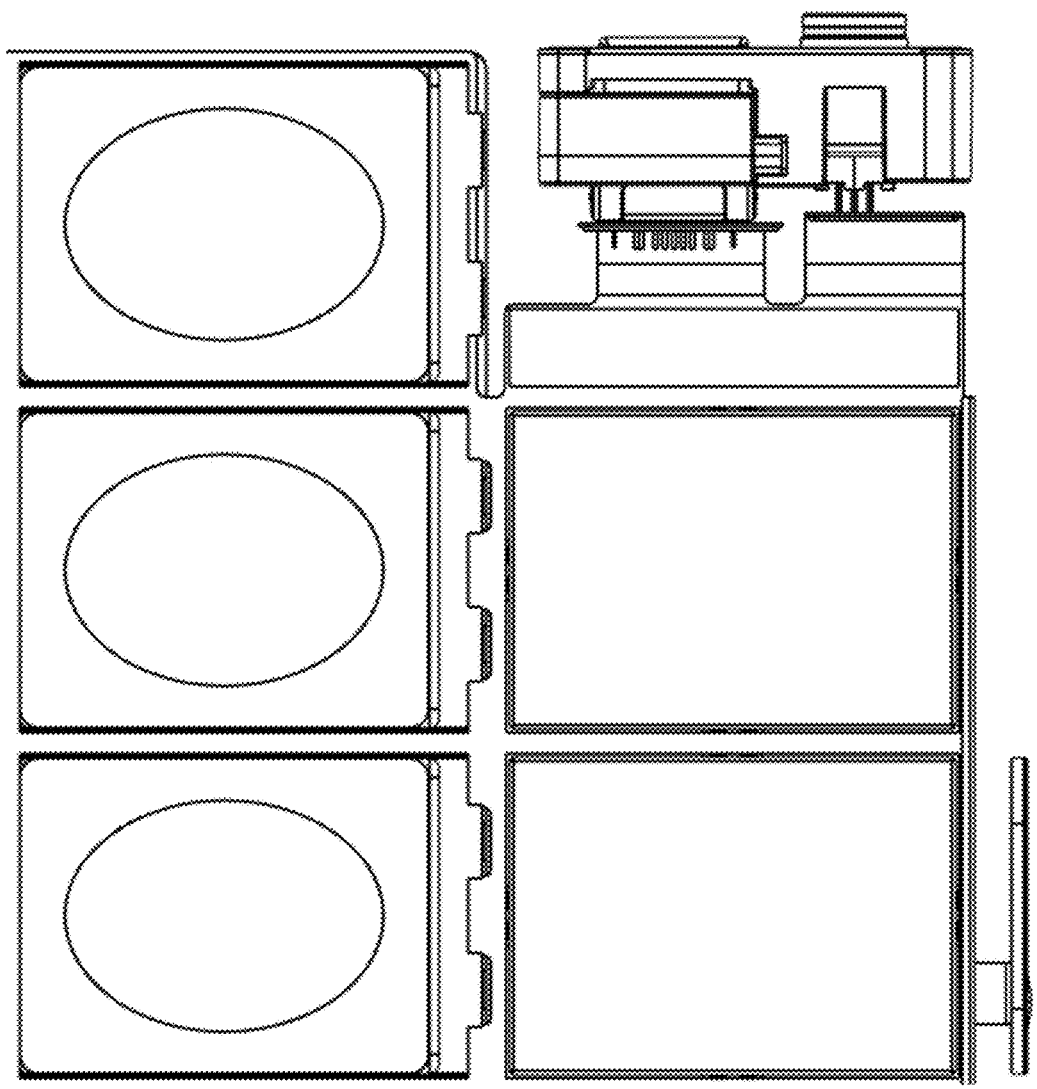

FIGS. 73A-73D show different side views of the flexible PCBA of FIGS. 71 and 72 from a perspective of each of four different edges according to aspects of this disclosure. For example, FIG. 73A shows a 3×2 matrix of battery cell modules with a connector module, FIGS. 73B and 73C show 4×2 and 5×2 matrices of battery cell modules, respectively, and FIG. 73D shows a 2×2 matrix 5810 of battery cell modules, a 2×2 matrix 5820 of battery cell modules and circuitry modules, and a connector interface 5830. FIGS. 74 and 75 show partial views of the illustrative PCBA 5600 of opposite sides near the connector module 4170.

Figure 76:
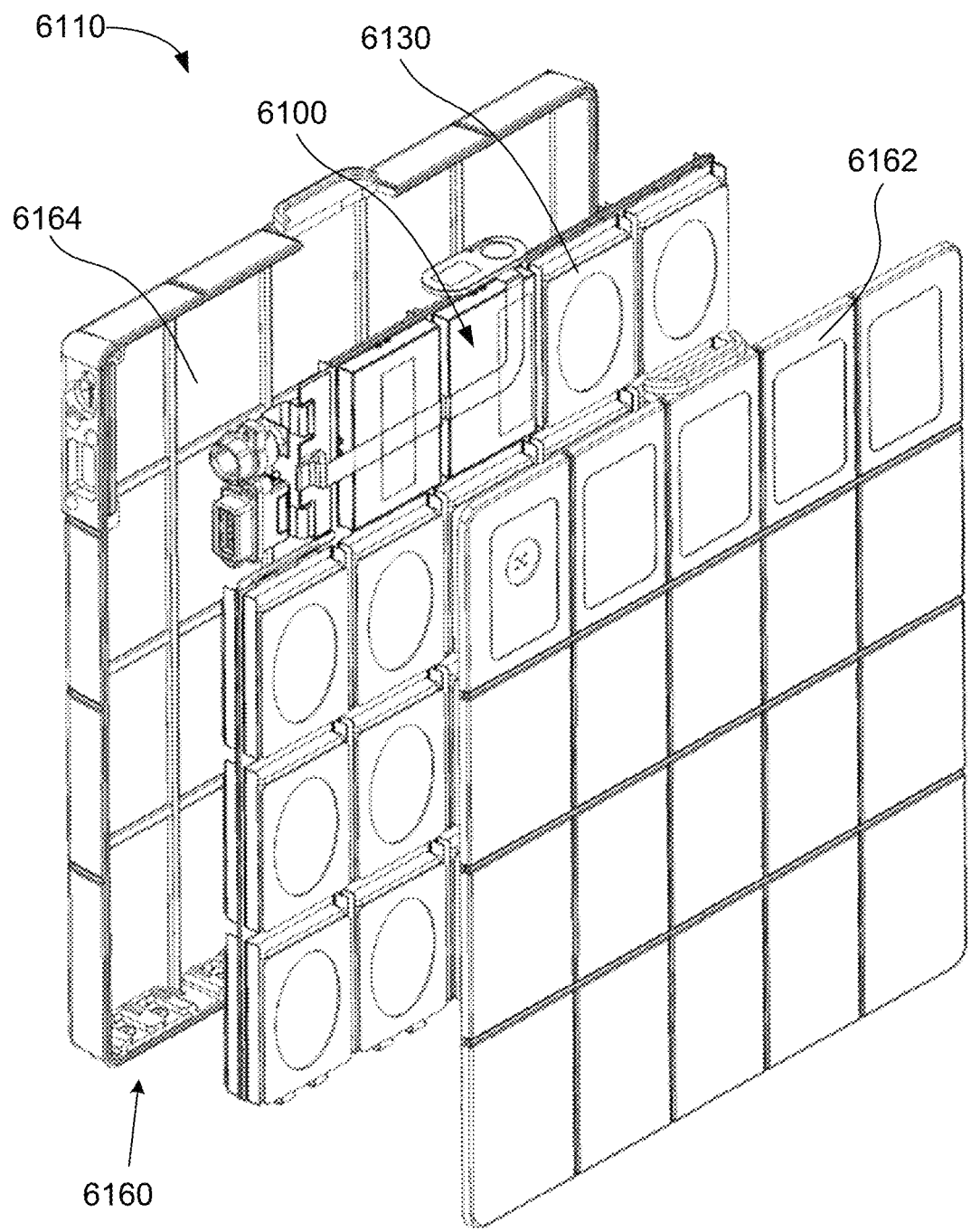
FIGS. 76 and 77 illustrate an illustrative conformal wearable battery (CWB) including a matrix of internal battery cell modules according to aspects of this disclosure.
Figure 77:
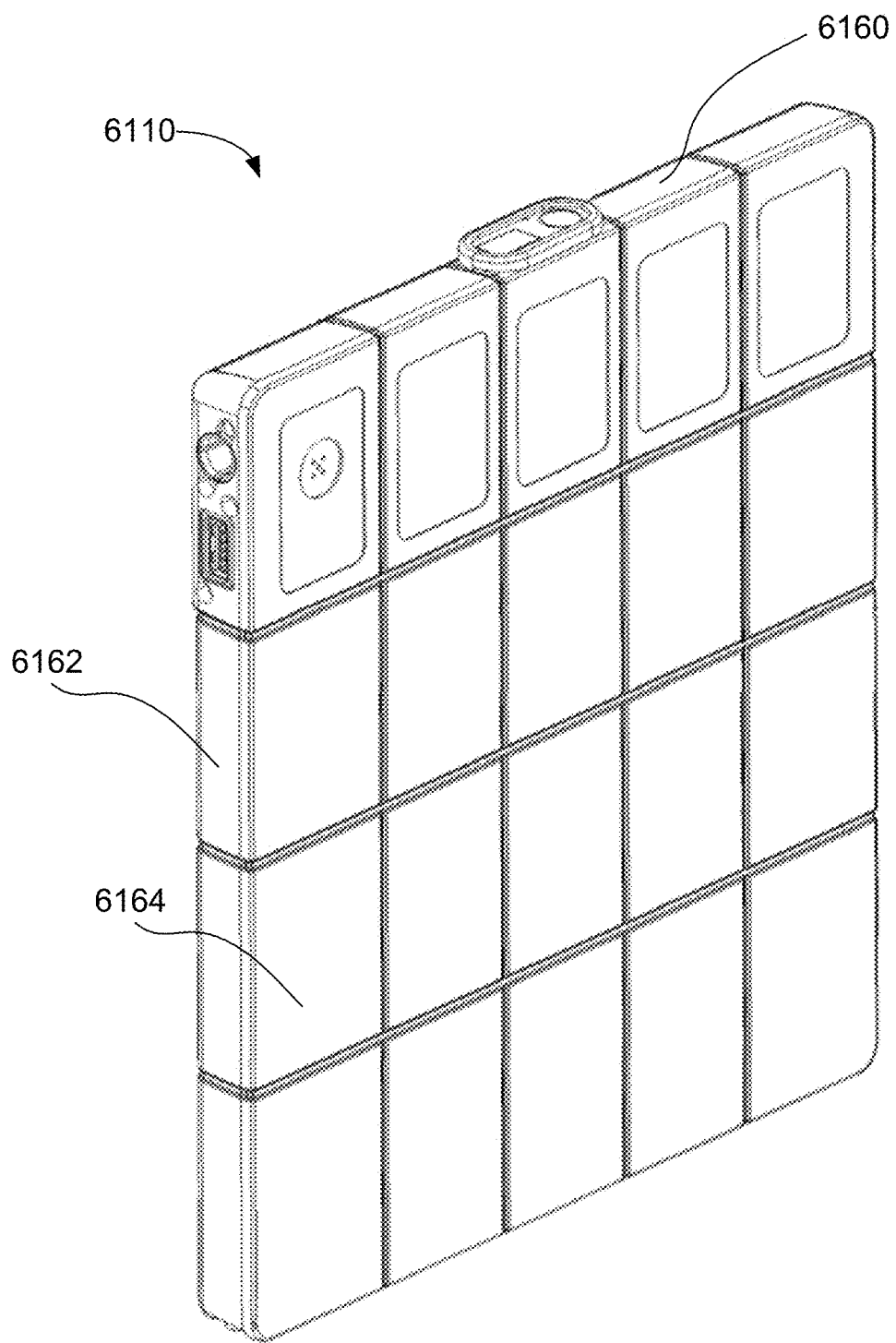

As shown in FIGS. 76 and 77, the battery cell assembly 6100 may be received into a housing 6160 to provide at least physical and/or environmental protection for the CWB 6110. The housing 6160 may include an upper housing member 6162 and a lower housing member 6164. The upper housing member 6162 and lower housing member 6164 may be connected together to form an interior cavity 6166, as shown in FIG. 76. In addition, the upper housing member 6162 and lower housing member 6164 may be sealed together along the perimeter to protect the battery cell assembly 6100 from to prevent ingress of solid material and/or liquid material. Accordingly, the CWB 6110 may meet the requirements of MIL-PRF-32383/4A. Each housing member 6162, 6164 may be formed from a polymeric material using a molding or other technique known to one skilled in the art.

The arrangement of the battery cell modules 6130 on the outward facing surfaces of the flexible PCBA 4500 places the battery cell modules such that an outward facing surface of each battery cell module faces an interior surface of either the upper housing member 6162 or the lower housing member 6164. Additionally, a plurality of battery cell shock absorbing members may be individually attached to the outward facing surface of each battery cell. Each battery cell attenuating member may be positioned between the outward facing surface and one of the interior surfaces of the respective upper or lower housing members 6162, 6164.

Figure 78:
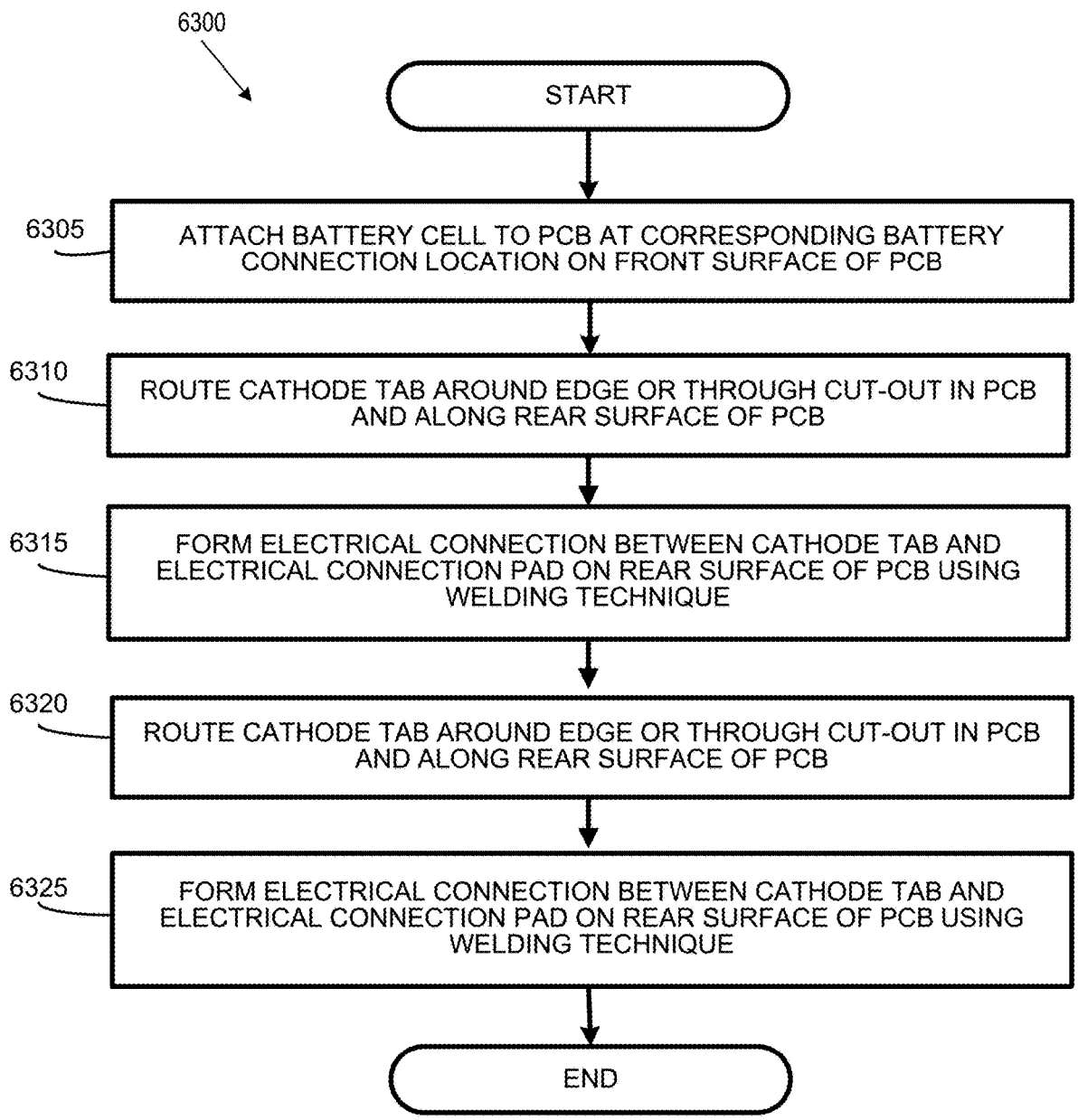
FIG. 78 shows an illustrative installation process for attaching each battery cell module to the flexible PCB according to aspects of this disclosure.

As discussed above, each battery cell may be connected to the flexible PCB 4100 using a means to reduce the height profile, while also maximizing the density of the matrix of the battery cells. As shown in FIG. 78, the installation process 6300 for each battery cell module 6130 to the flexible PCB 4100 may include multiple steps. As noted in step 6305, the battery cell module 6130 may be attached to a corresponding battery connection location 4230 on one of the outward facing surfaces of the flexible PCB 4100. The battery cell module 6130 may be attached using an adhesive (i.e. liquid adhesive, double-sided tape, or other similar method) that is positioned between the rear side of the battery cell of the battery cell module 6130 and the corresponding outward facing surface. When a tape is used, the tape may have a surface area similar to the surface area of the rear side of the battery cell of the battery cell 6130.

In step 6310, the cathode tab of each battery cell may be routed either to wrap around an edge of the flexible PCB 4100 (if the battery cell module 6130 is located along an edge of the flexible PCB 4100) or through a cut-out 4140 (if the battery cell module 6130 is located away from an edge of the flexible PCB 4100). The cathode tab is then formed or bent such that the cathode tab extends substantially parallel to a corresponding inward facing surface of the flexible PCB 4100 and onto the appropriate electrical connection pad 4150. In step 6315, an electrical connection may then be created between the cathode tab and the electrical connection pad 4150 or its corresponding surface coating. The electrical connection may be formed using a technique to create an electrical connection between metal interfacing materials, such as ultrasonic welding, laser welding, or other appropriate welding technique. By using laser welding or ultrasonic welding, the different materials such a cathode tab that includes aluminum to an ENIG surface coating without additional filler materials which can help minimize the height, H1, of the tab to the rear surface of the flexible PCB 4100 (e.g., an inward facing surface) of the flexible PCB 4100. In steps 6320 and 6325, the steps of routing and connecting the cathode tab may be repeated for the anode tab of the battery cell module 6130 to complete the electrical connection for the battery cell 6130. In some examples, the anode tab may be routed and connected before the cathode tab. As another option, to accommodate a production environment, the attachment steps may be done as groupings such that all of the battery cell modules 6130 may be affixed with adhesive first, then the tabs may be routed appropriately, and then the tabs may be have the electrical connections formed using the appropriate welding technique (e.g., each battery connection tab 4540, such as the cathode tab and/or the anode tab, may be welded individually in a sequence until all of the electrical connections are formed).

Electrical and electronic circuits, such as those found in a CWB, may need protection against electrical overloads and/or corresponding thermal runaway conditions that may cause catastrophic failure of the associated device. This protection for the voltage distribution-type circuits, within a CWB, may be provided by a fuse at each electrical connection position of each of the battery cells to an internal printed circuit board (PCB). An electric fuse consists principally of a section of conductor, known as a fusible element or fusible link, of such properties and proportions that excessive current (e.g., current above a predetermined limit) melts and thereby severs the circuit. A characteristic of an electric fuse is its current rating (e.g., 1 amp, 2 amps, etc.), which identifies the maximum current the electric fuse can allow to pass without melting or opening (e.g., 1 amp, 2 amps, etc.). For example, a two (2) amp fuse will melt or clear if current passing the fuse is greater than 2 amps. During assembly, as described above, electrical connection tabs (e.g., an anode tab and a cathode tab) of a battery cell may be physically and electrically connected to an electrical connection pad on the flexible circuit board. For example, heat energy may be applied to a surface of the electrical connection pad and/or a corresponding electrical connection tab via a soldering process, a laser welding process, or the like. In some cases, the heat energy may be conducted along metallic traces integral to the printed circuit board and associated with the electrical connection pad that may, in turn, cause heating of adjacent electrical components electrically and thermally connected to the electrical connection pad. In such cases, a fuse structure located adjacent to the electrical connection pad may experience localized heating via connected metallic traces due to the process of connecting the electrical connection tab to the electrical connection pad. In some cases, an amount of applied thermal energy may heat the electric fuse, which may cause failure of a fuse element of the electric fuse.

In an illustrative example, a trace fuse may be formed in a printed circuit board near, and electrically connected to, an electrical connection pad. The trace fuse may be designed to limit an amount of current to and/or from a battery cell that is physically and/or electrically connected to the electrical connection pad. During a manufacturing process, heat energy may be applied during soldering or welding of the battery cell's electrical connection tab(s) to its associated electrical connection pads on a printed circuit board. Because the metallic traces connected to the electrical connection pads are capable of conducing heat, the metallic traces may facilitate heat transfer from the electrical connection pad to adjacent components, such as the trace fuse. In some cases, the heat transferred, such as during a duration of soldering or welding may heat the trace fuse structures, such as a fuse element. If sufficient heat is conducted to the trace fuse, the fuse element may fail (e.g., open or "blow"), thereby causing a failure of the trace fuse. Because the trace fuse is integral to the printed circuit board, a blown trace fuse may not be repairable, thereby causing the entire printed circuit board to be scrapped. Therefore, a need has been recognized for a fusing structure with redundant fuse elements that may be enabled when a primary fuse element has failed to ensure cost-efficient manufacturing of the conformal wearable battery.

Figure 79:
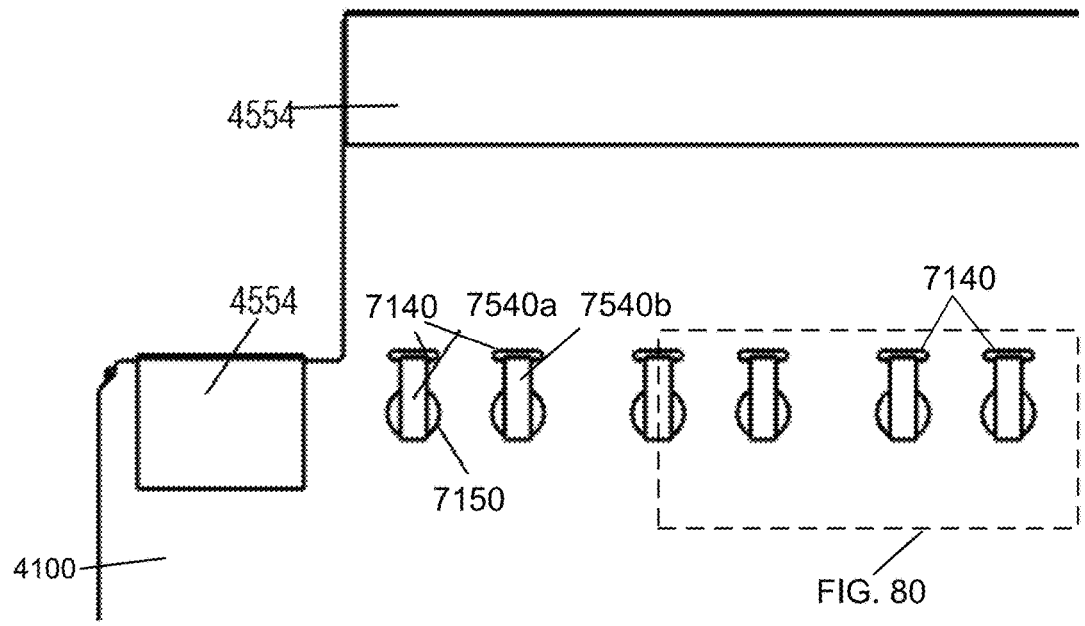
FIG. 79 illustrates a front view of a portion of the battery cell assembly according to aspects described herein.

FIG. 79 illustrates a portion of the flexible printed circuit board assembly according to aspects described herein. As discussed above, a battery cell module 5300 may be physically attached to an opposite side of the substrate of the flexible PCB 4100, such as by use of an adhesive material (e.g., glue, tape, etc.). Pairs of battery cell electrical connection tabs 7540a, 7540b may extend through pairs of cutouts 7140 to facilitate electrical connection of a battery cell module 5300 to the flexible PCB 4100. For example, the battery cell electrical connection tabs (e.g., an anode tab 7540a, a cathode tab 7540b) may be joined to respective electrical connection pads 7150 with a solder connection or with a weld, such as by using one or more of a laser welding process and/or an ultrasonic welding process. For each battery cell module 5300, the anode tab 7540a and the cathode tab 7540b may be inserted through a corresponding cutout of the pair of cutouts 7140 so that the anode tab 7540a and the cathode tab 7540b may be welded, or otherwise connected, to the connection pad 7150 on the opposite side of the flexible PCB 4100 from where the battery cell module 5300 is physically attached. The joining of the anode tab 7540a and the cathode tab 7540b creates an electrical connection between the battery cell module 5300 and the flexible PCB 4100. The anode tab 7540a and the cathode tab 7540b may be made of one or more different electrically conductive materials. For instance, cathode tab 7540a and the electrically conductive anode connection tab 7540a may comprise one or more of aluminum, copper, nickel, or other materials.

Figure 80:
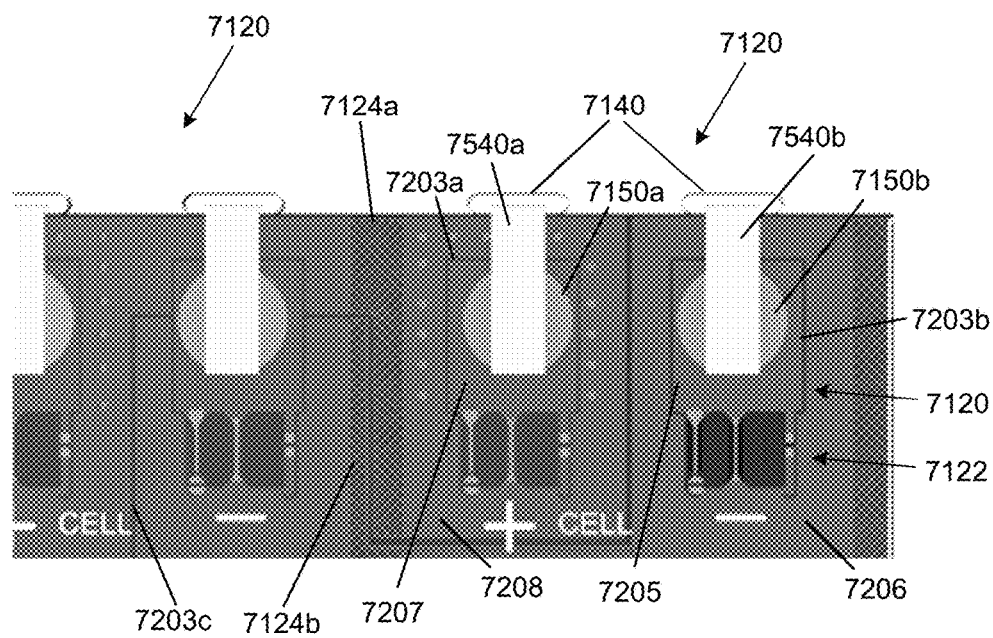
FIG. 80 shows a front view of a portion of the electrical connections of the battery cell assembly according to aspects described herein.

FIG. 80 shows a portion of the electrical connections of the flexible printed circuit board assembly according to aspects described herein. For example, physical and electrical connections of electrical connection tabs of two battery cells to the flexible PCB 4100 are shown. A positive terminal or tab of each battery cell (e.g., the anode tab 7540a) may be coupled to a positive connection pad 7150a associated with a positive trace bus 7208 and a negative terminal or tab (e.g., the cathode tab 7540b) of each battery cell may be coupled to a negative connection pad 7150b associated with a negative trace bus 7206 such that the plurality of battery cell modules of the battery cell array 4610 may be electrically coupled together. As discussed, the anode tab 7540a and the cathode tab 7540b of each battery cell module 5300 are passed through a corresponding pair of cutouts 7140 in the flexible PCB 4100 to be physically and electrically connected to corresponding positive trace pad 7150a and negative trace pad 7150b. Each of the positive trace pad 7150a and the negative trace pad 7150b may be formed as an exposed metallic feature (e.g., a circular metallic pad) of a conductive region formed on a layer of the flexible PCB 4100, such as the anode connection region 7207 and the cathode connection region 7205. Different conductive regions defined on the flexible PCB 4100 may be electrically isolated or separated from other conductive regions by an insulating feature defined in the flexible PCB 4100. For example, the positive trace bus 7208 may be electrically isolated from the negative trace bus 7206 by the insulating region 7203c. Additionally, flexible regions of the flexible PCB 4100, such as the flex line 1125, 4125 and/or bend line 1105, 4105 may include a conductive mesh 7124a to facilitate a flexible electrical connection on the positive trace bus 7208 and a conductive mesh 7124b to facilitate a flexible electrical connection on the negative trace bus 7206. The conductive mesh 7124a and 7124b may each include a plurality of electrical pathways, where a plurality of alternative conductive paths may be used to connect regions of the positive trace bus 7208 and the negative trace bus 7206. Should a portion of the alternate conductive paths of the conductive mesh 7124a, 7124b be damaged, for example by a destructive penetration to the CWB, a tear, a fracture, or other such damage to the flexible PCB, other alternative conductive pathways of the conductive mesh may be capable of providing electrical current around the damaged area and preventing failure of the positive trace bus 7208 or the negative trace bus 7206.

In some cases, such as during a battery cell failure condition, disconnecting a battery cell from the power bus (e.g., the positive trace bus 7208 and the negative trace bus 7206) may be desirable and/or necessary. As such, a battery cell connection region 7120 may be defined for each electrical connection. For example, the illustrative battery cell connection region 7120 may enclose the cathode connection region 7205 and the negative trace pad 7150b and may be defined by the insulating region 7203b. To facilitate an interruptible electrical connection between a battery terminal (e.g., the anode tab and/or the cathode tab) of a battery cell, the battery cell connection region 7120 may include one or more fusible structures, such as a redundant trace fuse structure 7122.

Figure 81A:
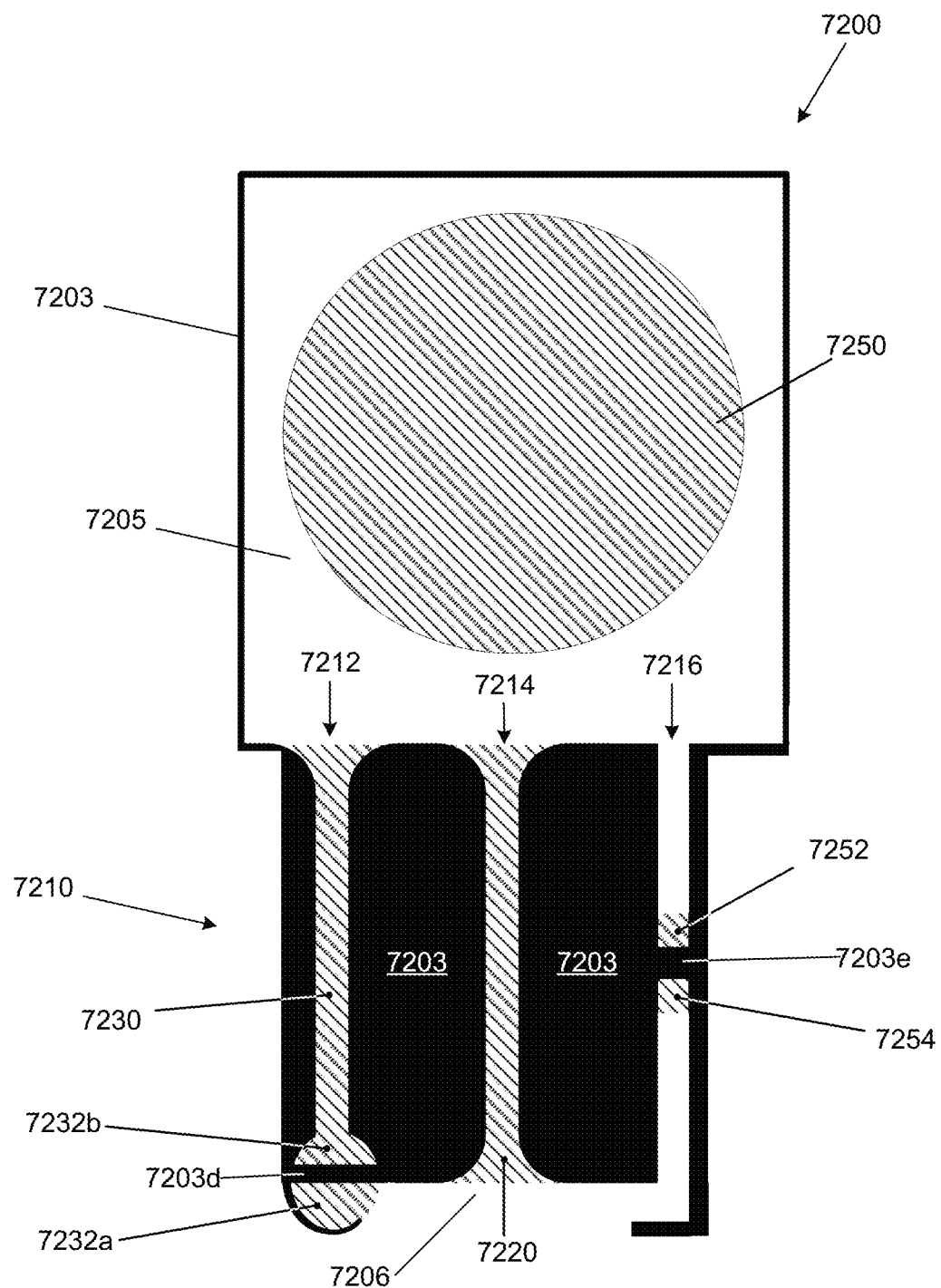
FIGS. 81A and 81B illustrate configurations of redundant trace fuses according to aspects described herein.
Figure 81B:
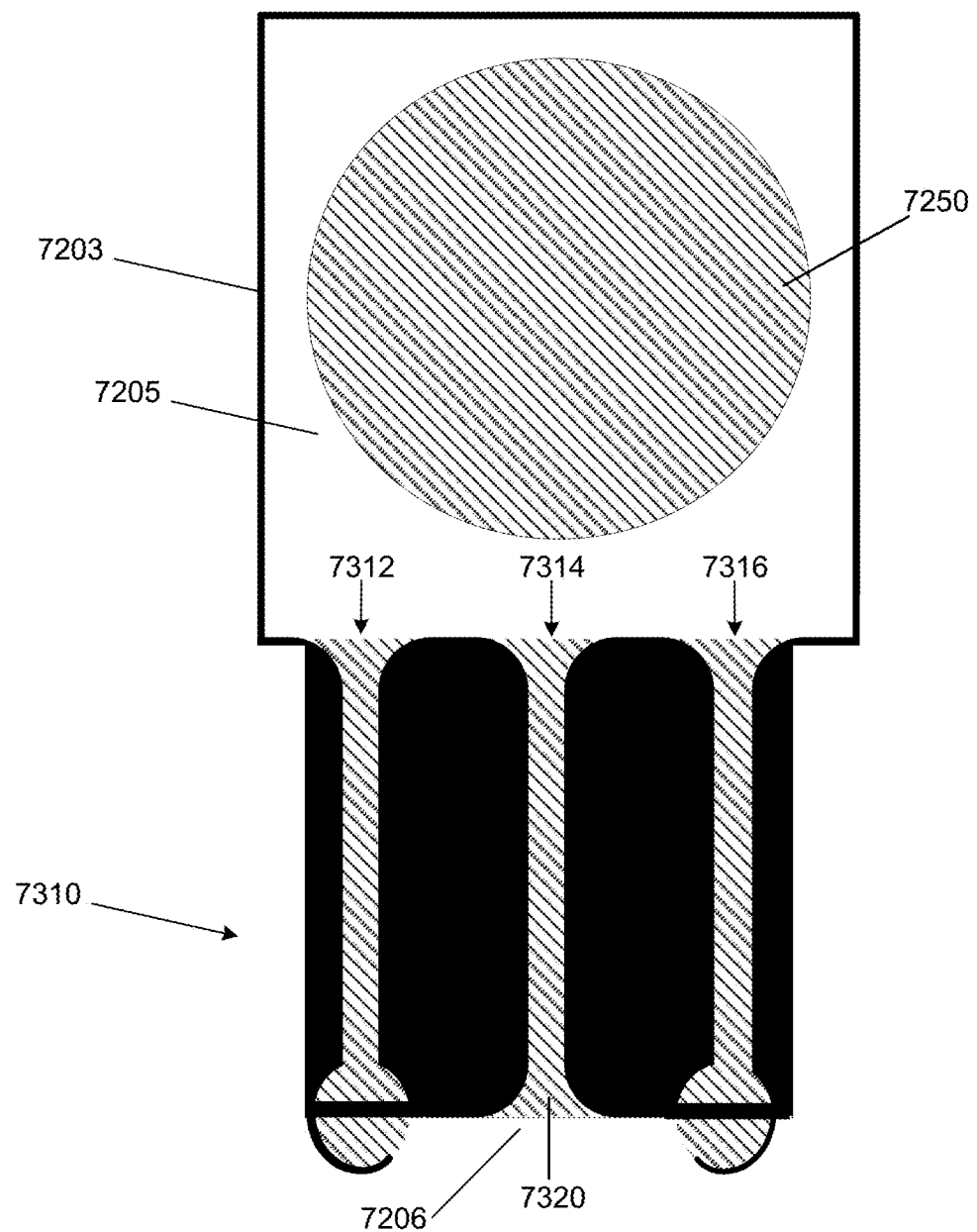

FIGS. 81A and 81B illustrate configurations of redundant trace fuses according to aspects described herein. For example, FIG. 81A shows a first configuration of a battery cell connection region 7120 bordered by an insulating region 7203 and including a trace fuse structure 7122 and a cathode connecting region 7205 surrounding a trace pad 7250 used for forming an electrical connection and a physical connection to a corresponding electrical tab (e.g., cathode tab or anode tab) of a battery cell such as via a welding or soldering process that, e.g., applies heat energy to the electrical connection/pad/surrounding area. The trace fuse structure 7210 may include one or more fusible elements. The illustrative trace fuse structure 7210 of FIG. 81A includes a trace fuse 7214, a redundant trace fuse 7212 and a third fusible structure 7216. Each of the trace fuse 7214, the redundant trace fuse 7212 and the third fusible structure 7216 may be separated by the insulating region 7203.

In some cases, a trace fuse may be used as an integral fusible structure to electrically disconnect an individual battery cell from a power bus of the CWB, such as when one or more battery cells enter a failure condition, e.g., thermal event, a high current event, or other failure event. In some cases, failure of a single battery cell of a multi-battery cell system can cause the whole system to fail. For example, failure of multiple battery cells may be induced based on a failure of a single battery cell and a resulting thermal runaway condition. In some cases, thermal runaway conditions may be caused, at least in part, due to heating of a battery cell due to excessive currents. To avoid such conditions, one or more fuses, such as the trace fuse 7214 may be used as an overcurrent protection device, such fuses can protect one or more of the battery cells of the CWB from damage due to large current and short circuit during charging, discharging, and/or a failure condition experienced by the CWB such as a penetration event.

In an illustrative example, the trace fuse 7214 may include a trace fuse element 7220 comprising a conductive trace electrically connecting the conductive region 7205 to an electrical circuit such as, for example, the negative trace bus 7206. The redundant trace fuse 7212 may be designed as a redundant fuse and may include a fuse element 7230 that may be electrically connected to the conductive region 7205 and may be electrically and physically disconnected from the negative trace bus 7206 by an insulating region 7203d. To facilitate an electrical connection of the redundant trace fuse 7212 to the electrical circuit (e.g., the negative trace bus 7206), the second fusible structure may include a pair of solder pads 7232a and 7232b. The solder pads 7232a and 7232b may be connected (e.g., soldered, welded, etc.) via a jumper, wire or other conductive element to complete the electrical connection to enable the redundant trace fuse 7212 connection between the conductive region 7206 and the negative trace bus 7206. The third fusible structure 7216 may include a first solder pad 7252 electrically connected to the conductive region 7205 and a second solder pad 7254 electrically connected to an external circuit, such as the negative trace bus 7206. In some cases, the first solder pad 7252 and the second solder pad 7254 may be separated by an insulating region 7203e. The third fusible structure may be enabled such as by soldering an external fuse (e.g., a surface mount fuse, etc.) between the first solder pad 7252 and the second solder pad 7254. The trace fuse element 7220 may have a length (e.g., between about 30 mils to about 200 mils) and a width (e.g., between about 4 mils to about 70 mils) that have been calculated such that the resistance of the trace fuse element 7220 may provide heating such that the trace fuse element 7220 may melt, or otherwise open, based on heating resulting from current flow when a current threshold has been exceeded (e.g., between about 1 amp to about 10 amps). Similarly the fuse element 7230 may have a length and width such that the resistance of the fuse element 7230 may provide heating such that the fuse element 7230 may melt, or otherwise open, when a current threshold has been exceeded. One or more of the dimensions (e.g., length, width, etc.) of the fuse element 7230 may be the same as or different than the dimensions of the fuse element 7220.

FIG. 81B shows another configuration of a battery cell connection region bordered by an insulating region 7203 and including a trace fuse structure 7310 and a conducting region 7205 surrounding a trace pad 7250 used for forming an electrical connection and a physical connection to a corresponding electrical tab (e.g., cathode tab or anode tab) of a battery cell such as via a welding or soldering process. The trace fuse structure 7310 may include one or more fusible elements. The illustrative trace fuse structure 7310 of FIG. 81B may include a trace fuse 7314, a first redundant trace fuse 7312 and a second redundant trace fuse 7316. Each of the trace fuse 7314, the first redundant trace fuse 7312 and a second redundant trace fuse (e.g., the redundant trace fuse 7316) of the trace fuse structure 7310 may be separated by at least a portion of the insulating region 7203.

In some cases, the trace fuse 7214 of the structure 7210 FIG. 81A and/or the trace fuse 7314 of the structure 7310 of FIG. 81B may be used as an emergency disconnect circuit for disconnecting a battery cell from the positive trace bus and/or the negative trace bus in the event of a battery cell failure and/or a failure of the CWB. For example, if a battery cell current exceeds a current rating threshold of the trace fuse element 7220 of the trace fuse 7214 or the trace fuse element 7320 of the trace fuse 7314, the trace fuse element 7220 and/or 7320 may melt or otherwise open. In some cases, if a temperature of the trace fuse element 7220 or a temperature near the trace fuse element 7220, the trace fuse element 7220 may melt or otherwise open. In some cases, the excessive heat may occur without an excessive current condition. For example, an excessive heat condition may be experienced locally to a particular trace fuse, such as during a process of soldering and/or welding a battery tab to an adjacent trace pad. For example, when a battery tab is soldered (or welded) to the trace pad 7250, heating applied to the battery tab and the trace pad 7250 may be thermally conducted to adjacent metal features of the flexible PCB 4100. In some cases, excessive heat may be applied to the trace pad 7250 and/or heating may be applied for a longer than normal duration. The excessive heat may, in turn, be enough to heat the trace fuse element 7220 of the trace fuse 7214 beyond its thermal capacity, thereby causing the fuse to open. If no alternative conductive path existed between the conductive region 7205 and an associated trace bus of the flexible PCB 4100, the flexible PCB 4100 may need to be scrapped, even for as little as one failed trace fuse 7214. Such losses reduce manufacturing throughput and efficiencies and cause associated costs to rise. If enough flexible PCBs are lost during production, a time delay may be occurred if additional replacement flexible PCBs must be sourced.

As a solution, one or more redundant trace fuse elements, such as the redundant trace fuse 7212 and the third fusible structure 7216 of the trace fuse structure 7210 shown in FIG. 81A may be used. In some cases, an alternative trace fuse structure 7210 with a different configuration of trace fuses and/or trace fuse structures may be used, such as the trace fuse structure 7310 of FIG. 81B. To enable operation of the redundant trace fuse 7212, a jumper or other conductive element may be soldered, welded, or otherwise electrically connected between the solder pads 7232a and 7232b to bypass the insulating region 7203d. Once connected, an electrical connectivity between the conductive region 7205 and, for example, the negative trace bus 7206 may be measured to validate that the redundant trace fuse 7212 is enabled as a trace fuse providing protection for the associated battery cell tab electrical connection. Similarly, if the third fusible structure 7216 is desired for use as a fusible link between the conductive region 7205 and the negative trace bus 7206, a fuse, such as a surface mount fuse, may be soldered or otherwise connected between the first solder pad 7252 and the second solder pad 7254. After which, electrical connectivity between the conductive region 7205 and the negative trace bus 7206 may be tested.

Figure 82:
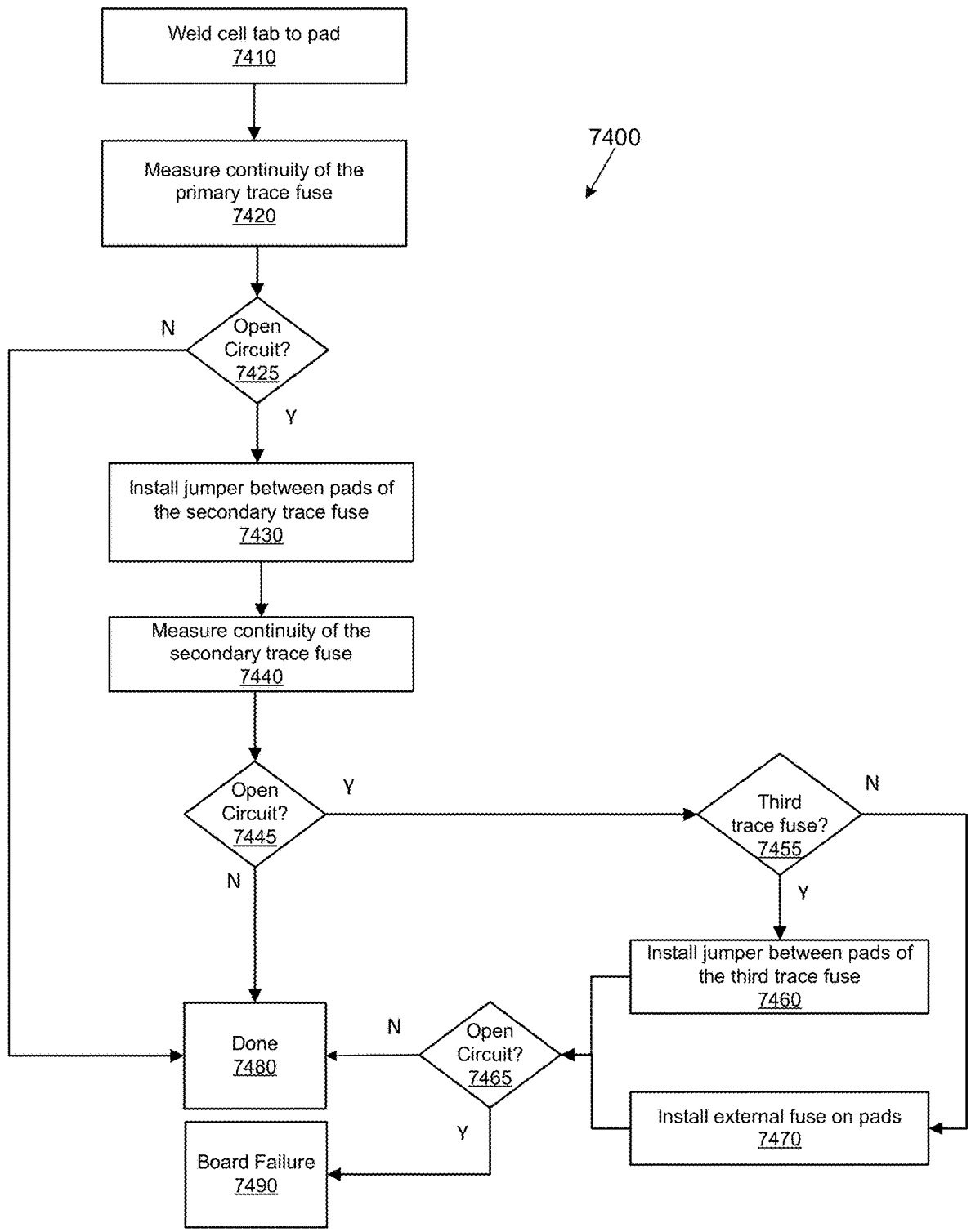
FIG. 82 shows an illustrative method of use of a redundant trace fuse structure according to aspects described herein.

FIG. 82 shows an illustrative method of use of a redundant trace fuse structure according to aspects described herein. For example, the illustrative installation process 7400 that may be used to establish electrical connections between a battery cell 5300 to the flexible PCB 4100. For example, at 7410, a battery cell tab (e.g., the anode tab 7540a, the cathode tab 7540b) may be electrically and physically connected to an electrical connection pad (e.g., the electrical connection pad 7540a, the electrical connection pad 7150b), such as by using a soldering or welding process. Once connected, a measurement may be taken at 7420 to verify that an electrical connection exists between the electrical connection pad and the corresponding trace bus, such as between the electrical connection pad 7540a and the positive trace bus 7208 and/or electrical connection pad 7150b and the negative trace bus 7206. If, at 7425, the electrical connection remains between the electrical connection pad 7540a and the positive trace bus 7208 and/or electrical connection pad 7150b and the negative trace bus 7206, the electrical connection of the battery cell 5300 to the flexible PCB 4100 is complete and that the trace fuse 7214 remains whole and the process 7400 completes for a particular tab of a battery cell at 7480. Once complete, the installation process 7400 may be repeated for each tab of the different battery cells of the CWB.

In some cases, the process 7400 may be performed in parallel for both the anode tab and the cathode tab for a particular battery cell. In some cases, the process 7400 may be completed for each electrical connection tab individually. In some cases, the process 7400 may be performed for groupings of battery cells of the plurality of battery cells contained in the CWB. For example, a row or column of battery cells may be connected by welding or soldering the battery cell tabs as a group, where continuity tests may be performed sequentially for each battery cell tab of the connected group of battery cells.

Returning to 7425, if an open circuit is detected indicating that the trace fuse 7214 has blown, a secondary trace fuse element may be enabled. For example, at 7430, a jumper may be installed (e.g., soldered, welded, or the like) between the solder pads 7232a and 7232b to complete an electrical circuit to enable the secondary trace fuse element, such as to enable a secondary fuse element comprising the redundant trace fuse 7212. Once the jumper has been installed, a measurement may be taken at 7440 to verify that an electrical continuity exists for the electrical circuit between the electrical connection pad 7150a and the corresponding trace bus, such as between the electrical connection pad 7150a and the positive trace bus 7208 and/or electrical connection pad 7150*b* and the negative trace bus 7206. If, at 7445, the electrical connection remains between the electrical connection pad 7150*a* and the positive trace bus 7208 and/or electrical connection pad 7150*b* and the negative trace bus 7206, the electrical connection of the battery cell 5300 to the flexible PCB 4100 is complete and that the redundant trace fuse 7212, 7312 remains whole and the process completes for a particular tab of a battery cell at 7480. Once complete, the process 7400 may be repeated for each tab of the different battery cells of the CWB.

If, at 7455, the continuity test results in a reading confirming an open circuit condition, the redundant trace fuse 7212 has opened so that at 7455, a check may be performed to identify a configuration of a third fuse element to identify whether the third fuse element comprises a redundant trace fuse 7216, 7316 or another structure configured to receive a fusible link, such as a pair of electrical pads as shown in the third fusible structure 7216. If third trace fuse is identified, a jumper may be installed (e.g., soldered, welded, or the like) between the solder pads 7252*a* and 7252*b* to complete an electrical circuit to enable the third trace fuse element 7216, such as to enable a redundant fuse element comprising the third trace fuse element 7216. Once the jumper has been installed, a measurement may be taken to verify that an electrical continuity exists for the electrical circuit between the electrical connection pad and the corresponding trace bus, such as between the electrical connection pad 7150*a* and the positive trace bus 7208 and/or electrical connection pad 7150*b* and the negative trace bus 7206. If at 7465, the electrical connection remains between the electrical connection pad 7150*a* and the positive trace bus 7208 and/or electrical connection pad 7150*b* and the negative trace bus 7206, the electrical connection of the battery cell 5300 to the flexible PCB is complete and that the redundant trace fuse 7216 remains whole and the process completes for a particular tab of a battery cell at 7480. If, however, at 7465 the continuity test identifies a discontinuity or open circuit between the electrical connection pad and the associated trace bus, the third trace fuse 7316 has failed, causing the flexible printed circuit board assembly to fail and a board failure process may proceed at 7490. In some cases, reusable components may be removed from the failed PCBA for future use.

Returning to 7455, if a trace fuse structure similar to the third fusible structure 7216 is identified, an external fuse may be installed (e.g., soldered, welded, etc.) at 7430 to complete the electrical circuit between the electrical connection pad 7150*a* and the corresponding trace bus, such as between the electrical connection pad 7150*a* and the positive trace bus 7208 and/or electrical connection pad 7150*b* and the negative trace bus 7206. Once the external fuse has been installed, a measurement may be taken to verify that an electrical continuity exists for the electrical circuit between the electrical connection pad 7150*a* and the corresponding trace bus, such as between the electrical connection pad 7150*a* and the positive trace bus 7208 and/or electrical connection pad 7150*b* and the negative trace bus 7206. If at 7465, the electrical connection remains between the electrical connection pad 7150*a* and the positive trace bus 7208 and/or electrical connection pad 7150*b* and the negative trace bus 7206, the electrical connection of the battery cell 5300 to the flexible PCB 4100 is complete and that the redundant fusible structure 7216 remains whole and the process completes for a particular tab of a battery cell at 7480. If, however, at 7465 the continuity test identifies a discontinuity or open circuit between the electrical connection pad and the associated trace bus, and the fuse element remains whole, a board failure may be identified causing the flexible printed circuit board assembly to fail and a board failure process may proceed at 7490.

A CWB assembly may include an array of a first quantity of battery cells disposed adjacent to one another in a horizontal direction and a second quantity of battery cells disposed adjacent to one another in a vertical direction. The array of battery cells may be arranged in a grid-like pattern. Each of the battery cells may be encased or housed in a battery cell housing separate from other battery cells. A battery cell as described herein may include a plurality of individual battery cell elements that are electrically connected together to form a compound battery cell that electrically performs as a single unit. Each of the battery cell housings may be physically connected to adjacent battery cell housings by flexible elements (e.g., a flexible printed circuit board), thereby facilitating a surface outline or shape of the array of battery cells to generally conform to a surface outline or shape of a user wearing the CWB assembly. One or more of the battery cell housings may include a positive-charge electrical terminal and a negative-charge electrical terminal that are electrically connected with the battery cell within an interior of the battery cell housing and provide electrical power to electrical devices disposed exterior to the battery cell housing. Electrical terminals of a plurality of the battery cells in the array of battery cells may be connected together to route electrical current through the plurality of the battery cells and a set of positive-charge and negative-charge electrical terminals that are shared among the plurality of the battery cells. The positive-charge electrical terminal and the negative-charge electrical terminal may provide an electrical current that passes through an electrically conductive path, for example, through an electronic device, via transfer of electrons through the electrically conductive path between the positive-charge electrical terminal and the negative-charge electrical terminal on the exterior of the battery cell housing. The CWB assembly may include a set of positive-charge and negative-charge electrical terminals that are shared among the plurality of the battery cells of the array of battery cells. The plurality of the battery cells may be electrically coupled together, for example, in series or in parallel.

While aspects of the disclosure have been described with reference to battery cells and/or a CWB comprising battery cells, arrangements and methods as described herein may also be applied to other devices and systems having a flexible PCBA to maximize space within a housing. For example, the arrangements and methods described herein may apply to any electronic device disposed within a housing for which maximizing usable interior space within a housing by folding a flexible PCBA within the available interior space is desired. Examples of such electronic devices may include underwater cameras, sonar devices, radar devices, lidar devices, emergency radio beacons, satellite communications devices, terrestrial wireless communications devices, global positioning system (GPS) receivers, electronic environmental sensor devices, electronic medical devices, computing processors, solar cell based power generation devices, wave motion based power generation devices, fuel cell based power generation devices, battery charging controllers, and/or portable chemical batteries for powering electronic or electrical devices.

In an illustrative example, a conformal wearable battery may include a plurality of battery cells and a flexible printed circuit board assembly (PCBA). The flexible PCBA may include a plurality of physical connection sections disposed in a grid like pattern, wherein each of the plurality of battery cells is physically affixed to the flexible PCBA at a corresponding physical connection section of the plurality of physical connection sections, a bend axis disposed between two parallel physical connection sections, wherein the bend axis facilitates folding of the flexible PCBA in half. Additionally, the flexible PCBA may include a plurality of first cut-outs disposed along the bend axis, wherein each first cut-out of the plurality of first cut-outs is disposed parallel to the bend axis and a plurality of second cut-outs disposed across the bend axis, wherein each second cut-out of the plurality of second cut-outs are disposed perpendicular to the bend axis.

The conformal wearable battery of the illustrative example may include a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery may include a plurality of battery cells, at least one circuitry module configured to control and monitor charging and discharging of the plurality of battery cells, and a flexible printed circuit board assembly (PCBA). The flexible PCBA may include a plurality of physical connection sections disposed in a grid like pattern, wherein each of the plurality of battery cells and the at least one circuitry module is physically affixed to the flexible PCBA at a corresponding physical connection section of the plurality of physical connection sections.

The conformal wearable battery of the illustrative example may include a flexible PCBA that includes a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

The conformal wearable battery of the illustrative example may include a plurality of battery cells and at least one circuitry module that, when affixed to the flexible PCBA, forms a matrix of physical components. The matrix of physical components may be a matrix of at least two rows and at least two columns.

The conformal wearable battery of the illustrative example may further include at least one connector configured to provide an electrical power connection from internal circuitry of the conformal wearable battery to an external device to be powered.

The conformal wearable battery of the illustrative example may include the plurality of battery cells, where the at least one connector, and the at least one circuitry module, when affixed to the flexible PCBA, comprises a matrix of physical components.

The conformal wearable battery of the illustrative example may comprise a bend axis that is a center of the grid like pattern of the physical connection sections when the flexible PCBA is unfolded. The conformal wearable battery of the illustrative example may include a flexible PCBA having each of the plurality of battery cells physically attached to a first side of the flexible PCBA. The conformal wearable battery of the illustrative example may include the flexible PCBA having each of the plurality of battery cells physically attached to a first side of the flexible PCBA and each of the plurality of battery cells electrically connected to the flexible PCBA on a second side of the flexible PCBA that is opposite the first side. The conformal wearable battery of the illustrative example may include the flexible PCBA having the plurality of battery cells disposed on an outside surface of the flexible PCBA, when the flexible PCBA is in a folded configuration.

The conformal wearable battery of the illustrative example may include a plurality of battery cells that are arranged in a three-dimensional grid pattern. The conformal wearable battery of the illustrative example may include a sealed flexible housing wherein the flexible PCBA is disposed within an interior cavity of the sealed flexible housing and wherein the flexible PCBA is in a folded configuration.

An illustrative system may include a plurality of battery cell modules and a flexible printed circuit board assembly (PCBA). The flexible PCBA may further include a plurality of battery cell connection sections disposed in a grid-like pattern along a first surface of the flexible PCBA where each of the plurality of battery cell modules is electrically attached to the flexible PCBA on a second surface of the flexible PCBA in a grid-like pattern, wherein the second surface is opposite the first surface.

The illustrative system may further include a housing, wherein the flexible PCBA, when in a folded configuration, is located within the housing.

The illustrative system may include a plurality of battery cell modules, where each of the plurality of battery cell modules includes a battery cell and an attenuating member made of a resilient material. Each battery cell may be a lithium-ion battery cell. The illustrative system may include a plurality of battery cells arranged in a three-dimensional grid pattern when the flexible PCBA is in a folded configuration.

An illustrative flexible printed circuit board assembly (PCBA) may include a plurality of battery modules physically affixed to the flexible PCBA, where the plurality of battery modules is arranged in a grid-like pattern and a bend axis near an approximate mid-point of the flexible PCBA. When the flexible PCBA is bent along the bend axis, the flexible PCBA is in a folded configuration and, when the flexible PCBA is in a folded configuration, the plurality of battery modules is disposed in a three-dimensional grid-like pattern.

The illustrative flexible PCBA may include a plurality of flexible sections, wherein the flexible sections allow for the flexible PCBA to flex between adjacent rows and adjacent columns of battery modules. The illustrative flexible PCBA may include at least one circuitry module that comprises a portion of the grid-like pattern.

A conformal wearable battery may include a plurality of battery cells and a flexible printed circuit board (PCB). In some cases, each battery cell may include a pair of electrically conductive elements that correspond to either a cathode or an anode of each battery cell. The flexible PCB may include a plurality of physical connection sections disposed in a grid like pattern on a first side of the flexible PCB, were each of the plurality of battery cells may be disposed associated with a corresponding physical connection section of the plurality of physical connection sections. The flexible PCB may include a plurality of electrical connection pads linearly disposed on a second side opposite the first side of the flexible PCB, where the plurality of electrical connection pads may include an electrically conductive surface coating. The electrically conductive surface coating may comprise an electroless nickel immersion gold (ENIG) surface coating and/or a lead-free immersion silver surface coating.

In some cases, the pair of electrically conductive elements may extend substantially parallel to and along the second side of the flexible PCB and each of the electrically conductive elements may be connected to a corresponding electrical connection pad of the plurality of electrical connection pads on the second side of the flexible PCB forming an electrical connection.

In some cases, the conformal wearable battery may include a plurality of battery cells that may be configured as pouch cell packaged polymer lithium-ion batteries. Each battery cell of the plurality of battery cells may be physically attached to the first side of the flexible PCB.

In some cases, the flexible PCB of the conformal wearable battery may include a plurality of cutouts extending through the flexible PCB, wherein at least one cutout of the plurality of cutouts is located adjacent to an electrical connection pad of the plurality of electrical connection pads. Each conductive element of the pair of electrically conductive elements may extend through a corresponding cutout of the plurality of cutouts. In some cases, the electrical connection between each electrically conductive element of the pair of electrically conductive elements and the corresponding electrical connection pad of the plurality of electrical connection pads may be joined with a weld, such as by using one or more of a laser welding process and/or an ultrasonic welding process.

In some cases, a connection pad of the plurality of electrical connection pads may have a width that is within a range of 1.8 times and 3 times a width of an electrically conductive element of the pair of electrically conductive elements and/or a height electrical connection may be within a range of 10% to 70% of a thickness of an electrically conductive element of the pair of electrically conductive elements.

In some cases, a system may include a first plurality of battery cells, wherein a first battery cell of the first plurality of battery cell includes a first pair of electrically conductive elements and a second plurality of battery cell, wherein a second battery cell of the second plurality of battery cell includes a second pair of electrically conductive elements, and may also include a flexible printed circuit board (PCB). The flexible PCB may include a plurality of battery cell connection sections disposed in a grid-like pattern along a first surface of the flexible PCB, a plurality of cutouts disposed adjacent and parallel to an edge of the plurality of battery cell connection sections, where the plurality of cutouts is arranged as multiple pairs of cutouts arranged adjacent a majority of the plurality of battery cell connection sections. The flexible PCB may also include a plurality of electrical connection pads disposed on a second surface of the flexible PCB opposite the first surface, where a majority of the plurality of electrical connection pads may be arranged adjacent the plurality of cutouts and the plurality of electrical connection pads may include an electrically conductive surface coating. In some cases, an electrically conductive element of the first pair of electrically conductive elements may wrap around an edge of the flexible PCB and may extend along the second surface of the flexible PCB. The electrically conductive element of the first pair of electrically conductive elements may connect to a corresponding electrical connection pad of the plurality of electrical connection pads forming a first electrical connection and an electrically conductive element of the second pair of electrically conductive elements may extend through a cutout of the plurality of cutouts such that each electrically conductive element of the second pair of electrically conductive elements connects to a corresponding electrical connection pad of the plurality electrical connection pads forming a second electrical connection.

In some cases, the system may further include the first electrical connection between the electrically conductive element of the first pair of electrically conductive elements and the corresponding electrical connection pad of the plurality of electrical connection pads may be joined with a weld, such as by using a laser welding process and/or using an ultrasonic welding process. In some cases, the connection pad of the plurality of electrical connection pads may have a circular shape with a diameter that is within a range of 1.8 times and 3 times a width of an electrically conductive element of the pair of electrically conductive elements.

In some cases, a flexible printed circuit board assembly (PCBA) may include a flexible printed circuit board (PCB) that may include a first side and a second side opposite the first side. The flexible PCBA may further include a plurality of electrical connection pads disposed on the second side of the flexible PCB, where the plurality of electrical connection pads may be arranged in multiple pairs of electrical connection pads and the plurality of electrical connection pads may include an electrically conductive surface coating. In some cases, the flexible PCBA may include a plurality of cutouts linearly disposed in the flexible PCB and adjacent to corresponding electrical connection pads and a plurality of battery cell modules physically affixed to the first side of the flexible PCB, were the plurality of battery cell modules may be arranged in a grid-like pattern and may include pouch cell packaged polymer lithium-ion material. In some cases, each battery cell module of the plurality of battery cell modules may include a pair of electrically conductive elements that extend substantially parallel to the second side of the flexible PCB and connect to corresponding electrical connection pads of the plurality of electrical connection pads forming an electrical connection for each battery cell module. In some cases, the electrical connection between each electrically conductive elements of the pair of electrically conductive elements and the corresponding electrical connection pads of the plurality of electrical connection pads may be formed using a welding process. In some cases, a connection pad of the plurality of electrical connection pads may have a circular shape with a diameter that is within a range of 1.8 times and 3 times a width of an electrically conductive element of the pair of electrically conductive elements. In some cases, each electrical connection pad of the plurality of electrical connection pads may include an electroless nickel immersion gold (ENIG) surface coating.

A molded housing may enclose an electronic component and include an electrically conductive contact component embedded within an exterior wall to conduct electricity between an interior and an exterior of the casing. The contact component may include two knurled areas separated by a recessed groove. The knurled areas and recessed groove may be coplanar with the exterior wall. The knurled areas and recessed groove may form an interface with the molded casing to seal the casing against ingress of liquid into the interior. The molded casing may include an upper housing and a lower housing formed from a combination of a rigid member and a flexible member. The rigid member may have a plurality of rigid regions, and the flexible member may have a plurality of flexible regions formed between neighboring rigid regions. The flexible member may be molded onto the rigid member using a two-shot injection molding process. In some examples, the contact component may be secured to a contact carrier, where the contact carrier is then secured to the exterior housing.

A molded housing may enclose an electronic component and include an electrically conductive contact component embedded within an exterior wall to conduct electricity between an interior and an exterior of the casing. The contact component may include two knurled areas separated by a recessed groove. The knurled areas and recessed groove may be coplanar with the exterior wall. The knurled areas and recessed groove may form an interface with the molded casing to seal the casing against ingress of liquid into the interior. The molded casing may include an upper housing and a lower housing formed from a combination of a rigid member and a flexible member. The rigid member may have a plurality of rigid regions, and the flexible member may have a plurality of flexible regions formed between neighboring rigid regions. The flexible member may be molded onto the rigid member using a two-shot injection molding process. In some examples, the contact component may be secured to a contact carrier, where the contact carrier is then secured to the exterior housing.

A flexible printed circuit board assembly (PCBA) for a conformal wearable battery (CBB) includes attachment sections for a plurality of battery cells that are arranged in a grid-like pattern on a same side of the flexible PCBA. The flexible PCBA is configured to fold along a bend axis so that the flexible PCBA is folded approximately in half. To reduce mechanical stresses placed on the flexible PCBA when folding the flexible PCBA along the bend axis, the flexible PCBA includes a plurality of cut-outs dispersed along the bend axis and parallel to adjacent battery cells. The CWB is configured to flex during use. The flexible PCBA includes a plurality of cut-outs disposed perpendicular to the bend axis, between adjacent rows of battery cells, and on the bend axis to relieve mechanical stresses applied to a bent portion of the flexible PCBA when the CWB is flexed during use.

A battery system that is formed from a plurality of battery cells arranged on a flexible printed circuit card, where the flexible printed circuit card is folded along an axis forming an upper and lower portion of the flexible circuit card. A visco-elastic shock-absorbing member installed between the upper and lower portion of the flexible circuit card. Each battery cell may also have a visco-elastic shock-absorbing member that is attached individually to each battery cell of the plurality of battery cells.

A matrix of battery cell modules includes a flexible printed circuit board assembly (PCBA) for a conformal wearable battery (CWB) with a plurality of attachment sections for each of a plurality of battery cells that are arranged in a grid-like pattern on a same side of the flexible PCBA. Each battery cell may be joined with a flexible PCB via a welding process. The flexible PCBA is configured to fold along a bend axis so that the flexible PCBA is folded approximately in half. When affixed to the flexible PCBA, the plurality of battery cell modules and a circuitry module form a grid of physical components. When folded, the flexible PCBA forms a three-dimensional grid of physical components comprising at least the battery cell modules.

Aspects of the disclosure have been described in terms of illustrative examples thereof. Numerous other examples, modifications, and variations within the scope and spirit of the appended claims will occur to persons of ordinary skill in the art from a review of this disclosure. For example, one or more of the steps depicted in the illustrative figures may be performed in other than the recited order, and one or more depicted steps may be optional in accordance with aspects of the disclosure.

Many illustrative embodiments are listed below in accordance with one or more aspects disclosed herein. Although many of the embodiments listed below are described as depending from other embodiments, the dependencies are not so limited. For example, embodiment #5 (below) is expressly described as incorporating the features of embodiment #1 (below), however, the disclosure is not so limited. For example, embodiment #5 may depend any one or more of the preceding embodiments (i.e., embodiment #1, embodiment #2, embodiment #3, and/or embodiment #4). Moreover, that any one or more of embodiments #2-#6 may be incorporated into embodiment #1 is contemplated by this disclosure. Likewise, any of embodiments #1, 8, and 16 may be combined with one or more of the features recited in embodiments #2-8, 9-15, and/or 17-20. Further likewise, any of embodiments #21, 32, and 39 may be combined with one or more of the features recited in embodiments #22-31, 33-37, and 40. Further likewise, any of embodiments #41, 49, 60 may be combined with one or more of the features recited in embodiments #42-48 and #50-59. Further likewise, any of embodiments #61, 70, and 76 may be combined with one or more of the features recited in embodiments #62-69, 71-75, and 77-80. Further likewise, any of embodiments #81, 92, 97, 105, and 110 may be combined with one or more of the features recited in embodiments #82-91, 93-97, 98-104, 106-109, and 111-115. Further likewise, any of embodiments #116, 128, and 133 may be combined with one or more of the features recited in embodiments #117-127, 129-132, and 134. Further likewise, any of embodiments #135, 140, 145, and 154 may be combined with one or more of the features recited in embodiments #136-129, 142-144, and 146-153. In addition, that any one or more of the features in embodiments #1, 6, 16, 21, 32, 39, 41, 49, 60, 61, 70, 76, 81, 92, 97, 105, 110, 116, 128, 133, 135, 140, 145, and 154 may be combined is contemplated by this disclosure. Moreover, that any one or more of the features in embodiments #1-154 can be combined is contemplated by this disclosure.

Embodiment #1. A conformal wearable battery comprising:

a plurality of battery cells arranged in a grid-like pattern, wherein the plurality of battery cells comprise a positive terminal and a negative terminal to provide electricity through a transfer of electrons between the positive terminal and negative terminal;

a housing with an interior cavity that receives the plurality of battery cells;

a conductive region coupled to one or more of the positive terminal and the negative terminal, wherein the electricity is provided from one or more of the plurality of battery cells to the conductive region; and a contact component having a front portion and a rear portion, wherein the contact component comprises an electrically conductive material, wherein the front portion includes an outward facing surface and a perimeter region surrounding the outward facing surface, wherein the outward facing surface is accessible from outside of the interior cavity of the housing and the rear portion has an inward facing surface;

wherein the contact component is connected to the conductive region; and wherein the perimeter region of the outward facing surface is secured to the housing forming a sealed edge to prevent ingress of liquid into the interior cavity.

Embodiment #2. The conformal wearable battery of Embodiment #1, further comprising a contact carrier that encases the rear portion of the contact component, wherein the contact carrier is secured to the housing.

Embodiment #3. The conformal wearable battery of Embodiment #2, wherein the contact carrier is secured to the housing between a rear surface of a sidewall of the housing and a rear flange that is spaced rearward of the rear surface.

Embodiment #4. The conformal wearable battery of Embodiment #3, wherein a first plug extends from the rear surface of the sidewall through an opening in the contact carrier to the rear flange of the housing.

Embodiment #5. The conformal wearable battery of Embodiment #1, wherein the electrically conductive material is formed from at least one material selected from brass, gold, copper, silver, aluminum, steel, or a combination thereof.

Embodiment #6. The conformal wearable battery of Embodiment #1, wherein the perimeter region includes a groove and the rear portion includes a textured region and a threaded female element.

Embodiment #7. The conformal wearable battery of Embodiment #6, wherein the textured region includes a plurality of angled gear teeth, and wherein the contact component includes an opening that receives a conductive element to create a connection between the conductive region and the contact component.

Embodiment #8. A conformal wearable battery comprising:
a plurality of battery cells comprising a positive terminal and a negative terminal to provide electricity through a transfer of electrons between the positive terminal and negative terminal;
a housing that includes a first shell and a second shell, wherein the first shell connects to the second shell to form an interior cavity that receives the plurality of battery cells;
a conductive region coupled to one or more of the positive terminal and the negative terminal, wherein the electricity is provided from one or more of the plurality of battery cells to the conductive region;
a first contact carrier that secures a first electrically conductive contact component, wherein the first contact carrier is secured to the first shell; and
the first contact component having a front portion and a rear portion, wherein the front portion includes an outward facing surface and a perimeter region surrounding the outward facing surface, wherein the outward facing surface is accessible from outside of the interior cavity of the housing; and
wherein the first contact component is connected to the conductive region.

Embodiment #9. The conformal wearable battery of Embodiment #8, wherein the first contact carrier is secured to the housing between a first rear surface of a first sidewall of the first shell and a first rear flange that is spaced rearward of the first rear surface.

Embodiment #10. The conformal wearable battery of Embodiment #9, wherein a first plug extends from the first rear surface of the first sidewall through an opening in the first contact carrier to the first rear flange of the first shell.

Embodiment #11. The conformal wearable battery of Embodiment #10, wherein the first plug, the first rear flange, and the first sidewall are a single unitary member.

Embodiment #12. The conformal wearable battery of Embodiment #8, wherein a sidewall of the first shell surrounds the perimeter region of the first contact component and the first contact carrier surrounds a textured region of the first contact component.

Embodiment #13. The conformal wearable battery of Embodiment #9, wherein the first rear flange includes an opening to allow access to an inward facing surface of the first contact component.

Embodiment #14. The conformal wearable battery of Embodiment #9, wherein a connector plate configured to receive a connector is secured between a second rear surface of a second sidewall of the first shell and a second rear flange, and
wherein a second plug extends from the second rear surface through an opening in the connector plate to the second rear flange.

Embodiment #15. The conformal wearable battery of Embodiment #8, further comprising a second contact carrier, wherein the first contact carrier secures the first contact component and a second electrically conductive contact component, and the second contact carrier secures a third electrically conductive contact component and a fourth electrically conductive contact component.

Embodiment #16. A system comprising:
an electronic component to provide an electrical signal, wherein the electronic component comprises a plurality of battery cells;
a housing that includes an interior cavity that receives the electronic component;
a conductive region coupled to the electronic component, wherein the electrical signal is provided from the electronic component to the conductive region; and
an electrically conductive contact component having a front portion and a rear portion, wherein the front portion includes an outward facing surface and a perimeter region surrounding the outward facing surface, wherein the outward facing surface is accessible from outside of the interior cavity of the housing and the rear portion has an inward facing surface,
wherein the contact component is connected to the conductive region; and
wherein the front portion is partially encased by a first material that forms a sidewall of the housing and the rear portion is partially encased by a second material, wherein the first material has a lower durometer than the second material.

Embodiment #17. The system of Embodiment #16, wherein the electronic component comprises a battery charging controller and a computing processor.

Embodiment #18. The system of Embodiment #16, wherein the perimeter region of the contact component includes a groove, and wherein the rear portion includes a textured region and a threaded female element.

Embodiment #19. The system of Embodiment #18, wherein the contact component includes a threaded opening that receives a conductive element to create a direct connection between the conductive region and the contact component.

Embodiment #20. The system of Embodiment #19, wherein the rear portion of the contact component is secured to a contact carrier that is formed from the second material.

Embodiment #21. A conformal wearable battery comprising:
a plurality of battery cells; and
a flexible printed circuit board assembly (PCBA) comprising:
a plurality of physical connection sections disposed in a grid like pattern, wherein each of the plurality of battery cells is physically affixed to the flexible PCBA at a corresponding physical connection section of the plurality of physical connection sections;
a bend axis disposed between two parallel physical connection sections, wherein the bend axis facilitates folding of the flexible PCBA in half;
a plurality of first cut-outs disposed along the bend axis, wherein each first cut-out of the plurality of first cut-outs is disposed parallel to the bend axis; and a plurality of second cut-outs disposed across the bend axis, wherein each second cut-out of the plurality of second cut-outs are disposed perpendicular to the bend axis.

Embodiment #22. The conformal wearable battery of Embodiment #21, wherein the flexible PCBA comprises a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

Embodiment #23. The conformal wearable battery of Embodiment #21, wherein the bend axis comprises a center of the grid like pattern of the physical connection sections.

Embodiment #24. The conformal wearable battery of Embodiment #21, wherein each first cut-out of the plurality of first cut-outs is rectangular-shaped, wherein a longer edge of each first cut-out is disposed parallel to the bend axis.

Embodiment #25. The conformal wearable battery of Embodiment #21, wherein each corner of each first cut-out of the plurality of first cut-outs is rounded.

Embodiment #26. The conformal wearable battery of Embodiment #21, wherein each second cut-out of the plurality of second cut-outs comprises a first semi-circular section, a second semi-circular section and a rectangular section.

Embodiment #27. The conformal wearable battery of Embodiment #26, wherein the rectangular section is disposed between the first semi-circular section and the second semi-circular section.

Embodiment #28. The conformal wearable battery of Embodiment #26, wherein the rectangular section is disposed laterally across the bend axis, wherein a mid-point of the rectangular section is located near the bend axis.

Embodiment #29. The conformal wearable battery of Embodiment #21, wherein each of the plurality of battery cells is physically attached to a first side of the flexible PCBA.

Embodiment #30. The conformal wearable battery of Embodiment #21, wherein the plurality of battery cells are disposed on an outside surface of the flexible PCBA, when the flexible PCBA is in a folded configuration.

Embodiment #31. The conformal wearable battery of Embodiment #21, further comprising a sealed flexible housing wherein the flexible PCBA is disposed within an interior cavity of the sealed flexible housing and wherein the flexible PCBA is in a folded configuration.

Embodiment #32. A system comprising:
a plurality of battery cell modules;
a flexible printed circuit board assembly (PCBA) comprising:
  a plurality of battery cell connection sections disposed in a grid-like pattern along a first surface of the flexible PCBA;
  a bend axis configured to divide the flexible PCBA in half when the flexible PCBA is in a folded configuration; and
  a plurality of cut-outs disposed along the bend axis, wherein each of the plurality of cut-outs reduce a bending force placed on the flexible PCBA when a flexing force is applied to the flexible PCBA.

Embodiment #33. The system of Embodiment #32, wherein the plurality of cut-outs comprises:
a plurality of first cut-outs having a first shape; and
a second plurality of cut-outs having a second shape.

Embodiment #34. The system of Embodiment #33, wherein the first shape comprises a substantially rectangular shape having rounded corners.

Embodiment #35. The system of Embodiment #33, wherein the second shape comprises at least one semi-circular section and a rectangular section.

Embodiment #36. The system of Embodiment #33, wherein the second shape comprises a rectangular section disposed across the bend axis and a first semi-circular section disposed at an end of the rectangular section on a first side of the bend axis and a semi-second circular section disposed at an opposite end of the rectangular section and on an opposite side of the bend axis.

Embodiment #37. The system of Embodiment #32, wherein a first plurality of cut-outs of the plurality of cut-outs are located near an approximate mid-point of a battery cell module.

Embodiment #38. The system of Embodiment #32, wherein a portion of the plurality of cut-outs is disposed on a bend line that is perpendicular to the bend axis and between two adjacent battery cell modules Embodiment #39. A flexible printed circuit board assembly (PCBA) comprising:
a plurality of battery modules physically affixed to the flexible PCBA, wherein the plurality of battery modules is arranged in a grid-like pattern;
a bend axis near an approximate mid-point of the flexible PCBA, wherein bending the flexible PCBA along the bend axis results in a folded configuration of the flexible PCBA; and
a plurality of cut-outs disposed along the bend axis, wherein the plurality of cut-outs reduces a force exerted on the flexible PCBA along the bend axis when the flexible circuit board is flexed.

Embodiment #40. The flexible PCBA of Embodiment #39, wherein the plurality of cut-outs disposed along the bend axis comprise a plurality of first cut-outs having a first shape and a plurality of second cut-outs having a second shape and wherein the plurality of first cut-outs are disposed along a flexible portion of the flexible PCBA between adjacent rows of the grid-like pattern that are perpendicular to the bend axis and the plurality of second cut-outs are disposed between adjacent battery modules in columns of the grid-like pattern, wherein the columns are on opposite sides of the bend axis.

Embodiment #41. A conformal wearable battery comprising:
a plurality of battery cells arranged in a grid-like pattern, wherein the plurality of battery cells includes a positive terminal and a negative terminal to provide electricity through a transfer of electrons between the positive terminal and negative terminal; and
a housing that includes:
  a first shell formed from a first member having a first plurality of rigid regions and a second member that has a first flexible region located between a first rigid region and a second rigid region of the first plurality of rigid regions, and wherein the first shell includes a front wall with an outward facing surface formed from outward facing surfaces of the first plurality of rigid regions and an outward facing surface of the second member, and
  a second shell attached to the first shell, wherein the second shell includes a third member having a second plurality of rigid regions and a fourth member that has a second flexible region located between a first rigid region and a second rigid region of the second plurality of rigid regions, and wherein the second shell has an outward facing surface formed from outward facing surfaces of the second plurality of rigid regions and an outward facing surface of the second member; and wherein the first shell connects to the second shell to form an interior cavity that receives the plurality of battery cells.

Embodiment #42. The conformal wearable battery of Embodiment #41, wherein the first member is formed from a first material and the second member is formed from a second material, wherein the first material has a hardness that is greater than a hardness of the second material.

Embodiment #43. The conformal wearable battery of Embodiment #42, wherein the third member is formed from the first material and the fourth member is formed from the second material.

Embodiment #44. The conformal wearable battery of Embodiment #43, wherein the first material comprises a polycarbonate, and the second material comprises a thermoplastic elastomer.

Embodiment #45. The conformal wearable battery of Embodiment #41, wherein the second member is molded onto the first member to form the first shell.

Embodiment #46. The conformal wearable battery of Embodiment #41, wherein the first rigid region of the first plurality of rigid regions includes a first outward facing surface, a first inward facing surface, and a first edge region along a majority of a perimeter of the first rigid region extending between the first outward facing surface and the first inward facing surface.

Embodiment #47. The conformal wearable battery of Embodiment #46, wherein the first edge region includes a first edge surface and a second edge surface, wherein the first edge surface and the second edge surface extend in different directions.

Embodiment #48. The conformal wearable battery of Embodiment #47, wherein the second member has a second edge region that has a complementary structure to the first edge region such that the first member and the second member are substantially coplanar on adjacent surfaces of the first edge region.

Embodiment #49. A housing for a plurality of battery cells arranged in a grid-like pattern, the housing comprising:

a first shell having a first member having a plurality of rigid regions and a second member that has a flexible region located between a first rigid region and a second rigid region of the plurality of rigid regions, and wherein a first wall of the first shell has an outward facing surface formed from outward facing surfaces of the plurality of rigid regions and an outward facing surface of the second member, a second shell attached to the first shell forming an interior cavity between the first shell and the second shell, wherein the first member is formed as a unitary member and the second member is molded onto the first member, and wherein the first member is formed from a first material and the second member is formed from a second material, wherein the first material having a first hardness and the second material has a second hardness, wherein the first hardness is greater than the second hardness.

Embodiment #50. The housing of Embodiment #49, wherein the plurality of rigid regions are arranged in an array with the plurality of rigid regions in both a horizontal direction and a vertical direction that correspond to the grid-like pattern of the plurality of battery cells.

Embodiment #51. The housing of Embodiment #49, wherein each rigid region of the plurality of rigid regions are spaced apart from an adjacent rigid region and is connected to the adjacent rigid region by a channel.

Embodiment #52. The housing of Embodiment #51, wherein the channel acts as a living hinge.

Embodiment #53. The housing of Embodiment #51, wherein the channel has a thickness that is less than a thickness of the first rigid region.

Embodiment #54. The housing of Embodiment #49, wherein the first rigid region of the plurality of rigid regions includes a first outward facing surface, a first inward facing surface, and a first edge region along a majority of a perimeter of the first rigid region extending between the first outward facing surface and the first inward facing surface.

Embodiment #55. The housing of Embodiment #54, wherein the first edge region includes a first edge surface that extends substantially perpendicular to the first outward facing surface and a second edge surface has a portion that extends substantially perpendicular to the first edge surface.

Embodiment #56. The housing of Embodiment #55, wherein the second edge surface includes a curved portion.

Embodiment #57. The housing of Embodiment #49, wherein a thickness of the first rigid region is substantially the same as a thickness of the flexible region, wherein the thickness of the first rigid region is measured at a center of the first rigid region and the thickness of the flexible region is measured at a location adjacent a first edge region of the first rigid region.

Embodiment #58. The housing of Embodiment #49, wherein the second shell includes a third member having a second plurality of rigid regions and a fourth member that has a second flexible region located between a first rigid region and a second rigid region of the second plurality of rigid regions, and wherein a first wall of the second shell has an outward facing surface formed from outward facing surfaces of the plurality of rigid regions and an outward facing surface of the second member.

Embodiment #59. The housing of Embodiment #49, wherein the second member includes a plurality of horizontal grooves and a plurality of vertical grooves.

Embodiment #60. A housing for a plurality of battery cells arranged in a grid-like pattern, the housing comprising:

a first shell having a first member having a plurality of rigid regions and a second member that has a flexible region located between a first rigid region and a second rigid region of the plurality of rigid regions, and wherein a first wall of the first shell has an outward facing surface formed from outward facing surfaces of the plurality of rigid regions and an outward facing surface of the second member, wherein the plurality of rigid regions are arranged in an array with the plurality of rigid regions in both a horizontal direction and a vertical direction that correspond to the grid-like pattern of the plurality of battery cells and each rigid region of the plurality of rigid regions are spaced apart from an adjacent rigid region and is connected to the adjacent rigid region by a channel, wherein the first member is formed as a unitary member and the second member is molded onto the first member, and wherein the first member is formed from a first material and the second member is formed from a second material, wherein the first material having a first hardness and the second material has a second hardness, wherein the first hardness is greater than the second hardness.

Embodiment #61. A conformal wearable battery comprising:

a plurality of non-cylindrical shaped polymer battery cells; and a flexible printed circuit board (PCB) comprising:

a plurality of physical connection sections disposed in a grid like pattern, wherein each of the plurality of battery cells is physically affixed to the flexible PCB at a corresponding physical connection section of the plurality of physical connection sections; and a bend axis that facilitates folding of the flexible PCB to form an upper portion of the flexible PCB and a lower portion of the flexible PCB;

a visco-elastic central shock-absorbing member positioned between the upper portion and the lower portion of the flexible PCB preventing the upper portion from contacting the lower portion, wherein the central shock-absorbing member electrically insulates the upper portion from the lower portion; and a flexible housing that includes an internal cavity that receives the plurality of battery cells, the flexible PCB, and the central shock-absorbing member.

Embodiment #62. The conformal wearable battery of Embodiment #61, further comprising:

a plurality of visco-elastic battery cell shock-absorbing members, each battery cell shock-absorbing member of the plurality of battery cell shock-absorbing members being individually attached to an outward facing surface of each battery cell, wherein each battery cell shock-absorbing member has an opening that is substantially aligned with a center of a pouch cell portion of each battery cell.

Embodiment #63. The conformal wearable battery of Embodiment #62, wherein the opening has an area that is within a range of 30 percent and 70 percent of an area of a front surface of the battery cell shock-absorbing member, wherein the area of the front surface is defined as the area of the front surface that is free of the opening.

Embodiment #64. The conformal wearable battery of Embodiment #62, wherein at least one battery cell shock-absorbing member of the plurality of battery cell shock-absorbing members contacts an interior surface of the housing.

Embodiment #65. The conformal wearable battery of Embodiment #62, wherein a thickness of the central shock-absorbing member is substantially the same as a thickness of one of the plurality of battery cell shock-absorbing members.

Embodiment #66. The conformal wearable battery of Embodiment #62, wherein a thickness of the central shock-absorbing member is within a range of 1.2 and 1.4 times a thickness of one of the plurality of battery cell shock-absorbing members.

Embodiment #67. The conformal wearable battery of Embodiment #61, wherein the central shock-absorbing member is continuous and extends at least 90 percent of a width of the upper portion of the flexible PCB.

Embodiment #68. The conformal wearable battery of Embodiment #61, wherein a thickness of the central shock-absorbing member is within a range of 2 percent and 5 percent of a thickness of the conformal wearable battery, wherein the thickness of the conformal wearable battery is a distance from an outermost outward facing surface of an upper housing member to an outermost outward facing surface of a lower housing member.

Embodiment #69. The conformal wearable battery of Embodiment #62, wherein the central shock-absorbing member is the same material as a battery cell shock-absorbing member of the plurality of battery cell shock-absorbing members, and wherein the central shock-absorbing member comprises polyurethane.

Embodiment #70. A conformal wearable battery comprising:

a plurality of battery cells; and
a flexible printed circuit board (PCB) comprising:
a plurality of physical connection sections, wherein each of the plurality of battery cells is physically affixed to the flexible PCB at a corresponding physical connection section of the plurality of physical connection sections;
a bend axis that facilitates folding of the flexible PCB to form an upper portion of the flexible PCB and a lower portion of the flexible PCB;
a plurality of battery cell shock-attenuating members, each battery cell shock-attenuating member of the plurality of battery cell shock-attenuating members being individually attached to an outward facing surface of each battery cell, wherein each battery cell shock-attenuating member is a foam member and has an opening that extends through the battery cell shock-attenuating member; and
a housing that includes an upper housing member, a lower housing member, and an internal cavity, wherein the internal cavity that receives the plurality of battery cells, the flexible PCB, and the plurality of battery cell shock-attenuating members,
wherein a first battery cell shock-attenuating member of the plurality of battery cell shock-attenuating members contacts an interior surface of the lower housing member and a second battery cell shock-attenuating member of the plurality of battery cell shock-attenuating members contacts an interior surface of the upper housing member.

Embodiment #71. The conformal wearable battery of Embodiment #70, wherein when a battery cell of the plurality of battery cells increases in volume, one of a battery cell shock-attenuating member of the plurality of shock-attenuating members is compressed.

Embodiment #72. The conformal wearable battery of Embodiment #70, wherein a thickness of a battery cell shock-attenuating member of the plurality of battery cell shock-attenuating members is within a range of 4 percent and 12 percent of a thickness of a battery cell of the plurality of battery cells.

Embodiment #73. The conformal wearable battery of Embodiment #70, wherein the opening of the plurality of battery cell shock-attenuating members has an oval shape.

Embodiment #74. The conformal wearable battery of Embodiment #70, further comprising:

a central shock-attenuating member, the central shock-attenuating member positioned between the upper portion and the lower portion of the flexible PCB preventing the upper portion from contacting the lower portion, wherein the central shock-attenuating member electrically insulates the upper portion from the lower portion.

Embodiment #75. The conformal wearable battery of Embodiment #74, wherein a thickness of the central shock-attenuating member is substantially the same as a thickness of a battery cell shock-attenuating member of the plurality of battery cell shock-attenuating members.

Embodiment #76. A system comprising:

a plurality of battery cells; and
a flexible printed circuit board (PCB) comprising:
a plurality of physical connection sections, wherein each of the plurality of battery cells is physically affixed to the flexible PCB at a corresponding physical connection section of the plurality of physical connection sections;
a bend axis that facilitates folding of the flexible PCB to form an upper portion of the flexible PCB and a lower portion of the flexible PCB;
a central shock-attenuating member formed from a polymeric foam material, the central shock-attenuating member positioned between the upper portion and the lower portion preventing the upper portion of the flexible PCB from contacting the lower portion of the flexible PCB;
a plurality of battery cell shock-attenuating members formed from a polymeric foam material, each battery cell shock-attenuating member of the plurality of battery cell shock-attenuating members being individually attached to an outward facing surface of each battery cell of the plurality of battery cells; and
a housing that includes an internal cavity, wherein the internal cavity receives the plurality of battery cells, the flexible PCB, the central shock-attenuating member, and the plurality of battery cell shock-attenuating members, wherein a battery cell shock-attenuating member of the plurality of battery cell shock-attenuating members contacts an interior surface of the housing.

Embodiment #77. The system of Embodiment #76, wherein when a battery cell of the plurality of battery cells increases in volume, one of a battery cell shock-attenuating member of the plurality of shock-attenuating members or the central shock-attenuating member is compressed.

Embodiment #78. The system of Embodiment #76, wherein when a battery cell of the plurality of battery cells increases in volume, the battery cell that increases in volume expands into a cavity formed by an opening in each battery cell shock-attenuating member of the plurality of battery cell shock-attenuating members.

Embodiment #79. The system of Embodiment #76, wherein a thickness of a battery cell shock-attenuating member of the plurality of battery cell shock-attenuating members is within a range of 4 percent and 12 percent of a thickness of a battery cell of the plurality of battery cells.

Embodiment #80. The system of Embodiment #76, wherein the central shock-attenuating member contacts both inward facing surfaces of the upper portion and the lower portion of the flexible PCB.

Embodiment #81. A conformal wearable battery comprising:
a plurality of battery cells, each battery cell including a pair of electrically conductive elements that correspond to either a cathode or an anode of each battery cell; and
a flexible printed circuit board (PCB) comprising:
a plurality of physical connection sections disposed in a grid like pattern on a first side of the flexible PCB, wherein each of the plurality of battery cells is disposed at a corresponding physical connection section of the plurality of physical connection sections;
a plurality of electrical connection pads linearly disposed on a second side opposite the first side of the flexible PCB, the plurality of electrical connection pads comprising an electrically conductive surface coating; and
wherein the pair of electrically conductive elements extend substantially parallel to and along the second side of the flexible PCB, and wherein each electrically conductive elements are connected to a corresponding electrical connection pad of the plurality of electrical connection pads on the second side of the flexible PCB forming an electrical connection.

Embodiment #82. The conformal wearable battery of Embodiment #81, wherein the plurality of battery cells comprise pouch cell packaged polymer lithium-ion, and each battery cell of the plurality of battery cells is physically attached to the first side of the flexible PCB.

Embodiment #83. The conformal wearable battery of Embodiment #81, wherein the flexible PCB further comprises:
a plurality of cutouts extending through the flexible PCB, wherein at least one cutout of the plurality of cutouts is located adjacent to an electrical connection pad of the plurality of electrical connection pads.

Embodiment #84. The conformal wearable battery of Embodiment #83, wherein each conductive element of the pair of electrically conductive elements extends through a corresponding cutout of the plurality of cutouts.

Embodiment #85. The conformal wearable battery of Embodiment #81, wherein the electrically conductive surface coating comprises an electroless nickel immersion gold (ENIG) surface coating.

Embodiment #86. The conformal wearable battery of Embodiment #81, wherein the electrically conductive surface coating comprises a lead-free immersion silver surface coating.

Embodiment #87. The conformal wearable battery of Embodiment #81, wherein the electrical connection between each electrically conductive element of the pair of electrically conductive elements and the corresponding electrical connection pad of the plurality of electrical connection pads are joined with a weld.

Embodiment #88. The conformal wearable battery of Embodiment #87, wherein the weld is formed using a laser welding process.

Embodiment #89. The conformal wearable battery of Embodiment #87, wherein the weld is formed using an ultrasonic welding process.

Embodiment #90. The conformal wearable battery of Embodiment #81, wherein a connection pad of the plurality of electrical connection pads has a width that is within a range of 1.8 times and 3 times a width of an electrically conductive element of the pair of electrically conductive elements.

Embodiment #91. The conformal wearable battery of Embodiment #81, wherein a height electrical connection is within a range of 1.2 to 3 times a thickness of an electrically conductive element of the pair of electrically conductive elements.

Embodiment #92. A system comprising:
a first plurality of battery cells; wherein a first battery cell of the first plurality of battery cell includes a first pair of electrically conductive elements;
a second plurality of battery cells, wherein a second battery cell of the second plurality of battery cell includes a second pair of electrically conductive elements; and
a flexible printed circuit board (PCB) comprising:
a plurality of battery cell connection sections disposed in a grid-like pattern along a first surface of the flexible PCB;
a plurality of cutouts disposed adjacent and parallel to an edge of the plurality of battery cell connection sections, wherein the plurality of cutouts is arranged as multiple pairs of cutouts arranged adjacent a majority of the plurality of battery cell connection sections; and
a plurality of electrical connection pads disposed on a second surface of the flexible PCB opposite the first surface, wherein a majority of the plurality of electrical connection pads are arranged adjacent the plurality of cutouts, wherein the plurality of electrical connection pads comprise an electrically conductive surface coating;
wherein an electrically conductive element of the first pair of electrically conductive elements wraps around an edge of the flexible PCB and extends along the second surface of the flexible PCB, wherein the electrically conductive element of the first pair of electrically conductive elements connects to a corresponding electrical connection pad of the plurality of electrical connection pads forming a first electrical connection; and wherein an electrically conductive element of the second pair of electrically conductive elements extends through a cutout of the plurality of cutouts, wherein each electrically conductive element of the second pair of electrically conductive elements connects to a corresponding electrical connection pad of the plurality electrical connection pads forming a second electrical connection.

Embodiment #93. The system of Embodiment #92, wherein the first electrical connection between the electrically conductive element of the first pair of electrically conductive elements and the corresponding electrical connection pad of the plurality of electrical connection pads are joined with a weld.

Embodiment #94. The system of Embodiment #93, wherein the weld is formed using a laser welding process.

Embodiment #95. The system of Embodiment #94, wherein the weld is formed using an ultrasonic welding process.

Embodiment #96. The system of Embodiment #92, wherein a connection pad of the plurality of electrical connection pads has a circular shape with a diameter that is within a range of 1.8 times and 3 times a width of an electrically conductive element of the first pair of electrically conductive elements.

Embodiment #97. A flexible printed circuit board assembly (PCBA) comprising:
 a flexible printed circuit board (PCB) comprising:
 a first side;
 a second side opposite the first side;
 a plurality of electrical connection pads disposed on the second side of the flexible PCB, the plurality of electrical connection pads arranged in multiple pairs of electrical connection pads and the plurality of electrical connection pads comprising an electrically conductive surface coating;
 a plurality of cutouts linearly disposed in the flexible PCB and adjacent to corresponding electrical connection pads; and
 a plurality of battery cell modules physically affixed to the first side of the flexible PCB, wherein the plurality of battery cell modules are arranged in a grid-like pattern and comprise pouch cell packaged polymer lithium-ion, wherein each battery cell module of the plurality of battery cell modules includes a pair of electrically conductive elements that extend substantially parallel to the second side of the flexible PCB and connect to corresponding electrical connection pads of the plurality of electrical connection pads forming an electrical connection for each battery cell module.

Embodiment #98. The flexible printed circuit board assembly (PCBA) of Embodiment #97, wherein the electrical connection between each electrically conductive elements of the pair of electrically conductive elements and the corresponding electrical connection pads of the plurality of electrical connection pads are joined with a weld.

Embodiment #99. The flexible printed circuit board assembly (PCBA) of Embodiment #97, wherein a connection pad of the plurality of electrical connection pads has a circular shape with a diameter that is within a range of 1.8 times and 3 times a width of an electrically conductive element of the pair of electrically conductive elements.

Embodiment #100. The flexible printed circuit board assembly (PCBA) of Embodiment #97, wherein each electrical connection pad of the plurality of electrical connection pads comprises an electroless nickel immersion gold (ENIG) surface coating.

Embodiment #101. The system of Embodiment #92, wherein the first plurality of battery cells and the second plurality of battery cells comprise pouch cell packaged polymer lithium-ion.

Embodiment #102. The system of Embodiment #92, wherein the electrically conductive surface coating comprises an electroless nickel immersion gold (ENIG) surface coating.

Embodiment #103. The system of Embodiment #92, wherein the electrically conductive surface coating comprises a lead-free immersion silver surface coating.

Embodiment #104. The system of Embodiment #92, wherein a first height of the first electrical connection is within a range of 1.2 to 3 times a thickness of a first electrically conductive element of the first pair of electrically conductive elements and a second height of the second electrical connection is within a range of 1.2 to 3 times a thickness of a second electrically conductive element of the second pair of electrically conductive elements.

Embodiment #105. A conformal wearable battery comprising:
 a first plurality of battery cells; wherein a first battery cell of the first plurality of battery cells includes a first pair of electrically conductive elements;
 a second plurality of battery cells, wherein a second battery cell of the second plurality of battery cells includes a second pair of electrically conductive elements, wherein the first plurality of battery cells and the second plurality of battery cells comprise pouch cell packaged polymer lithium-ion; and
 a flexible printed circuit board (PCB) comprising:
 a plurality of battery cell connection sections disposed in a grid-like pattern along a first surface of the flexible PCB;
 a plurality of cutouts disposed adjacent and parallel to an edge of the plurality of battery cell connection sections, wherein the plurality of cutouts is arranged as multiple pairs of cutouts arranged adjacent a majority of the plurality of battery cell connection sections; and
 a plurality of electrical connection pads disposed on a second surface of the flexible PCB opposite the first surface, wherein a majority of the plurality of electrical connection pads are arranged adjacent the plurality of cutouts, wherein the plurality of electrical connection pads comprise an electrically conductive surface coating;
 wherein an electrically conductive element of the first pair of electrically conductive elements wraps around an edge of the flexible PCB and extends along the second surface of the flexible PCB, wherein the electrically conductive element of the first pair of electrically conductive elements connects to a corresponding electrical connection pad of the plurality of electrical connection pads forming a first electrical connection;
 wherein an electrically conductive element of the second pair of electrically conductive elements extends through a cutout of the plurality of cutouts, wherein each electrically conductive element of the second pair of electrically conductive elements connects to a corresponding electrical connection pad of the plurality electrical connection pads forming a second electrical connection; and
 wherein a first height of the first electrical connection is within a range of 1.2 to 3 times a thickness of a first electrically conductive element of the first pair of electrically conductive elements and a second height of the second electrical connection is within a range of 1.2 to 3 times a thickness of a second electrically conductive element of the second pair of electrically conductive elements.

Embodiment #106. The conformal wearable battery of Embodiment #105, wherein the first electrical connection between the electrically conductive element of the first pair of electrically conductive elements and the corresponding electrical connection pad of the plurality of electrical connection pads are joined with a weld.

Embodiment #107. The conformal wearable battery of Embodiment #106, wherein the weld is formed using a laser welding process.

Embodiment #108. The conformal wearable battery of Embodiment #106, wherein the weld is formed using an ultrasonic welding process.

Embodiment #109. The conformal wearable battery of Embodiment #105, wherein a connection pad of the plurality of electrical connection pads has a circular shape with a diameter that is within a range of 1.8 times and 3 times a width of an electrically conductive element of the pair of electrically conductive elements.

Embodiment #110. A flexible printed circuit board (PCB) assembly comprising:
a first plurality of battery cells; wherein a first battery cell of the first plurality of battery cells includes a first pair of electrically conductive elements;
a second plurality of battery cells, wherein a second battery cell of the second plurality of battery cells includes a second pair of electrically conductive elements; and
a flexible printed circuit board comprising:
a plurality of battery cell connection sections disposed in a grid-like pattern along a first surface of the flexible PCB;
a plurality of cutouts disposed adjacent and parallel to an edge of the plurality of battery cell connection sections, wherein the plurality of cutouts is arranged as multiple pairs of cutouts arranged adjacent a majority of the plurality of battery cell connection sections; and
a plurality of electrical connection pads disposed on a second surface of the flexible PCB opposite the first surface, wherein a majority of the plurality of electrical connection pads are arranged adjacent the plurality of cutouts, wherein the plurality of electrical connection pads comprise an electrically conductive surface coating comprising an electroless nickel immersion gold (ENIG) surface coating;
wherein an electrically conductive element of the first pair of electrically conductive elements wraps around an edge of the flexible PCB and extends along the second surface of the flexible PCB, wherein the electrically conductive element of the first pair of electrically conductive elements connects, by a weld, to a corresponding electrical connection pad of the plurality of electrical connection pads forming a first electrical connection; and
wherein an electrically conductive element of the second pair of electrically conductive elements extends through a cutout of the plurality of cutouts, wherein each electrically conductive element of the second pair of electrically conductive elements connects to a corresponding electrical connection pad of the plurality electrical connection pads forming a second electrical connection.

Embodiment #111. The flexible printed circuit board (PCB) assembly of Embodiment #110, wherein the first plurality of battery cells and the second plurality of battery cells comprise pouch cell packaged polymer lithium-ion.

Embodiment #112. The flexible printed circuit board (PCB) assembly of Embodiment #110, wherein the weld is formed using a laser welding process.

Embodiment #113. The flexible printed circuit board (PCB) assembly of Embodiment #110, wherein the weld is formed using an ultrasonic welding process.

Embodiment #114. The flexible printed circuit board (PCB) assembly of Embodiment #110, wherein a connection pad of the plurality of electrical connection pads has a circular shape with a diameter that is within a range of 1.8 times and 3 times a width of an electrically conductive element of the pair of electrically conductive elements.

Embodiment #115. The flexible printed circuit board (PCB) assembly of Embodiment #110, wherein a first height of the first electrical connection is within a range of 1.2 to 3 times a thickness of a first electrically conductive element of the first pair of electrically conductive elements and a second height of the second electrical connection is within a range of 1.2 to 3 times a thickness of a second electrically conductive element of the second pair of electrically conductive elements.

Embodiment #116. A conformal wearable battery comprising:
a plurality of battery cells, each battery cell of the plurality of battery cells comprising:
a lithium-ion pouch cell; and
an attenuating member affixed to an exterior surface of the lithium-ion pouch cell;
at least one circuitry module configured to control and monitor charging and discharging of the plurality of battery cells; and
a flexible printed circuit board assembly (PCBA) comprising:
a plurality of physical connection sections disposed in a grid like pattern, wherein each of the plurality of battery cells and the at least one circuitry module is physically affixed to the flexible PCBA at a corresponding physical connection section of the plurality of physical connection sections;
a plurality of flexible regions distributed between the physical connection sections disposed in the grid like pattern, wherein the plurality of flexible regions allows the conformal wearable battery to flex in response to an applied force; and
a plurality of electrical connection pad pairs, wherein each pad pair of the plurality of electrical connection pad pairs is associated with a corresponding physical connection section and is positioned parallel to a corresponding flexible region.

Embodiment #117. The conformal wearable battery of Embodiment #116, wherein the flexible PCBA comprises a first plurality of electrical connections each connecting a cathode of a corresponding battery cell of the plurality of battery cells and second plurality of electrical connections each connecting an anode of the corresponding battery cell of the plurality of battery cells to electrical conductors of the flexible printed circuit board assembly.

Embodiment #118. The conformal wearable battery of Embodiment #116, wherein the plurality of battery cells and the at least one circuitry module, when affixed to the flexible PCBA, comprises a matrix of physical components.

Embodiment #119. The conformal wearable battery of Embodiment #18 wherein the matrix of physical components comprises a matrix of at least two rows and at least two columns.

Embodiment #120. The conformal wearable battery of Embodiment #116, wherein conformal wearable battery comprises at least one connector configured to provide an electrical power connection from internal circuitry of the conformal wearable battery to an external device to be powered.

Embodiment #121. The conformal wearable battery of Embodiment #120, wherein the plurality of battery cells, the at least one connector, and the at least one circuitry module, when affixed to the flexible PCBA, comprises a matrix of physical components.

Embodiment #122. The conformal wearable battery of Embodiment #116, wherein a bend axis comprises a center of the grid like pattern of the physical connection sections when the flexible PCBA is unfolded.

Embodiment #123. The conformal wearable battery of Embodiment #116, wherein each of the plurality of battery cells is physically attached to a first side of the flexible PCBA.

Embodiment #124. The conformal wearable battery of Embodiment #116, wherein each of the plurality of battery cells is physically attached to a first side of the flexible PCBA and each of the plurality of battery cells is electrically connected to the flexible PCBA on a second side of the flexible PCBA, the second side being opposite the first side.

Embodiment #125. The conformal wearable battery of Embodiment #116, wherein the plurality of battery cells is disposed on an outside surface of the flexible PCBA, when the flexible PCBA is in a folded configuration.

Embodiment #126. The conformal wearable battery of Embodiment #125, wherein the plurality of battery cells is arranged in a three-dimensional grid pattern.

Embodiment #127. The conformal wearable battery of Embodiment #116, further comprising a sealed flexible housing wherein the flexible PCBA is disposed within an interior cavity of the sealed flexible housing and wherein the flexible PCBA is in a folded configuration.

Embodiment #128. A system comprising:
a plurality of battery cell modules, each battery cell module of the plurality of battery cell modules comprising:
    a lithium-ion pouch cell comprising a cathode tab and an anode tab;
    an attenuating member affixed to an exterior surface of the lithium-ion pouch cell;
a flexible printed circuit board assembly (PCBA) comprising:
    a plurality of battery cell connection sections disposed in a grid-like pattern along a first surface of the flexible PCBA; and
    a plurality of electrical connection pad pairs, wherein each pad pair of the plurality of pad pairs is associated with a corresponding battery cell connection section and is positioned parallel to a corresponding flexible region of the flexible PCBA, wherein each of the plurality of battery cell modules is electrically attached to the flexible PCBA on a second surface of the flexible PCBA in a grid-like pattern via a corresponding pad pair, and wherein the second surface is opposite the first surface.

Embodiment #129. The system of Embodiment #128, further comprising a housing, wherein the flexible PCBA, when in a folded configuration, is located within the housing.

Embodiment #130. The system of Embodiment #128, wherein a center line of the attenuating member of each of the plurality of battery cell modules is offset from a center line of the lithium-ion pouch cell.

Embodiment #131. The system of Embodiment #129, wherein the battery cell comprises a lithium-ion battery cell.

Embodiment #132. The system of Embodiment #128, wherein the plurality of battery cell modules is arranged in a three-dimensional grid pattern when the flexible PCBA is in a folded configuration.

Embodiment #133. A flexible printed circuit board assembly (PCBA) comprising:
a plurality of battery modules physically affixed to the flexible PCBA, wherein the plurality of battery modules is arranged in a grid-like pattern, wherein each battery module of the plurality of battery cell modules comprises:
    a lithium-ion pouch cell; and
    an attenuating member affixed to an exterior surface of the lithium-ion pouch cell;
a bend axis near an approximate mid-point of the flexible PCBA, wherein bending the flexible PCBA along the bend axis results in a folded configuration of the flexible PCBA;
wherein, when the flexible PCBA is in a folded configuration:
    the plurality of battery modules is disposed in a flexible three-dimensional grid-like pattern on an exterior surface of the folded flexible PCBA, and
    the plurality of battery modules is electrically connected to the flexible PCBA via electrical pads disposed parallel and adjacent to a flexible section between adjacent rows of battery modules of the grid-like pattern.

Embodiment #134. The flexible PCBA of Embodiment #133, further comprising a plurality of the flexible sections, wherein the plurality of the flexible sections allows for the flexible PCBA to flex between adjacent rows and adjacent columns of battery modules.

Embodiment #135. A conformal wearable battery with a redundant trace fuse circuit, comprising:
a plurality of battery cells arranged in a grid-like pattern, wherein each battery cell of the plurality of battery cells comprise a positive terminal and a negative terminal to provide electricity through a transfer of electrons between the positive terminal and negative terminal;
a housing with an interior cavity that receives the plurality of battery cells;
a printed circuit board, comprising:
    a first electrical connection pad coupled to a positive terminal of a battery cell of the plurality of battery cells;
    a positive conductive region receiving electrical energy via positive terminals of one or more of the plurality of battery cells; and
    a first redundant trace fuse circuit comprising:
        a first fusible link electrically connecting the first electrical connection pad to the positive conductive region; and
        a second fusible link that is selectively enabled to electrically connect the first electrical connection pad to the positive conductive region.

Embodiment #136. The conformal wearable battery of Embodiment #135, wherein the printed circuit board comprises:
a second electrical connection pad coupled to a negative terminal of the battery cell of the plurality of battery cells;
a negative conductive region receiving electrical energy via negative terminals of one or more of the plurality of battery cells; and
a second redundant trace fuse circuit comprising:
    a third fusible link electrically connecting the second electrical connection pad to the negative conductive region; and
    a fourth fusible link to selectively electrically connect the second electrical connection pad to the negative conductive region.

Embodiment #137. The conformal wearable battery of Embodiment #135, wherein the first redundant trace fuse circuit comprises a plurality of conductive paths to connect the first electrical connection pad to the positive conductive region, wherein each of the plurality of conductive paths are connected independently from the other.

Embodiment #138. The conformal wearable battery of Embodiment #137, wherein a first conductive path of the plurality of conductive paths comprises a fuse element and a first pair of electrically separated conductive pads, wherein the fuse element is enabled via connection of a jumper between the first pair of electrically separated conductive pads.

Embodiment #139. The conformal wearable battery of Embodiment #137, wherein the printed circuit board comprises a flexible printed circuit board and further comprises:
a plurality of physical connection sections disposed in a grid like pattern, wherein each of the plurality of battery cells and the at least one circuitry module is physically affixed to the printed circuit board at a corresponding physical connection section of the plurality of physical connection sections;
a plurality of flexible regions distributed between the physical connection sections disposed in the grid like pattern, wherein the plurality of flexible regions allows the conformal wearable battery to flex in response to an applied force;
a plurality of electrical connection pad pairs, wherein each pad pair of the plurality of electrical connection pad pairs comprises an adjacent pair of electrical connection pads that is associated with a corresponding physical connection section, and is aligned parallel to a corresponding flexible region, wherein the plurality of electrical connection pad pairs comprises a first electrical connection pad pair and a second electrical connection pad pair and wherein the first electrical connection pad pair comprises the first electrical connection pad;
a pair of cutouts in the flexible PCBA through which a first pair of electrically conductive elements of the first battery cell extend, wherein the first pair of electrically conductive elements of the first battery cell are electrically connected to the first electrical connection pad pair; and
an edge of the flexible PCBA around which a second pair of electrically conductive elements of the second battery cell wraps, wherein the second pair of electrically conductive elements of the second battery cell are electrically connected to adjacent pads of the second electrical connection pad pair.

Embodiment #140. A printed circuit board, comprising:
a pair of electrical connection pads, wherein a first electrical connection pad is coupled to a positive terminal of a battery cell of a plurality of battery cells and a second electrical connection pad is coupled to a negative terminal of the battery cell of the plurality of battery cells;
a positive conductive region receiving electrical energy via positive terminals of one or more of the plurality of battery cells;
a negative conductive region receiving electrical energy via negative terminals of one or more of the plurality of battery cells; and
a plurality of first redundant trace fuse circuits, wherein each trace fuse circuit comprises:
a first fusible link that electrically connects the first electrical connection pad to the positive conductive region; and
a second fusible link that is selectively enabled to electrically connect the first electrical connection pad to the positive conductive region.

Embodiment #141. The printed circuit board of Embodiment #140, comprising:
a second redundant trace fuse circuit comprising:
a third fusible link electrically connecting the second electrical connection pad to the negative conductive region; and
a fourth fusible link to selectively electrically connect the second electrical connection pad to the negative conductive region.

Embodiment #142. The printed circuit board of Embodiment #140, wherein the second fusible link comprises a plurality of conductive paths to connect the first electrical connection pad to the positive conductive region, wherein each of the plurality of conductive paths are connected independently from the other.

Embodiment #143. The printed circuit board of Embodiment #142, wherein a first conductive path of the plurality of conductive paths comprises a fuse element and a first pair of electrically separated conductive pads, wherein the fuse element is enabled via connection of a jumper between the first pair of electrically separated conductive pads.

Embodiment #144. The printed circuit board of Embodiment #142, wherein at a first conductive path of the plurality of conductive paths comprise a pair of electrically separated conductive pads, wherein the first conductive path is enabled via connection of an external fuse component.

Embodiment #145. A method comprising:
forming a first electrical connection between a first electrical connection pad and a first battery terminal;
measuring, after forming the first electrical connection, continuity of a first electrical path between the first electrical connection pad and a first conductive region of a printed circuit board, wherein the first electrical path comprises a first trace fuse component formed on the printed circuit board;
selectively enabling, based on a measured discontinuity in the first electrical path, a second electrical connection between the first electrical connection pad and the first conductive region, wherein the second electrical connection comprises a second fuse component.

Embodiment #146. The method of Embodiment #145, wherein forming the second electrical connection path comprises electrically connecting a second fuse component using a conductive shunt component.

Embodiment #147. The method of Embodiment #145, wherein the second fuse component comprises a second trace fuse component formed on the printed circuit board.

Embodiment #148. The method of Embodiment #145, comprising:
measuring, after forming the second electrical connection, continuity of a second electrical path between the first electrical connection pad and the first conductive region of the printed circuit board, wherein the second electrical path comprises a second trace fuse component formed on the printed circuit board;
selectively enabling, based on a measured discontinuity in the second electrical path, a third electrical path between the first electrical connection pad and the first conductive region, wherein the third electrical path comprises a third fuse component Embodiment #149. The method of Embodiment #148, wherein the third fuse component comprises one of a third trace fuse component or a pair of secondary electrical connection pads formed on the printed circuit board to receive an external fuse component.

Embodiment #150. The method of Embodiment #145, wherein the second fuse component comprises electrically connecting a fuse component to a pair of secondary electrical connection pads formed on the printed circuit board.

Embodiment #151. The method of Embodiment #145, wherein forming the first electrical connection between the first electrical connection pad and the first battery terminal comprises heating one or both of the first electrical connection pad and the first battery terminal and wherein the heating one or both of the first electrical connection pad and the first battery terminal causes the discontinuity in the first electrical path.

Embodiment #152. The method of Embodiment #145, further comprising:

inserting through a pair of cutouts in the printed circuit board, the first battery terminal and a second battery terminal of a first battery cell, wherein the first battery cell is positioned adjacent a first side of the printed circuit board and the first electrical connection pad and a second electrical connection pad are on a second side of the printed circuit board opposite the first side;

forming a second electrical connection between a second electrical connection pad and the second battery terminal;

measuring, after forming the second electrical connection, continuity of a fourth electrical path between the second electrical connection pad and a second conductive region of a printed circuit board, wherein the second electrical path comprises a fourth trace fuse component formed on the printed circuit board;

selectively enabling, based on a measured discontinuity in the fourth electrical path, a fifth electrical connection between the second electrical connection pad and the second conductive region, wherein the fifth electrical connection comprises a fifth fuse component.

Embodiment #153. The method of Embodiment #152, further comprising:

connecting, based on a successful connection of the first battery cell to the printed circuit board, a second battery cell to the printed circuit board by:
  forming a sixth electrical connection between a third electrical connection pad and a third battery terminal comprising an anode of the second battery cell;
  measuring, after forming the sixth electrical connection, continuity of a sixth electrical path between the third electrical connection pad and a first conductive region of a printed circuit board, wherein the sixth electrical path comprises a sixth trace fuse component formed on the printed circuit board;
  selectively enabling, based on a measured discontinuity in the third electrical path, a seventh electrical connection between the third electrical connection pad and the first conductive region, wherein the seventh electrical connection comprises a seventh fuse component.

Embodiment #154. A method of assembling a printed circuit board assembly comprising:

(a) electrically connecting, via an application of heat energy, an anode tab of a battery cell to a first electrical connection pad formed in a printed circuit board and a cathode tab of the battery cell to a second electrical connection pad formed in the printed circuit board, wherein the first electrical connection pad is electrically connected to a first charge bus of the printed circuit board via a first trace fuse of a first redundant trace fuse assembly and the second electrical connection pad is electrically connected to a second charge bus of the printed circuit board via a second trace fuse of a second redundant trace fuse assembly and wherein the first trace fuse assembly and the second trace fuse assembly are formed in the printed circuit board;

(b) determining whether one of the first trace fuse or the second trace fuse is in open circuit condition;

(c) selectively enabling, based on an indication that the first trace fuse is an open circuit condition, a third trace fuse of the first trace fuse assembly;

(d) selectively enabling, based on an indication that the second trace fuse is an open circuit condition, a fourth trace fuse of the second trace fuse assembly;

(e) determining whether one of the third trace fuse or the fourth trace fuse is in open circuit condition;

(f) repeating steps (a)-(e), based on an indication that the anode tab is electrically connected to the first charge bus via the first redundant trace fuse assembly and the cathode tab is electrically connected to the second charge bus via the second redundant trace fuse assembly, to electrically connect a second battery cell to the printed circuit board; and (g) discontinuing, based on an indication that at least one of the third trace fuse or the fourth trace fuse is in an open circuit condition, assembly of the printed circuit board assembly.

What is claimed is:

1. A conformal wearable battery with at least one redundant trace fuse circuit, comprising:
    a plurality of battery cells arranged in a grid-like pattern, wherein each battery cell of the plurality of battery cells comprises a positive terminal and a negative terminal to provide electricity through a transfer of electrons between the positive terminal and the negative terminal;
    a housing with an interior cavity that receives the plurality of battery cells;
    a printed circuit board, comprising:
        a first electrical connection pad coupled to the positive terminal of a first battery cell of the plurality of battery cells;
        a positive conductive region receiving electrical energy via the positive terminals of one or more second battery cells of the plurality of battery cells;
        a first redundant trace fuse circuit of the at least one redundant trace fuse circuit comprising:
            a first fusible link electrically connecting the first electrical connection pad to the positive conductive region, wherein the first fusible link is integral to the printed circuit board such that the first fusible link is irreparable once blown; and
            a second fusible link that is selectively enabled to electrically connect the first electrical connection pad to the positive conductive region;
        a plurality of physical connection sections disposed in a grid like pattern, wherein each of the plurality of battery cells is physically affixed to the printed circuit board at a corresponding physical connection section of the plurality of physical connection sections;
        a plurality of flexible regions distributed between the physical connection sections disposed in the grid like pattern, wherein the plurality of flexible regions allows the conformal wearable battery to flex in response to an applied force;
        a plurality of first cut-outs disposed along a bend axis, wherein the bend axis is disposed between two of the plurality of physical connection sections, wherein a longer edge of each first cut-out of the plurality of first cut-outs is disposed parallel to the bend axis; and
        a plurality of second cut-outs disposed in pairs along a flex line perpendicular to the bend axis, wherein each pair of the plurality of second cut-outs facilitate an electrical connection, to the printed circuit board, of an associated battery cell of the plurality of battery cells.

2. The conformal wearable battery of claim 1, wherein the printed circuit board comprises:
a second electrical connection pad coupled to the negative terminal of the first battery cell of the plurality of battery cells;
a negative conductive region receiving electrical energy via the one or more negative terminals of one or more third battery cells of the plurality of battery cells; and
a second redundant trace fuse circuit comprising:
a third fusible link electrically connecting the second electrical connection pad to the negative conductive region; and
a fourth fusible link to selectively electrically connect the second electrical connection pad to the negative conductive region.

3. The conformal wearable battery of claim 1, wherein the first fusible link comprises a section of conductor configured to become inoperative after a current in excess of a threshold amount is passed to the section of conductor, wherein the first redundant trace fuse circuit comprises a plurality of conductive paths to connect the first electrical connection pad to the positive conductive region, and wherein each of the plurality of conductive paths are connected independently from the other.

4. The conformal wearable battery of claim 3, wherein a first conductive path of the plurality of conductive paths comprises a fuse element and a first pair of electrically separated conductive pads, wherein the fuse element is enabled via connection of a jumper between the first pair of electrically separated conductive pads.

5. The conformal wearable battery of claim 1, wherein the printed circuit board comprises: a plurality of electrical connection pad pairs, wherein each pad pair of the plurality of electrical connection pad pairs comprises an adjacent pair of electrical connection pads that is associated with a corresponding physical connection section, and is aligned parallel to a corresponding flexible region, wherein the plurality of electrical connection pad pairs comprises a first electrical connection pad pair and a second electrical connection pad pair and wherein the first electrical connection pad belongs to one of the first electrical connection pad pair or the second electrical connection pad pair.

6. A conformable wearable battery, comprising:
a pair of electrical connection pads, wherein a first electrical connection pad is coupled to a positive terminal of a first battery cell of a plurality of battery cells and a second electrical connection pad is coupled to a negative terminal of the first battery cell of the plurality of battery cells;
a positive conductive region receiving electrical energy via positive terminals of one or more second battery cells of the plurality of battery cells;
a negative conductive region receiving electrical energy via negative terminals of one or more third battery cells of the plurality of battery cells;
a plurality of first redundant trace fuse circuits, wherein each trace fuse circuit comprises:
a first fusible link that electrically connects the first electrical connection pad to the positive conductive region; and
a second fusible link that is selectively enabled to electrically connect the first electrical connection pad to the positive conductive region; and a flexible printed circuit board assembly comprising:
a plurality of physical connection sections disposed in a grid like pattern, wherein each of the plurality of battery cells is physically affixed to the flexible printed circuit board assembly at a corresponding physical connection section of the plurality of physical connection sections;
a plurality of first cut-outs disposed across a bend axis, wherein the bend axis is disposed between two of the plurality of physical connection sections, wherein a longer edge of each of the plurality of first cut-outs is disposed perpendicular to the bend axis; and
a plurality of second cut-outs disposed in pairs along a flex line perpendicular to the bend axis, wherein each pair of the plurality of second cut-outs facilitate an electrical connection, to the flexible printed circuit board assembly, of an associated battery cell of the plurality of battery cells.

7. The conformable wearable battery of claim 6, comprising:
a second redundant trace fuse circuit comprising:
a third fusible link electrically connecting the second electrical connection pad to the negative conductive region; and
a fourth fusible link to selectively electrically connect the second electrical connection pad to the negative conductive region.

8. The conformable wearable battery of claim 6, wherein the first fusible link comprises a section of conductor capable of transferring heat energy from the first electrical connection pad to the section of conductor, wherein the second fusible link comprises a plurality of conductive paths to connect the first electrical connection pad to the positive conductive region, wherein each of the plurality of conductive paths are connected independently from the other.

9. The conformable wearable battery of claim 8, wherein a first conductive path of the plurality of conductive paths comprises a fuse element and a first pair of electrically separated conductive pads, wherein the fuse element is enabled via connection of a jumper between the first pair of electrically separated conductive pads.

10. The conformable wearable battery of claim 8, wherein a first conductive path of the plurality of conductive paths comprises a pair of electrically separated conductive pads, wherein the first conductive path is enabled via connection of an external fuse component.

11. The conformal wearable battery of claim 6, wherein the printed circuit board comprises:
a flexible printed circuit board;
a plurality of electrical connection pad pairs, wherein each pad pair of the plurality of electrical connection pad pairs comprises an adjacent pair of electrical connection pads that is associated with a corresponding physical connection section, and is aligned parallel to a corresponding flexible region, wherein the plurality of electrical connection pad pairs comprises a first electrical connection pad pair and a second electrical connection pad pair and wherein the first electrical connection pad belongs to one of the first electrical pad pair or the second electrical pad pair;
wherein a first pair of electrically conductive elements, of a fourth battery cell, extends through the flexible printed circuit board, wherein the first pair of electrically conductive elements are electrically connected to the first electrical connection pad pair; and
wherein an edge of the flexible printed circuit board around which a second pair of electrically conductive elements, of a fifth battery cell, wraps, wherein the second pair of electrically conductive elements are electrically connected to adjacent pads of the second electrical connection pad pair.

12. The conformal wearable battery of claim 6, wherein the printed circuit board comprises:
a plurality of third cut-outs disposed along the bend axis, wherein a longer edge of each of the plurality of third cut-outs is disposed perpendicular to the bend axis.

13. The conformal wearable battery of claim 1, wherein the printed circuit board comprises:
a plurality of third cut-outs disposed across the bend axis, wherein a longer edge of each of the plurality of third cut-outs is disposed perpendicular to the bend axis.

14. The conformal wearable battery of claim 5, wherein the printed circuit board comprises a flexible printed circuit board, and wherein:
a first pair of electrically conductive elements, of a third battery cell, extends through the flexible printed circuit board, wherein the first pair of electrically conductive elements are electrically connected to the first electrical connection pad pair; and
an edge of the flexible printed circuit board around which a second pair of electrically conductive elements, of a fourth battery cell, wraps, wherein the second pair of electrically conductive elements are electrically connected to the second electrical connection pad pair.

15. A conformal wearable battery comprising:
a pair of electrical connection pads, wherein a first electrical connection pad is coupled to a positive terminal of a first battery cell of a plurality of battery cells and a second electrical connection pad is coupled to a negative terminal of the first battery cell;
a positive conductive region receiving electrical energy via positive terminals of one or more second battery cells of the plurality of battery cells;
a negative conductive region receiving electrical energy via negative terminals of one or more third battery cells of the plurality of battery cells;
a plurality of first redundant trace fuse circuits, wherein each trace fuse circuit comprises:
a first fusible link that electrically connects the first electrical connection pad to the positive conductive region; and
a second fusible link that is selectively enabled to electrically connect the first electrical connection pad to the positive conductive region; and
a flexible printed circuit board assembly that comprises:
a plurality of physical connection sections disposed in a grid like pattern, wherein each of the plurality of battery cells is physically affixed to the flexible printed circuit board at a corresponding physical connection section of the plurality of physical connection sections;
a plurality of first cut-outs disposed along a bend axis, wherein the bend axis is disposed between two of the plurality of physical connection sections;
a plurality of second cut-outs disposed across the bend axis; and
a plurality of third cut-outs disposed in pairs along a flex line that is perpendicular to the bend axis, wherein each pair of the third cut-outs facilitate an electrical connection, to the flexible printed circuit board assembly, of an associated battery cell of the plurality of battery cells.

16. The conformal wearable battery of claim 15, comprising:
a second redundant trace fuse circuit comprising:
a third fusible link electrically connecting the second electrical connection pad to the negative conductive region; and
a fourth fusible link to selectively electrically connect the second electrical connection pad to the negative conductive region.

17. The conformal wearable battery of claim 15, wherein the first fusible link comprises a section of conductor capable of transferring heat energy from the first electrical connection pad to the section of conductor, wherein the second fusible link comprises a plurality of conductive paths to connect the first electrical connection pad to the positive conductive region, wherein each of the plurality of conductive paths are connected independently from the other.

18. The conformal wearable battery of claim 17, wherein a first conductive path of the plurality of conductive paths comprises a fuse element and a first pair of electrically separated conductive pads, wherein the fuse element is enabled via connection of a jumper between the first pair of electrically separated conductive pads.

19. The conformal wearable battery of claim 17, wherein a first conductive path of the plurality of conductive paths comprises a pair of electrically separated conductive pads, wherein the first conductive path is enabled via connection of an external fuse component.

20. The conformal wearable battery of claim 15, wherein a longer edge of each first cut-out of the plurality of first cut-outs is disposed parallel to the bend axis, and wherein a longer edge of each second cut-out of the plurality of second cut-outs is disposed perpendicular to the bend axis.

* * * * *